United States Patent
Teh et al.

(10) Patent No.: US 7,010,736 B1
(45) Date of Patent: Mar. 7, 2006

(54) ADDRESS SEQUENCER WITHIN BIST (BUILT-IN-SELF-TEST) SYSTEM

(75) Inventors: Boon Tang Teh, Penang (MY); Edward V. Bautista, Jr., Santa Clara, CA (US); Ken Cheong Cheah, Penang (MY); Colin Bill, Cupertino, CA (US); Joseph Kucera, Austin, TX (US); Weng Fook Lee, Penang (MY); Darlene G. Hamilton, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 520 days.

(21) Appl. No.: 10/200,518

(22) Filed: Jul. 22, 2002

(51) Int. Cl.
*G01R 31/28* (2006.01)

(52) U.S. Cl. ................. 714/733; 365/185.22; 365/200; 365/201; 714/30

(58) Field of Classification Search ............... 714/733, 714/31, 30, 25, 42, 54, 718; 365/185.29, 365/185.33, 201; 711/103
See application file for complete search history.

(56) References Cited

U.S. PATENT DOCUMENTS

| | | | |
|---|---|---|---|
| 5,410,544 A * | 4/1995 | Kreifels et al. | 714/31 |
| 5,640,349 A * | 6/1997 | Kakinuma et al. | 365/185.33 |
| 5,781,477 A * | 7/1998 | Rinerson et al. | 365/185.29 |
| 6,085,334 A | 7/2000 | Giles et al. | 714/7 |
| 6,347,056 B1 * | 2/2002 | Ledford et al. | 365/201 |
| 6,356,974 B1 * | 3/2002 | Chevallier | 711/103 |
| 6,415,403 B1 * | 7/2002 | Huang et al. | 714/726 |
| 6,543,016 B1 | 4/2003 | Lewandowski et al. | 714/718 |
| 6,760,865 B1 * | 7/2004 | Ledford et al. | 714/30 |

* cited by examiner

*Primary Examiner*—Guy Lamarre
*Assistant Examiner*—Fritz Alphonse
(74) *Attorney, Agent, or Firm*—Monica H. Choi

(57) ABSTRACT

An address sequencer is fabricated on a semiconductor substrate having flash memory cells fabricated thereon for sequencing through the flash memory cells during BIST (built-in-self-test) of the flash memory cells. The address sequencer includes an address sequencer control logic and address sequencer buffers fabricated on the semiconductor substrate. The address sequencer buffers generate a plurality of bits indicating an address of the flash memory cells. The address sequencer control logic controls the buffers to sequence through a respective sequence of bit patterns for each of a plurality of BIST modes.

28 Claims, 60 Drawing Sheets

| Register # | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| BIST Set #1 | 1 | 0 | 0 | Mode #1 | Mode #2 | Mode #3 | Mode #4 | Mode #5 | | | | P/F #5 | P/F #4 | P/F #3 | P/F #2 | P/F #1 |
| BIST Set #2 | 1 | 0 | 1 | Mode #6 | Mode #7 | Mode #8 | Mode #9 | Mode #10 | | | | P/F #10 | P/F #9 | P/F #8 | P/F #7 | P/F #6 |
| BIST Set #3 | 1 | 1 | 0 | Mode #11 | Mode #12 | Mode #13 | Mode #14 | Mode #15 | | | | P/F #15 | P/F #14 | P/F #13 | P/F #12 | P/F #11 |
| BSTAT | | | | 1 | 2 | 3 | 4 | 5 | | | | | | | | |

*FIG. 11*

| YCE(1) | LBMATCH_Q | REDL(0) | REDH(0) | FAILREP |
|---|---|---|---|---|
| 0 | 0 | 1 | Don't Care | 1 |
| 0 | 0 | 0 | Don't Care | 0 |
| 0 | 1 | Don't Care | 1 | 1 |
| 0 | 1 | Don't Care | 0 | 0 |

*FIG. 30*

| BREP01 | REDL(0) | REDH(0) | REDL(1) | REDH(1) | REDOK |
|---|---|---|---|---|---|
| 0 | 0 | 0 | Don't Care | Don't Care | 0 |
| 0 | 1 | 0 | Don't Care | Don't Care | 1 |
| 0 | 0 | 1 | Don't Care | Don't Care | 1 |
| 1 | Don't Care | Don't Care | 0 | 0 | 0 |
| 1 | Don't Care | Don't Care | 1 | 0 | 1 |
| 1 | Don't Care | Don't Care | 0 | 1 | 1 |

*FIG. 32*

| R (Reset) | S (Set) | Q (MATCHD) |
|---|---|---|
| 0 | 0 | 0 |
| 0 | 1 | Not Applicable |
| 1 | 0 | Latched to Last Value |
| 1 | 1 | 1 |

| Sector Number | Sector Size | A[19:15] | A[14:12] |
|---|---|---|---|
| 34 | 16 Kbyte | 1 1 1 1 1 | 1 1 0 |
| 33 | 8 Kbyte | 1 1 1 1 1 | 1 0 1 |
| 32 | 8 Kbyte | 1 1 1 1 1 | 1 0 0 |
| 31 | 32 Kbyte | 1 1 1 1 1 | 0 1 1 |
| 30 | 64 Kbyte | 1 1 1 1 0 | 0 1 0 |
| 29 | 64 Kbyte | 1 1 1 0 1 | 0 1 0 |
| ⋮ | ⋮ | ⋮ | ⋮ |
| 1 | 64 Kbyte | 0 0 0 0 1 | 0 1 0 |
| 0 | 64 Kbyte | 0 0 0 0 0 | 0 1 0 |

| Reference Cell | A[2] | A[1] | A[0] |
|---|---|---|---|
| ERV | 1 | 1 | 1 |
| RDV | 1 | 1 | 0 |
| PGMV | 1 | 0 | 1 |
| APDEV1 | 1 | 0 | 0 |
| APDEV2 | 0 | 1 | 1 |

| a1 | a2 | a3 | a4 |
|---|---|---|---|
| b1 | b2 | b3 | b4 |
| c1 | c2 | c3 | c4 |
| d1 | d2 | d3 | d4 |

| 0 | 0 | 0 | 0 |
|---|---|---|---|
| 0 | 0 | 0 | 0 |
| 0 | 0 | 0 | 0 |
| 0 | 0 | 0 | 0 |

| Flash Memory Cell Location | X-Address A11:A6 | Y-Address A5:A0 |
|---|---|---|
| a1 | 1 1 1 1 1 1 | 1 1 1 1 1 1 |
| a2 | 1 1 1 1 1 0 | 1 1 1 1 1 1 |
| a3 | 1 1 1 1 0 1 | 1 1 1 1 1 1 |
| a4 | 1 1 1 1 0 0 | 1 1 1 1 1 1 |
| b1 | 1 1 1 1 1 1 | 1 1 1 1 1 0 |
| b2 | 1 1 1 1 1 0 | 1 1 1 1 1 0 |
| b3 | 1 1 1 1 0 1 | 1 1 1 1 1 0 |
| b4 | 1 1 1 1 0 0 | 1 1 1 1 1 0 |
| c1 | 1 1 1 1 1 1 | 1 1 1 1 0 1 |
| c2 | 1 1 1 1 1 0 | 1 1 1 1 0 1 |
| c3 | 1 1 1 1 0 1 | 1 1 1 1 0 1 |
| c4 | 1 1 1 1 0 0 | 1 1 1 1 0 1 |
| d1 | 1 1 1 1 1 1 | 1 1 1 1 0 0 |
| d2 | 1 1 1 1 1 0 | 1 1 1 1 0 0 |
| d3 | 1 1 1 1 0 1 | 1 1 1 1 0 0 |
| d4 | 1 1 1 1 0 0 | 1 1 1 1 0 0 |

*FIG. 68*

| Control and Output Signals | BIST Program Margin | BIST Erase Margin | Manual Program Margin | Manual Erase Margin |
|---|---|---|---|---|
| ERMARGIN | 0 | 1 | 0 | 1 |
| STEST | 1 | 1 | 0 | 0 |
| BVERIFY | 1 | 1 | 0 | 0 |
| BREPAIR | 1 | 0 | 0 | 0 |
| BWPPGM | 0 | 0 | 0 | 0 |
| IN | 1 | 0 | 1 | 0 |
| OUTB | 0 Volts | VPROG | 0 Volts | VPROG |
| PMOSFET STATE | ON | OFF | ON | OFF |
| NMOSFET STATE | ON | ON | OFF | ON |
| OUTPUT NODE | 3.3 Volts | 0 Volts | VPROG | 0 Volts |

FIG. 79

ADDRESS SEQUENCER WITHIN BIST (BUILT-IN-SELF-TEST) SYSTEM

TECHNICAL FIELD

The present invention relates generally to manufacture of flash memory devices, and more particularly, to implementation of an address sequencer within an BIST (built-in-self-test) system for on-chip testing of an array of flash memory cells with a plurality of BIST (built-in-self-test) modes.

The "Detailed Description" section is organized with the following sub-sections:
- A. BIST(Built-in-Self-Test) System;
- B. BIST(Built-in-Self-Test) Interface;
- C. Back-End BIST(Built-in-Self-Test) State Machine;
- D. On-Chip Repair of Defective Address of Core Flash Memory Cells;
- E. Diagnostic Mode for Testing Functionality of BIST (Built-in-Self-Test) Back-End State Machine;
- F. Address Sequencer within BIST (Built-In-Self-Test) System;
- G. Pattern Generator in BIST (Built-In-Self-Test) System;
- H. On-Chip Erase Pulse Counter for Efficient Erase Verify BIST (Built-In-Self-Test) Mode; and
- I. Generation of Margining Voltage On-Chip During Testing CAM Portion of Flash Memory Device.

The present invention relates to sub-section "F" entitled "Address Sequencer within BIST (Built-In-Self-Test) System", with particular reference to FIGS. 42–58.

BACKGROUND OF THE INVENTION

Referring to FIG. 1, a flash memory cell 100 of a flash memory device includes a tunnel dielectric structure 102 typically comprised of silicon dioxide ($SiO_2$) or nitrided oxide as known to one of ordinary skill in the art of integrated circuit fabrication. The tunnel dielectric structure 102 is disposed on a semiconductor substrate or a p-well 103. In addition, a floating gate structure 104, comprised of a conductive material such as polysilicon for example, is disposed over the tunnel dielectric structure 102. A dielectric structure 106, typically comprised of silicon dioxide ($SiO_2$), is disposed over the floating gate structure 104. A control gate structure 108, comprised of a conductive material, is disposed over the dielectric structure 106.

A drain bit line junction 110 that is doped with a junction dopant, such as arsenic (As) or phosphorous (P) for example, is formed within an active device area 112 of the semiconductor substrate or p-well 103 toward a left sidewall of the floating gate structure 104 in FIG. 1. A source bit line junction 114 that is doped with the junction dopant is formed within the active device area 112 of the semiconductor substrate or p-well 106 toward a right sidewall of the floating gate structure 104 of FIG. 1.

During the program or erase operations of the flash memory cell 100 of FIG. 1, charge carriers are injected into or tunneled out of the floating gate structure 104. Such variation of the amount of charge carriers within the floating gate structure 104 alters the threshold voltage of the flash memory cell 100, as known to one of ordinary skill in the art of flash memory technology. For example, when electrons are the charge carriers that are injected into the floating gate structure 104, the threshold voltage increases. Alternatively, when electrons are the charge carriers that are tunneled out of the floating gate structure 104, the threshold voltage decreases. These two conditions are used as the two states for storing digital information within the flash memory cell 100, as known to one of ordinary skill in the art of electronics.

During programming of the flash memory cell 100 for example, a voltage of +9 Volts is applied on the control gate structure 108, a voltage of +5 Volts is applied on the drain bit line junction 110, and a voltage of 0 Volts is applied on the source bit line junction 114 and on the semiconductor substrate or p-well 103. With such bias, when the flash memory cell 100 is an N-channel flash memory cell, electrons are injected into the floating gate structure 104 to increase the threshold voltage of the flash memory cell 100 during programming of the flash memory cell 100.

Alternatively, during erasing of the flash memory cell 100, a voltage of −9.5 Volts is applied on the control gate structure 108, the drain bit line is floated at junction 110, and a voltage of +4.5 Volts is applied on the source bit line junction 114 and on the semiconductor substrate or p-well 103 for example. With such bias, when the flash memory cell 100 is an N-channel flash memory cell, electrons are pulled out of the floating gate structure 104 to decrease the threshold voltage of the flash memory cell 100 during erasing of the flash memory cell 100. Such an erase operation is referred to as an edge erase process by one of ordinary skill in the art of flash memory technology.

In an alternative channel erase process, a voltage of −9.5 Volts is applied on the control gate structure 108 and a voltage of +9 Volts is applied on the semiconductor substrate or p-well 103 with the drain and source bit line junctions 110 and 114 floating. With such bias, when the flash memory cell 100 is an N-channel flash memory cell, electrons are pulled out of the floating gate structure 104 to the substrate or p-well 103 to decrease the threshold voltage of the flash memory cell 100 during erasing of the flash memory cell 100.

FIG. 2 illustrates a circuit diagram representation of the flash memory cell 100 of FIG. 1 including a control gate terminal 150 coupled to the control gate structure 108, a drain terminal 152 coupled to the drain bit line junction 110, a source terminal 154 coupled to the source bit line junction 114, and a substrate or p-well terminal 156 coupled to the substrate or p-well 103. FIG. 3 illustrates an electrically erasable and programmable memory device 200 comprised of an array of flash memory cells, as known to one of ordinary skill in the art of flash memory technology. Referring to FIG. 3, the array of flash memory cells 200 includes rows and columns of flash memory cells with each flash memory cell having similar structure to the flash memory cell 100 of FIGS. 1 and 2. The array of flash memory cells 200 of FIG. 3 is illustrated with 2 columns and 2 rows of flash memory cells for simplicity and clarity of illustration. However, a typical array of flash memory cells comprising an electrically erasable and programmable memory device has more numerous rows and columns of flash memory cells.

Further referring to FIG. 3, in the array of flash memory cells 200 comprising an electrically erasable and programmable memory device, the control gate terminals of all flash memory cells in a row of the array are coupled together to form a respective word line for that row. In FIG. 3, the control gate terminals of all flash memory cells in the first row are coupled together to form a first word line 202, and the control gate terminals of all flash memory cells in the second row are coupled together to form a second word line 204.

In addition, the drain terminals of all flash memory cells in a column are coupled together to form a respective bit line for that column. In FIG. 3, the drain terminals of all flash memory cells in the first column are coupled together to form a first bit line 206, and the drain terminals of all flash memory cells in the second column are coupled together to form a second bit line 208. Further referring to FIG. 3, the source terminal of all flash memory cells of the array 200 are coupled together to a source voltage $V_{SS}$, and the substrate or p-well terminal of all flash memory cells of the array 200 are coupled together to a substrate voltage $V_{SUB}$.

Referring to FIG. 4, a flash memory device comprised of an array of flash memory cells as illustrated in FIG. 3 for example is fabricated on a semiconductor die of a semiconductor wafer 220. A plurality of semiconductor dies are manufactured on the semiconductor wafer 220. Each square area on the semiconductor wafer 220 of FIG. 4 represents one semiconductor die. More numerous semiconductor dies are typically fabricated on a semiconductor wafer than shown in FIG. 4 for clarity of illustration. Each semiconductor die of FIG. 4 has a respective flash memory device comprised of an array of core flash memory cells.

During manufacture of the flash memory devices on the semiconductor wafer 220, each flash memory device on a semiconductor die is tested for proper functionality, as known to one of ordinary skill in the art of flash memory device manufacture. Referring to FIG. 5, an example semiconductor die 222 has a flash memory device comprised of an array of core flash memory cells 224. Referring to FIGS. 3 and 5, during testing of the flash memory device on the semiconductor die 222, an external test system applies bias voltages on the array of core flash memory cells 224 via contact pads 226 of the semiconductor die 222 for testing the array of core flash memory cells 224.

Referring to FIGS. 3 and 5, patterns of programming and erasing voltages are applied on the array of core flash memory cells 224 by the external test system via the contact pads 226 according to a plurality of flash memory test modes. For example, the array of core flash memory cells 224 are programmed and erased in an alternating checkerboard pattern in one test mode. Alternatively, the flash memory cells located in the diagonal of the array of core flash memory cells 224 are programmed in another test mode. Then, a read operation is performed on the array of core flash memory cells by the external test system for each test mode via the contact pads 226 to determine that the array of core flash memory cells 224 are properly programmed and erased. Such a plurality of flash memory test modes and such an external test system for testing the proper functionality of the array of core flash memory cells are known to one of ordinary skill in the art of flash memory device manufacture. An example of such an external test system is the model V3300, available from Agilent Technologies, Inc., headquartered in Palo Alto, Calif.

Furthermore, the BIST (built-in-self-test) system performs a plurality of BIST (built-in-self-test) modes with each BIST mode sequencing through the array of flash memory cells in a respective sequence. Thus, an address sequencer within the BIST system is desired for efficiently sequencing through the array of flash memory cells according to the respective sequence for each of the plurality of BIST modes.

SUMMARY OF THE INVENTION

Accordingly, in a general aspect of the present invention, an address sequencer having an address sequencer control logic is fabricated on the semiconductor die having the array of flash memory cells fabricated thereon.

In one embodiment of the present invention, in an apparatus and method for sequencing through flash memory cells within a BIST (built-in-self-test) system for testing an array of flash memory cells fabricated on a semiconductor die, a plurality of bits are generated by address sequencer buffers fabricated on the semiconductor die for indicating a respective address for each flash memory cell of the array of flash memory cells. A first group of bits are generated by a first plurality of address sequencer buffers for indicating a Y-address for each flash memory cell of the array of flash memory cells. A second group of bits are generated by a second plurality of address sequencer buffers for indicating an X-address for each flash memory cell of the array of flash memory cells. A third group of bits are generated by a third plurality of address sequencer buffers for indicating a sector address for each flash memory cell of the array of flash memory cells.

An address sequencer control logic, fabricated on the semiconductor die, inputs control signals from at least one of a BIST (built-in-self-test) back-end state machine, a BIST (built-in-self-test) interface, a BIST (built-in-self-test) front-end interface decoder, and the address sequencer buffers. The address sequencer control logic controls the first, second, and third address sequencer buffers to generate a respective bit pattern for each of the first, second, and third group of bits depending on the control signals. The address sequencer control logic controls the address sequencer buffers to sequence through a respective sequence of bit patterns for each of a plurality of BIST (built-in-self-test) modes.

In this manner, sequencing through the addresses of the array of flash memory cells for each BIST mode is performed on-chip by the address sequencer control logic and the address sequencer buffers. Thus, pins from the external test system are not used for such sequencing through the addresses of the array of flash memory cells. With use of such minimized number of pins from the external test system, a higher number of semiconductor dies may be tested concurrently by the external test system having a limited total number of pins, to maximize throughput during manufacture of flash memory devices. In addition, because such sequencing through the addresses of the array of flash memory cells is performed on-chip, the speed of performing such address sequencing is not limited by the capacity of the external test system. Thus, such sequencing through the addresses of array of flash memory cells may be more efficient for the plurality of BIST modes.

These and other features and advantages of the present invention will be better understood by considering the following detailed description of the invention which is presented with the attached drawings.

BRIEF DESCRIPTION OF THE DRAWINGS

FIG. 11 shows example data within a serial shift register of the BIST interface, according to one embodiment of the present invention;

FIG. 30 shows a table of values of a FAILREP value generated by the FAILREP logic of FIG. 28, according to an embodiment of the present invention;

FIG. 32 shows a table of values of a REDOK value generated by the repair matching unit of FIG. 26, according to an embodiment of the present invention;

FIG. 65 shows the desired bit pattern of all logical high states when the current BIST mode is for erasing each flash memory cell of the array of flash memory cells of FIG. 63;

FIG. 66 shows the desired bit pattern of the array of flash memory cells of FIG. 63 when the current BIST mode is for a checker-board pattern of logical low and high states;

FIG. 67 shows the desired bit pattern of the array of flash memory cells of FIG. 63 when the current BIST mode is for a diagonal pattern of a logical low state only at the diagonal locations of the array of flash memory cells;

FIG. 68 shows a table of the respective X-address and the respective Y-address of the flash memory cell of each location of the array of flash memory cells of FIG. 63;

FIG. 79 shows a table of voltage levels during operation of the margining voltage generator apparatus of FIG. 76, according to one embodiment of the present invention;

The figures referred to herein are drawn for clarity of illustration and are not necessarily drawn to scale. Elements having the same reference number in FIGS. 1–83 refer to elements having similar structure and function.

DETAILED DESCRIPTION

A. BIST(Built-in-Self-Test) System

Figure 3:
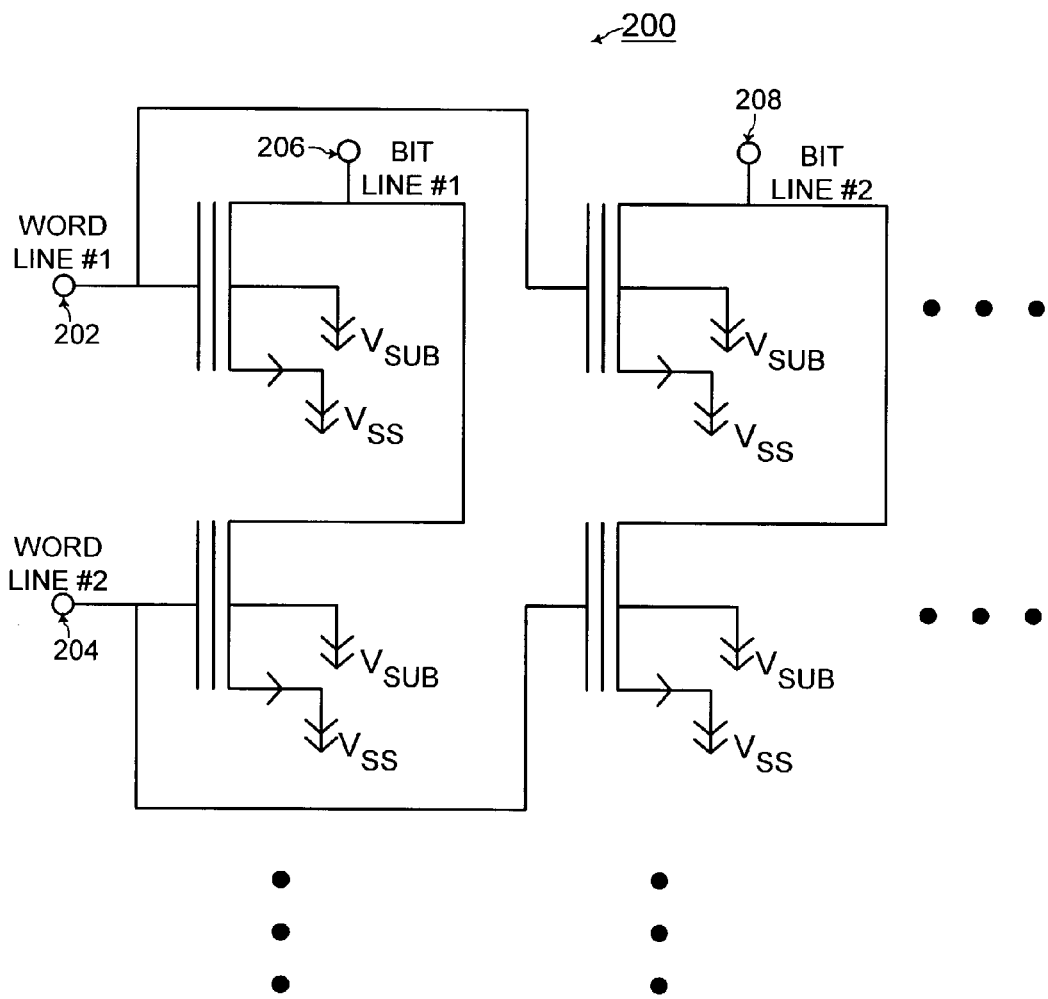
FIG. 3 shows an array of flash memory cells comprising a flash memory device.
Figure 6:
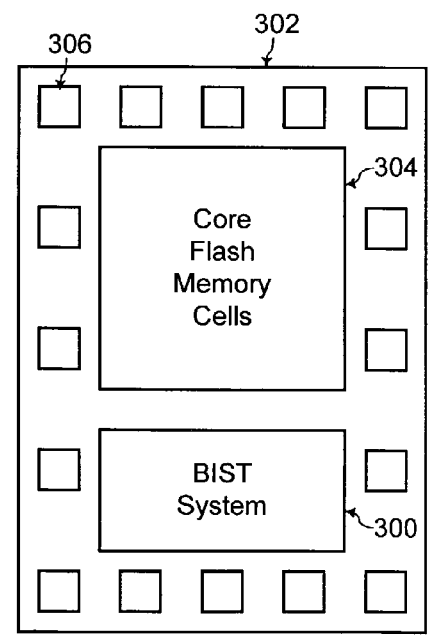
FIG. 6 shows a BIST (built-in-self-test) system built on-chip with the array of core flash memory cells on the same semiconductor die such that the programming, erasing, and reading operations during testing of the flash memory device are performed on-chip within the semiconductor die, according to an aspect of the present invention.

Referring to FIG. 6, in a general aspect of the present invention, a BIST (built-in-self-test) system 300 is fabricated on a semiconductor die 302 having a flash memory device 304 fabricated thereon. The flash memory device 304 is comprised of an array of core flash memory cells as illustrated in FIG. 3 for example. The semiconductor die 302 also has conductive pads 306 fabricated thereon for providing connection to the array of core flash memory cells 304 and the BIST system 300. More numerous conductive pads are typically fabricated than those illustrated in FIG. 6 for clarity of illustration.

Figure 7:
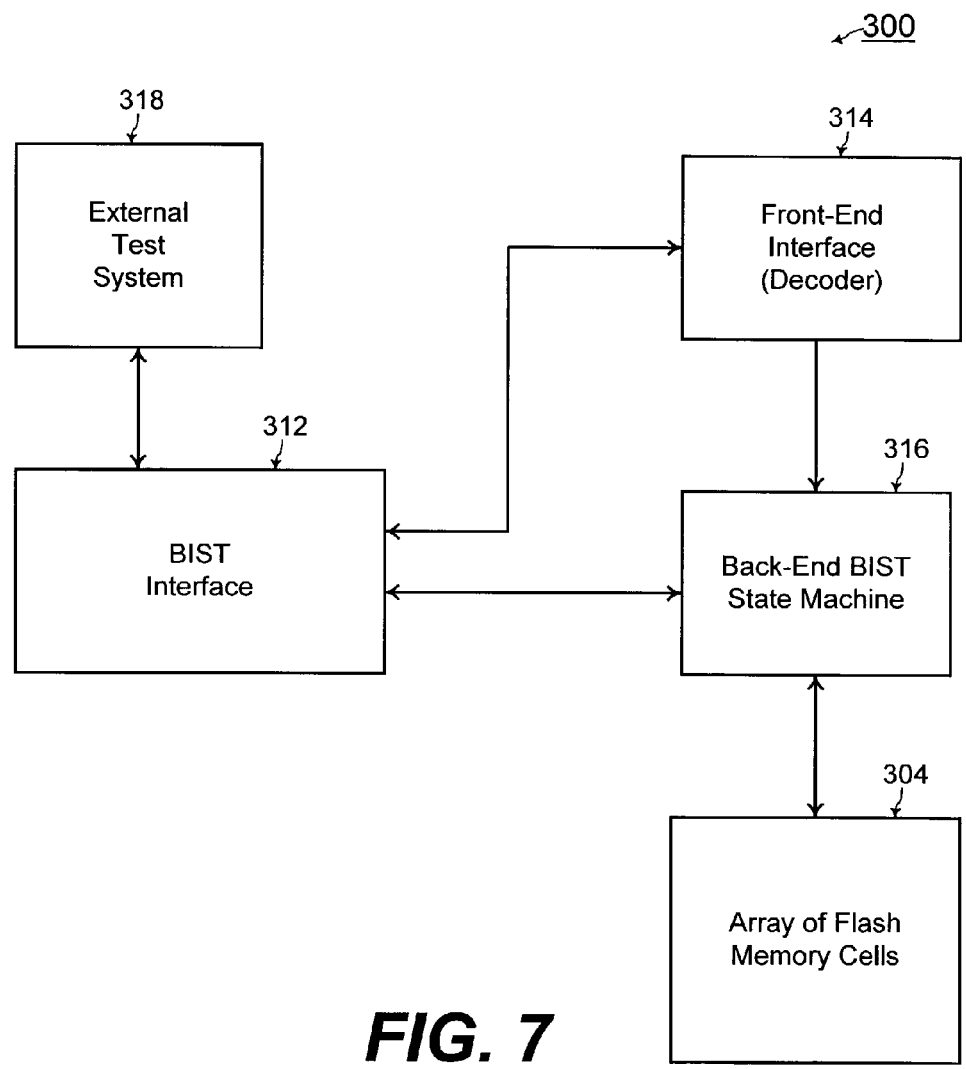
FIG. 7 shows a general block diagram of the components of the BIST system of FIG. 6, according to one embodiment of the present invention.

FIG. 7 shows a block diagram of the BIST system 300 of FIG. 6 fabricated on-chip with the array of core flash memory cells 304. The BIST system 300 is comprised of a BIST (built-in-self-test) interface 312, a front-end interface 314, and a back-end BIST (built-in-self-test) state machine 316. The BIST interface 312 is coupled between an external test system 318 and the front-end interface 314 and the back-end BIST state machine 316. The back-end BIST state machine 316 is coupled between the front-end interface 314, the BIST interface 312, and the array of core flash memory cells 304.

Referring to FIGS. 6 and 7, the BIST interface 312, the front-end interface 314, and the back-end BIST state machine 316 comprise the BIST system 300 fabricated on the semiconductor die 302 with the array of core flash memory cells 304 such that the BIST system 300 is on-chip with the array of core flash memory cells 304. The external test system 318 is not part of the BIST system 300. Rather the external test system 318 is external to the semiconductor die 302 and interfaces with the BIST system 300 during testing of the array of core flash memory cells 304.

The BIST interface 312 inputs control signals and test data from the external test system 318 to interpret commands from the external test system 318 during testing of the array of core flash memory cells 304. In addition, the BIST interface 312 outputs test results from testing of the array of core flash memory cells 304 to the external test system 318. The back-end BIST state machine 316 applies programming and erasing voltages on the array of core flash memory cells 304 for testing the array of core flash memory cells 304. In addition, the back-end BIST state machine 316 performs read operations on the array of core flash memory cells 304 to determine whether the array of core flash memory cells 304 pass or fail the testing of the array of core flash memory cells 304.

The front-end interface provides test mode identification data to the back-end BIST state machine 316 such that the back-end BIST state machine 316 applies an appropriate pattern of programming and erasing voltages on the array of core flash memory cells 304 for testing the array of core flash memory cells 304 according to the test mode identification. A plurality of test modes are performed on the array of core flash memory cells 304 during testing of the array of core flash memory cells 304. In one example, during testing of the array of core flash memory cells 304, approximately nineteen different test modes are performed on the array of core flash memory cells 304.

Each test mode corresponds to a respective pattern of biasing each flash memory cell of the array of core flash memory cells 304 for a desired pattern of programmed and erased states of the array of core flash memory cells 304. For example, the core flash memory cells are programmed and erased in an alternating checker-board pattern in the array of core flash memory cells 304 for a desired checker-board pattern of programmed and erased core flash memory cells in one test mode. Alternatively, the flash memory cells located in the diagonal of the array of core flash memory cells 304 are programmed for a desired diagonal pattern of programmed flash memory cells in another test mode. Such test modes for testing the functionality of the array of core flash memory cells are known to one of ordinary skill in the art of flash memory device manufacture.

The back-end state machine 316 applies appropriate programming or erasing voltages on each flash memory cell of the array of core flash memory cells 304 according to the respective pattern of biasing the array of core flash memory cells 304 for a test mode. The test mode identification from the front-end interface 314 indicates the current test mode to be performed by the back-end state machine 316.

The back-end state machine 316 measures a pattern of programmed and erased states for the array of core flash memory cells after the back-end state machine 316 applies the appropriate voltages on the array of core flash memory cells for the test mode. In addition, the back-end state machine 316 determines whether that test mode resulted in a pass or fail by comparing the measured pattern of programmed and erased states with the desired pattern of programmed and erased states of the array of core flash memory cells, for the test mode. The pass or fail results for the test modes from the back-end state machine 316 are stored in the BIST interface 312.

B. BIST(Built-in-Self-Test) Interface

Figure 8:
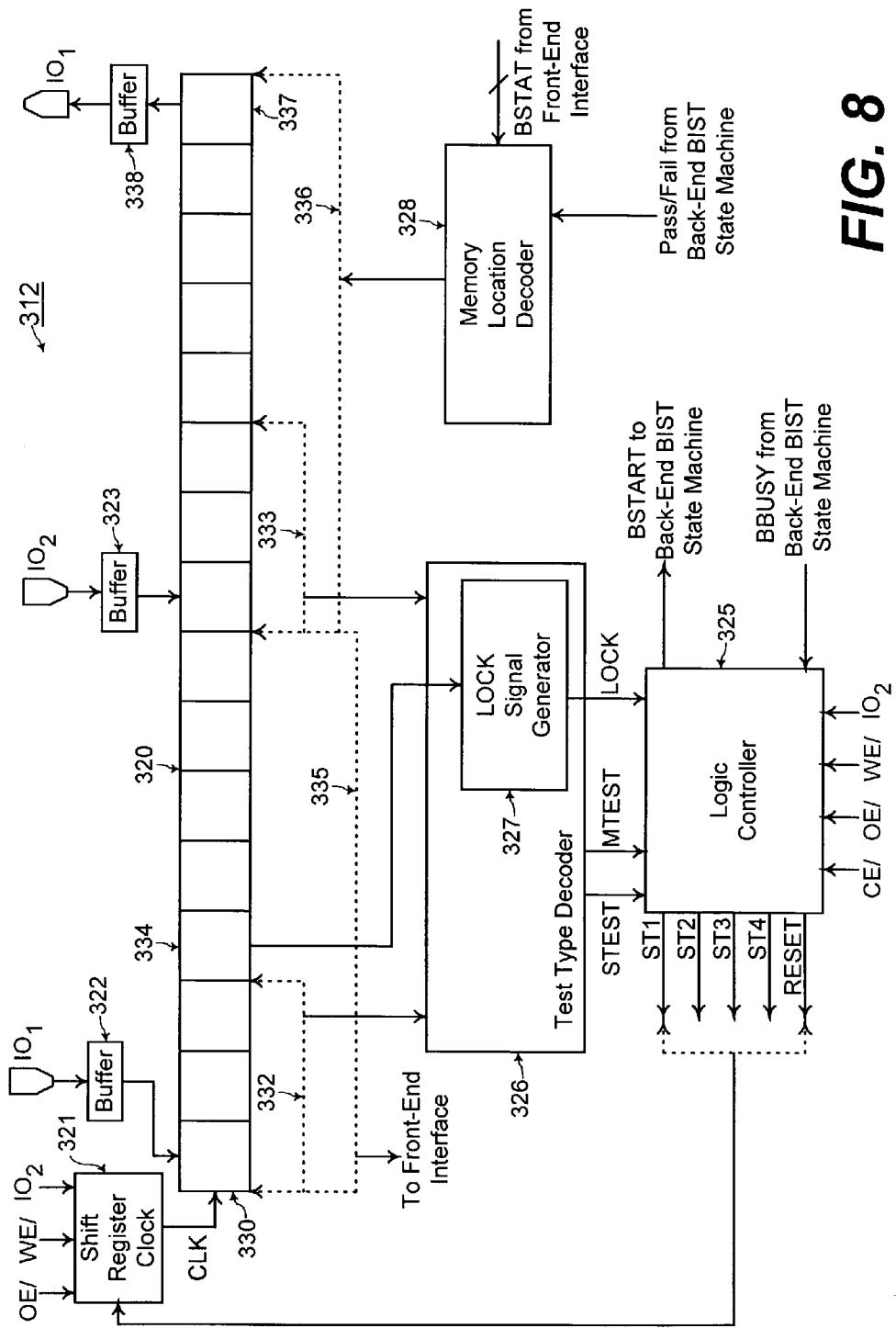
FIG. 8 shows a block diagram of the components of the BIST interface of FIG. 7, according to one embodiment of the present invention.

FIG. 8 shows a block diagram of an example implementation of the BIST interface 312. Referring to FIG. 8, the BIST interface 312 includes a serial shift register 320. Serial shift registers are known to one of ordinary skill in the art of electronics. In addition, the BIST interface 312 includes a shift register clock 321 for driving the serial shift register 320 to serially shift data bits. The BIST interface 312 also includes a first buffer 322, a second buffer 323, and a third buffer 338 for inputting and outputting data bits to and from the serial shift register 320. Furthermore, the BIST interface 312 includes a logic controller 325, a test type decoder 326, a lock signal generator 327, and a memory location decoder 328.

Figure 9:
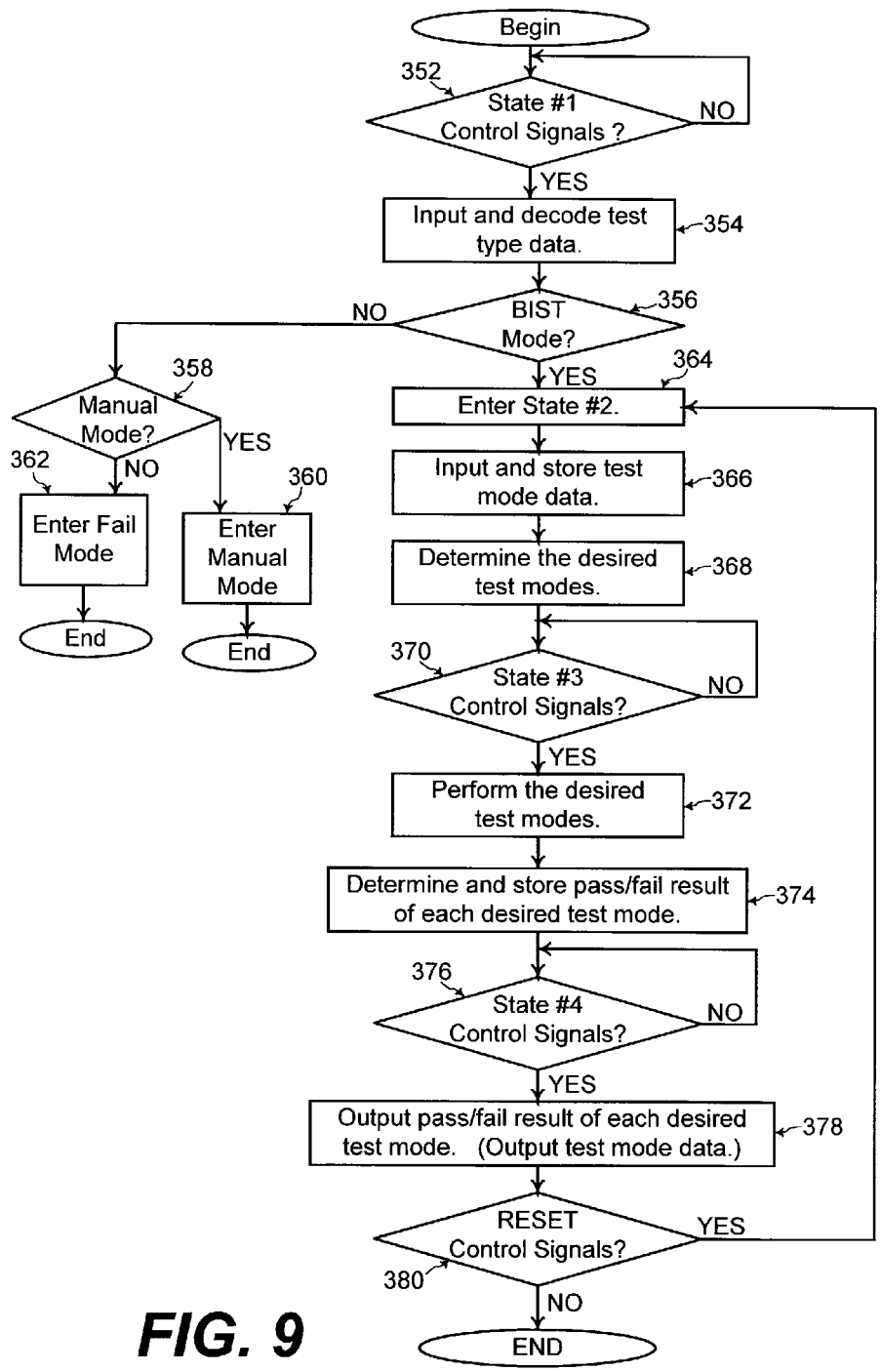
FIG. 9 shows a flow chart of the steps of operation of the BIST interface of FIG. 8 within the BIST system of FIGS. 6 and 7 for performing a plurality of flash memory test modes, according to one embodiment of the present invention.
Figure 10:
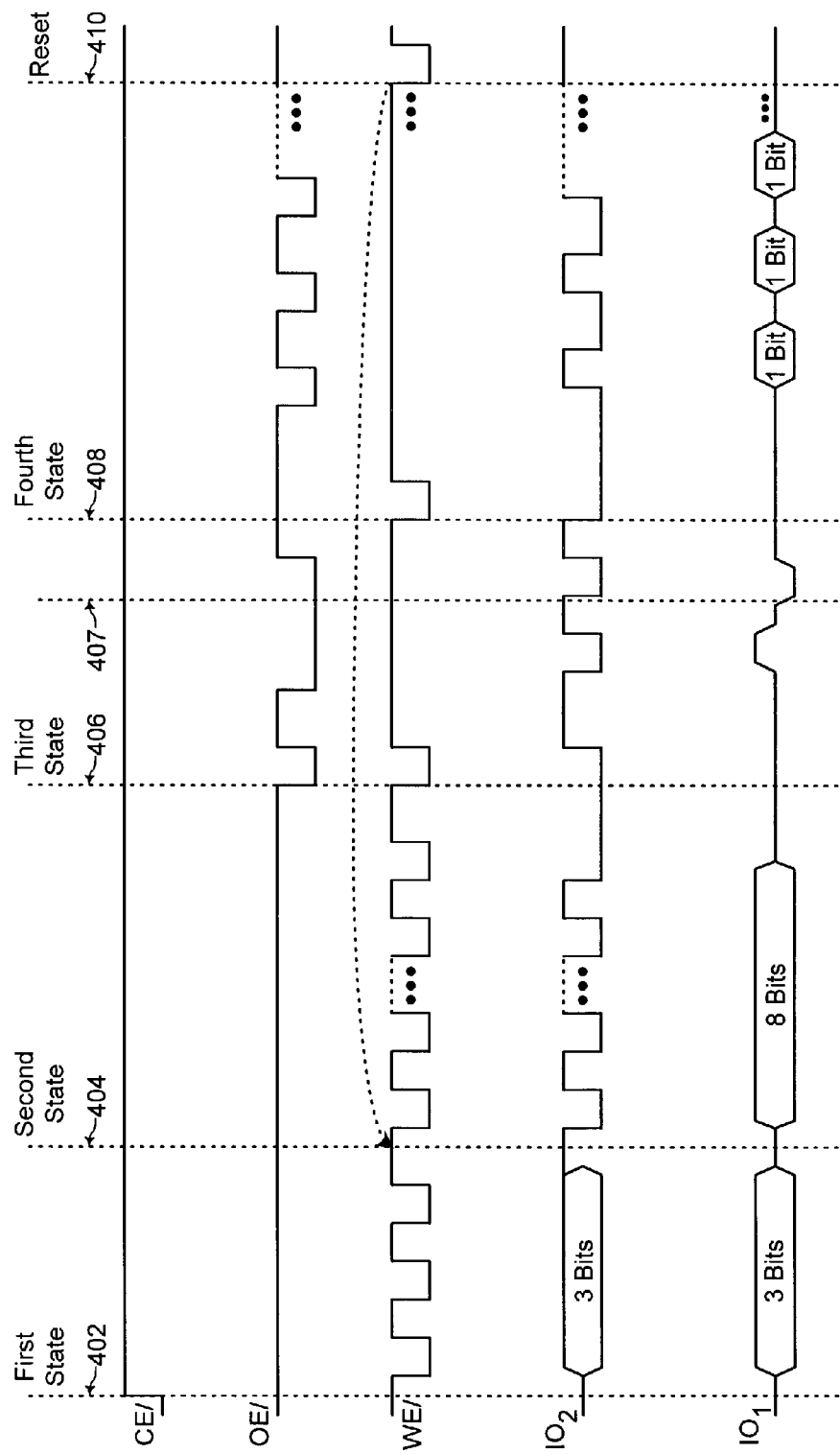
FIG. 10 shows a timing diagram of control signals from the external test system for timing occurrence of the first state, the second state, the third state, and the fourth state of the BIST interface of FIG. 8, according to one embodiment of the present invention.

FIG. 9 shows a flowchart of the steps of operation of the BIST interface 312 within the BIST system 300 during testing of the array of core flash memory cells 304. In addition, FIG. 10 shows timing diagrams of the control signals and data during testing of the array of core flash memory cells 304. Referring to FIGS. 7, 8, 9, and 10, the external test system 318 sends a first set of control signals including a CE/ (chip enable bar) signal that is set high via a CE/ (chip enable bar) control pin to the logic controller 325 of the BIST interface 312 to indicate start of a first state (step 352 of FIG. 9, and time point 402 of FIG. 10). With such a high CE/ signal, the serial shift register 320 is reset to contain a low "0" bit except for a high "1" bit at the first register 330.

In addition, with such a high CE/ signal, the logic controller 325 sets the ST1 signal high. The ST1 signal is coupled to the shift register clock 321 that is driven by a WE/(write enable bar) clock signal from the external test system 318. The shift register clock 321 generates a clock signal from the WE/ clock signal provided by the external test system 318 for driving the serial shift register 320 to shift in test type data from the external test system 318 with the WE/ clock signal.

Referring to FIGS. 8 and 9, during the first state, the test type data includes a first three data bits that are shifted into a first portion 332 including three registers of the serial shift register 320. These first three data bits are input into the first portion 332 of the serial shift register 320 via a first $IO_1$ (input/output) pin from the external test system 318 when the first buffer 322 turns on. Furthermore, the test type data includes a second three bits that are shifted into a second portion 333 including the three registers of the serial shift register 320. These second three data bits are input into the second portion 333 of the serial shift register 320 via a second $IO_2$ (input/output) pin from the external test system 318 when the second buffer 323 turns on. The first and second three bits of the test type data are shifted into the first and second portions 332 and 333 of the serial shift register 320 after three cycles of the WE/ clock signal (step 354 of FIG. 9).

The first and second portions 332 and 333 of the serial shift register 320 are coupled to the test type decoder 326. After the first and second three bits of the test type data are shifted into the first and second portions 332 and 333 of the serial shift register 320 with three cycles of the WE/ clock signal, the test type decoder 326 decodes the first and second three bits of the test type data to determine whether the external test system 318 invokes a BIST (built-in-self-test) mode or a manual mode (step 356 of FIG. 9). A respective proper combination of data bits must be entered as the first and second three bits of the test type data by the external test system 318 to invoke each of the BIST mode and the manual mode. Decoder technology for implementing such a test type decoder 326 is known to one of ordinary skill in the art of electronics.

The external test system 318 invokes a manual mode to disable the BIST system 300 such that the external test system 318 may perform the programming, erasing, and reading operations directly on the array of core flash memory cells 304 for testing the array of core flash memory cells 304, as in the prior art for example. On the other hand, the external test system 318 invokes the BIST mode to use the BIST system 300 to perform the programming, erasing, and reading operations on-chip for testing the array of core flash memory cells 304.

If a proper combination of data bits corresponding to the BIST mode is entered as the first and second three bits of the test type data by the external test system 318, then the test type decoder 326 sets the STEST flag to be high while the MTEST flag remains low. Alternatively, if another proper combination of data bits corresponding to the manual mode is entered as the first and second three bits of the test type data by the external test system 318, then the test type decoder sets the MTEST flag to be high while the STEST flag remains low. The STEST flag and the MTEST flag are sent to the logic controller 325. On the other hand, if the respective proper combination of data bits corresponding to the BIST mode or the manual mode is not entered as the first and second three bits of the test type data by the external test system 318, then the STEST flag and the MTEST flag remain low.

In addition, after the first and second three bits of the test type data are shifted into the first and second portions 332 and 333 of the serial shift register 320 with three cycles of the WE/ clock signal, the high bit that was set at the first register 330 has shifted to the fourth register 334. The content of the fourth register 334 is coupled to the lock signal generator 327. The lock signal generator 327 automatically sets the LOCK flag high when the content of the fourth register 334 turns high after the first and second three bits of the test type data are shifted into the first and second portions 332 and 333 of the serial shift register 320 with three cycles of the WE/ clock signal. At that point, the high bit from the first register 330 has shifted to the fourth register 334. The LOCK flag that is set high is also sent to the logic controller 325 to indicate that the test type decoder 326 has decoded the test type data. Furthermore, when the LOCK flag is set high, the first state ends, and the contents of the serial shift register 320 are reset low.

If the logic controller 325 determines that the external test system 318 invokes the manual mode because the MTEST flag is set high by the test type decoder (step 358 of FIG. 9), then the array of flash memory cells are not tested for a plurality of test modes using the BIST system 300. Instead, the external test system 318 tests for the plurality of test modes in accordance with a manual mode of the prior art for example (step 360 of FIG. 9).

If the logic controller 325 determines that the external test system 318 invokes neither the manual mode nor the BIST mode because both the STEST flag and MTEST flag are set low when the LOCK flag is set high (step 358 of FIG. 9), then a fail mode is entered (step 362 of FIG. 9) by the logic controller. In the fail mode, garbage data bits are stored in the serial shift register 320 such that when the external test system 318 reads such garbage data bits, the external test system 318 determines that the fail mode has occurred.

If the logic controller 325 determines that the external test system 318 invokes the BIST mode because the STEST flag is set high (step 356 of FIG. 9), then the rest of the steps of operation of the flow chart of FIG. 9 are performed. Such decoding of the data bits of the test type data for invoking the BIST mode is used to ensure that a user does not accidentally invoke the BIST mode such that the array of core flash memory cells 304 are not tested on-chip uncontrollably during use of the array of core flash memory cells 304 by a customer after manufacture of the array of core flash memory cells 304.

Referring to FIGS. 8, 9, and 10, if the logic controller 325 determines that the external test system 318 invokes the BIST mode, a second state is entered by the BIST system 300 (step 364 of FIG. 9, and time point 404 in FIG. 10). In that case, the ST2 flag from the logic controller is set high and is coupled to the shift register clock 321. After start of the second state with the ST2 flag set high, the external test system 318 provides a WE/ clock signal via the WE/ control pin and a second $IO_2$ (input/output) clock signal via the second $IO_2$ pin. With the ST2 flag set high, the shift register clock 321 generates a clock signal for driving the serial shift register 320 from a combination of the WE/ clock signal and the second $IO_2$ clock signal. For example the serial shift register 320 shifts one bit at each occurrence of the combination of the WE/ clock signal turning high and the second $IO_2$ clock signal subsequently turning low. Such a combination ensures that the serial shift register 320 does not erroneously shift one bit at an uncontrolled noise transition of the WE/ clock signal alone or the second $IO_2$ clock signal alone.

When the shift register clock 321 drives the serial shift register 320, test mode data including a series of data bits is serially shifted into a third portion 335 of the serial shift register 320. The test mode data is provided by the external test system 318 via the first $IO_1$ pin to the first register 330 when the first buffer 322 turns on. FIG. 11 shows example contents of the serial shift register 320 after the second state. In the example embodiment of FIG. 11, the first eight registers of the serial shift register 320 comprise the third portion 335 of the serial shift register 320, and the second eight registers of the serial shift register 320 comprise a fourth portion 336 of the serial shift register 320. The test mode data is serially shifted into the third portion 335 of the serial shift register 320 (step 366 of FIG. 9). The test mode data indicates a set of desired test modes chosen by the external test system 318 to be performed on the array of core flash memory cells 304 by the BIST system 300.

Each test mode corresponds to a respective pattern of biasing each flash memory cell of the array of core flash memory cells 304 for a desired pattern of programmed and erased states of the array of core flash memory cells 304. For example, the core flash memory cells are programmed and erased in an alternating checker-board pattern in the array of core flash memory cells 304 for a desired checker-board pattern of programmed and erased core flash memory cells in one test mode. Alternatively, the flash memory cells located in the diagonal of the array of core flash memory cells 304 are programmed for a desired diagonal pattern of programmed flash memory cells in another test mode. Such test modes for testing the functionality of the array of core memory cells are known to one of ordinary skill in the art of flash memory device manufacturing.

A plurality of test modes are performed on the array of core flash memory cells 304 during testing of the array of core flash memory cells 304. In one example, during testing of the array of core flash memory cells 304, approximately nineteen different test modes may be performed on the array of core flash memory cells 304. In one embodiment of the present invention, the test mode data is a code of data bits that indicate which of such test modes is chosen by the external test system 318 as the desired test modes to be performed on the array of core flash memory cells 304 by the BIST system 300.

Referring to FIG. 11, the first three bits from the first three registers indicates which set of test modes are chosen by the external test system 318. Each set corresponds to a set of five possible test modes. Each possible test mode is assigned to a respective shift register of the serial shift register 320 that is set high for choosing that test mode as a desired test mode to be performed on the array of core flash memory cells 304. For example, a digital code of "1, 0, 0" within the first three shift registers indicates that a first set of possible test modes, including a first test mode (#1), a second test mode (#2), a third test mode (#3), a fourth test mode (#4), and a fifth test mode (#5) is chosen by the external test system 318. Then, the fourth shift register is set high if the first test mode (#1) is a desired test mode to be performed on the array of core flash memory cells 304 and is set low otherwise. Similarly, the fifth shift register is set high if the second test mode (#2) is a desired test mode and is set low otherwise, the sixth shift register is set high if the third test mode (#3) is a desired test mode and is set low otherwise, the seventh shift register is set high if the fourth test mode (#4) is a desired test mode and is set low otherwise, and the eighth shift register is set high if the fifth test mode (#5) is a desired test mode and is set low otherwise.

On the other hand, the digital code of "1, 0, 1" within the first three shift registers indicates that a second set of possible test modes, including a sixth test mode (#6), a seventh test mode (#7), an eighth test mode (#8), a ninth test mode (#9), and a tenth test mode (#10) is chosen by the external test system 318. Then, the fourth shift register is set high if the sixth test mode (#6) is a desired test mode to be performed on the array of core flash memory cells 304 and is set low otherwise. Similarly, the fifth shift register is set high if the seventh test mode (#7) is a desired test mode and is set low otherwise, the sixth shift register is set high if the eighth test mode (#8) is a desired test mode and is set low otherwise, the seventh shift register is set high if the ninth test mode (#9) is a desired test mode and is set low otherwise, and the eighth shift register is set high if the tenth test mode (#10) is a desired test mode and is set low otherwise.

Alternatively, the digital code of "1, 1, 0" within the first three shift registers indicates that a third set of possible test modes, including an eleventh test mode (#11), a twelfth test mode (#12), a thirteenth test mode (#13), a fourteenth test mode (#14), and a fifteenth test mode (#15) is chosen by the external test system 318. Then, the fourth shift register is set high if the eleventh test mode (#11) is a desired test mode to be performed on the array of core flash memory cells 304 and is set low otherwise. Similarly, the fifth shift register is set high if the twelfth test mode (#12) is a desired test mode and is set low otherwise, the sixth shift register is set high if the thirteenth test mode (#13) is a desired test mode and is set low otherwise, the seventh shift register is set high if the fourteenth test mode (#14) is a desired test mode and is set low otherwise, and the eighth shift register is set high if the fifteenth test mode (#15) is a desired test mode and is set low otherwise.

In this manner, the test mode data as stored in the third portion 335 of the serial shift register 320 indicates a set of desired test modes to be performed on the array of core flash memory cells 304. Referring to FIGS. 7 and 8, the third portion 335 of the serial shift register 320 is coupled to the front-end interface 314 that decodes the data bits within the third portion 335 of the serial shift register 320 to determine which test modes are desired to be performed by the back-end BIST state machine 316. In addition, the front-end interface dictates the order of performing the desired test modes (step 368 of FIG. 9). The front-end interface 314 sends a respective identification of a current test mode to be performed by the back-end BIST state machine 316 from decoding the test mode data. The front-end interface 314 cycles through each of the desired test modes as the current test mode until all of the desired test modes are performed by the back-end BIST state machine 316.

After the external test system 318 sends the eight bits of the test mode data to be stored in the third portion 335 of the serial shift register 320, the external test system 318 sends a third set of control signals to the logic controller 325 indicating the start of the third state (step 370 of FIG. 9, and time point 406 in FIG. 10) including an OE/ (output enable bar) signal that is set low via an OE/ control pin, the WE/ control signal that is set low via the WE/ control pin, and the second IO₂ pin that is set low as a control signal. The logic controller 325 set the ST3 flag high to indicate start of the third state. The ST3 flag is coupled to the shift register clock 321 that does not provide a clock signal to the serial shift register 320 such that the data within the serial shift register 320 is not shifted during the third state.

During the third state, the back-end BIST state machine 316 performs each of the desired test modes as indicated by the test mode data in the order as determined by the front-end state machine 314 (step 372 of FIG. 9). The logic controller 325 sets the BSTART flag high to control the back-end BIST state machine 316 to start performing the desired test modes as determined by the front-end interface 314. The front-end interface 314 sends a respective identification of a current test mode to be performed by the back-end BIST state machine 316. The front-end interface 314 and the back-end BIST state machine 316 cycle through each of the desired test modes as the current test mode until all of the desired test modes are performed by the back-end BIST state machine 316 during the third state.

In one example embodiment, the front-end interface 314 is a decoder that is hardwired to the first eight registers comprising the third portion 335 of the serial shift register 320. In addition, the front-end interface 314 is coupled to the back-end BIST state machine 316 with fifteen test mode flags. Each test mode flag corresponds to a respective one of the fifteen test modes. In that case, the front-end interface decodes the eight data bits of the third portion 335 of the serial shift register 320 and sets one of the fifteen test mode flags high corresponding to the current test mode to be performed by the back-end BIST state machine 316. Decoder technology for implementing such a front-end interface 314 is known to one of ordinary skill in the art of electronics.

Referring to FIGS. 7, 8, and 11, the front-end interface cycles through any of the test modes chosen when the data bit within any of the fourth, fifth, sixth, seventh, or eighth registers of the serial shift register 320 is set high. In addition, the front-end interface provides a value of BSTAT that indicates which of such five test modes is the current test mode. For example, for any set of test modes, if the test mode corresponding to the fourth register is the current test mode, then the BSTAT value is "1". If the test mode corresponding to the fifth register is the current test mode, then the BSTAT value is "2". If the test mode corresponding to the sixth register is the current test mode, then the BSTAT value is "3". If the test mode corresponding to the seventh register is the current test mode, then the BSTAT value is "4". If the test mode corresponding to the eighth register is the current test mode, then the BSTAT value is "5". Such BSTAT value may be indicated in binary form with three data bits from the front-end interface 314.

When the front-end interface 314 sends a respective identification of a current test mode to be performed by the back-end BIST state machine 316, the back-end BIST state machine 316 applies appropriate programming or erasing voltages on each flash memory cell of the array of core flash memory cells 304 according to the respective pattern of biasing the array of core flash memory cells 304 for the current test mode. In addition, the back-end state machine measures a pattern of programmed and erased states for the array of core flash memory cells after the back-end BIST state machine 316 applies the appropriate voltages on the array of core flash memory cells for the current test mode. Furthermore, the back-end BIST state machine 316 determines whether the current test mode resulted in a pass or fail by comparing the measured pattern of programmed and erased states with the desired pattern of programmed and erased states of the array of core flash memory cells, for the current test mode (step 374 of FIG. 9).

The pass or fail result from the back-end BIST state machine 316 is stored in a fourth portion 336 of the serial shift register 320 during the third state (step 374 of FIG. 9). Referring to FIGS. 7, 8, and 11, the respective pass or fail result corresponding to each test mode is stored in a respective register of the fourth portion 336 of the serial shift register 320. Referring to FIG. 11 for example, when a digital code of "1, 0, 0" within the first three shift registers indicates that the first set of possible test modes are selected, the respective pass or fail result corresponding the first test mode (#1) is stored within the sixteenth shift register. Similarly, the respective pass or fail result corresponding the second test mode (#2) is stored within the fifteenth shift register, the respective pass or fail result corresponding the third test mode (#3) is stored within the fourteenth shift register, the respective pass or fail result corresponding the fourth test mode (#4) is stored within the thirteenth shift register, and the respective pass or fail result corresponding the fifth test mode (#5) is stored within the twelfth shift register.

On the other hand, when a digital code of "1, 0, 1" within the first three shift registers indicates that the second set of possible test modes are selected, the respective pass or fail result corresponding the sixth test mode (#6) is stored within the sixteenth shift register. Similarly, the respective pass or fail result corresponding the seventh test mode (#7) is stored within the fifteenth shift register, the respective pass or fail result corresponding the eighth test mode (#8) is stored within the fourteenth shift register, the respective pass or fail result corresponding the ninth test mode (#9) is stored within the thirteenth shift register, and the respective pass or fail result corresponding the tenth test mode (#10) is stored within the twelfth shift register.

Alternatively, when a digital code of "1, 1, 0" within the first three shift registers indicates that the third set of possible test modes are selected, the respective pass or fail result corresponding the eleventh test mode (#11) is stored within the sixteenth shift register. Similarly, the respective pass or fail result corresponding the twelfth test mode (#12) is stored within the fifteenth shift register, the respective pass or fail result corresponding the thirteenth test mode (#13) is stored within the fourteenth shift register, the respective pass or fail result corresponding the fourteenth test mode (#14) is stored within the thirteenth shift register, and the respective pass or fail result corresponding the fifteenth test mode (#15) is stored within the twelfth shift register.

The back-end BIST state machine 316 determines whether the current test mode resulted in a pass or fail by comparing the measured pattern of programmed and erased states with the desired pattern of programmed and erased states of the array of core flash memory cells, for the current test mode (step 374 of FIG. 9). If the measured pattern of programmed and erased states is substantially same as the desired pattern of programmed and erased states of the array of core flash memory cells, then a pass result is assigned to the current test mode. Otherwise, a fail result is assigned to the current test mode.

Such a pass or fail result is sent from the back-end BIST state machine 316 to the memory location decoder 328 of FIG. 8. The BSTAT value indicating which test mode is the current mode is also sent to the memory location decoder 328 from the front-end interface 314. The memory location decoder decodes the BSTAT value and stores the respective pass or fail result of the current test mode within the appropriate one register of the twelfth, thirteenth, fourteenth, fifteenth, or sixteenth registers comprising the fourth portion 336 of the serial shift register 320 corresponding to that current test mode.

In one embodiment of the present invention, each of the twelfth, thirteenth, fourteenth, fifteenth, or sixteenth registers comprising the fourth portion 336 of the serial shift register 320 is reset to be low "0" before the second state. Then, if a current test mode has a pass result, then the memory location decoder 328 sets a high "1" within the one register of the twelfth, thirteenth, fourteenth, fifteenth, or sixteenth registers comprising the fourth portion 336 of the serial shift register 320 corresponding to that current test mode. On the other hand, the register corresponding to the current test mode remains set low "0" if the current test mode has a fail result. Decoder technology for implementing such a memory location decoder 328 is known to one of ordinary skill in the art of electronics.

When the front-end interface 314 and the back-end BIST state machine 316 have cycled through all of the desired test modes as indicated by the test mode data in the third portion 335 of the serial shift register 320, the back-end BIST state machine 316 sets a BBUSY flag to be low from being high to indicate the end of the third state (time point 407 of FIG. 10). During the third state, the external test system 318 polls the BIST interface via the second $IO_2$ pin, and the BBUSY flag from the back-end BIST state machine 316 is passed to the external text system 318 via the first $IO_1$ pin as the result of such polling. In that case, the second $IO_2$ pin is used as a control enable pin, and the first $IO_1$ pin is used as an output pin for the BBUSY flag during the third state.

In this manner, when the BBUSY flag is set to be low from being high to indicate the end of the third state by the back-end BIST state machine 316, the external test system 318 is notified that the back-end BIST state machine 316 has completed performance of each of the desired test modes. The external test system 318 then sends a fourth set of control signals including the WE/ control signal set to be low and the second 102 pin set to be low as a control signal to indicate to the logic controller 325 the start of the fourth state (step 376 of FIG. 9 and time point 408 of FIG. 10). In that case, the logic controller 325 sets the ST4 flag to be high. During this fourth state, the respective pass or fail result as stored in the fourth portion 336 of the shift register 320 for each of the desired test modes is output to the external test system 318 (step 378 in FIG. 9).

During the fourth state, the external test system 318 provides a second $IO_2$ clock signal via the second $IO_2$ pin and an OE/ clock signal via the OE/ control pin. When the shift register clock 321 receives the ST4 flag that is high from the logic controller 325, the shift register clock 321 drives the serial shift register 320 with a clock signal generated from a combination of the second $IO_2$ clock signal and the OE/ clock signal. For example the serial shift register 320 shifts one bit at each occurrence of the combination of the OE/clock signal turning low and the second $IO_2$ clock signal subsequently turning high. Such a combination ensures that the serial shift register 320 does not erroneously shift one bit at an uncontrolled noise transition of the OE/ clock signal alone or the second $IO_2$ clock signal alone. When the serial shift register 320 is driven with such a clock signal, the content of the serial shift register 320 is shifted out to the external test system 318. The third buffer 338 is turned on such that the content of the last shift register 337 is output via the first $IO_1$ pin during shifting of the content of the serial shift register 320 to the external test system 318.

The respective pass or fail result for each desired test mode is stored at a respective location within the fourth portion 336 of the serial shift register 320. Thus, the external test system 318 determines which of the desired test modes has a pass result and which of the desired test modes has a fail result from the respective location of each of the pass or fail results as stored in the fourth portion 336 of the serial shift register 320. The flash memory device 304 may then be sorted from such pass or fail results. For example, the semiconductor die 302 having the flash memory device 304 may be marked to be scrapped if any of the desired test modes has a fail result.

In another embodiment of the present invention, the eight bits of the test mode data stored in the third portion 335 of the serial shift register 320 is also shifted out to the external test system 318 through the buffer 338 and via the first $IO_1$ pin during the fourth state (step 378 in FIG. 9). In this embodiment, the external test system 318 determines whether the eight bits of test mode data were properly transferred from the external test system 318 to the third portion 335 of the serial shift register 320 during the second state by determining whether the eight bits of test mode data shifted out from the third portion 335 of the serial shift register 320 have a proper bit pattern.

In any case, when all of the pass or fail results from the fourth portion 336 of the serial shift register 320 are output to the external test system 318, the fourth state terminates. At this point, the external test system 318 may send a reset control signal to the logic controller 325 (step 380 of FIG. 9) including the WE/ control signal that is set low while the OE/ control signals is set high and the second $IO_2$ pin is set high as a control signal.

If the external test system 318 does send the reset control signal to the logic controller 325, then the BIST interface 312 returns to enter the second state (step 364 of FIG. 9) to repeat the second state, the third state, and the fourth state for performing a second set of desired test modes. Referring to FIG. 11 for example, after performance of the first set of desired test modes when the digital code of "1, 0, 0" was within the first three shift registers of the serial shift register 320, the second state may be performed again with the external test system 318 entering a digital code of "1, 0, 1" into the first three shift registers of the serial shift register 320 to indicate the second set of desired test modes. In that case, the second state, the third state, and the fourth state are repeated for this second set of desired test modes until the respective pass or fail result for the second set of desired test modes is output to the external test system 318.

In this manner, the second state, the third state, and the fourth state may be repeated for a different set of desired test modes when the external test system 318 sends the reset control signal to the logic controller 325 after the fourth state for each set of desired test modes such that a plurality of sets of test modes may be performed by the BIST system 300. On the other hand, when the reset control signals are not asserted by the external test system 318 at the end of any fourth state, the BIST mode is terminated.

By performing the programming, erasing, and reading operations on the core flash memory cells on-chip within each semiconductor die, a minimized number of pins of the external test system 318 are used for testing each semiconductor die. For example, in the embodiment of the present invention as described herein, two IO pins are used for inputting the test type data and the test mode data into the serial shift register 320 from the external test system 318, and for outputting the pass or fail results from the serial shift register 320 to the external test system 318. In addition, three pins are used for the CE/, WE/, and OE/control signals, and two pins are used for the power supply source, from the external test system 318.

Figure 4:
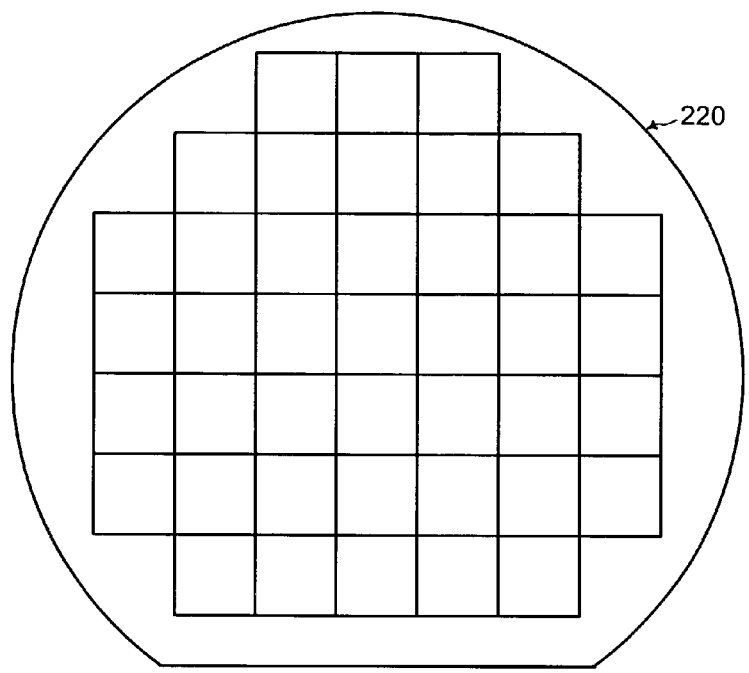
FIG. 4 shows a semiconductor wafer having a plurality of semiconductor dies with each semiconductor die having a respective array of flash memory cells fabricated thereon.
Figure 5:
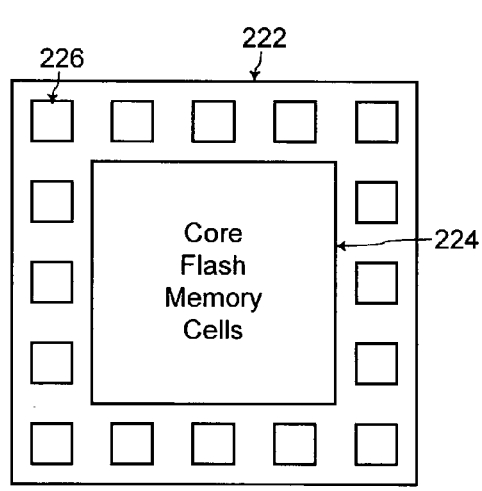
FIG. 5 shows an example semiconductor die with an array of core flash memory cells fabricated thereon and with contact pads used when the external test system performs the programming, erasing, and reading operations directly on the array of core flash memory cells for testing the array of core flash memory cells, according to the prior art.

Thus, the number of pins dedicated for testing each semiconductor die is reduced from 46 in the prior art to about 7 in one embodiment of the present invention such that the number of semiconductor die that may be concurrently tested by the external test system 318 is increased by about 7 times. Referring to FIGS. 4 and 6, each semiconductor die of the semiconductor wafer 220 has a respective BIST system 300 fabricated on the semiconductor die along with the respective array of core flash memory cells 304. Referring to FIGS. 4, 6, 7, and 8, a respective set of seven pins of the external test system 318 is coupled to the respective BIST system 300 of each of a plurality of semiconductor dies of the semiconductor wafer 220.

Referring to FIGS. 9 and 10, the steps of the flow chart of FIG. 9, including the first state, the second state, the third state, and the fourth state, are concurrently performed at each of the plurality of semiconductor dies of the semiconductor wafer 220. Because the number of pins dedicated for testing each semiconductor die is reduced in the present invention, the number of semiconductor die that may be concurrently tested by the external test system 318 having a limited total number of pins is increased to maximize throughput during manufacture of flash memory devices.

Figure 12:
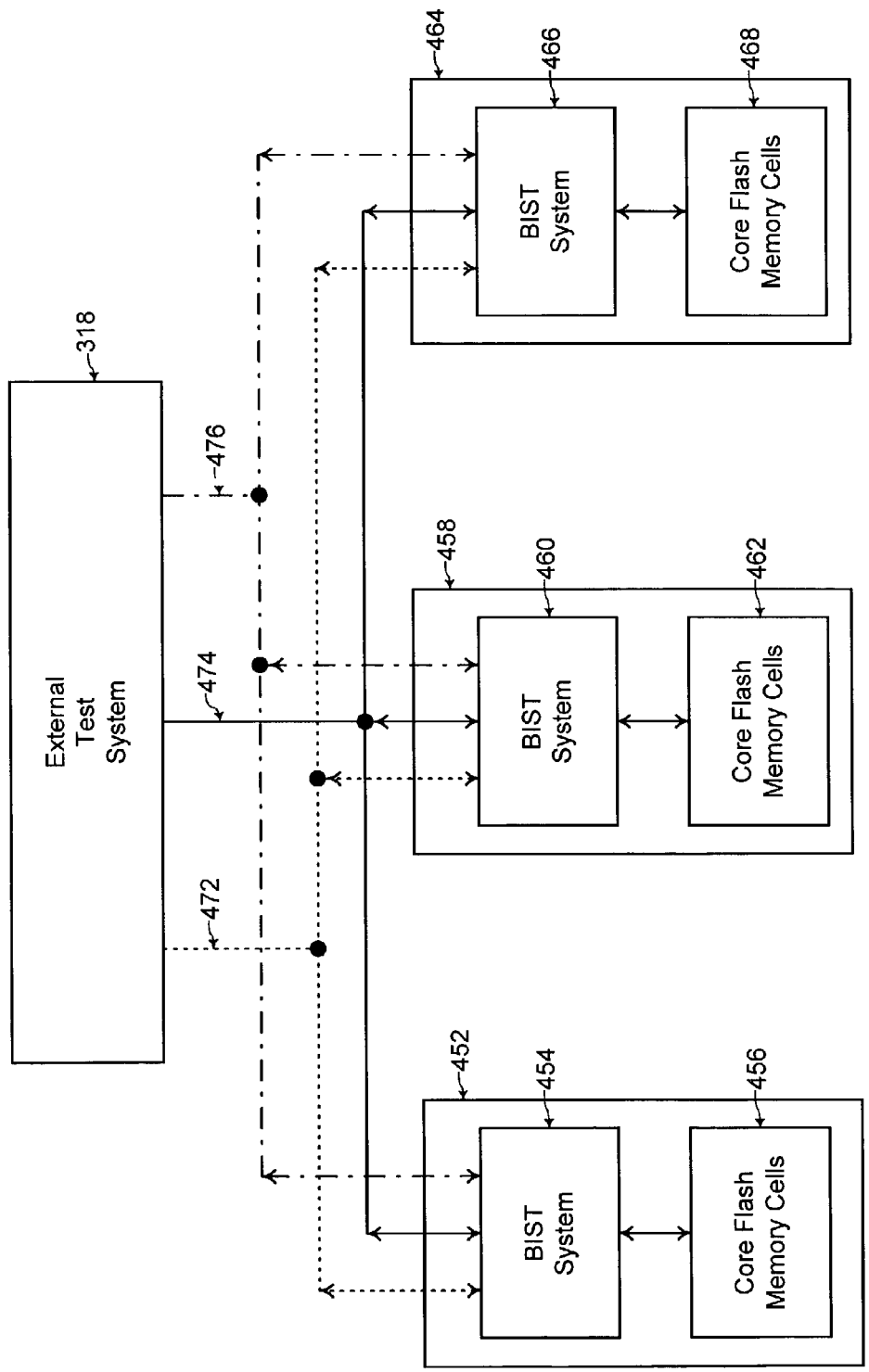
FIG. 12 shows pins from the external test system being shared by a plurality of semiconductor dies for further maximizing throughput during on-chip testing of the respective core flash memory cells of the plurality of semiconductor dies, according to another embodiment of the present invention.

Referring to FIG. 12, in another embodiment of the present invention, pins from the external test system 318 are shared by a plurality of semiconductor dies. FIG. 12 shows a first semiconductor die 452 with a first respective BIST system 454 and a first respective array of core flash memory cells 456, a second semiconductor die 458 with a second respective BIST system 460 and a second respective array of core flash memory cells 462, and a third semiconductor die 464 with a third respective BIST system 466 and a third respective array of core flash memory cells 468.

The BIST systems 454, 458, and 464 are similar in structure and function to the BIST system 300 as described, herein for on-chip testing of the respective array of core flash memory cells 456, 462, and 468. The first, second, and third semiconductor dies 452, 458, and 464 are disposed on a same semiconductor wafer in one embodiment of the present invention. A first pin 472, a second pin 474, and a third pin 476 from the external test system 318 are coupled to and shared by each of the BIST systems 454, 458, and 464 of the first, second, and third semiconductor dies 452, 458, and 464. Each of such shared pins may be bi-directional for providing signals in both directions to and from the external test system 318 from and to the BIST systems 454, 458, and 464 or may be unidirectional for providing signals in one direction to or from the external test system 318 from or to the BIST systems 454, 458, and 464.

In one example, the first pin 472, the second pin 474, and a third pin 476 from the external test system 318 may be the CE/ control pin for providing the CE/ control signal, the WE/ control pin for providing the WE/ control signal, and the OE/ control pin for providing the OE/ control signal. In that case, the first, second, and third semiconductor dies 452, 458, and 464 share the control pins from the external test system 318. However, the first, second, and third semiconductor dies 452, 458, and 464 may have respective pins for the respective first $IO_1$ and second $IO_2$ pins that are a separate set of pins from the external test system 318.

In that example, the first, second, and third semiconductor dies 452, 458, and 464 are tested concurrently with simultaneous CE/, WE/, and OE/ control signals on the shared control pins 472, 474, and 476 and with the external test system 318 outputting or inputting data to and from the first, second, and third semiconductor dies 452, 458, and 464 with separates respective pins for the respective first $IO_1$ and second $IO_2$ pins for each of the first, second, and third semiconductor dies 452, 458, and 464.

In another example, a plurality of semiconductor dies such as the first, second, and third semiconductor dies 452, 458, and 464 are coupled to and share common first $IO_1$ and second $IO_2$ pins from the external test system 318. In that case, each of the semiconductor dies 452, 458, and 464 may have respective pins for the respective CE/, WE/, and OE/control pins that are a separate set of pins from the external test system 318.

In that example, the first, second, and third semiconductor dies 452, 458, and 464 are tested in sequence with the external test system 318 outputting or inputting data to and from the first, second, and third semiconductor dies 452, 458, and 464 in sequence through the shared first $IO_1$ and second $IO_2$ pins for the first, second, and third semiconductor dies 452, 458, and 464. The timing for testing each of the first, second, and third semiconductor dies 452, 458, and 464 in sequence may be controlled with the separate CE/, WE/, and OE/control signals on the separate respective CE/, WE/, and OE/ control pins for each of the first, second, and third semiconductor dies 452, 458, and 464.

With such sharing of pins from the external test system 318, the number of control and input/output signals required from the external test system 318 for testing the respective array of core flash memory cells of each of the semiconductor die may be significantly reduced. Thus, a more cost effective external test system for the BIST (built-in-self-test) may result with maximized throughput during manufacture of flash memory devices.

The foregoing is by way of example only and is not intended to be limiting. For example, the present invention may be practiced for a larger number of test modes and a larger number of data bits in the serial shift register 320 of FIG. 8. Any numbers described or illustrated herein are by way of example only. The present invention is limited only as defined in the following claims and equivalents thereof.

C. Back-End BIST(Built-in-Self-Test) State Machine

Figure 13:
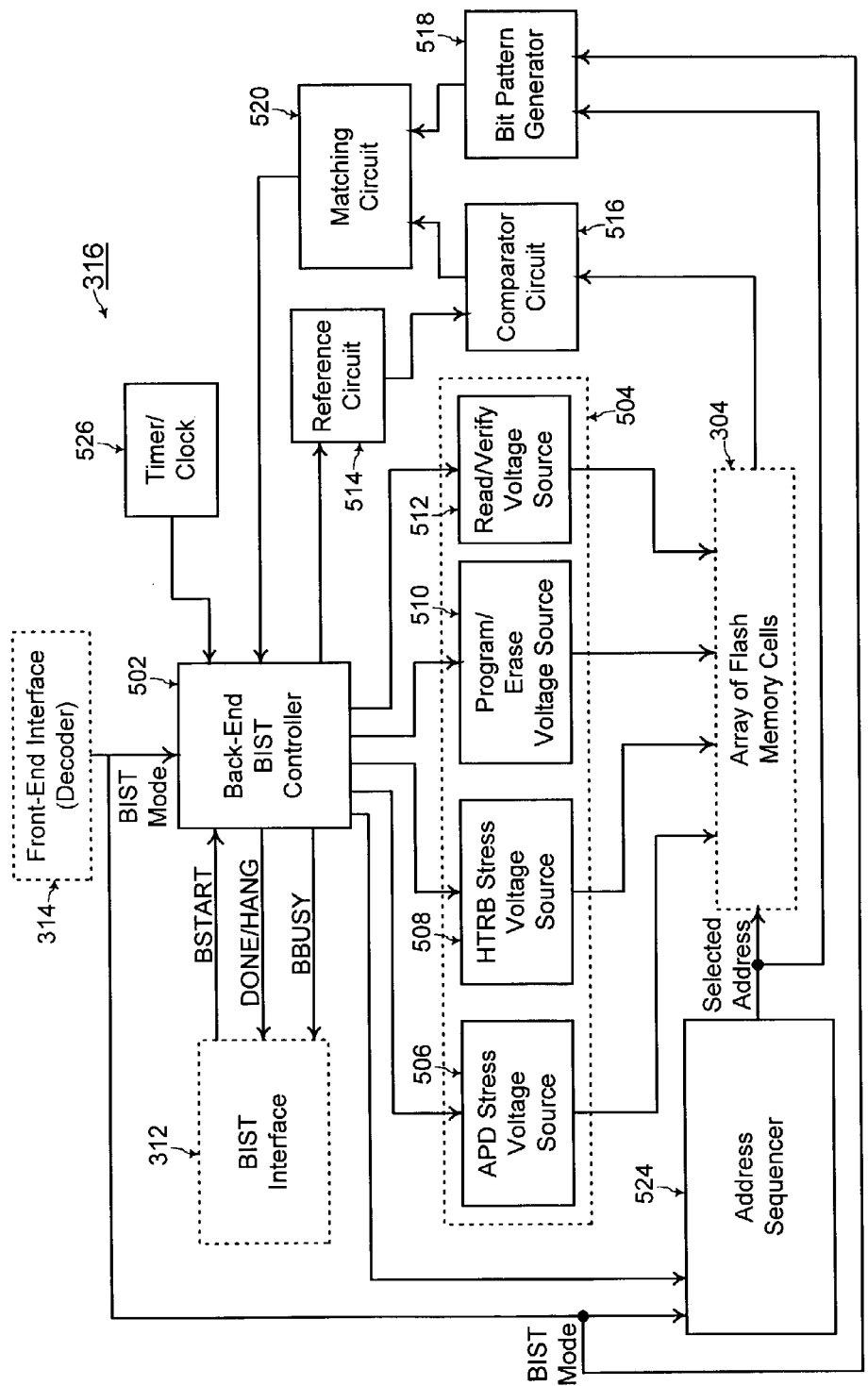
FIG. 13 shows a block diagram of the components of the back-end BIST state machine of FIG. 7, according to one embodiment of the present invention.

FIG. 13 shows the block diagram of the back-end BIST state machine 316 of the BIST system 300 of FIG. 7. In FIG. 13, the array of core flash memory cells 304, the front-end interface 314, and the BIST interface 312 are outlined in dashed lines since the array of core flash memory cells 304, the front-end interface 314, and the BIST interface 312 are not part of the back-end BIST state machine 316. The back-end BIST state machine 316 includes a back-end BIST controller 502 coupled to the front-end interface 314 and the BIST interface 312 of the BIST system 300. Referring to FIGS. 6 and 13, the BIST controller 502 is fabricated on-chip on the semiconductor die 302 having the array of core flash memory cells 304 fabricated thereon.

The front-end interface 314 sends to the BIST controller 502 a respective identification corresponding to a current BIST mode to be performed by the back-end BIST state machine 316. The BIST interface 312 sends a BSTART signal to the BIST controller 502 to indicate start of performance of a set of BIST modes by the back-end BIST state machine 316.

In addition, the BIST controller 502 sends a respective DONE or HANG signal for each BIST mode after performance of each BIST mode. The BIST controller 502 sends a DONE signal after successful performance of a current BIST mode or if the array of core flash memory cells passes the current BIST mode. Alternatively, the BIST controller 502 sends a HANG signal if the current BIST mode could not be completed successfully or if the array of core flash memory cells fails the current BIST mode. The BIST controller 502 is a data processor such as a PLD (programmable logic device), and such data processor devices for implementing the BIST controller are known to one of ordinary skill in the art of electronics.

The back-end BIST state machine 316 further includes a plurality of voltage sources 504 (shown within dashed lines in FIG. 13). The plurality of voltage sources includes an APD stress voltage source 506, a HTRB stress voltage source 508, a program/erase voltage source 510, and a read/verify voltage source 512 that provide voltages to be applied on the array of core flash memory cells 304. The plurality of voltage sources 506, 508, 510, and 512 are coupled between the array of core flash memory cells 304 and the BIST controller 502. The BIST controller 502 controls the plurality of voltage sources 506, 508, 510, and 512 to apply appropriate voltages on the array of core flash memory cells 304 for each BIST mode. Referring to FIGS. 6 and 13, the plurality of voltage sources 506, 508, 510, and 512 are fabricated on-chip on the semiconductor die 302 having the array of core flash memory cells 304 fabricated thereon. Voltage sources for generating voltages are known to one of ordinary skill in the art of electronics. In addition, mechanisms for controlling application of chosen voltages on selected flash memory cells of an address of the array of core flash memory cells 304 are known to one of ordinary skill in the art of flash memory devices.

The back-end BIST state machine 316 also includes a reference circuit 514 and a comparator circuit 516. The reference circuit 514 generates reference currents or voltages, and the comparator circuit 516 compares a current or a voltage of a flash memory cell of the array of core flash memory cells 304 to generate a respective logical high or low state corresponding to that flash memory cell during a read or verify operation of the flash memory cell. Referring to FIGS. 6 and 13, the reference circuit 514 and the comparator circuit 516 are fabricated on-chip on the semiconductor die 302 having the array of core flash memory cells 304 fabricated thereon. Such reference circuits and comparator circuits used during a read or verify operation of a flash memory cell are known to one of ordinary skill in the art of electronics.

During a read or verify operation of the flash memory cells 304, a respective logical high or low state is generated for each of a predetermined number of flash memory cells comprising an address to form a measured bit pattern by the comparator 516. A bit pattern generator 518 generates a desired bit pattern corresponding to that address of flash memory cells. The address sequencer 524 coupled to the bit pattern generator 518 indicates the current address of flash memory cells to the bit pattern generator 518. An example implementation of the bit pattern generator 518 is described herein at section "G" entitled "Pattern Generator in BIST (Built-In-Self-Test) System". Referring to FIGS. 6 and 13, the bit pattern generator 518 is fabricated on-chip on the semiconductor die 302 having the array of core flash memory cells 304 fabricated thereon.

A matching circuit 520 compares the measured bit pattern from the comparator circuit 516 with the desired bit pattern from the bit pattern generator 518 to determine whether the measured bit pattern is same as the desired bit pattern. The result of such a comparison is sent from the matching circuit 520 to the BIST controller 502. Implementation of such a matching circuit is known to one of ordinary skill in the art of electronics. Referring to FIGS. 6 and 13, the matching circuit 520 is fabricated on-chip on the semiconductor die 302 having the array of core flash memory cells 304 fabricated thereon.

Furthermore, the back-end BIST state machine 316 further includes an address sequencer 524 such that the current BIST mode is performed through each address of the array of flash memory cells 304. An example implementation of the address sequencer 524 of the back-end BIST state machine 316 is described at section "F" entitled "Address Sequencer within BIST (Built-In-Self-Test) System". Referring to FIGS. 6 and 13, the address sequencer 524 is fabricated on-chip on the semiconductor die 302 having the array of core flash memory cells 304 fabricated thereon.

A timer or clock 526 is coupled to the BIST controller 502 such that the BIST controller 502 times the duration of steps during performance of the BIST modes. Implementation for timers and clocks are known to one of ordinary skill in the art of electronics. Referring to FIGS. 6 and 13, the timer or clock 526 is fabricated on-chip on the semiconductor die 302 having the array of core flash memory cells 304 fabricated thereon.

Figure 14:
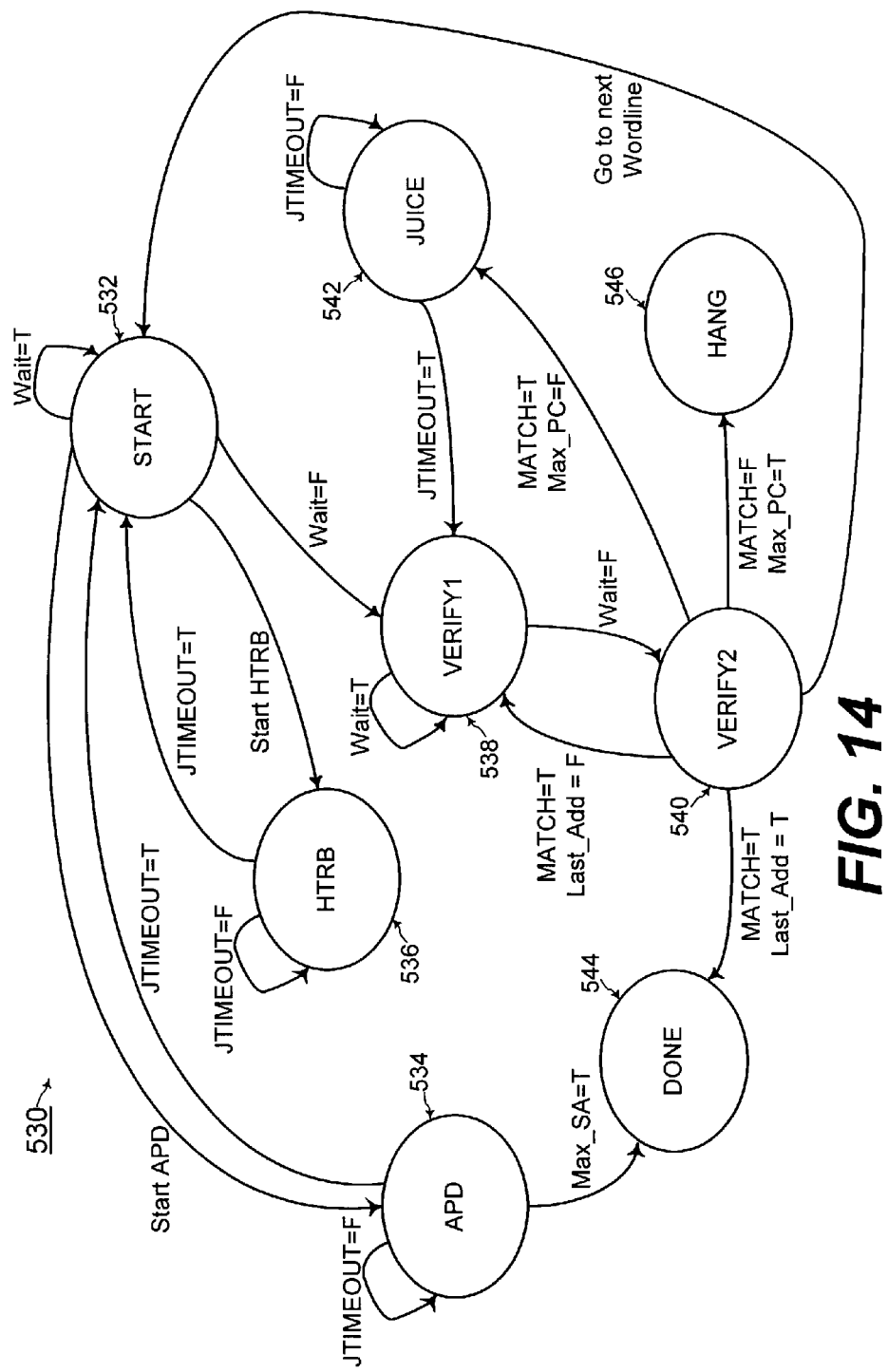
FIG. 14 shows the relatively small number of states of the back-end BIST state machine of FIG. 13 including the START, JUICE, VERIFY1, VERIFY2, APD, HTRB, DONE, and HANG states for performing each of the BIST modes, according to one embodiment of the present invention.

FIG. 14 shows a state machine diagram 530 having a relatively small number of states during operation of the back-end BIST state machine 316 of FIG. 13 for performing each of the BIST modes for testing the array of core flash memory cells 304. The state machine diagram includes a START state 532, an APD (Auto Program Disturb) state 534, an HTRB (High Temperature Retention Bake) state 536, a VERIFY1 state 538, a VERIFY2 state 540, a JUICE state 542, a DONE state 544, and a HANG state 546. The back-end BIST state machine 316 enters a respective set of these finite number of states 532, 534, 536, 538, 540, 542, 544, and 546 for performing each BIST mode for testing the array of core flash memory cells 304.

Performance of some example BIST modes for testing the array of core flash memory cells 304 by the back-end BIST state machine 316 with reference to the state machine diagram 530 of FIG. 14 is now described. Referring to FIG. 7, for indicating a start of performance of a set of BIST modes by the back-end BIST state machine 316, the BIST interface 312 sends a BSTART signal to the back-end BIST state machine 316.

In addition, the front-end interface 314 sends a respective identification for a current BIST mode of the set of BIST modes to be currently performed by the back-end BIST state machine 316. The front-end interface 314 cycles through each BIST mode of the set of BIST modes as the current BIST mode until each BIST mode of the set of the BIST modes have been performed by the back-end BIST state machine 316. When each BIST mode of the set of the BIST modes has been performed by the back-end BIST state machine 316, a BBUSY signal from the back-end BIST state machine 316 is no longer asserted to indicate to the BIST interface 312 completion of the set of BIST modes by the back-end BIST state machine 316. Before then, the BBUSY signal is asserted to the BIST interface 312 by the BIST state machine 316 to indicate that the set of BIST modes is not yet completed.

Generally a BIST mode includes at least one of applying voltages on each flash memory cell of the array of core flash memory cells 304 and of reading a respective logical state of each flash memory cell of the array of core flash memory cells 304. When the BIST mode includes applying programming or erasing voltages on each flash memory cell of the array of core flash memory cells 304, the BIST mode may also include verifying the programmed or erased state of each flash memory cell of the array of core flash memory cells 304.

Examples of BIST modes for applying voltages on each flash memory cell of the array of core flash memory cells 304 include a BIST mode for applying programming voltages on each flash memory cell such that a logical low state is programmed for each flash memory cell of the array of core flash memory cells 304, or for applying erasing voltages on each flash memory cell such that a logical high state is programmed for each flash memory cell of the array of core flash memory cells 304. Alternatively, programming voltages and erasing voltages are applied alternatingly on each flash memory cell for a checker-board pattern of logical low and high states for the array of core flash memory cells 304.

Figure 15:
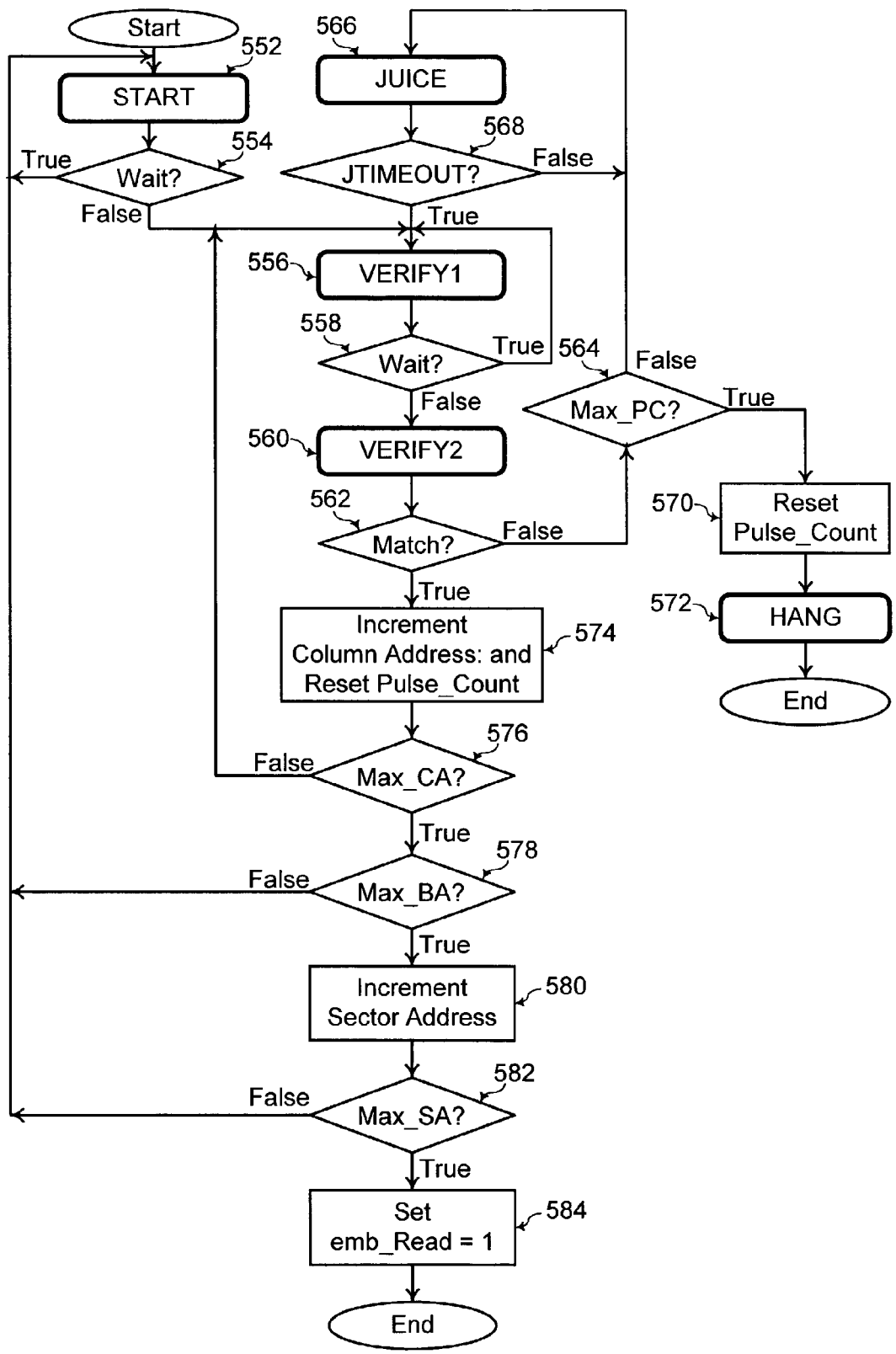
FIG. 15 shows a flow chart of the steps of operation of the back-end BIST state machine of FIG. 13 when a current BIST mode is for applying programming and/or erasing voltages on the core flash memory cells, according to one embodiment of the present invention.

FIG. 15 shows a flow chart for an example BIST mode for applying programming or erasing voltages on each flash memory cell of the array of core flash memory cells 304 with verifying the programmed or erased state of each flash memory cell of the array of core flash memory cells 304. Referring to FIGS. 13, 14, and 15, the BIST controller 502 receives the respective identification of a current BIST mode to be currently performed for applying voltages on each flash memory cell of the array of core flash memory cells 304. At the start of such a BIST mode, the BIST controller 502 enters the START state 532 of FIG. 14 (step 552 in FIG. 15). During the START state, the timer 526 times a predetermined wait time period before starting the current BIST mode to reset the regulation capacitors within the voltage sources 504 that provide the voltage applied on the word-lines of the flash memory cells during the START state (step 554 in FIG. 15). Resetting the regulation capacitors within the voltage sources 504 that provide the voltage applied on the word-lines of the flash memory cells is known to one of ordinary skill in the art of flash memory devices. Before expiration of the wait time period (Wait=True), the back-end BIST state machine 316 remains within the START state.

After expiration of the wait time period (Wait=False) within the START state, the back-end BIST state machine 316 enters the VERIFY1 state 538 of FIG. 14 (step 556 of FIG. 15). During the VERIFY1 state, the timer 526 times a predetermined wait time period before voltages from the plurality of voltage sources 504 are applied on an address of flash memory cells for the VERIFY2 state such that the voltage levels from the plurality of voltage sources 504 are stabilized before the VERIFY2 state (step 558 in FIG. 15). Before expiration of the wait time period (Wait=True) within the VERIFY1 state, the back-end BIST state machine 316 remains within the VERIFY1 state.

Figure 16:
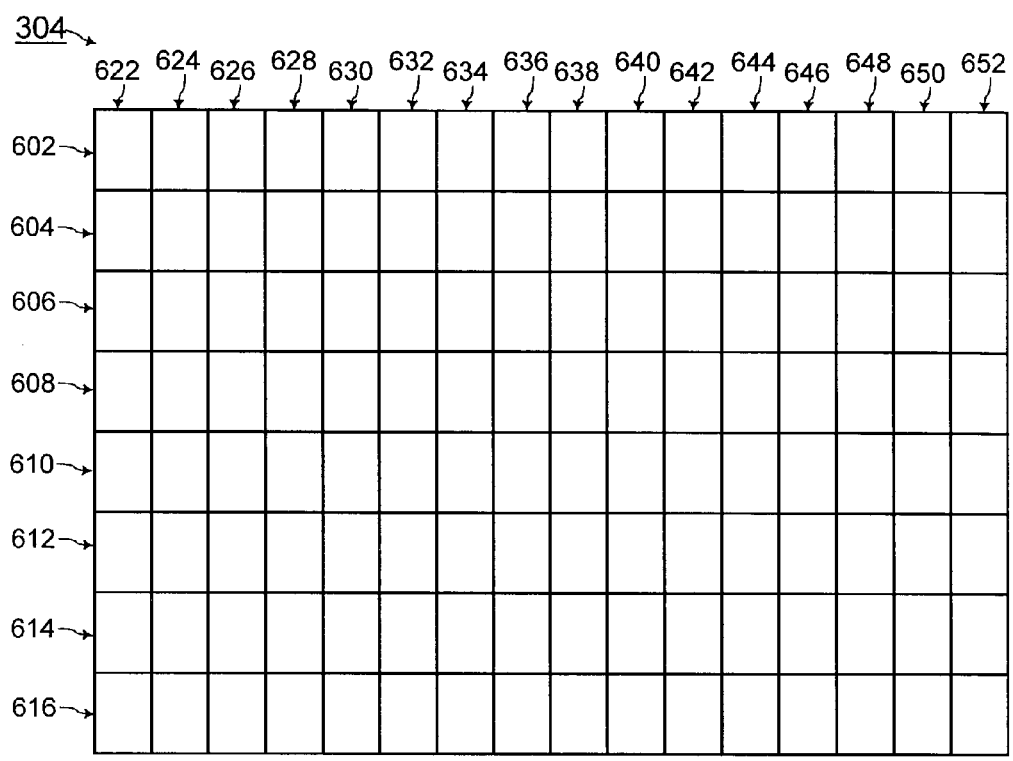
FIG. 16 shows the core flash memory cells divided into blocks and sectors.

FIG. 16 shows an example lay-out of the array of core flash memory cells 304 that includes eight horizontal sectors including a first sector 602, a second sector 604, a third sector 606, a fourth sector 608, a fifth sector 610, a sixth sector 612, a seventh sector 614, and an eighth sector 616. Furthermore, the array of core flash memory cells includes sixteen vertical blocks within each horizontal sector including a first block 622, a second block 624, a third block 626, a fourth block 628, a fifth block 630, a sixth block 632, a seventh block 634, an eighth block 636, a ninth block 638, a tenth block 640, an eleventh block 642, a twelfth block 644, a thirteenth block 646, a fourteenth block 648, a fifteenth block 650, and a sixteenth block 652.

Figure 17:
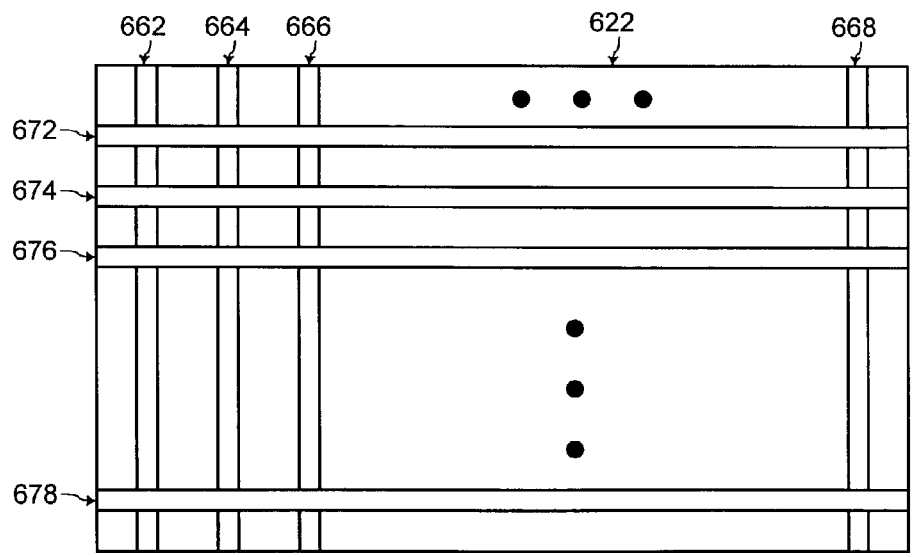
FIG. 17 shows an example of sixty-four bit lines and sixty-four word lines formed within each block of the core flash memory cells of FIG. 16.

Referring to FIG. 17, each block within a sector of flash memory cells includes sixty-four bit lines and sixty-four word lines. For example, FIG. 17 shows the first bit line 662, the second bit line 664, the third bit line 666, and so on up to the sixty-fourth bit line 668 and the first word line 672, the second word line 674, the third word line 676, and so on up to the sixty-fourth word line 678 for the first block 622 of the first sector 602. The intersection of a bit line and a word line forms a flash memory cell within the block of flash memory cells. A word line runs horizontally and continuously through all of the sixteen blocks 622, 624, 626, 628, 630, 632, 634, 636, 638, 640, 642, 644, 646, 648, 650, and 652.

Referring to FIGS. 16 and 17, in one embodiment of the present invention, a predetermined number of flash memory cells comprising an address are formed by the sixteen flash memory cells coupled to a same word line and to an Nth bit line within each of the sixteen blocks 622, 624, 626, 628, 630, 632, 634, 636, 638, 640, 642, 644, 646, 648, 650, and 652. For example, a first address is comprised of each of the sixteen flash memory cells coupled to a top-most word line 672 and to a respective first left-most bit line 662 in each of the sixteen blocks 622, 624, 626, 628, 630, 632, 634, 636, 638, 640, 642, 644, 646, 648, 650, and 652. Then, a second address is comprised of each of the sixteen flash memory cells coupled to the top-most word line 672 and to a respective second left-most bit line 664 in each of the sixteen blocks 622, 624, 626, 628, 630, 632, 634, 636, 638, 640, 642, 644, 646, 648, 650, and 652. Thus, a possible sixty-four column addresses are associated with each horizontal word line since a respective sixty-four bit lines run through each of the sixteen blocks 622, 624, 626, 628, 630, 632, 634, 636, 638, 640, 642, 644, 646, 648, 650, and 652. Referring to FIG. 15, before the START state 552, the address sequencer is reset to a first address as a current address of sixteen flash memory cells.

Referring to FIG. 15, after expiration of the wait time period (Wait=False) within the VERIFY1 state, the back-end BIST state machine 316 enters the VERIFY2 state 540 of FIG. 14 (step 560 of FIG. 15). During the VERIFY2 state, the BIST controller 502 controls the read/verify voltage source 504 to apply verify voltages on each of a predetermined number (i.e. sixteen for the example of FIGS. 16 and 17 as described herein) of flash memory cells comprising a current address of the array of flash memory cells 304.

A measured bit pattern corresponding to that current address of flash memory cells is generated by the comparator circuit 516 using the reference circuit 514. The measured bit pattern is comprised of the series of a respective bit (which may be a logical high state "1" or a logical low state "0") read from each of the predetermined number of flash memory cells after verify voltages are applied on the flash memory cells comprising the current address. Verify voltages applied on the flash memory cells for verifying the programmed or erase states of flash memory cells are known to one of ordinary skill in the art of flash memory devices. In addition, a desired bit pattern corresponding to the current address of flash memory cells is generated by the bit pattern generator 518. The desired bit pattern is the series of bits comprised of a respective bit (which may be a logical high state "1" or a logical low state "0") desired for each of the predetermined number of flash memory cells of the current address.

The matching circuit 520 then compares the measured bit pattern and the desired bit pattern for the current address of flash memory cells (step 562 of FIG. 15). If any bit of the measured bit pattern is not same as the desired bit pattern, the BIST controller 502 checks the PULSE_COUNT variable to a Max_PC (maximum pulse count). Before the START state 552 for the current BIST mode, the PULSE_COUNT has been reset to zero. If the PULSE_COUNT is less than Max_PC (step 564 in FIG. 15), then the BIST controller 502 controls the plurality of voltage sources 504 to apply respective programming or erasing voltages corresponding to the current BIST mode on the flash memory cells comprising the current address of the core flash memory cells 304 during the JUICE state 542 of FIG. 14 (step 566 in FIG. 15). In addition, in that case, the PULSE_COUNT is incremented by one.

For example, if the current BIST mode is for applying programming voltages to each of the flash memory cells, then the desired bit pattern for the flash memory cells comprising the current address is a series of sixteen zero's. If any bit of the measured bit pattern is a logical high state (i.e., a "1"), then the programming voltages from the program voltage source 510 are applied on any flash memory cell having a logical high state, and the PULSE_COUNT is incremented by one. The timer 526 times a juice time period, JTIMEOUT, for applying such voltages during the JUICE state (step 568 in FIG. 15). The value for the juice time period depends on the current BIST mode. For example, the value for the juice time period may vary depending on whether the current BIST mode is for applying programming voltages or for applying erasing voltages. Before expiration of the juice time period (JTIMEOUT=False), the back-end BIST state machine 316 remains within the JUICE state to apply the respective voltages corresponding to the current BIST mode during the juice time period, JTIMEOUT.

After expiration of the juice time period (JTIMEOUT=TRUE), the back-end BIST state machine 316 goes to the VERIFY1 and VERIFY2 states 538 and 540 of FIG. 14 (steps 556, 558, 560, and 562 of FIG. 15) again. With the VERIFY1 and VERIFY 2 states again, a measured bit pattern corresponding to the current address of flash memory cells is generated by the comparator circuit 516 using the reference circuit 514 after the last additional JUICE state 566, and the matching circuit 520 compares the measured bit pattern with the desired bit pattern. With the additional JUICE state 566, the measured bit pattern corresponding to the current address of flash memory cells has a greater probability of being same as the desired bit pattern. If the measured bit pattern is not same as the desired pattern, again, steps 564, 566, 568, 556, 558, 560, and 562 are repeated with an increment of the PULSE_COUNT until the PULSE_COUNT is greater than Max_PC or until the measured bit pattern is same as the desired bit pattern.

When PULSE_COUNT is greater than Max_PC, the JUICE state (steps 566 and 568 in FIG. 15) has been entered a MAX_PC number of times. If the measured bit pattern is not same as the desired bit pattern after the respective programming or erasing voltages corresponding to the current BIST mode have been applied on the flash memory cells of the current address a Max_PC number of times, then the PULSE_COUNT is reset to zero (step 570 in FIG. 15), and the HANG state 546 of FIG. 14 is entered by the BIST controller 502 (step 572 in FIG. 15).

On the other hand, if the measured bit pattern is same as the desired bit pattern as determined in step 562 of FIG. 15 before PULSE_COUNT is greater than Max_PC, then the current address of the core flash memory cells 304 is incremented to a next column address within the address sequencer 524, and the PULSE_COUNT is reset to zero (step 574 in FIG. 15). In addition, after the current address is incremented to the next column address, the BIST controller 502 loops back to the VERIFY1 state (step 574 in FIG. 15) such that steps 556, 558, 560, 562, 564, 566, 568, 570, 572, and 574 of FIG. 15 are repeated for the subsequent column address.

For FIGS. 16 and 17, a column address is for the sixteen flash memory cells coupled to a same word line and to an Nth bit line within each of the sixteen blocks 622, 624, 626, 628, 630, 632, 634, 636, 638, 640, 642, 644, 646, 648, 650, and 652. For example in FIGS. 16 and 17, a first column address is comprised of each of the sixteen flash memory cells coupled to a top-most word line 672 and to a respective first left-most bit line 662 in each of the sixteen blocks 622, 624, 626, 628, 630, 632, 634, 636, 638, 640, 642, 644, 646, 648, 650, and 652. Then, a second column address is comprised of each of the sixteen flash memory cells coupled to the top-most word line 672 and to a respective second left-most bit 664 in each of the sixteen blocks 622, 624, 626, 628, 630, 632, 634, 636, 638, 640, 642, 644, 646, 648, 650, and 652. Thus, a possible sixty-four column addresses are associated with each horizontal word line since a respective set of sixty-four vertical bit lines run through each of the sixteen blocks 622, 624, 626, 628, 630, 632, 634, 636, 638, 640, 642, 644, 646, 648, 650, and 652.

The loop of steps 556, 558, 560, 562, 564, 566, 568, 570, 572, and 574 of FIG. 15 are repeated for each of such column addresses until the current column address is greater than a Max_CA (maximum column address, i.e., 64 in the example of FIGS. 16 and 17). When the current column address is greater than Max_CA (step 576 of FIG. 15), the current BIST mode with steps 556, 558, 560, 562, 564, 566, 568, 570, 572, and 574 of FIG. 15 has been performed for all sixty-four column addresses for a current word line. Referring to FIGS. 16 and 17, each horizontal sector 602, 604, 606, 608, 610, 612, 614, and 616 has a respective set of sixty-four word lines. The loop for performing the current BIST mode for all sixty-four column addresses is repeated for each of the sixty-four word lines until the current block address is greater than Max_BA (maximum block address) (step 578 of FIG. 15).

When the current block address is greater than Max_BA (step 578 of FIG. 15), referring to FIGS. 16 and 17, the current BIST mode has been performed for all addresses within a current one of the horizontal sectors 602, 604, 606, 608, 610, 612, 614, and 616. Otherwise, if the current block address is not greater than Max_BA (step 578 of FIG. 15), the loop of steps 556, 558, 560, 562, 564, 566, 568, 570, 572, 574, 576, and 578 of FIG. 15 are repeated until the current block address is greater than Max_BA when the current BIST mode has been performed for all addresses within a current one of the horizontal sectors. When the current block address is greater than Max_BA (step 578 of FIG. 15) with the current BIST mode being performed for all addresses within a current one of the horizontal sectors, the current sector address is incremented to the next horizontal sector within the address sequencer 524.

The loop of steps 552, 554, 556, 558, 560, 562, 564, 566, 568, 570, 572, 574, 576, 578, 580, and 582 of FIG. 15 are repeated until the current sector address is greater than Max_SA (maximum sector address) (step 582 in FIG. 15) when the current BIST mode has been performed for all addresses within all of the horizontal sectors 602, 604, 606, 608, 610, 612, 614, and 616. At that point, a variable emb_Read (embedded Read) is set to a logical high state "1" (step 584 in FIG. 15), and the current BIST mode may then include reading the programmed or erased states for each of the flash memory cells. With performance of such nested loops of decisional steps 576, 578, and 582 and with the address sequencer 524, the current BIST mode of FIG. 15 is performed through each address of the whole array of core flash memory cells 304.

Figure 18:
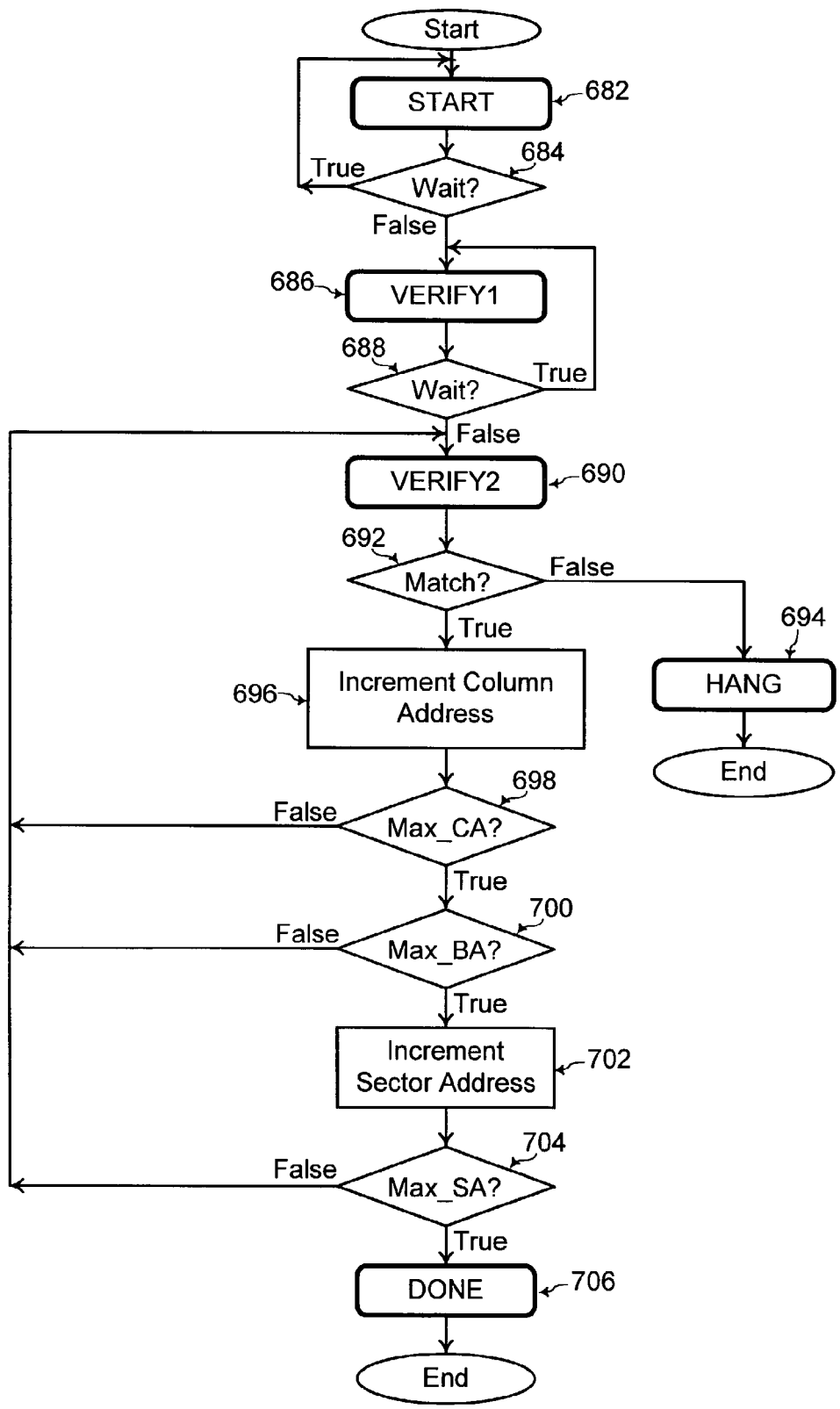
FIG. 18 shows a flow chart of the steps of operation of the back-end BIST state machine of FIG. 13 when a current BIST mode includes reading the respective logical state programmed or erased for each flash memory cell of the core flash memory cells, according to one embodiment of the present invention.

FIG. 18 shows a flowchart of a BIST mode that includes reading a respective logical state of each flash memory cell of the array of core flash memory cells 304. For example, such a BIST mode may be performed after the variable emb_Read (embedded Read) is set to a logical high state "1" in step 584 of the BIST mode of FIG. 15. At the start of such a read operation of a BIST mode, the BIST controller 502 enters the START state 532 of FIG. 14 (step 682 in FIG. 18). During the START state, the timer 526 times a predetermined wait time period before starting the current BIST mode to reset the regulation capacitors within the voltage sources 504 that provide the voltage applied on the word-lines of the flash memory cells (step 684 in FIG. 18). Before expiration of the wait time period (Wait=True), the back-end BIST state machine 316 remains within the START state.

After expiration of the wait time period (Wait=False) within the START state, the back-end BIST state machine 316 enters the VERIFY1 state 538 of FIG. 14 (step 686 of FIG. 18). During the VERIFY1 state, the timer 526 times a predetermined wait time period before voltages from the plurality of voltage sources 504 are applied on an address of flash memory cells for the VERIFY2 state such that the voltage levels from the plurality of voltage sources 504 are stabilized before the VERIFY2 state (step 688 in FIG. 18). Before expiration of the wait time period (Wait=True) within the VERIFY1 state, the back-end BIST state machine 316 remains within the VERIFY1 state.

After expiration of the wait time period (Wait=False) within the VERIFY1 state, the back-end BIST state machine 316 enters the VERIFY2 state 540 of FIG. 14 (step 690 of FIG. 18). During the VERIFY2 state, the BIST controller 502 controls the read/verify voltage source 512 to apply read voltages on each of a predetermined number (i.e. sixteen for the example of FIGS. 16 and 17 as described herein) of flash memory cells comprising a current address of the array of flash memory cells 304. Read voltages applied on flash memory cells for determining the programmed or erased state of flash memory cells are known to one of ordinary skill in the art of flash memory devices.

A measured bit pattern corresponding to that current address of flash memory cells is generated by the comparator circuit 516 using the reference circuit 514. The measured bit pattern is comprised of the series of a respective bit (which may be a logical high state "1" or a logical low state "0") read from each of the predetermined number of flash memory cells after read voltages are applied on the flash memory cells comprising the current address.

In addition, a desired bit pattern corresponding to the current address of flash memory cells is generated by the bit pattern generator 518. The desired bit pattern is the series of bits comprised of a respective bit (which may be a logical high state "1" or a logical low state "0") desired for each of the predetermined number of flash memory cells of the current address. For example, when the last BIST mode was for programming a logical low state "0" into each flash memory cell of the array of core flash memory cells 304, the desired bit pattern is a series of sixteen "0's" for an address of sixteen flash memory cells. Alternatively, when the last BIST mode was for erasing a logical high state "1" into each flash memory cell of the array of core flash memory cells 304, the desired bit pattern is a series of sixteen "1'" for an address of sixteen flash memory cells. Or, when the last BIST mode was for alternatingly programming and erasing a logical low or high state into the array of core flash memory cells 304 in a checker-board pattern, the desired bit pattern is a series of sixteen alternating 1's and 0's for an address of sixteen flash memory cells.

The matching circuit 520 then compares the measured bit pattern and the desired bit pattern for the current address of flash memory cells (step 692 of FIG. 18). If the measured bit pattern is not same as the desired bit pattern (MATCH=FALSE), the BIST controller 502 enters a HANG state 546 of FIG. 14 and sends a HANG signal to the BIST interface 312 (step 694 of FIG. 18). Alternatively, if the measured bit pattern is same as the desired bit pattern (MATCH=TRUE) for the current address of flash memory cells, the column address is incremented within the address sequencer 524 (step 696 in FIG. 18), and the VERIFY2 state with the matching step 692 is repeated for each subsequent column address until a maximum column address (Max_CA) is reached (step 698 in FIG. 18). The BIST controller 502 increments the column address of flash memory cells within the address sequencer 524.

Then, the VERIFY2 state with the matching step 692 is repeated for all possible column addresses for each word line until a maximum block address (Max_BA) (i.e., a maximum word line) is reached for one of the horizontal sectors 602, 604, 606, 608, 610, 612, 614, and 616 (step 700 in FIG. 18). At that point, the sector address is incremented within the address sequencer 524 (step 702 in FIG. 18) to perform the BIST mode on each of the horizontal sectors 602, 604, 606, 608, 610, 612, 614, and 616 until the maximum sector address (Max_SA) is reached (step 704 in FIG. 18). With performance of such nested loops of decisional steps 698, 700, and 704 and with the address sequencer 524, the current BIST mode of FIG. 18 is performed through each address of the whole array of core flash memory cells 304 as long as the HANG signal is not generated (MATCH=TRUE and LAST_ADD=FALSE in FIG. 14).

As soon as a HANG signal is generated to enter the HANG state (step 694 in FIG. 18) for any address of flash memory cells, the current BIST mode of FIG. 18 terminates without performing the current BIST mode of FIG. 18 for any subsequent address of flash memory cells. In that case, the array of core flash memory cells 304 currently being tested with the BIST mode of FIG. 18 fails that current BIST mode. On the other hand, when the current BIST mode of FIG. 18 is performed through each address of the whole array of core flash memory cells 304 with the nested loops of decisional steps 698, 700, and 704 without generation of a HANG signal (MATCH=TRUE and LAST_ADD=TRUE in FIG. 14), the BIST controller 502 enters a DONE state 544 of FIG. 14 and sends a DONE signal to the BIST interface 312 (step 706 of FIG. 18), and the current BIST mode of FIG. 18 ends. In that case, the array of core flash memory cells 304 currently being tested with the BIST mode of FIG. 18 passes that current BIST mode.

Figure 19:
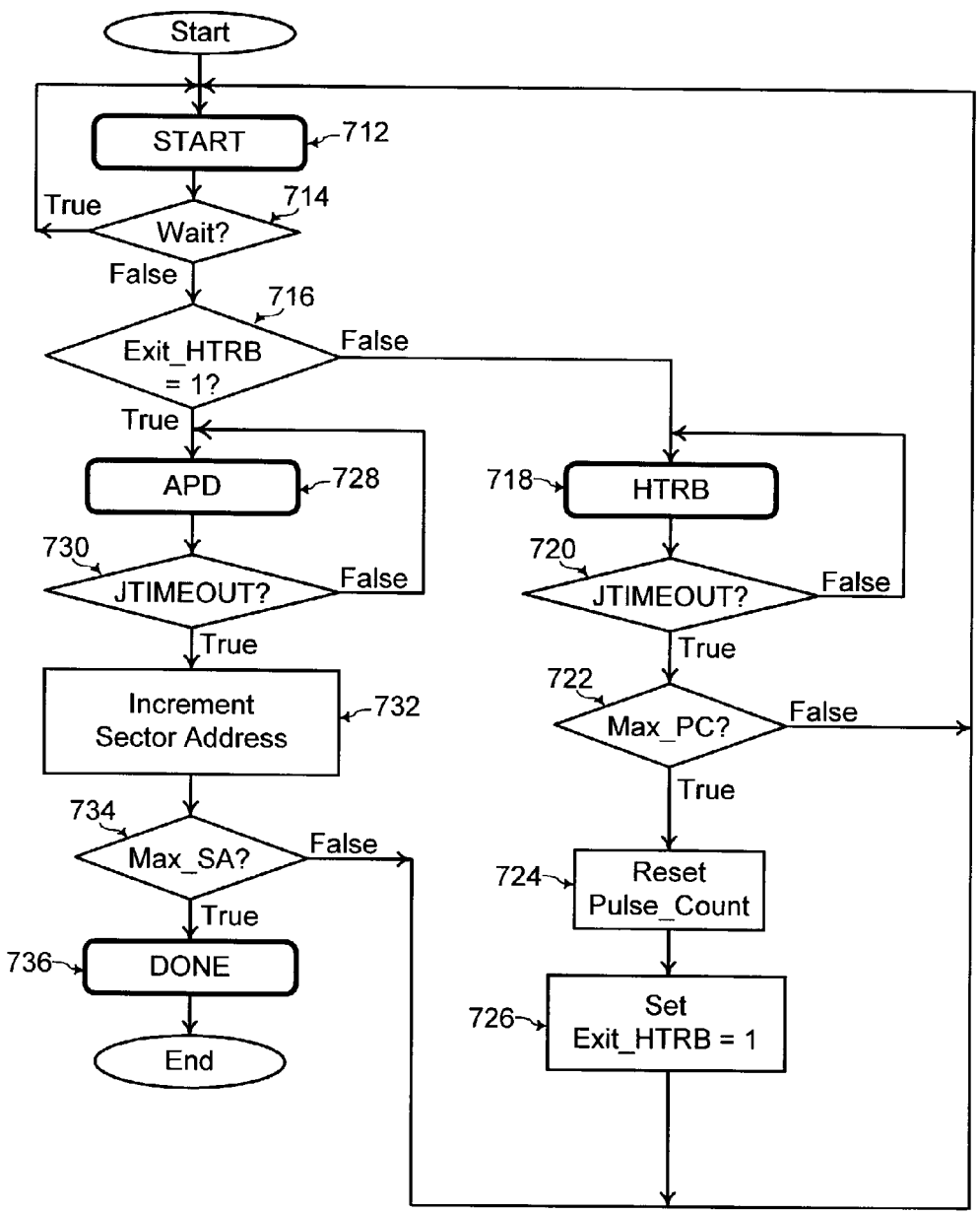
FIG. 19 shows a flow chart of the steps of operation of the back-end BIST state machine of FIG. 13 when a current BIST mode is for applying stress voltages on the bit line and on the word line of each flash memory cell of the core flash memory cells, according to one embodiment of the present invention.

FIG. 19 shows a flowchart of a BIST mode for applying stress voltages on each flash memory cell of the array of core flash memory cells 304. A BIST mode tests for the functionality of the array of core flash memory cells 304 after APD and HTRB stress voltages are applied on each flash memory cell of the array of core flash memory cells 304. Referring to FIGS. 16 and 17, for HTRB stress voltages, all word lines of the whole array of core flash memory cells 304 are stressed with application of a relatively high voltage level such as about 9 Volts for example from the HTRB stress voltage source 508 while the bit lines within the array of core flash memory cells are grounded.

Referring to FIGS. 16 and 17, for the APD stress voltages, all bit lines of one of the horizontal sectors 602, 604, 606, 608, 610, 612, 614, and 616 are stressed with application of a relatively high voltage level such as about 5 Volts for example while the word lines of such flash memory cells are grounded. Because of current flow through the bit lines, the APD stress voltages are applied one horizontal sector at a time. Such a BIST mode for applying the HTRB and APD stress voltages are known to one of ordinary skill in the art of flash memory devices.

Referring to FIGS. 13, 14, and 19, the BIST controller 502 receives the respective identification of such a current BIST mode to be currently performed for applying HTRB and APD stress voltages on each flash memory cell of the array of core flash memory cells 304. At that point, the Exit_HTRB variable is set to a logical low state "0", and the variables PULSE_COUNT and SECTOR_ADDRESS are reset to zero. At the start of such a BIST mode, the BIST controller 502 enters the START state 532 of FIG. 14 (step 712 in FIG. 19). During the START state, the timer 526 times a predetermined wait time period before starting the current BIST mode such that the voltage levels from the plurality of voltage sources 506, 508, 510, and 512, especially the APD stress voltage source 506 and the HTRB stress voltage source 508, are stabilized during the wait time period (step 714 in FIG. 19). Before expiration of the wait time period (Wait=True), the back-end BIST state machine 316 remains within the START state.

After expiration of the wait time period (Wait=False) within the START state, if the Exit_HTRB variable is not set to a logical high state "1" (step 716 in FIG. 19), then the HTRB state 536 in FIG. 14 is entered (step 718 in FIG. 19). During the HTRB state, all word lines of the whole array of core flash memory cells 304 are stressed with application of a relatively high voltage level such as about 9 Volts for example from the HTRB stress voltage source 508 while the bit lines within the array of core flash memory cells are grounded. The timer 526 times a juice time period, JTIMEOUT, for applying such a HTRB stress voltage on the core flash memory cells 304 during the HTRB state (step 720 in FIG. 19). Before expiration of the juice time period (JTIMEOUT=False), the back-end BIST state machine 316 remains within the HTRB state to apply the HTRB stress voltage on the core flash memory cells 304 during the juice time period, JTIMEOUT.

After expiration of the juice time period (JTIMEOUT=TRUE) within the HTRB state, the back-end BIST state machine 316 checks whether the PULSE_COUNT is greater than Max_PC (maximum pulse count) (step 722 in FIG. 19). If PULSE_COUNT is not greater than Max_PC, then the HTRB state is entered again for the JTIMEOUT time period and PULSE_COUNT is incremented. The loop of steps 712, 714, 716, 718, 720, and 722 is repeated until PULSE_COUNT is greater than Max_PC. In that case, PULSE_COUNT is reset to zero (step 724 in FIG. 19), and the variable Exit_HTRB is set to a logical high state "1" (step 726 in FIG. 19).

At that point, the BIST controller 502 returns back to the START state (step 712 in FIG. 19). Since the Exit_HTRB variable has been set to a logical high state "1", the APD state 534 in FIG. 14 is entered (step 728 in FIG. 19). In the APD state, referring to FIG. 16, all bit lines of one of the horizontal sectors 602, 604, 606, 608, 610, 612, 614, and 616 are stressed with application of a relatively high voltage level such as about 5 Volts for example while the word lines of such flash memory cells are grounded. Because of current flow through the bit lines, the APD stress voltages are applied one horizontal sector at a time.

For a current SECTOR_ADDRESS, the APD stress voltage source 506 applies the APD stress voltage on each flash memory cell within one of the horizontal sectors 602, 604,

606, 608, 610, 612, 614, and 616 having the current SECTOR_ADDRESS for a juice time period JTIMEOUT. The timer 526 times a juice time period, JTIMEOUT, for applying such an APD stress voltage during the APD state (step 730 in FIG. 19). Before expiration of the juice time period (JTIMEOUT=False), the back-end BIST state machine 316 remains within the APD state to apply the APD stress voltage on the current SECTOR_ADDRESS of the core flash memory cells 304 during the juice time period, JTIMEOUT.

After expiration of the juice time period, JTIMEOUT, within the APD state, the SECTOR_ADDRESS is incremented within the address sequencer 524 (step 732 in FIG. 19), and the BIST controller 502 checks whether the SECTOR_ADDRESS is greater than Max_SA (step 734 in FIG. 19). If the SECTOR_ADDRESS is not greater than Max_SA, then steps 712, 714, 728, 730, and 732 are repeated until SECTOR_ADDRESS is greater than Max_SA. At that point, the APD stress voltage has been applied on each flash memory cell of all of the horizontal sectors 602, 604, 606, 608, 610, 612, 614, and 616, and the DONE state 544 of FIG. 14 is entered (step 736 of FIG. 19) to end the BIST mode of FIG. 19.

In this manner, any BIST mode of the set of BIST modes are performed with the back-end BIST state machine having a relatively small number of states including the START, JUICE, VERIFY1, VERIFY2, APD, HTRB, DONE, and HANG states. The back-end BIST state machine is fabricated on-chip with the array of core flash memory cells such that the programming, erasing, and reading operations are performed on-chip on the semiconductor die of the array of flash memory cells. Thus, the number of pins of the external test system used to test each semiconductor die is reduced. With such a reduced number of pins, a higher number of semiconductor dies may be tested concurrently by an external test system having a limited total number of pins, to maximize throughput during manufacture of flash memory devices.

The foregoing is by way of example only and is not intended to be limiting. For example, the present invention may be practiced for a larger number of BIST modes and with a different lay-out of the array of core flash memory cells 304 aside from the example of FIGS. 16 and 17. Any numbers described or illustrated herein are by way of example only. The present invention is limited only as defined in the following claims and equivalents thereof.

D. On-Chip Repair of Defective Address of Core Flash Memory Cells

Figure 20:
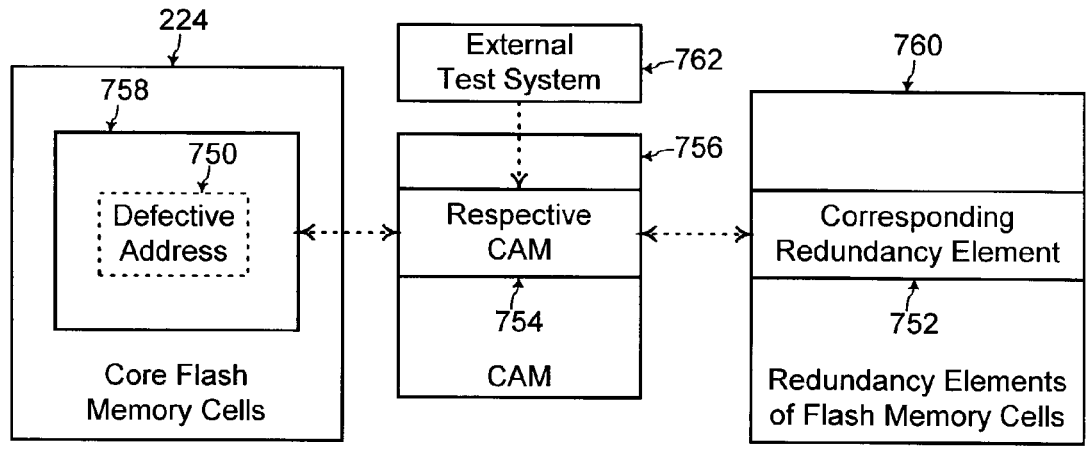
FIG. 20 shows a block diagram of the external test system programming a CAM (content addressable memory) for replacing a defective address of core flash memory cells with a redundancy element of flash memory cells for repairing the defective address of core flash memory cells, according to the prior art.

In addition, referring to FIG. 20, during testing of the array of core flash memory cells 224 in the prior art, if a defective address 750 of the array of core flash memory cells 224 is detected, such a defective address 750 is repaired by replacing the set of flash memory cells comprising the defective address 750 with a corresponding redundancy element of flash memory cells 752. Such a repair is performed by programming a respective set of CAM flash memory cells 754 within a CAM (content addressable memory) 756 that redirects the access of the defective address of flash memory cells 750 to the redundancy element of flash memory cells 752 instead. The CAM (content addressable memory) 756 is fabricated on the same semiconductor die having the array of core flash memory cells 224 fabricated thereon.

Typically a larger region 758 having a larger number of flash memory cells of the array of core flash memory cells 224 than just the defective address 750 of flash memory cells is replaced with the corresponding redundancy element of flash memory cells 752. A plurality of redundancy elements 760 is available to repair a plurality of defective addresses of the array of core flash memory cells 224. Such repair of defective addresses of flash memory cells during testing of the array of core flash memory cells 224 using redundancy elements of flash memory cells 760 is known to one of ordinary skill in the art of flash memory manufacture.

In the prior art, an external test system 762 performs such repair of defective addresses of flash memory cells during testing of the array of core flash memory cells 224 using redundancy elements of flash memory cells 760. Thus, in the prior art, the external test system 762 programs the CAM (content addressable memory) 756 for redirecting access of the defective address of flash memory cells 750 to the redundancy element of flash memory cells 752. An example of such an external test system is the model V3300, available from Agilent Technologies, Inc., headquartered in Palo Alto, Calif. However, when the external test system 762 performs such repair of defective addresses of flash memory cells, additional pins from the external test system 762 are used for programming the CAM (content addressable memory) 756 fabricated on the same semiconductor die having the array of core flash memory cells 224 fabricated thereon.

Such use of additional number of pins from the external test system 762 for performing such repair of defective addresses of flash memory cells is disadvantageous with a decrease in throughput during testing the semiconductor dies of core flash memory cells. Thus, a mechanism is desired for minimizing the number of pins used for testing the flash memory device on each semiconductor die including repairing the defective addresses of flash memory cells such that a maximized number of semiconductor die may be tested concurrently with an external test system having a limited total number of pins, to increase throughput during manufacture of flash memory devices.

In addition, testing and repair of the core flash memory cells by the external test system 762 may be slow depending on the capacity of the external test system 762. Thus, an efficient mechanism is desired for faster testing and repair of the core flash memory cells.

When the back-end BIST (built-in-self-test) state machine 316 determines that a current address of flash memory cells fails a current BIST (built-in-self-test) mode as a defective address of flash memory cells, the back-end BIST (built-in-self-test) state machine 316 invokes a repair routine. The steps of the flowchart of FIG. 21 having the same reference numeral as the steps of the flowchart of FIG. 15 are same as described herein for the flowchart of FIG. 15.

Figure 21:
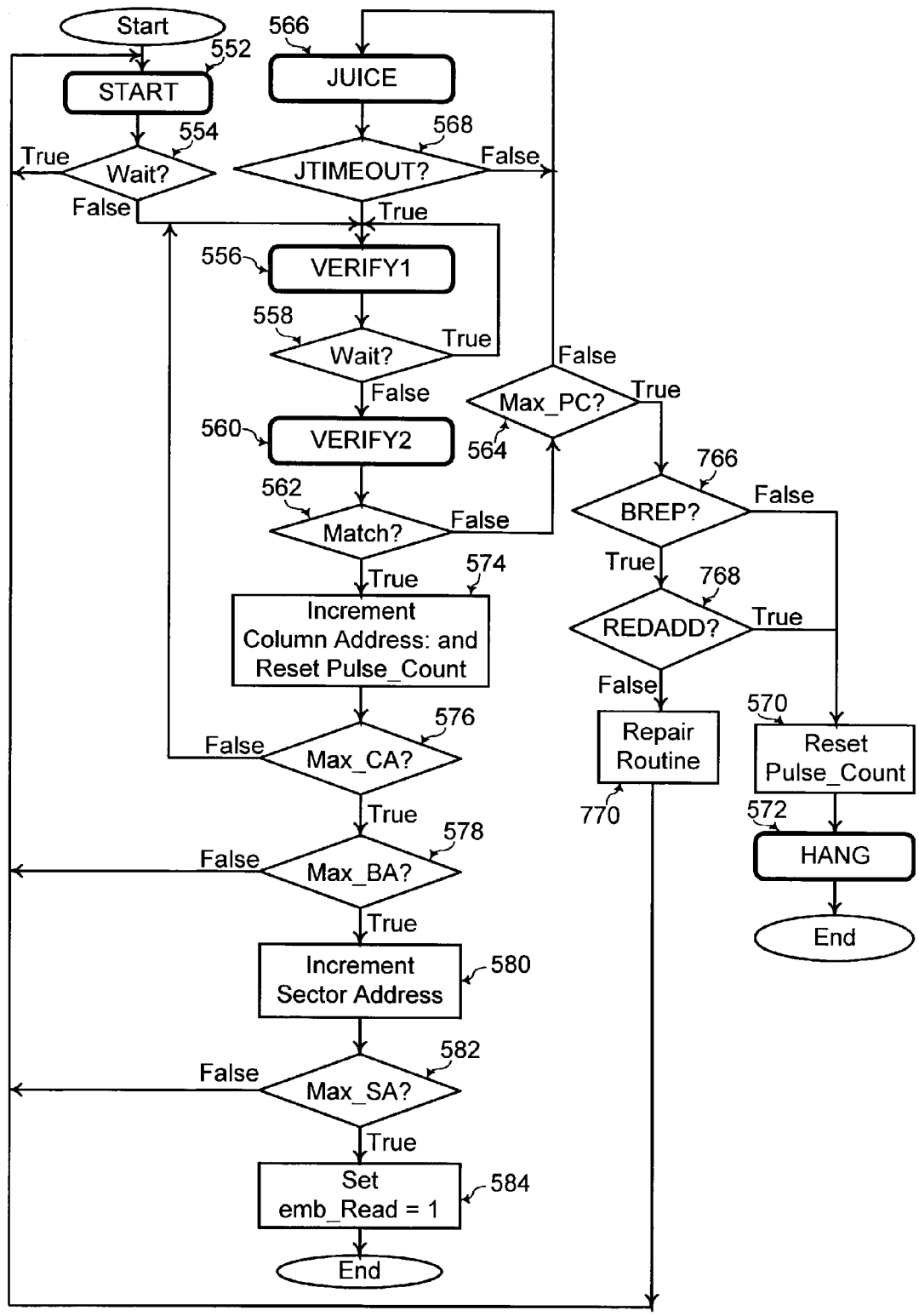
FIG. 21 shows the flow-chart of FIG. 15 with added steps for on-chip programming of the CAM (content addressable memory) for replacing a defective address of core flash memory cells with a redundancy element of flash memory cells for on-chip repair of the defective address of core flash memory cells, according to an embodiment of the present invention.

The steps of FIGS. 15 and 21 are for performing a BIST (built-in-self-test) mode that includes applying programming or erasing voltages on each flash memory cell of the array of core flash memory cells 304 with verifying the programmed or erased state of each flash memory cell of the array of core flash memory cells 304. However in contrast to FIG. 15, in FIG. 21, when the JUICE state (steps 566 and 568 in FIG. 21) has been entered a MAX_PC number of times with the PULSE_COUNT being greater than Max_PC (in step 564 of FIG. 21), the HANG state is not necessarily immediately entered. In the case the JUICE state (steps 566 and 568 in FIG. 21) has been entered a MAX_PC number of times with the PULSE_COUNT being greater than Max_PC (in step 564 of FIG. 21), the current address of flash memory cells is determined to be a defective address of flash memory cells.

Rather, the BIST controller 502 checks a BREP value which is set by the external test system 318 (step 766 of FIG. 21). A user sets the BREP value via the external test system 318 to a logical high state (i.e., a True state) if the user desires the on-chip repair routine to be invoked by the BIST controller 502 and to a logical low state (i.e., a False state) otherwise. Thus, if the BREP value is set to the logical low state (i.e., the False state), then steps 570 and 572 are performed for immediately entering the HANG state in FIG. 21 similarly as in FIG. 15 such that the repair routine is not invoked.

Figure 22:
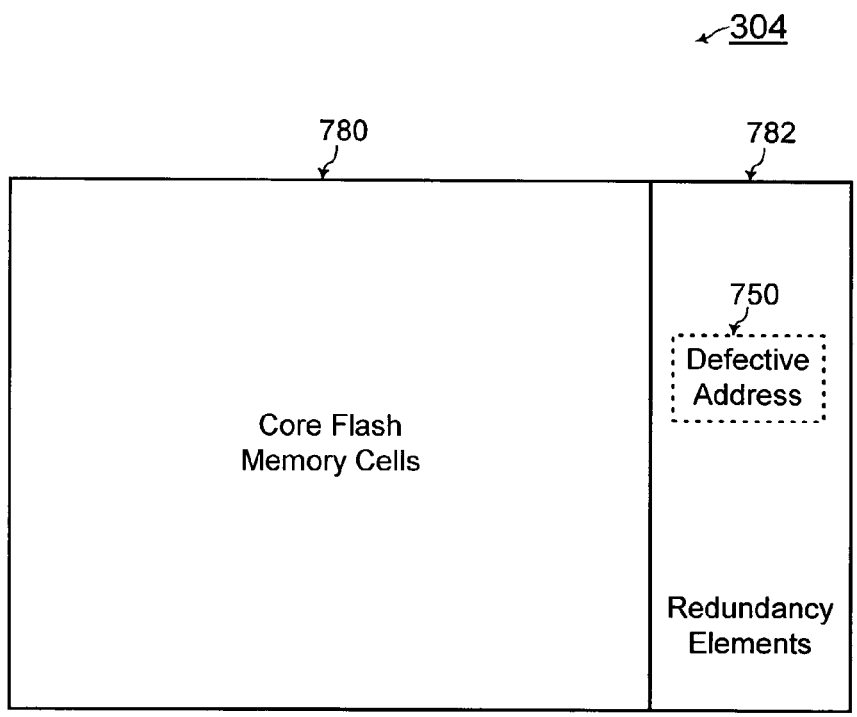
FIG. 22 illustrates a defective address of flash memory cells located within the redundancy elements of flash memory cells.

On the other hand, if the BREP value is set to the logical high state (i.e., the True state) in FIG. 21, the BIST controller 502 determines the logical state of a REDADD value (step 768 of FIG. 21). Referring to FIG. 22, the REDADD value indicates whether the current defective address of flash memory cells is within the redundancy elements of flash memory cells. Referring to FIG. 22, the array of flash memory cells 304 being tested is comprised of core flash memory cells 780 and redundancy elements of flash memory cells 782. Typically, an array of flash memory cells are fabricated with redundancy elements of flash memory cells for repairing defective flash memory cells within the core flash memory cells 780, as known to one of ordinary skill in the art of flash memory manufacture.

During testing of the array of flash memory cells 304, the address sequencer 524 sequences through the addresses of the redundancy elements of flash memory cells 782 as well as the addresses of the core flash memory cells 780 to also test for the proper functionality of the redundancy elements of flash memory cells 782. The BIST controller 502 determines the REDADD variable to be a logical high state (i.e., the True state) if the current address of flash memory cells is for the redundancy elements of flash memory cells 782 and to be a logical low state (i.e., the False state) if the current address of flash memory cells is for the core flash memory cells 780.

Referring to FIG. 21, if the REDADD variable is determined to be the logical high state (i.e., the True state), then steps 570 and 572 are performed for immediately entering the HANG state since the current defective address of flash memory cells 750 is within the redundancy elements of flash memory cells 782. Defective addresses of the core flash memory cells 780 are desired to be repaired by being replaced with a redundancy element of flash memory cells, but defective addresses of the redundancy elements of flash memory cells are not repaired in such a manner according to one embodiment of the present invention.

Referring to FIG. 21, if the BREP value is set to a logical high state (step 766 of FIG. 21) and if the REDADD value is determined to be a logical low state (state 768 of FIG. 21), then the repair routine is invoked (step 770 of FIG. 21). Within the repair routine, the current defective address of flash memory cells may be repaired by being replaced with a redundancy element of flash memory cells.

Figure 23:
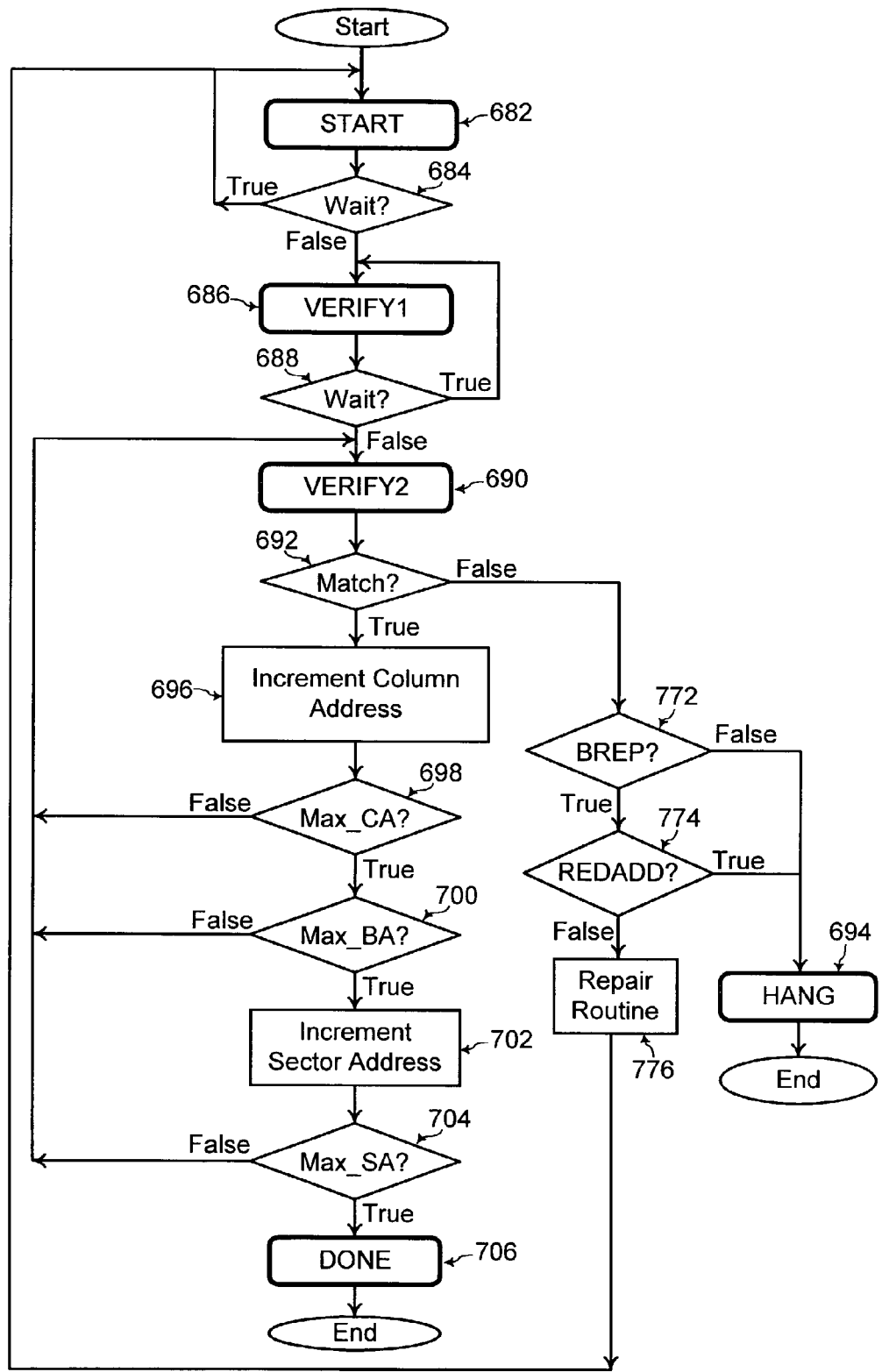
FIG. 23 shows the flow-chart of FIG. 18 with added steps for on-chip programming of the CAM (content addressable memory) for replacing a defective address of core flash memory cells with a redundancy element of flash memory cells for on-chip repair of the defective address of core flash memory cells, according to an embodiment of the present invention.

Similarly, referring to FIGS. 18 and 23, the steps of the flowchart of FIG. 23 having the same reference numeral as the steps of the flowchart of FIG. 18 are same as described herein for the flowchart of FIG. 18. The steps of FIGS. 18 and 23 are for performing a BIST (built-in-self-test) mode that includes reading a respective logical state of each flash memory cell of the array of flash memory cells 304. However in contrast to FIG. 18, in FIG. 23, when the measured bit pattern and the desired bit pattern for the current address of flash memory cells is not the same (steps 692 in FIG. 23), the HANG state is not necessarily immediately entered. In the case that the measured bit pattern and the desired bit pattern for the current address of flash memory cells is not the same, the current address of flash memory cells is determined to be a defective address of flash memory cells.

Rather, the BIST controller 502 checks the BREP value which is set by the external test system 318 (step 772 of FIG. 23). A user sets the BREP value via the external test system 318 to a logical high state (i.e., a True state) if the user desires the on-chip repair routine to be invoked by the BIST controller 502 and to a logical low state (i.e., a False state) otherwise. Thus, if the BREP value is set to the logical low state (i.e., the False state), then step 694 is performed for immediately entering the HANG state in FIG. 23 similarly as in FIG. 18 such that the repair routine is not invoked.

On the other hand, if the BREP value is set to the logical high state (i.e., the True state) in FIG. 23, the BIST controller 502 determines the logical state of the REDADD value (step 774 of FIG. 23). Referring to FIG. 22, the REDADD value indicates whether the current defective address of flash memory cells is within the redundancy elements of flash memory cells. Referring to FIG. 23, if the REDADD is determined to be the logical high state (i.e., the True state), then step 694 is performed for immediately entering the HANG state since the current defective address of flash memory cells 750 is within the redundancy elements of flash memory cells 782. If the BREP value is set to a logical high state (step 772 of FIG. 23) and if the REDADD value is determined to be a logical low state (state 774 of FIG. 23), then the repair routine is invoked (step 776 of FIG. 23). Within the repair routine, the current defective address of flash memory cells may be repaired by being replaced with a redundancy element of flash memory cells.

Figure 24:
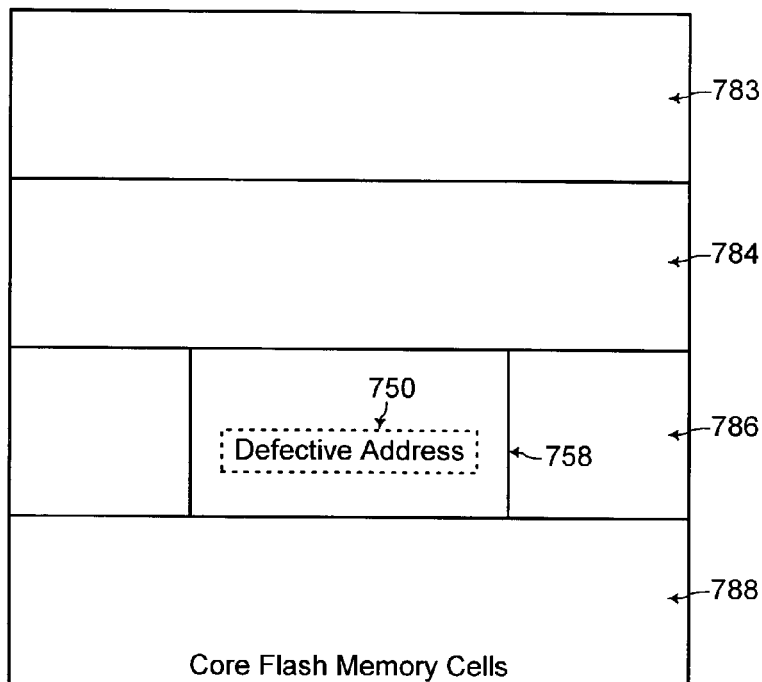
FIG. 24 illustrates the core flash memory cells divided into a plurality of blocks according to the prior art.

Referring to FIG. 24, for either case of FIG. 21 or 23, for the repair routine, the core flash memory cells are grouped into blocks (such as 4 Megabit blocks for example) including a first block 783, a second block 784, a third block 786, and a fourth block 788 for example. Each of the blocks 783, 784, 786, and 788 is further divided into a plurality of horizontal sectors of flash memory cells (not shown in FIG. 24 for clarity of illustration). For example, each of the blocks 783, 784, 786, and 788 includes eight horizontal sectors of flash memory cells in one embodiment of the present invention. A typical flash memory device is comprised of more blocks but four blocks 783, 784, 786, and 788 are illustrated in FIG. 24 for clarity of illustration.

The current defective address of flash memory cells is contained within one of the blocks 783, 784, 786, and 788 such as the third block 786 in FIG. 24. A larger region 758 having a larger number of flash memory cells within the third block 786 than just the defective address of flash memory cells 750 is replaced with a redundancy element of flash memory cells for repairing the defective address of flash memory cells 750, as known to one of ordinary skill in the art of flash memory manufacture. For example, whole columns of flash memory cells having a flash memory cell of the defective address within any one of the blocks 783, 784, 786, and 788 are replaced by a redundancy element of flash memory cells.

Figure 25:
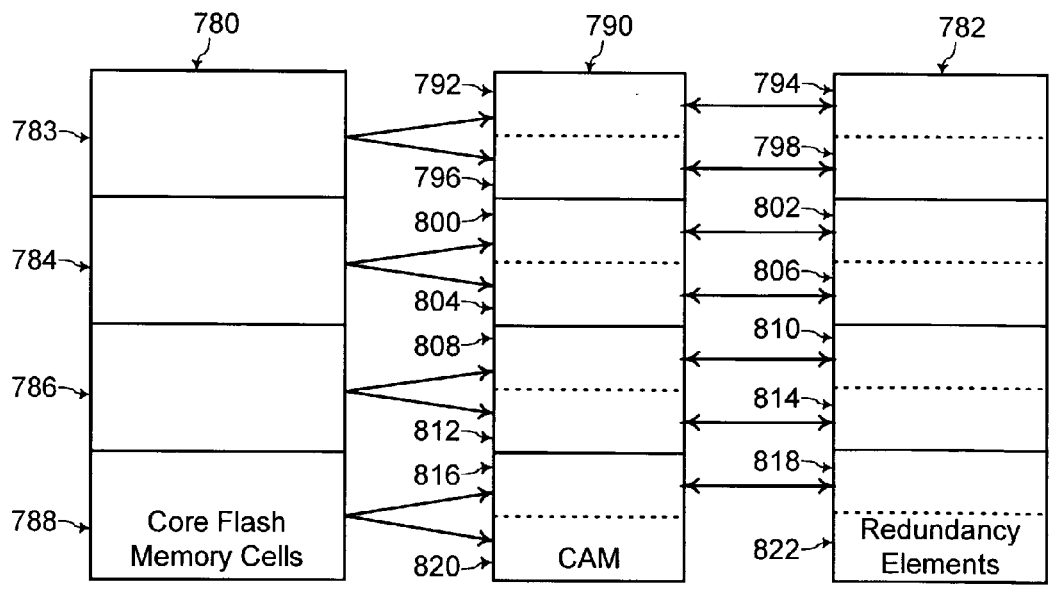
FIG. 25 illustrates a respective set of two redundancy elements available for repairing defective addresses of core flash memory cells within each block of core flash memory cells, according to an embodiment of the present invention.

Referring to FIG. 25, a CAM (content addressable memory) 790 is programmed to replace a region of flash memory cells having the defective address of flash memory cells within the core flash memory cells 780 with a redundancy element of flash memory cells within the redundancy elements of flash memory cells 782. The CAM (content addressable memory) 790 is comprised of flash memory cells that are programmed with information of the defective address of flash memory cells and the corresponding redundancy element of flash memory cells for replacing the defective address of flash memory cells. When the defective address of flash memory cells is later accessed, the CAM (content addressable memory) 790 redirects access of the defective address of flash memory cells to the redundancy element of flash memory cells. Such use of a CAM (content addressable memory) and redundancy elements of flash memory cells for repairing a defective address of core flash memory cells is known to one of ordinary skill in the art of flash memory manufacture.

Referring to FIG. 25, in one embodiment of the present invention, a respective set of CAM flash memory cells is programmed for replacing each defective address of flash memory cells within the core flash memory cells 780 with a corresponding redundancy element of flash memory cells within the redundancy elements of flash memory cells 782. A finite number of redundancy elements of flash memory cells are available for repairing a finite number of defective addresses of flash memory cells. In one embodiment of the present invention, two redundancy elements of flash memory cells are available for repairing defective addresses of flash memory cells within each one of the blocks 783, 784, 786, and 788.

In the example of FIG. 25, two redundancy elements are available to repair flash memory cells within each one of the blocks 783, 784, 786, and 788. A first respective set of CAM flash memory cells 792 is programmed to replace one set of defective flash memory cells within the first block 783 of core flash memory cells 780 with a first redundancy element of flash memory cells 794. A second respective set of CAM flash memory cells 796 is programmed to replace another set of defective flash memory cells within the first block 783 of core flash memory cells 780 with a second redundancy element of flash memory cells 798.

Similarly, a third respective set of CAM flash memory cells 800 is programmed to replace one set of defective flash memory cells within the second block 784 of core flash memory cells 780 with a third redundancy element of flash memory cells 802. A fourth respective set of CAM flash memory cells 804 is programmed to replace another set of defective flash memory cells within the second block 784 of core flash memory cells 780 with a fourth redundancy element of flash memory cells 806.

Also, a fifth respective set of CAM flash memory cells 808 is programmed to replace one set of defective flash memory cells within the third second block 786 of core flash memory cells 780 with a fifth redundancy element of flash memory cells 810. A sixth respective set of CAM flash memory cells 812 is programmed to replace another set of defective flash memory cells within the third block 786 of core flash memory cells 780 with a sixth redundancy element of flash memory cells 814.

Finally, a seventh respective set of CAM flash memory cells 816 is programmed to replace one set of defective flash memory cells within the fourth block 788 of core flash memory cells 780 with a seventh redundancy element of flash memory cells 818. An eighth respective set of CAM flash memory cells 820 is programmed to replace another set of defective flash memory cells within the fourth block 788 of core flash memory cells 780 with an eighth redundancy element of flash memory cells 822.

Figure 26:
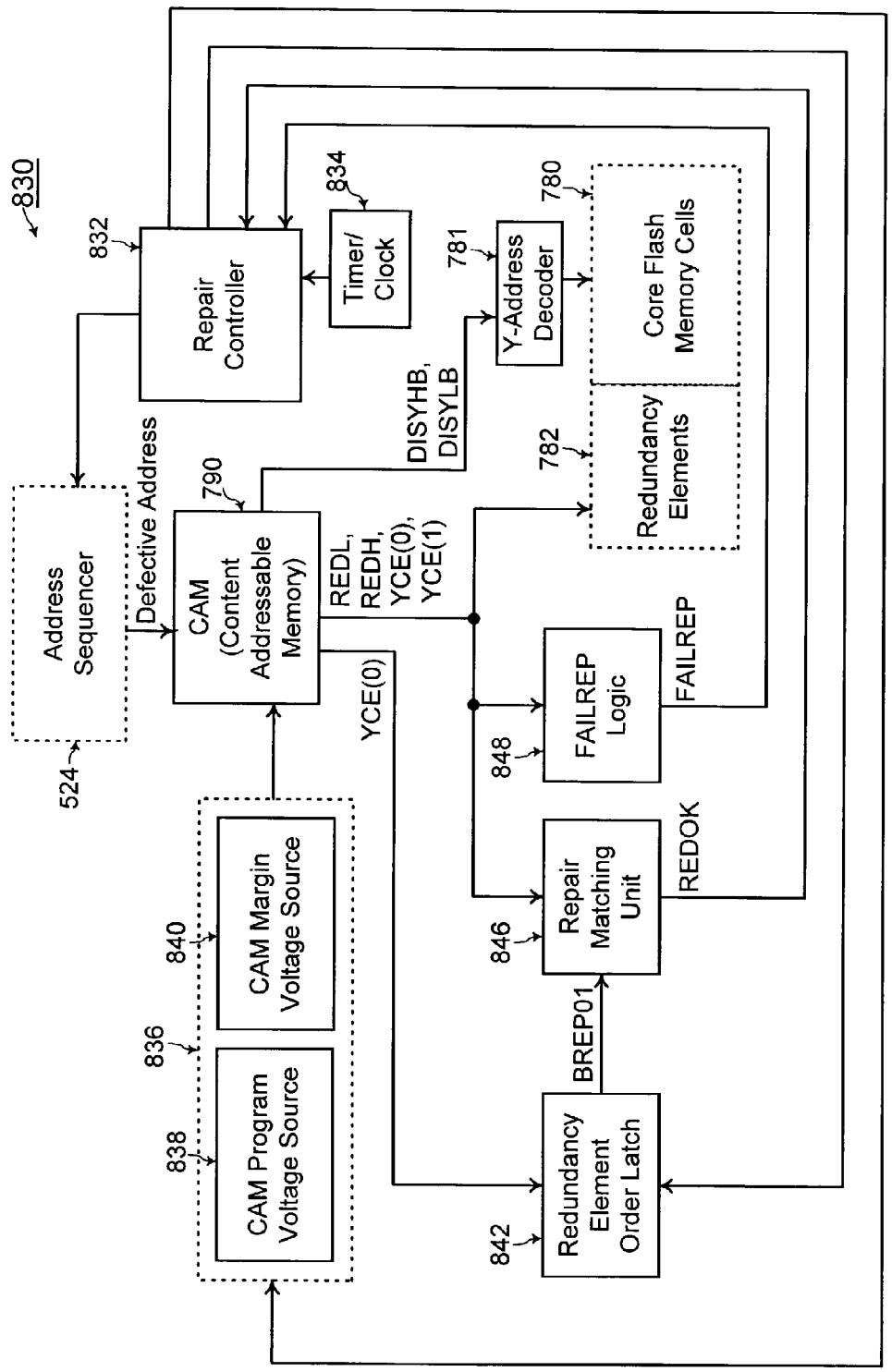
FIG. 26 shows a block diagram of the components used during the repair routine for on-chip repair of the defective address of core flash memory cells, according to an embodiment of the present invention.

FIG. 26 shows on-chip repair components 830 used during the repair routine 770 of FIG. 21 or 776 of FIG. 23 for on-chip repair of the defective address of flash memory cells within the core flash memory cells 780 with redundancy elements 782 by programming the CAM (content addressable memory) 790, according to an embodiment of the present invention. Such on-chip repair components 830 include a repair controller 832, a timer/clock 834, and voltage sources 836. The voltage sources 836 include a CAM (content addressable memory) program voltage source 838 and a CAM (content addressable memory) margin voltage source 840. In addition, such on-chip repair components include a redundancy element order latch 842, a repair matching unit 846, and a FAILREP logic 848. In a general aspect of the present invention, the on-chip repair components 832, 834, 838, 840, 842, 846, and 848 are fabricated on the semiconductor die having the core flash memory cells 780, the redundancy elements 782, and the CAM (content addressable memory) 790 fabricated thereon.

Figure 27:
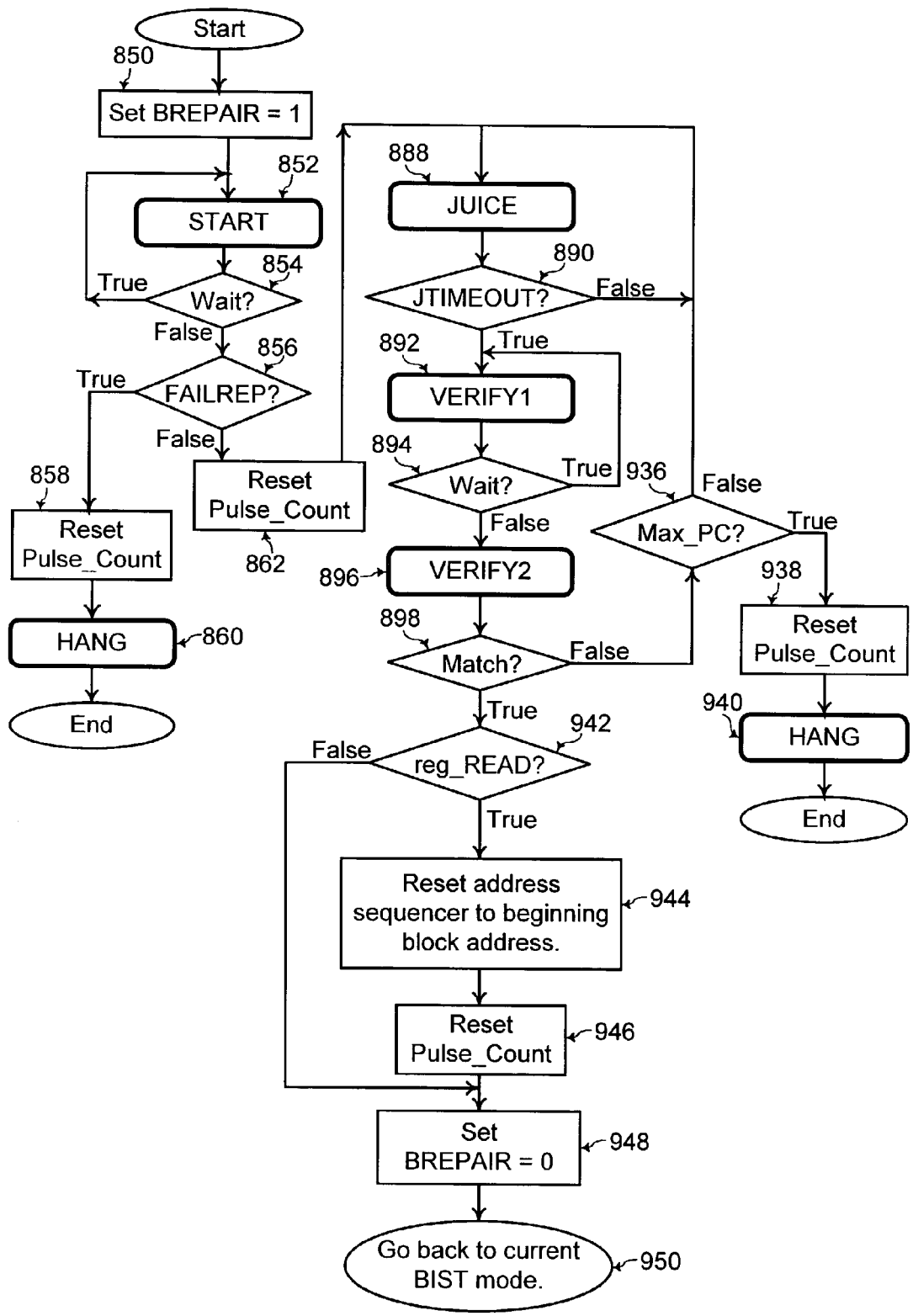
FIG. 27 shows a flow-chart of steps of the repair routine during operation of the components of FIG. 26 for on-chip repair of the defective address of core flash memory cells, according to an embodiment of the present invention.

FIG. 27 shows a flow-chart of steps during operation of the on-chip repair components 830 of FIG. 26 for performing the repair routine 770 of FIG. 21 or 776 of FIG. 23. In one embodiment of the present invention, the repair controller 832 of FIG. 26 is implemented as the back-end BIST controller 502 of FIG. 13. When the repair controller 832 determines that the repair routine (such as step 770 of FIG. 21 or 776 of FIG. 23 for example) is invoked, the repair controller 832 sets a BREPAIR variable to a logical high state from the logical low state (step 850 of FIG. 27) to indicate that the repair routine is being invoked.

When the repair routine is invoked, the repair controller 832 enters the START state (step 852 in FIG. 27). During the START state, the timer 834 times a predetermined wait time period to reset the regulation capacitors within the voltage sources 836 that provide the voltage to be applied on the word-lines of the CAM flash memory cells. Resetting the regulation capacitors within the voltage sources 836 that provide the voltage to be applied on the word-lines of the CAM flash memory cells is known to one of ordinary skill in the art of flash memory devices. Before expiration of the wait time period (Wait=True), the repair controller 832 remains within the START state (step 854 of FIG. 27). Timers for timing a predetermined time period are known to one of ordinary skill in the art.

Figure 29:
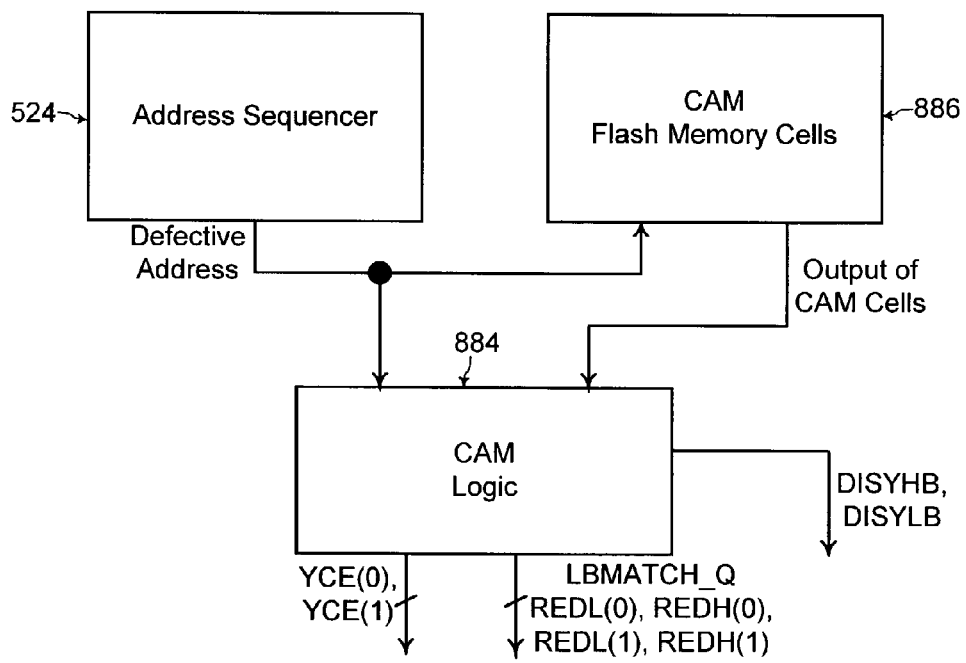
FIG. 29 illustrates a CAM (content addressable memory) logic of the prior art for generating variables used during verification of proper programming of the CAM (content addressable memory)

In addition, during the START state, referring to FIG. 29, variables YCE(0) and YCE(1) are generated by a CAM (content addressable memory) logic 884 fabricated along with the CAM (content addressable memory) 790. The CAM flash memory cells 886 in FIG. 29 represent one of the respective sets of CAM flash memory cells 792, 796, 800, 804, 808, 812, 816, or 820 in FIG. 25 for example that is programmed for replacing a defective address of core flash memory cells with a redundancy element of flash memory cells. The CAM logic 884 inputs the defective address from the address sequencer 524 and the output of the CAM flash memory cells 886 after such CAM flash memory cells 886 are programmed and generates variables of YCE(0), YCE(1), LBMATCH_Q, REDL(0), REDH(0), REDL(1), and REDH(1).

In one embodiment of the present invention, each address of core flash memory cells is for sixteen core flash memory cells as described in reference to FIGS. 16 and 17. In a further embodiment of the present invention, each byte from eight of the sixteen core flash memory cells is repaired a byte at a time. Each defective address of sixteen core flash memory cells is comprised of a low byte of eight core flash memory cells and a high byte of eight core flash memory cells. In the embodiment when the defective address of sixteen flash memory cells is repaired a byte at a time, each of two redundancy elements of flash memory cells replaces a byte of a defective address of sixteen flash memory cells within each of the blocks of core flash memory cells 783, 784, 786, and 788 in the example of FIG. 25.

Referring to FIG. 29, the variables LBMATCH_Q, YCE(0), YCE(1), REDL(0), REDH(0), REDL(1), and REDH(1) are generated by the CAM logic 884 to keep track of which of the two redundancy elements has been used to replace which of the two bytes of a defective address of core flash memory cells. The CAM logic compares the defective address as generated by the address sequencer 524 and the output of the respective set of CAM flash memory cells programmed within the CAM (content addressable memory) 886 for repairing the defective address of flash memory cells and generates a respective logical state for each of the variables LBMATCH_Q, YCE(0), YCE(1), REDL(0), REDH(0), REDL(1), and REDH(1) depending on the prior respective logical state for each of such variables.

The LBMATCH_Q variable indicates whether a defective flash memory cell is present in the low byte or the high byte of the defective address of core flash memory cells. If a defective flash memory cell is present in the low byte of the defective address of core flash memory cells, then the LBMATCH_Q variable is set to a logical low state (i.e. a "0" state). On the other hand, if a defective flash memory cell is present in the high byte of the defective address of core flash memory cells, then the LBMATCH_Q variable is set to a logical high state (i.e. a "1" state).

Initially, each of the variables YCE(0), YCE(1), REDL(0), REDH(0), REDL(1), and REDH(1) is set to a logical low state (i.e. a "0" state). In addition, initially before any redundancy elements are used for repairing any defective address within one of the blocks of core flash memory cells 783, 784, 786, and 788, two redundancy elements of flash memory cells are available for repairing any defective byte of defective address of flash memory cells. When a first one of the two redundancy elements is used for repairing a byte of a defective address of core flash memory cells, the YCE(0) variable corresponding to that first one of the two redundancy elements is set to a logical high state (i.e. a "1" state), and that first one of the two redundancy elements is no longer available. Then, when a second one of the two redundancy elements is used for repairing a byte of a defective address of core flash memory cells, the YCE(1) variable corresponding to that second one of the two redundancy elements is set to a logical high state (i.e. a "1" state), and that second one of the two redundancy elements is no longer available such that no more redundancy elements are available for repairing any defective address of core flash memory cells within the current one of the blocks of core flash memory cells 783, 784, 786, and 788.

The REDL(0) variable is set to a logical high state (i.e. a "1" state) when the low byte of the defective address of core flash memory cells is repaired using the first one of the two redundancy elements. On the other hand, the REDH(0) variable is set to a logical high state (i.e. a "1" state) when the high byte of the defective address of core flash memory cells is repaired using the first one of the two redundancy elements. Only one of the low or high bytes of the defective address of core flash memory cells is repaired using any one of the redundancy elements. Thus, only one of the REDL(0) and REDH(0) variables is set to the logical high state.

Similarly, the REDL(1) variable is set to a logical high state (i.e. a "1" state) when the low byte of the defective address of core flash memory cells is repaired using the second one of the two redundancy elements. On the other hand, the REDH(1) variable is set to a logical high state (i.e. a "1" state) when the high byte of the defective address of core flash memory cells is repaired using the second one of the two redundancy elements. Only one of the low or high bytes of the defective address of core flash memory cells is repaired using any one of the redundancy elements. Thus, only one of the REDL(1) and REDH(1) variables is set to the logical high state.

In addition, referring to FIGS. 26 and 29, the CAM logic 884 generates DISYHB and DISYLB signals that are sent to a Y-address decoder 781 coupled to the core flash memory cells 780. When the content of an address of the core flash memory cells 780 is accessed, the Y-address decoder decodes such an address to select the output of the flash memory cells of such an address. The DISYHB and DISYLB signals are generated by the CAM logic 884 to disable the Y-address decoder 781 from outputting the content of a defective address of the core flash memory cells 780.

Such a CAM logic 884 for generating the signals LBMATCH_Q, YCE(0), YCE(1), REDL(0), REDH(0), REDL(1), REDH(1), DISYHB, and DISYLB as described herein is known to one of ordinary skill in the art of flash memory devices. In addition, such a Y-address decoder 781 as described herein is known to one of ordinary skill in the art of flash memory devices.

During the START state (steps 852 and 854 of FIG. 27), the CAM logic 884 generates the respective logical state for each of the YCE(0) and YCE(1) signals. After expiration of the wait time period (Wait=False) within the START state, the repair controller 832 checks the FAILREP value from the FAILREP logic 848 (step 856 of FIG. 27). The FAILREP logic 848 determines whether any redundancy element is available to repair the current defective address of flash memory cells. Referring to FIG. 25 for example, two redundancy elements are available for repairing defective addresses within each one of the blocks 783, 784, 786, and 788 of flash memory cells. If the two redundancy elements have already been used to repair defective addresses within one block of flash memory cells, then no more redundancy element is available to repair any more defective address within that one block of flash memory cells.

In addition, the FAILREP logic 848 determines whether the current defective address of flash memory cells has been previously repaired already. If the current defective address of flash memory cells has been previously repaired already, then that defective address of flash memory cells is determined to be permanently defective and cannot be repaired. In either the case of no more redundancy element being available or the current defective address of flash memory cells having been previously repaired already, the FAILREP logic 848 sets the FAILREP variable to a logical high state (i.e., the True state). On the other hand, if a redundancy element is available and if the current defective address of flash memory cells has not been previously repaired, then the FAILREP logic 848 sets the FAILREP variable to a logical low state (i.e., the False state).

Referring to FIG. 27, if the FAILREP variable is set to the logical high state, then the PULSE_COUNT variable is reset to zero (step 858 of FIG. 27) and the HANG state is entered (step 860 of FIG. 27) to terminate the repair routine and the current BIST mode. On the other hand, if the FAILREP variable is set to the logical low state, then the PULSE_COUNT variable is reset to zero (step 862 of FIG. 27), and the repair routine continues.

Figure 28:
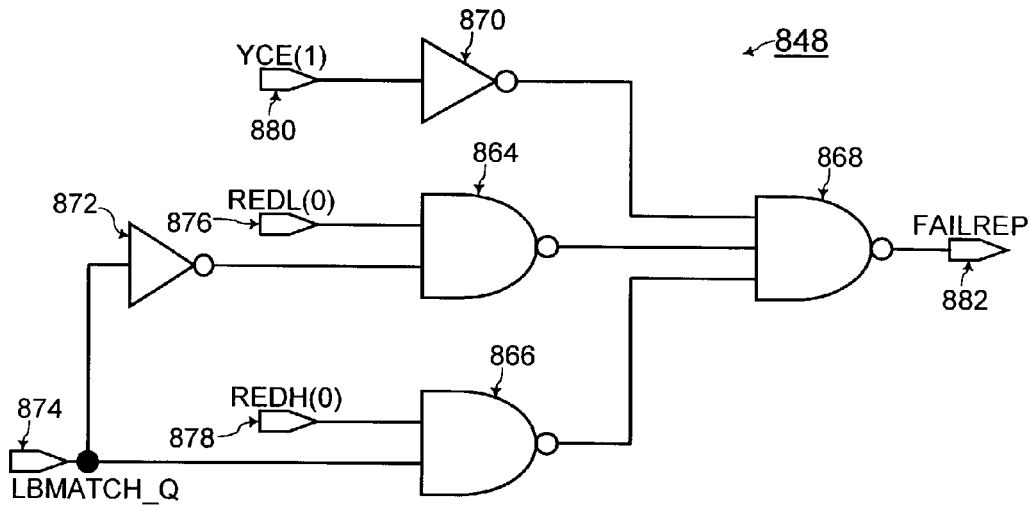
FIG. 28 shows an example implementation of a FAILREP logic of FIG. 26, according to an embodiment of the present invention.

FIG. 28 shows an example implementation of the FAILREP logic 848 including a first NAND gate 864, a second NAND gate 866, a third NAND gate 868, a first inverter 870, and a second inverter 872. The first NAND gate 864 has as an input the output of the second inverter 872 which has the LBMATCH_Q variable applied at a first input terminal 874 as an input. The first NAND gate 864 also has an input the REDL(0) variable applied at a second input terminal 876. The second NAND gate 866 has as inputs the LBMATCH_Q variable applied at the first input terminal 874 and a REDH(0) variable applied at a third input terminal 878. The third NAND gate 868 has as an input the output of the first inverter 870 which has as an input a YCE (1) variable applied at a fourth input terminal 880 and has as further inputs the outputs of the first and second NAND gates 864 and 866. The output of the third NAND gate 868 provides the FAILREP variable at an output terminal 882.

FIG. 30 shows a table of possible logical states for the variables LBMATCH_Q, YCE(1), REDL(0), and REDH(0) as input to the FAILREP logic 848 of FIG. 28. Referring to FIGS. 28 and 30, if the YCE(1) variable is set to the logical high state (i.e. a "1" state), the FAILREP logic 848 generates the FAILREP value to be the logical low state irrespective of the respective logical state for each of the variables LBMATCH_Q, REDL(0), and REDH(0). The YCE(1) variable being set to the logical high state indicates that no more redundancy element is available for repairing any more defective address of core flash memory cells for the current one of the blocks of core flash memory cells 783, 784, 786, and 788. In that case, the FAILREP logic 848 generates the FAILREP value to be the logical high state, and the HANG state is entered in steps 858 and 860 in the flowchart of FIG. 27.

On the other hand, referring to FIGS. 28 and 30, if the YCE(1) variable is set to the logical low state (i.e. a "0" state), the respective logical state for each of the variables LBMATCH_Q, REDL(0), and REDH(0) determines the FAILREP variable output by the FAILREP logic 848. When the YCE(L) variable is set to the logical low state, a redundancy element is available to repair the current defective address of core flash memory cells. Referring to FIG. 30, when the LBMATCH_Q variable is set to the logical low state to indicate that a defective flash memory cell is within the low byte of the current defective address of core flash memory cells, the logical state of the REDL(0) variable determines the FAILREP variable output by the FAILREP logic 848. On the other hand, when the LBMATCH_Q variable is set to the logical high state to indicate that a defective flash memory cell is within the high byte of the current defective address of core flash memory cells, the logical state of the REDH(0) variable determines the FAILREP variable output by the FAILREP logic 848.

When the LBMATCH_Q variable is set to the logical low state, the FAILREP variable output by the FAILREP logic 848 is the logical high state if the REDL(0) variable is the logical high state and is the logical low state if the REDL(0) variable is the logical low state, irrespective of the logical state of the REDH(0) value. When the LBMATCH_Q variable is set to the logical low state and the REDL(0) variable is the logical high state, then the FAILREP logic 848 determines that the low byte of the current defective address of core flash memory cells was priorly repaired already using the first one of the redundancy elements. In that case, the FAILREP variable is set to the logical high state, and the HANG state is entered in steps 858 and 860 in the flowchart of FIG. 27. On the other hand, when the LBMATCH_Q variable is set to the logical low state and the REDL(0) variable is the logical low state, then the FAILREP logic 848 determines that the low byte of the current defective address of core flash memory cells was not priorly repaired. In that case, the FAILREP variable is set to the logical low state when the YCE(1) variable is also set to the logical low state, and the repair routine continues in FIG. 27.

Similarly, when the LBMATCH_Q variable is set to the logical high state, the FAILREP variable output by the FAILREP logic 848 is the logical high state if the REDH(0) variable is the logical high state and is the logical low state if the REDH(0) variable is the logical low state, irrespective of the logical state of the REDL(0) value. When the LBMATCH_Q variable is set to the logical high state and the REDH(0) variable is the logical high state, then the FAILREP logic 848 determines that the high byte of the current defective address of core flash memory cells was priorly repaired already using the first one of the redundancy elements. In that case, the FAILREP variable is set to the logical high state, and the HANG state is entered in steps 858 and 860 in the flowchart of FIG. 27. On the other hand, when the LBMATCH_Q variable is set to the logical high state and the REDH(0) variable is the logical low state, then the high byte of the current defective address of core flash memory cells was not priorly repaired. In that case, the FAILREP variable is set to the logical low state when the YCE(1) variable is also set to the logical low state, and the repair routine continues in FIG. 27.

When the repair routine continues after the FAILREP logic 848 sets the FAILREP variable to the logical low state, the PULSE_COUNT is reset to zero (step 862 of FIG. 27), and the repair controller 832 enters the JUICE state (step 888 of FIG. 27). Referring to FIGS. 26 and 27, during the JUICE state, the repair controller 832 controls the CAM program voltage source 838 to apply programming voltages on a respective set of CAM flash memory cells. With such programming voltages, the respective set of CAM flash memory cells are programmed with the current defective address of core flash memory cells such that access to the current defective address of core flash memory cells is redirected to a corresponding redundancy element of flash memory cells. In one embodiment of the present invention, one of the low byte or high byte of the current defective address of core flash memory cells is repaired with access to such one of the low byte or high byte of the current defective address of core flash memory cells being redirected to the corresponding redundancy element of flash memory cells.

In addition, the DISYHB and DISYLB signals are generated by the CAM logic 884 to disable the Y-address decoder 781 from outputting the content of a defective address of the core flash memory cells 780. The DISYHB signal is asserted by the CAM logic 884 to disable the Y-address decoder 781 from outputting the content of the high byte of a defective address of the core flash memory cells 780. The DISYLB signal is asserted by the CAM logic 884 to disable the Y-address decoder 781 from outputting the content of the low byte of a defective address of the core flash memory cells 780.

Programming voltages for programming CAM flash memory cells are known to one of ordinary skill in the art of flash memory manufacture. In addition, processes for fabricating the CAM program voltage source 838, on the semiconductor die having the core flash memory cells 780 fabricated thereon, for generating such programming voltages applied on selected CAM flash memory cells are known to one of ordinary skill in the art of flash memory manufacture.

The timer 834 times a juice time period, JTIMEOUT, for applying such programming voltages on the respective set of CAM flash memory cells during the JUICE state (step 890 in FIG. 27). Before expiration of the juice time period (JTIMEOUT=False), the repair controller 832 remains within the JUICE state to apply the programming voltages on the respective set of CAM flash memory cells for the juice time period, JTIMEOUT.

After expiration of the juice time period (JTIMEOUT=TRUE), the repair controller 832 goes to the VERIFY1 state (step 892 of FIG. 27). During the VERIFY1 state, the timer 834 times a predetermined wait time period before margining voltages from the CAM margin voltage source 840 are applied on the respective set of CAM flash memory cells for the VERIFY2 state such that the voltage levels from the CAM margin voltage source 840 are stabilized before the VERIFY2 state (step 894 in FIG. 27). Before expiration of the wait time period (Wait=True) within the VERIFY1 state, the repair controller 832 remains within the VERIFY1 state.

After expiration of the wait time period (Wait=False) within the VERIFY1 state, the repair controller 832 enters the VERIFY2 state (step 896 of FIG. 27). During the VERIFY2 state, the repair controller 832 controls the CAM margin voltage source 840 to apply margining voltages on the respective set of CAM flash memory cells that were programmed in the JUICE state in step 888 of FIG. 27. Margining voltages are verifying voltages that are applied on each flash memory cell of the respective set of CAM flash memory cells that were programmed in the JUICE state for verifying that such flash memory cells were properly programmed after the JUICE state.

Such margining voltages for verifying that such flash memory cells were properly programmed after the JUICE state are known to one of ordinary skill in the art of flash memory manufacture. In addition, processes for fabricating the CAM margin voltage source 840, on the semiconductor die having the core flash memory cells 780 fabricated thereon, for generating such margining voltages are known to one of ordinary skill in the art of flash memory manufacture.

During the VERIFY2 state, the repair controller 832 receives a REDOK variable generated by the repair matching unit 846 during a MATCH step (step 898 of FIG. 27). Referring to FIG. 29, after the programming voltages have been applied during the JUICE state (step 888 of FIG. 27) and then after the margining voltages have been applied on the respective set of CAM flash memory cells for replacing the current defective address of core flash memory cells with the redundancy element of flash memory cells, the CAM logic 884 of FIG. 29 compares the output of such respective CAM flash memory cells with the current defective address from the address sequencer 524 to generate the YCE(0), YCE(1), REDL(0), REDH(0), REDL(1), and REDH(1) variables.

As described herein, the YCE(0), YCE(1), REDL(0), REDH(0), REDL(1), and REDH(1) variables are generated by the CAM logic 884 of FIG. 29 to keep track of which of the two redundancy elements has been used to replace which of the two bytes of a defective address of core flash memory cells. The CAM logic compares the defective address as generated by the address sequencer 524 and the output of the respective set of flash memory cells programmed within the CAM (content addressable memory) 790 for repairing the current defective address of flash memory cells and generates a respective logical state for each of the variables YCE(0), YCE(1), REDL(0), REDH(0), REDL(1), and REDH(1) depending on the prior respective logical state for each of such variables.

Initially, each of the variables YCE(0), YCE(1), REDL(0), REDH(0), REDL(1), and REDH(1) is set to a logical low state (i.e. a "0" state). In addition, initially before any redundancy element is used for repairing any defective address within one of the blocks of core flash memory cells 783, 784, 786, and 788, two redundancy elements of flash memory cells are available for repairing any defective byte of a defective address of flash memory cells. When a first one of the two redundancy elements is used for repairing a byte of a defective address of core flash memory cells, the YCE(0) variable corresponding to that first one of the two redundancy elements is set to a logical high state (i.e. a "1" state), and that first one of the two redundancy elements is no longer available. Then, when a second one of the two redundancy elements is used for repairing a byte of a defective address of core flash memory cells, the YCE(1) variable corresponding to that second one of the two redundancy elements is set to a logical high state (i.e. a "1" state), and that second one of the two redundancy elements is no longer available such that no more redundancy elements are available for repairing any defective address of core flash memory cells within the current one of the blocks of core flash memory cells 783, 784, 786, and 788.

The REDL(0) variable is set to a logical high state (i.e. a "1" state) when the low byte of the defective address of core flash memory cells is repaired using the first one of the two redundancy elements. On the other hand, the REDH(0) variable is set to a logical high state (i.e. a "1" state) when the high byte of the defective address of core flash memory cells is repaired using the first one of the two redundancy elements. Only one of the low or high bytes of the defective address of core flash memory cells is repaired using any one of the redundancy elements. Thus, only one of the REDL(0) and REDH(0) variables is set to the logical high state.

Similarly, the REDL(1) variable is set to a logical high state (i.e. a "1" state) when the low byte of the defective address of core flash memory cells is repaired using the second one of the two redundancy elements. On the other hand, the REDH(1) variable is set to a logical high state (i.e. a "1" state) when the high byte of the defective address of core flash memory cells is repaired using the second one of the two redundancy elements. Only one of the low or high bytes of the defective address of core flash memory cells is repaired using any one of the redundancy elements. Thus, only one of the REDL(1) and REDH(L) variables is set to the logical high state.

Referring to FIG. 26, the redundancy element order latch 842 inputs the YCE(0) variable for keeping track of which of the two redundancy elements available for the current one of the blocks core flash memory cells 783, 784, 786, and 788 is currently being used. If the YCE(0) variable is set to the logical low state (i.e., the "0" state), the YCE(0) variable indicates that the first one of the two redundancy elements is available. In that case, the redundancy element order latch 842 sets a BREP01 variable to a logical low state (i.e., the "0" state) to indicate that the first one of the two redundancy elements is to be used to repair the current defective address of core flash memory cells. On the other hand, if the YCE(0) variable is set to the logical high state (i.e., the "1" state), the YCE(0) variable indicates that the first one of the two redundancy elements has already been used and is not available and that the second one of the two redundancy elements is available. In that case, the redundancy element order latch 842 sets a BREP01 variable to a logical high state (i.e., the "1" state) to indicate that the second one of the two redundancy elements is to be used to repair the current defective address of core flash memory cells. Implementations of general latches for the redundancy element order latch 842 are known to one of ordinary skill in the art of electronics.

Figure 31:
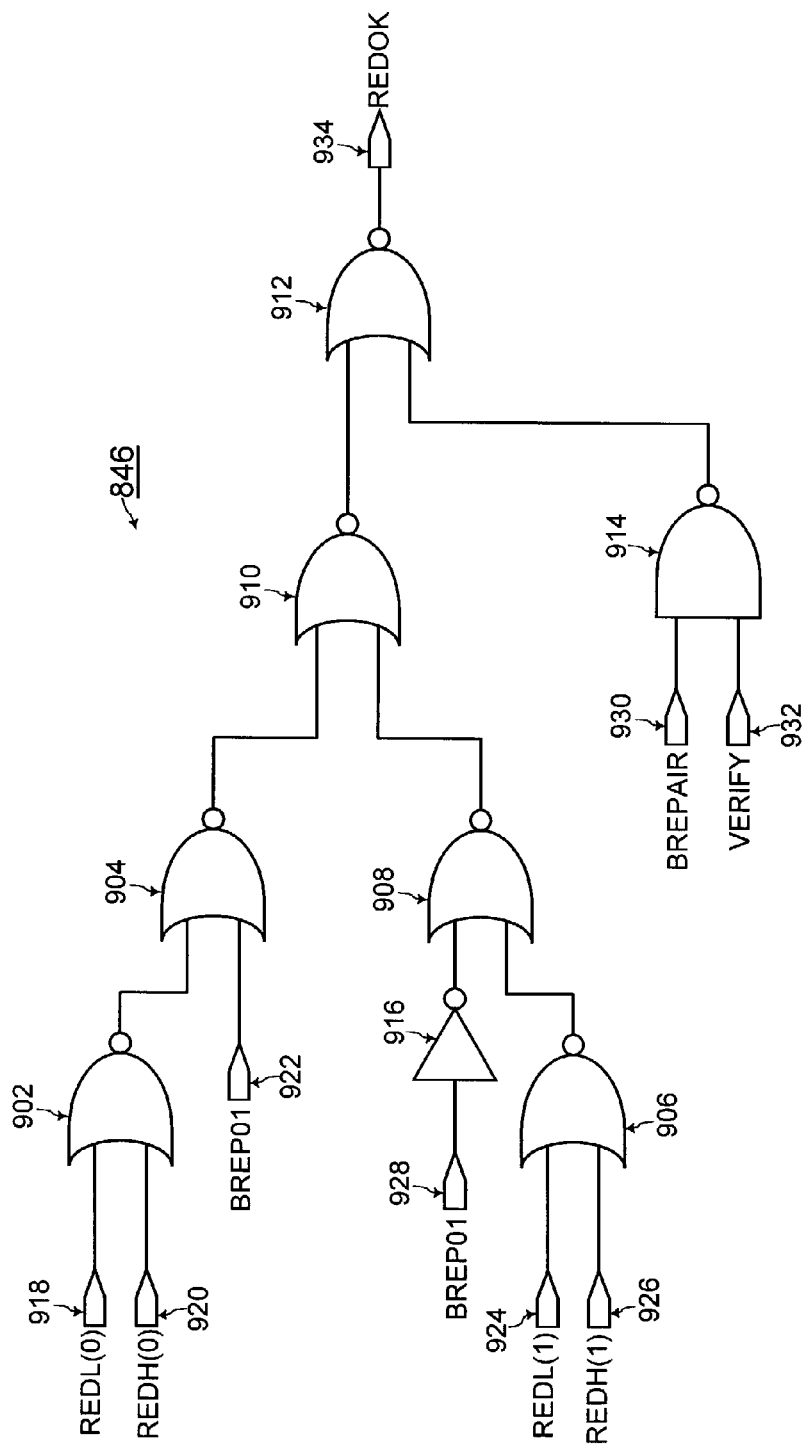
FIG. 31 shows an example implementation of a repair matching unit of FIG. 26, according to an embodiment of the present invention.

FIG. 31 shows an example implementation of the repair matching unit 846 including a first NOR gate 902, a second NOR gate 904, a third NOR gate 906, a fourth NOR gate 908, a fifth NOR gate 910, a sixth NOR gate 912, a NAND gate 914, and an inverter 916. The first NOR gate 902 has as inputs the REDL(0) variable applied on a first input terminal 918 and the REDH(0) variable applied on a second input terminal 920. The second NOR gate 904 has as inputs the output of the first NOR gate 902 and the BREP01 variable applied on a third input terminal 922. The third NOR gate 906 has as inputs the REDL(1) variable applied on a fourth input terminal 924 and the REDH(1) variable applied on a fifth input terminal 926. The fourth NOR gate 908 has as inputs the output of the third NOR gate 906 and the output of the inverter 916 which has as the input the BREP01 variable applied on a sixth input terminal 928.

The fifth NOR gate 910 has as inputs the output of the second NOR gate 904 and the output of the fourth NOR gate 908. The NAND gate 914 has as inputs the BREPAIR variable applied on a seventh input terminal 930 and the VERIFY variable applied on an eighth input terminal 932. The sixth NOR gate 912 has as inputs the output of the fifth NOR gate 910 and the output of the NAND gate 914. The output of the sixth NOR gate 912 provides the REDOK variable on the output terminal 934.

During the MATCH step 898 of FIG. 27, the BREPAIR variable is set to the logical high state (i.e., a "1" state) and the VERIFY variable is set to the logical high state (i.e., a "1" state) by the repair controller 832. In that case, the BREP01, REDL(0), REDH(0), REDL(1), and the REDH(1) variables determine the logical state of the output REDOK of the repair matching unit 846 of FIG. 31. FIG. 32 shows a table of possible logical states for the BREP01, REDL(0), REDH(0), REDL(1), and the REDH(1) variables as input to the repair matching unit 846 of FIG. 31. The BREP01 variable is generated by the redundancy element order latch 842 as described herein, and the REDL(0), REDH(0), REDL(1), and the REDH(1) variables are generated by the CAM logic 884 of FIG. 29 as described herein.

Referring to FIGS. 31 and 32, the BREP01 variable is set to the logical low state (i.e., the "0" state) by the redundancy element order latch 842 to indicate that the first one of the two redundancy elements is being used for repairing one of the low or high bytes of the current defective address of core flash memory cells. Alternatively, the BREP01 variable is set to the logical high state (i.e., the "1" state) by the redundancy element order latch 842 to indicate that the second one of the two redundancy elements is being used for repairing one of the low or high bytes of the current defective address of core flash memory cells.

Referring to FIGS. 31 and 32, when the BREP01 variable is set to the logical low state (i.e., the "0" state), the REDL(0) and REDH(0) variables determine the logical state of the REDOK output, irrespective of the respective logical state of each of the REDL(1) and REDH(1) variables. In that case, one of the REDL(0) and REDH(0) variables is set to the logical high state to indicate that the first one of the two redundancy elements has been used to repair one of the low byte or the high byte of the current defective address of core flash memory cells.

When the REDL(0) is set to the logical high state (instead of the REDH(0) variable), the first one of the two redundancy elements has been used to repair the low byte of the current defective address of core flash memory cells. When the REDH(0) is set to the logical high state (instead of the REDL(0) variable), the first one of the two redundancy elements has been used to repair the high byte of the current defective address of core flash memory cells. In either case, the respective CAM flash memory cells have been properly programmed such that the first one of the two redundancy elements has been properly used to repair one of the low byte or the high byte of the current defective address of core flash memory cells. Thus, when the BREP01 variable is set to the logical low state and one of the REDL(0) and REDH(0) variables is set to the logical high state, the REDOK variable output by the repair matching unit 848 is set to the logical high state.

On the other hand if the BREP01 variable is set to the logical low state and both of the REDL(0) and REDH(0) variables are set to the logical low state by the CAM logic 884, then the respective CAM flash memory cells have not been properly programmed such that the first one of the two redundancy elements has not been properly used to repair one of the low byte or the high byte of the current defective address of core flash memory cells. In that case, the REDOK variable output by the repair matching unit 848 is set to the logical low state.

Similarly, referring to FIGS. 31 and 32, when the BREP01 variable is set to the logical high state (i.e., the "1" state), the REDL(1) and REDH(1) variables determine the logical state of the REDOK output, irrespective of the respective logical state of each of the REDL(0) and REDH(0) variables. In that case, one of the REDL(1) and REDH(1) variables is set to the logical high state to indicate that the second one of the two redundancy elements has been used to repair one of the low byte or the high byte of the current defective address of core flash memory cells.

When the REDL(1) is set to the logical high state (instead of the REDH(1) variable), the second one of the two redundancy elements has been used to repair the low byte of the current defective address of core flash memory cells. When the REDH(1) is set to the logical high state (instead of the REDL(1) variable), the second one of the two redundancy elements has been used to repair the high byte of the current defective address of core flash memory cells. In either case, the respective CAM flash memory cells have been properly programmed such that the second one of the two redundancy elements has been properly used to repair one of the low byte or the high byte of the current defective address of core flash memory cells. Thus, when the BREP01 variable is set to the logical high state and one of the REDL(1) and REDH(1) variables is set to the logical high state, the REDOK variable output by the repair matching unit 848 is set to the logical high state.

On the other hand if the BREP01 variable is set to the logical high state and both of the REDL(1) and REDH(1) variables are set to the logical low state by the CAM logic 884, then the respective CAM flash memory cells have not been properly programmed such that the second one of the two redundancy elements has not been properly used to repair one of the low byte or the high byte of the current defective address of core flash memory cells. In that case, the REDOK variable output by the repair matching unit 748 is set to the logical low state.

Referring to FIG. 27, if the REDOK variable is set to the logical low state (i.e., the False state), then the respective CAM flash memory cells have not been properly programmed for repairing the current defective address of core flash memory cells. In that case, the repair controller 832 checks the PULSE_COUNT variable to a Max_PC (maximum pulse count) (step 936 of FIG. 27). If the PULSE_COUNT is less than Max_PC, then the repair controller 832 repeats the JUICE state and the VERIFY2 state (steps 888, 890, 892, 894, 896, and 898 of FIG. 27), and the PULSE_COUNT is incremented by one. In that case, the repair controller 832 controls the CAM program voltage source 838 to reapply the programming voltages on the respective CAM flash memory cells for repairing the current defective address of core flash memory cells for the juice time period, JTIMEOUT. In addition, during the VERIFY2 state, the REDOK variable is regenerated by the repair matching unit 846 with the new values of the REDL(0), REDH(0), REDL (1), and REDH(1) variables from the CAM logic 884 after this reapplication of the programming voltages.

The repair controller repeats the JUICE state and the VERIFY2 state (steps 888, 890, 892, 894, 896, and 898 of FIG. 27) with increment of the PULSE_COUNT every time the REDOK variable is set to the logical low state until the REDOK variable is set to the logical high state with the PULSE_COUNT not exceeding the Max_PC (maximum pulse count) or until the PULSE_COUNT exceeds the Max_PC (maximum pulse count) with the REDOK variable remaining set to the logical low state. When the PULSE_COUNT exceeds the Max_PC (maximum pulse count) with the REDOK variable remaining set to the logical low state, the PULSE_COUNT variable is reset to zero (step 938 of FIG. 27), and the HANG state is entered (step 940 of FIG. 27) to terminate the repair routine of FIG. 27. In that case, the repair routine is not successful in replacing the current defective address of core flash memory cells with a redundancy element of flash memory cells.

On the other hand, if the REDOK variable is set to the logical high state with the PULSE_COUNT not exceeding the Max_PC (maximum pulse count), then the repair routine continues. In that case, the repair routine is successful in replacing the low byte or high byte of the current defective address of flash memory cells with a redundancy element of flash memory cells. In addition, a reg_READ variable is checked by the repair controller 832 (step 942 of FIG. 27). The reg_READ variable is set to a logical high state by the front-end decoder 314 of the BIST system 300 for example when the current BIST mode is for reading a respective logical state of each flash memory cell of the array of core flash memory cells without applying programming or erasing voltages on the core flash memory cells such as for the BIST mode illustrated by the flowchart of FIG. 23. Otherwise, the reg_READ variable is set to a logical low state such as for the BIST mode illustrated by the flowchart of FIG. 21.

If the reg_READ variable is set to the logical high state, then the repair controller 832 resets the address sequencer 524 to a beginning address of the current block of core flash memory cells containing the defective address of core flash memory cells (step 944 of FIG. 27), and the PULSE_COUNT is reset to zero (step 946 of FIG. 27). For example, referring to FIG. 24, the defective address of core flash memory cells 750 is contained within the third block 786 of core flash memory cells. In such an example, if the reg_READ variable is set to the logical high state, then the repair controller 832 resets the address sequencer 524 to a beginning address of the third block 786 of core flash memory cells. With such resetting of the address sequencer 524 to a beginning address of the current block of core flash memory cells, the BIST mode for reading a respective logical state of each flash memory cell of the array of core flash memory cells is performed for the whole block of core flash memory cells containing the defective address of core flash memory cells with the replacement by the redundancy element of flash memory cells to further ensure proper repair using such an redundancy element of flash memory cells.

Referring to FIG. 27, after the repair controller 832 resets the address sequencer 524 to a beginning address of the current block of core flash memory cells containing the defective address of core flash memory cells (step 944 of FIG. 27) and after the PULSE_COUNT is reset to zero (step 946 of FIG. 27) when the reg_READ variable is set to the logical high state, the BREPAIR variable is set to the logical low state (i.e., the "0" state) (step 948 of FIG. 27), and the repair routine returns to the current BIST mode that invoked the repair routine (step 950 of FIG. 27). On the other hand, if the regREAD variable is set to the logical low state, the BREPAIR variable is set to the logical low state (i.e., the "0" state) (step 948 of FIG. 27), and the repair routine returns to the current BIST mode that invoked the repair routine (step 950 of FIG. 27) without performance of steps 944 and 946 of FIG. 27.

For example, when the repair routine 770 returns to the current BIST mode of FIG. 21, the steps including and after the START state 552 are performed again for the current defective address of core flash memory cells that has been repaired with replacement by the redundancy element of flash memory cells. Alternatively, when the repair routine 776 returns to the current BIST mode of FIG. 23, the steps including and after the START state 682 are performed again from a beginning address of the current block of core flash memory cells containing the defective address of core flash memory cells but with replacement by the redundancy element of flash memory cells within the current block of core flash memory cells.

In this manner, the repair of a defective address of flash memory cells during testing of the array of core flash memory cells 780 by programming the CAM (content addressable memory) 790 to replace the defective address of flash memory cells with the redundancy element of flash memory cells 782 is performed on-chip. Thus, pins from the external test system are not used for programming the CAM (content addressable memory) to replace the defective address of flash memory cells with the redundancy element of flash memory cells. With use of such minimized number of pins from the external test system, a higher number of semiconductor dies may be tested and repaired concurrently by the external test system having a limited total number of pins, to maximize throughput during manufacture of flash memory devices.

In addition, because such repair by programming the CAM flash memory cells is performed on-chip, the speed of performing such a repair mechanism is not limited by the capacity of the external test system. Thus, such an on-chip repair mechanism may be more efficient.

The foregoing is by way of example only and is not intended to be limiting. For example, the present invention may be practiced for a larger number of available redundancy elements of flash memory cells. Any numbers described or illustrated herein are by way of example only. In addition, the present invention may be practiced for replacing a whole defective address of core flash memory cells with a redundancy element of flash memory cells instead of for replacing a byte of the defective address of core flash memory cells, as would be apparent to one of ordinary skill in the art of flash memory manufacture from the description herein. The present invention is limited only as defined in the following claims and equivalents thereof.

E. Diagnostic Mode for Testing Functionality of BIST (Built-in-Self-Test) Back-End State Machine The accuracy of testing the array of core flash memory cells 304 with the BIST system 300 is ensured by also testing for the functionality of the components of the BIST system 300 of FIG. 7, especially the back-end BIST state machine 316. With such testing for ensuring functionality of the components of the BIST system 300, when the array of core flash memory cells 304 is deemed non-functional after testing with the BIST system 300, such non-functionality is relied upon to arise from a defect within the array of core flash memory cells 304 and not from a defect within the components of the BIST system 300 of FIG. 7.

Figure 33:
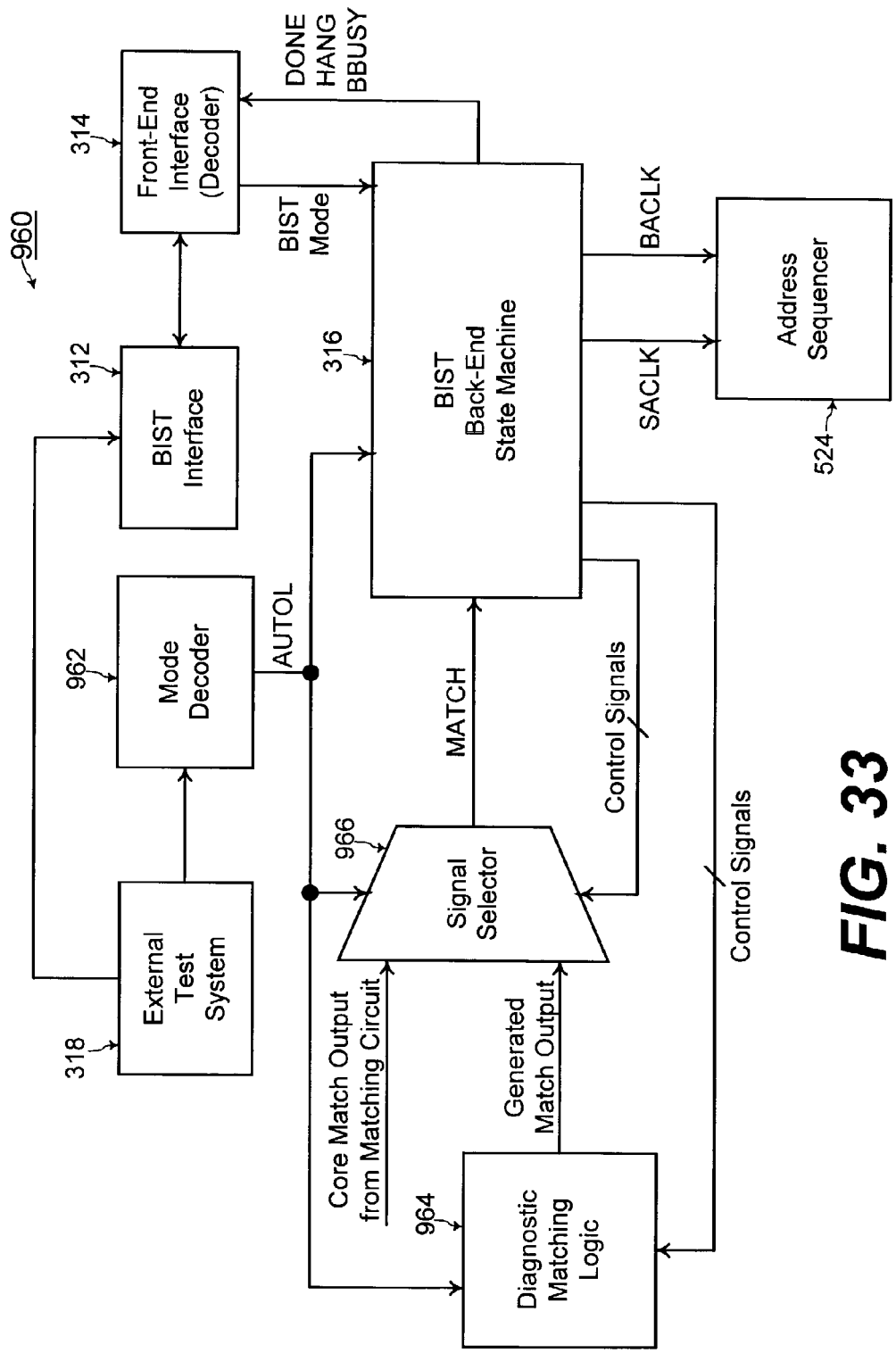
FIG. 33 shows components of a system for testing the functionality of the back-end state machine of the BIST (built-in-self-test) system fabricated on a semiconductor die having the array of core flash memory cells fabricated thereon irrespective of a functionality of the array of core flash memory cells, according to another aspect of the present invention.

In another embodiment of the present invention, the functionality of the BIST (built-in-self-test) back-end state machine 316 is determined independent of the functionality of the array of core flash memory cells 304. Referring to FIG. 33, a system 960 for determining the functionality of the BIST (built-in-self-test) back-end state machine 316 independent of the functionality of the array of core flash memory cells 304 includes a mode decoder 962, a diagnostic matching logic 964, and a signal selector 966. The BIST interface 312, the front-end interface 314, the BIST back-end state machine 316, the address sequencer 524, and the external test system 318 are similar as described herein.

The mode decoder 962 is coupled to the external test system 318, and the mode decoder 962 receives a bit pattern from the external test system 318 that sends a predetermined bit pattern for invoking a diagnostic mode for testing the functionality of the BIST back-end state machine 316. The mode decoder 962 decodes the bit pattern sent from the external test system 318 and sets an AUTOL signal to a logical high state (i.e. a "1" state) if the external test system 318 sends the predetermined bit pattern for invoking the diagnostic mode for testing the functionality of the BIST back-end state machine 316. The mode decoder 962 sets the AUTOL signal to a logical low state (i.e., a "0" state) otherwise. Implementation of bit pattern decoders for the mode decoder 962 is known to one of ordinary skill in the art of digital electronics.

The AUTOL signal is coupled from the mode decoder 962 to the diagnostic matching logic 964, the signal selector 966, and the BIST back-end state machine 316. The diagnostic matching logic 964 inputs the AUTOL signal and control signals from the back-end state machine 316 and generates a generated match output. The signal selector 966 inputs the generated match output from the diagnostic matching logic 964 and a core match output from the matching circuit 520 of FIG. 13. The signal selector 966 outputs a MATCH signal as one of the generated match output from the diagnostic matching logic 964 or the core match output from the matching circuit 520 depending on the AUTOL signal and depending on control signals from the BIST back-end state machine 316.

When the diagnostic mode for testing the functionality of the BIST back-end state machine 316 is invoked with the AUTOL signal being set to a logical high state, the signal selector 966 selects the generated match output from the diagnostic matching logic 964 as the MATCH signal sent to the BIST back-end state machine 316. On the other hand, when the diagnostic mode is not invoked with the AUTOL signal being set to a logical low state, the signal selector 966 selects the core match output from the matching circuit 520 as the MATCH signal sent to the BIST back-end state machine 316.

In either case, the BIST back-end state machine 316 uses the MATCH signal during a VERIFY state during a BIST (built-in-self-test) mode for determining whether such a BIST mode results in a pass state or a fail state, as described herein. The matching circuit 520 of FIG. 13 generates the core match output depending on a comparison of a desired bit pattern to a measured bit pattern of an address of the array of core flash memory cells 304. However, the diagnostic matching logic 964 generates the generated match output depending on the AUTOL signal from the mode decoder 962 and the control signals from the BIST back-end state machine 316. Thus, the generated match output from the diagnostic matching logic 964 is independent of the functionality of the array of core flash memory cells 304.

Figure 34:
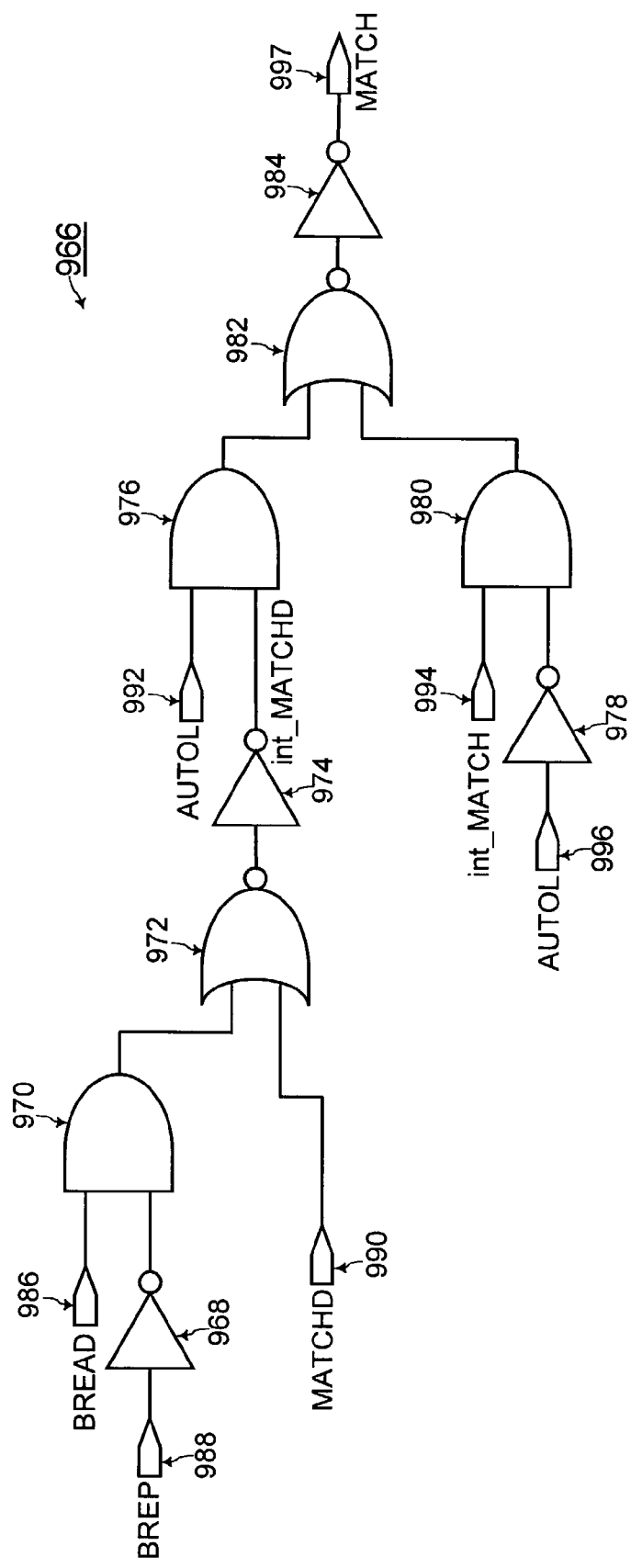
FIG. 34 shows an example implementation of a signal selector within the system of FIG. 33, according to an embodiment of the present invention.

FIG. 34 shows an example implementation of the signal selector 966 of FIG. 33 including a first inverter 968, a first AND gate 970, a first NOR gate 972, a second inverter 974, a second AND gate 976, a third inverter 978, a third AND gate 980, a second NOR gate 982, and a fourth inverter 984. The first AND gate 970 has as inputs a BREAD signal on a first input terminal 986 and the output of the first inverter 968 which has as an input a BREP signal on a second input terminal 988. The first NOR gate 972 has as inputs the output of the first AND gate 970 and a MATCHD signal on a third input terminal 990. The second AND gate 976 has as inputs the AUTOL signal on a fourth input terminal 992 and the output of the second inverter 974. The second inverter 974 has an input the output of the first NOR gate 972.

In addition, the third AND gate 980 has as inputs an int_MATCH signal on a fifth input terminal 994 and the output of the third inverter 978 which has as an input the AUTOL signal on a sixth input terminal 996. The second NOR gate 982 has as inputs the output of the second AND gate 976 and the output of the third AND gate 980. The fourth inverter 984 has as an input the output of the second NOR gate 982. The output of the fourth inverter 984 is the output of the signal selector that provides the MATCH signal at an output terminal 997.

The int_MATCH signal at the fifth input terminal 994 is the core match output from the matching circuit 520, and the MATCHD signal at the third input terminal 990 is the generated match output from the diagnostic matching logic 964. The AUTOL signal on the fourth input terminal 992 and the sixth input terminal 996 is the AUTOL signal generated by the mode decoder 962. The BREAD signal on the first input terminal 986 and the BREP signal on the second input terminal 988 are control signals from the BIST back-end state machine 316.

Figure 35:
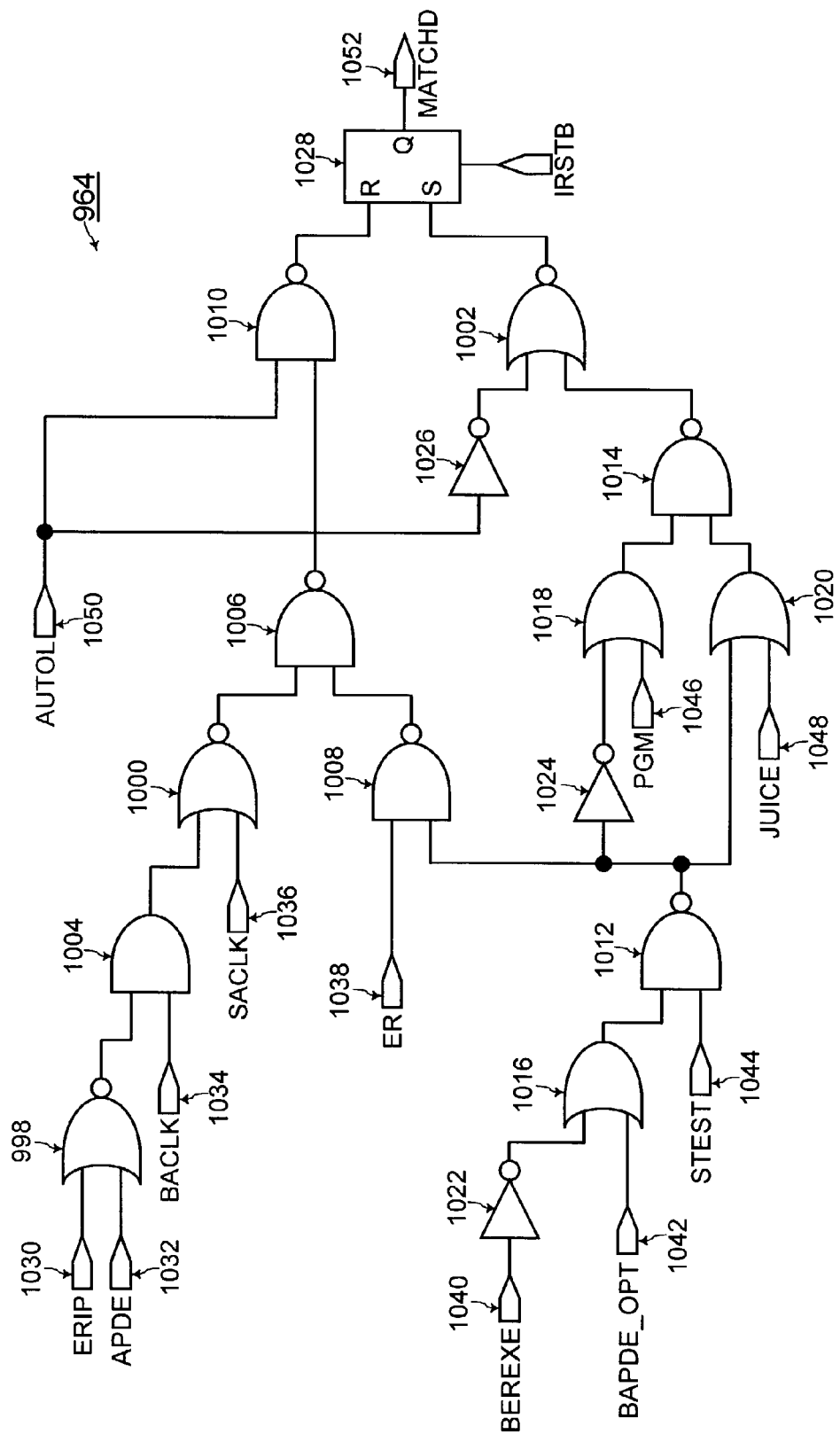
FIG. 35 shows an example implementation of a diagnostic matching logic within the system of FIG. 33, according to an embodiment of the present invention.

FIG. 35 shows an example implementation of the diagnostic matching logic 964 of FIG. 33 including a first NOR gate 998, a second NOR gate 1000, and a third NOR gate 1002. In addition, the diagnostic matching logic 964 includes a first AND gate 1004, a first NAND gate 1006, a second NAND gate 1008, a third NAND gate 1010, a fourth NAND gate 1012, and a fifth NAND gate 1014. The diagnostic matching logic 964 also includes a first OR gate 1016, a second OR gate 1018, and a third OR gate 1020, and a first inverter 1022, a second inverter 1024, and a third inverter 1026. Furthermore, the diagnostic matching logic 964 includes a latch 1028.

The first NOR gate 998 has as inputs an ERIP signal on a first input terminal 1030 and an APDE signal on a second input terminal 1032. The first AND gate 1004 has as inputs the output of the first NOR gate 998 and a BACLK signal on a third input terminal 1034. The second NOR gate 1000 has as inputs the output of the first AND gate 1004 and a SACLK signal on a fourth input terminal 1036. The second NAND gate 1008 has as inputs an ER signal on a fifth input terminal 1038 and the output of the fourth NAND gate 1012.

In addition, the first OR gate 1016 has as inputs the output of the first inverter 1022 which has as an input a BEREXE signal on a sixth input terminal 1040, and a BAPDE_OPT signal on a seventh input terminal 1042. The fourth NAND gate 1012 has as inputs the output of the first OR gate 1016 and a STEST signal on an eighth input terminal 1044. The second OR gate 1018 has as inputs the output of the second inverter 1024 which has as an input the output of the fourth NAND gate 1012, and a PGM signal on a ninth input terminal 1046. The third OR gate 1020 has as inputs the output of the fourth NAND gate 1012 and a JUICE signal on a tenth input terminal 1048.

Furthermore, the first NAND gate 1006 has as inputs the output of the second NOR gate 1000 and the output of the second NAND gate 1008. The fifth NAND gate 1014 has as inputs the output of the second OR gate 1018 and the output of the third OR gate 1020. The third NAND gate 1010 has as inputs the AUTOL signal on an eleventh input terminal 1050 and the output of the first NAND gate 1006. The third NOR gate 1002 has as inputs the output of the third inverter 1026 which has as an input the AUTOL signal on the eleventh input terminal 1050, and the output of the fifth NAND gate 1014.

The latch 1028 has as a reset input (i.e., "R" input) the output of the third NAND gate 1010 and has as a set input (i.e., "S" input) the output of the third NOR gate 1002. Additionally, the latch 1028 provides as a Q output the MATCHD signal at an output terminal 1052. The MATCHD signal is the generated match output provided to the signal selector 966 of FIGS. 33 and 34.

The AUTOL signal on the eleventh input terminal 1050 is generated by the mode decoder 962 of FIG. 33. The ERIP signal on the first input terminal 1030, the APDE signal on the second input terminal 1032, the BACLK signal on the third input terminal 1034, the SACLK signal on the fourth input terminal 1036, the ER signal on the fifth input terminal 1038, the BEREXE signal on the sixth input terminal 1040, the BAPDE_OPT signal on the seventh input terminal 1042, the STEST signal on the eighth input terminal 1044, the PGM signal on the ninth input terminal 1046, and the JUICE signal on the tenth input terminal 1048 are generated by the BIST back-end state machine 316, and in particular, the back-end BIST controller 502 of FIG. 13.

Figures 36, 37:
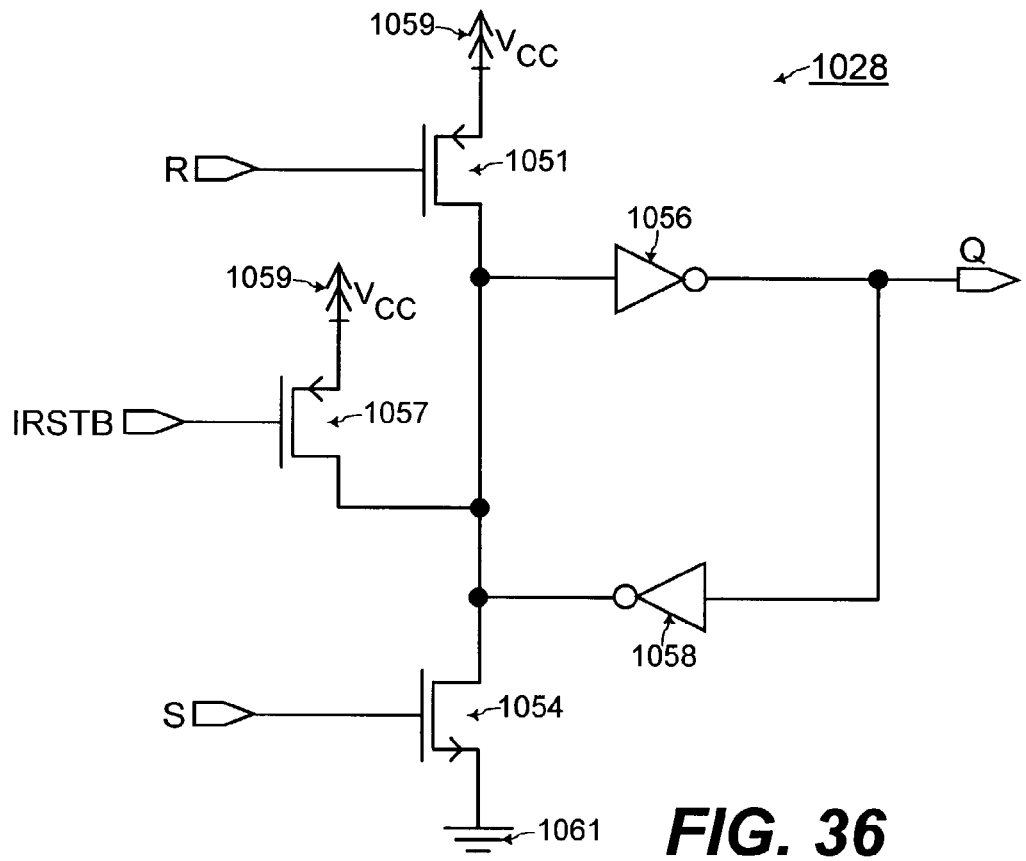
FIG. 36 shows an example implementation of a signal latch within the diagnostic matching logic of FIG. 35, according to an embodiment of the present invention.
FIG. 37 shows a table of possible Reset and Set values generated within the diagnostic matching logic of FIG. 35 with a resulting Q-output for the signal latch of FIG. 36, according to an embodiment of the present invention.

FIG. 36 shows an example implementation of the latch 1028 of FIG. 35 including a first PMOSFET (P-channel metal oxide semiconductor field effect transistor) 1051, a second PMOSFET (P-channel metal oxide semiconductor field effect transistor) 1057, an NMOSFET (N-channel metal oxide semiconductor field effect transistor) 1054, a first inverter 1056, and a second inverter 1058. The source of the first PMOSFET 1051 and the source of the second PMOSFET 1057 are coupled to a positive voltage source 1059, and the source of the NMOSFET 1054 is coupled to a negative voltage source 1061. The positive voltage source 1059 provides the voltage of a logical high state such as +5 Volts for example, and the negative voltage source 1061 may be the ground node in an example implementation of the latch 1028.

The gate of the first PMOSFET 1051 is coupled to the reset input (i.e., "R" input) of the latch 1028 which is coupled to the output of the third NAND gate 1010 in FIG. 35. The gate of the NMOSFET 1054 is coupled to the set input (i.e., "S" input) of the latch 1028 which is coupled to the output of the third NOR gate 1002 in FIG. 35. The drain of the first PMOSFET 1051 is coupled to the drain of the NMOSFET 1054 which is also coupled to the input of the first inverter 1056 and the output of the second inverter 1058. The output of the first inverter 1056 is coupled to the input of the second inverter 1058 and is the Q output of the latch 1028 for providing the generated match output MATCHD of the diagnostic matching logic 964.

In addition, the gate of the second PMOSFET 1057 is coupled to a reset input (i.e., the "IRSTB" input), and the drain of the second PMOSFET 1057 is coupled to the drain of the first PMOSFET 1051 and drain of the NMOSFET 1054. When the AUTOL is set to the logical high state, the BIST back-end state machine 316 sets the IRSTB signal to the logical high state to turn off the second PMOSFET 1057 such that the generated match output MATCHD is determined by the set input and the reset input applied on the first PMOSFET 1051 and the NMOSFET 1054. On the other hand, when the AUTOL is set to the logical low state, the BIST back-end state machine 316 sets the IRSTB signal to the logical low state to turn on the second PMOSFET 1057 which in turn latches the generated match output MATCHD to the logical low state.

FIG. 37 shows a table of variables during operation of the latch 1028 of FIG. 36 when AUTOL is set to the logical high state and when the IRSTB signal is set to the logical high state. In that case, the generated match output MATCHD is determined by the set input and the reset input applied on the first PMOSFET 1051 and the NMOSFET 1054. When the reset input (i.e., "R" input) and the set input (i.e., "S" input) are at a logical low state (i.e., a "0" state), the Q output (i.e., MATCHD output) of the latch 1028 turns to the logical low state (i.e., a "0" state). On the other hand, when the reset input (i.e., "R" input) and the set input (i.e., "S" input) are at a logical high state (i.e., a "1" state), the Q output (i.e., MATCHD output) of the latch 1028 turns to the logical high state (i.e., a "1" state).

When the reset input (i.e., "R" input) is at a logical high state (i.e., a "1" state) and the set input (i.e., "S" input) is at a logical low state (i.e., a "0" state), the Q output (i.e., MATCHD output) of the latch 1028 is latched to a previous logical state of the Q output. The condition of the reset input (i.e., "R" input) being at a logical low state (i.e., a "0" state) and the set input (i.e., "S" input) being at a logical high state (i.e., a "1" state) is not used with the latch 1028 within the diagnostic matching logic 964 of FIG. 35.

Figure 38:
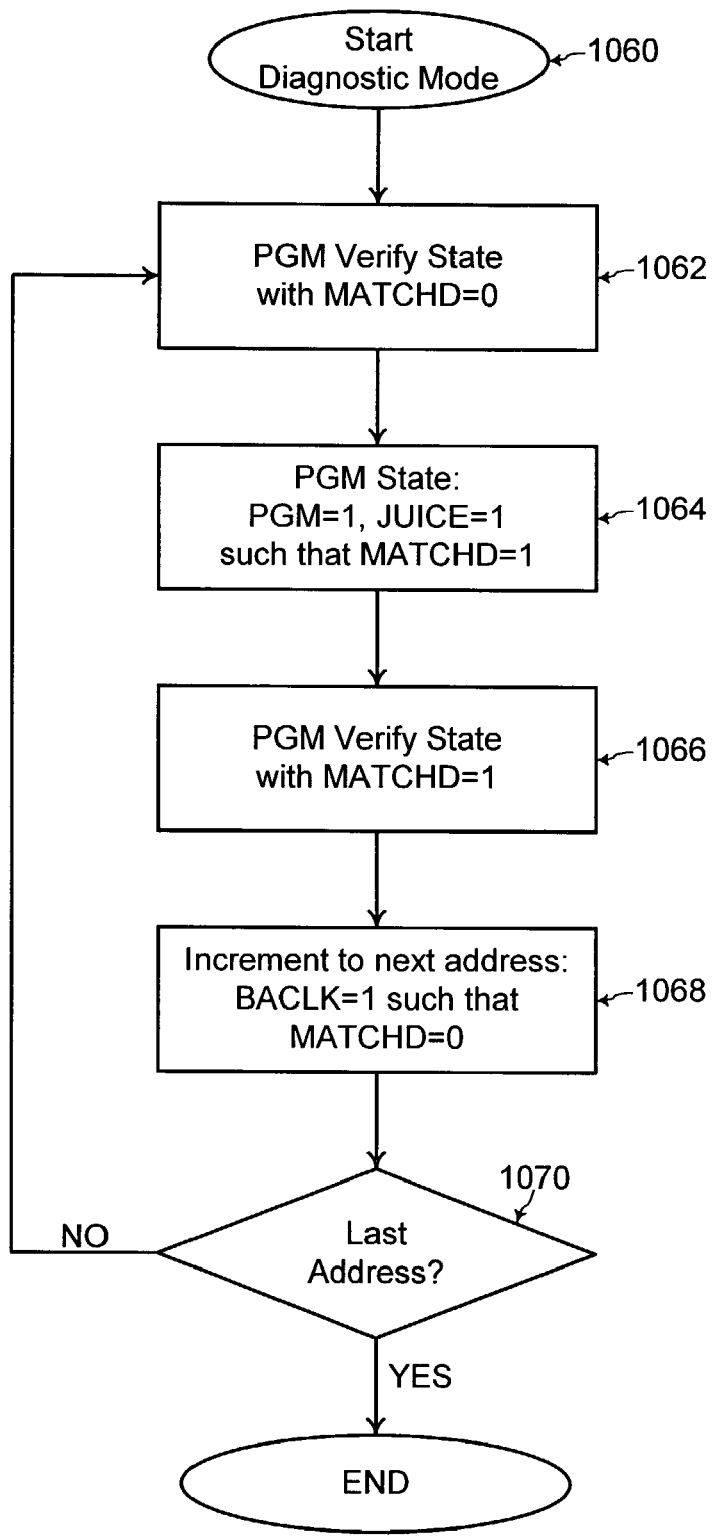
FIG. 38 shows a flow-chart of the states entered by the back-end state machine of FIG. 33 when a BIST mode being performed by the back-end state machine after the diagnostic mode is invoked is for programming flash memory cells of the array of core flash memory cells, according to an embodiment of the present invention.

The operation of the components of the system 960 of FIG. 33 for testing the functionality of the back-end state machine 316 is now described. FIG. 38 shows a flowchart of states entered by the back-end state machine 316 of FIG. 33 when a BIST mode being performed by the back-end state machine 316 after the diagnostic mode is invoked is for programming flash memory cells of the array of core flash memory cells 304. Referring to FIGS. 33 and 38, the diagnostic mode is started (step 1060 of FIG. 38) when the external test system 318 enters the predetermined bit pattern for invoking the diagnostic mode. Furthermore, referring to FIG. 33, at the start of the diagnostic mode, the user inputs data into the BIST interface 312 for invoking the current BIST mode.

In that case, the AUTOL signal from the mode decoder 962 is set to the logical high state (i.e., the "1" state). In addition, when the diagnostic mode is invoked, the back-end state machine 316 follows the steps of the flowchart of FIG. 15 but uses the MATCH signal from the signal selector 966 during the VERIFY state (steps 560 and 562 of FIG. 15) instead of just the output of the matching circuit 520.

Referring to FIG. 34, when the BIST mode being performed by the back-end state machine 316 after the diagnostic mode is invoked is for programming flash memory cells of the array of core flash memory cells 304, the BREAD signal is set to a logical low state (i.e., the "0" state). Thus, with the AUTOL signal set to the logical high state, the MATCH signal from the signal selector 966 of FIG. 34 is the generated match output MATCHD from the diagnostic matching logic 964.

Referring to FIG. 36, before start of the diagnostic mode, the AUTOL signal and the IRSTB signal of the latch 1028 are set to the logical low state such that the generated match output MATCHD is latched to the logical low state. Thus, at the start of the BIST mode for programming flash memory cells of the array of core flash memory cells 304, the generated match output MATCHD is latched to the logical low state (i.e., the "0" state) at a beginning address of the array of core flash memory cells 304. When the back-end state machine 316 enters a first program VERIFY state (steps 560 and 562 of FIG. 15), the generated match output MATCHD is latched to the logical low state (i.e., the "0" state), and thus, the beginning address of the array of core flash memory cells has a fail result (step 1062 of FIG. 38). Because of such a fail result, the back-end state machine 316 enters a program JUICE state (step 566 of FIG. 15).

Referring to FIG. 35, the PGM signal on the ninth input terminal 1046, the JUICE signal on the tenth input terminal 1048, and the STEST signal on the eighth input terminal 1044 are set to the logical high state by the BIST controller 502 in the program JUICE state, in addition to the AUTOL signal on the eleventh input terminal 1050 being set to the logical high state by the mode decoder 962. The other signals (i.e., the ERIP, APDE, BACLK, SACLK, ER, BEREXE, and BAPDE_OPT signals) are set to the logical low state by the BIST controller 502 in the program JUICE state. Thus, the generated match output MATCHD is set to a logical high state (i.e., the "1" state) in the program JUICE state (step 1064 of FIG. 38).

After the program JUICE state, the BIST controller 502 enters a subsequent program VERIFY state (steps 560 and 562 of FIG. 15) with the generated match output MATCHD being set to the logical high state (i.e., the "1" state) from the prior program JUICE state, and thus, the beginning address of the array of core flash memory cells has a pass result (step 1066 of FIG. 38). Because of such a pass result, referring to FIG. 33, the back-end state machine 316 controls the address sequencer 524 to increment to a subsequent address of the array of core flash memory cells 304 by setting the BACLK signal to a logical high state (step 1068 of FIG. 38).

Referring to FIG. 35, when the BACLK signal is set to the logical high state (with the AUTOL and STEST signals also set to the logical high state but with the ERIP, APDE, SACLK, ER, PGM, JUICE, BEREXE, and BAPDE_OPT signals set to the logical low state), the generated match output MATCHD is set back to a logical low state (i.e., the "0" state). After the address sequencer 524 increments to the subsequent address of the array of core flash memory cells 304, the BIST controller 502 checks whether such an address is past the last address of the array of core flash memory cells 304 (step 1070 of FIG. 38). If the address is past the last address of the array of core flash memory cells 304, then the BIST mode ends. Otherwise, steps 1062, 1064, 1066, 1068, and 1070 of FIG. 38 are repeated for each of the subsequent addresses of the array of core flash memory cells 304 until the address sequencer 524 reaches an address that is past the last address of the array of core flash memory cells 304.

Referring to FIG. 13 nodes of the back-end state machine 316 such as the node from the program/erase voltage source 510 may be probed to determine whether the back-end state machine 316 is functional during the steps of FIG. 38 when the BIST mode being performed by the back-end state machine 316 after the diagnostic mode is invoked is for programming flash memory cells of the array of core flash memory cells 304. For example, the node from the program/erase voltage source 510 of FIG. 13 provides a word-line voltage of +9 Volts each time the program JUICE state is entered in step 1064 of FIG. 38 if the back-end state machine 316 is functional. With such probing of nodes of the back-end state machine 316 of FIG. 13 during the steps of FIG. 38, the functionality of the back-end state machine 316 is determined when a BIST mode is for programming flash memory cells of the array of core flash memory cells 304.

Figure 39:
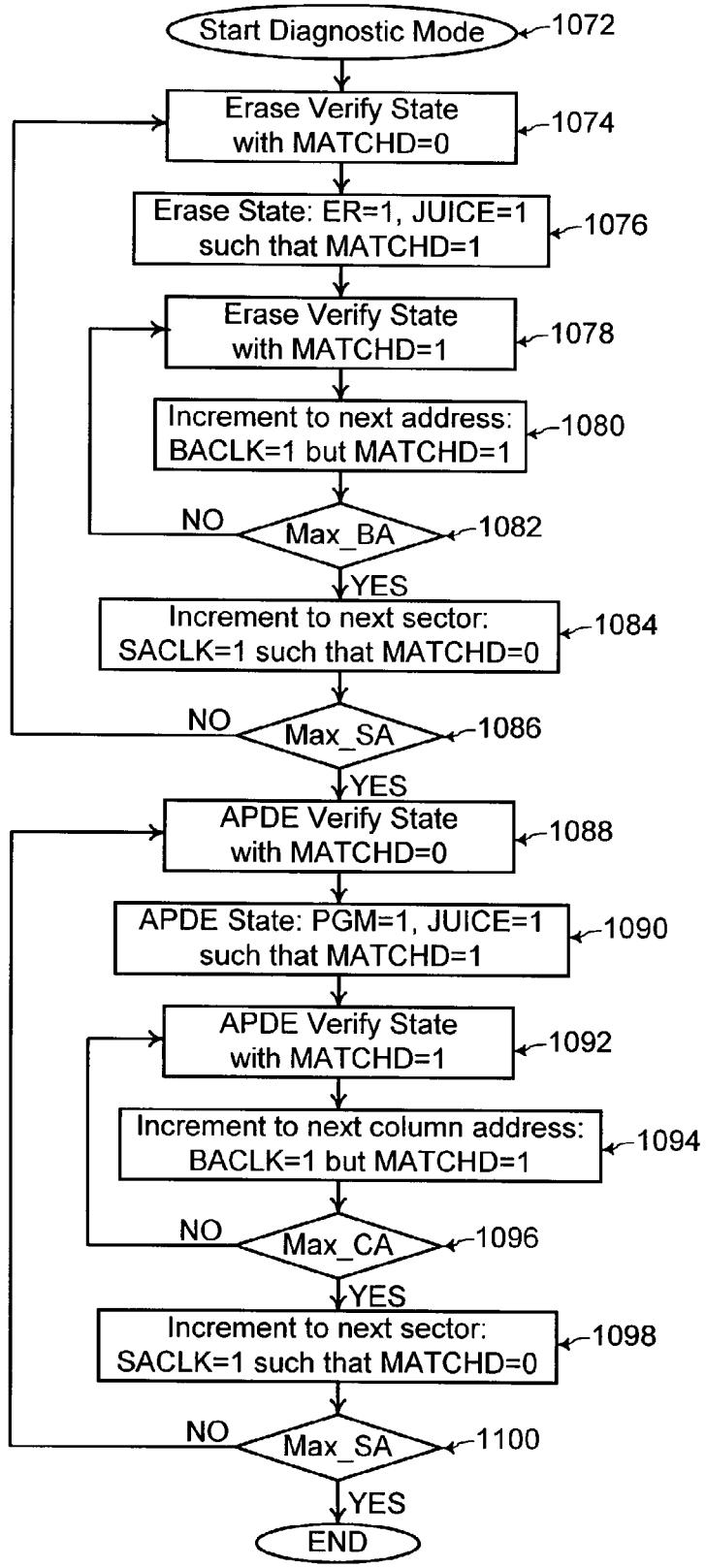
FIG. 39 shows a flow-chart of the states entered by the back-end state machine of FIG. 33 when a BIST mode being performed by the back-end state machine after the diagnostic mode is invoked is for erasing flash memory cells of the array of core flash memory cells with a stand-alone APDE (Auto Program Disturb after Erase), according to an embodiment of the present invention.
Figure 40:
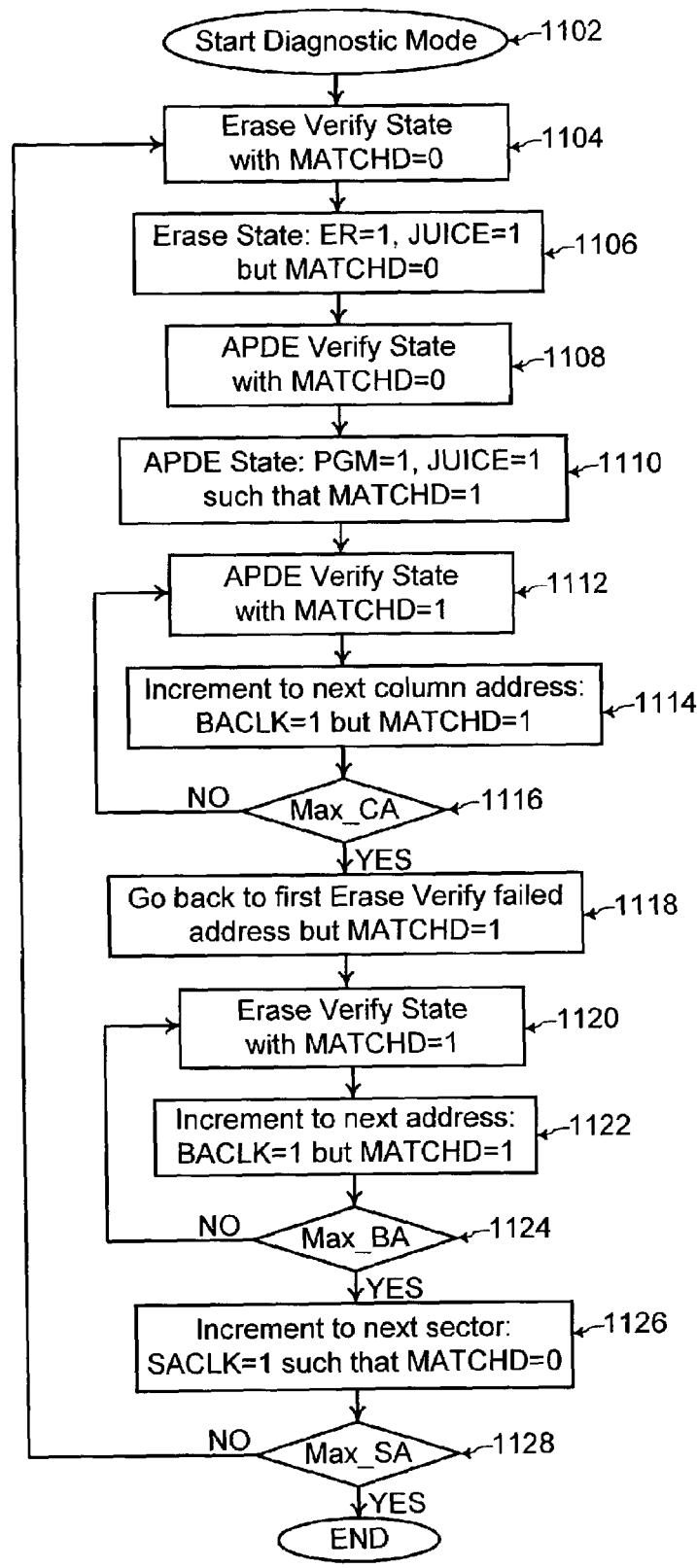
FIG. 40 shows a flow-chart of the states entered by the back-end state machine of FIG. 33 when a BIST mode being performed by the back-end state machine after the diagnostic mode is invoked is for erasing flash memory cells of the array of core flash memory cells with interleaved APDE (Auto Program Disturb after Erase), according to an embodiment of the present invention.

FIG. 39 shows a flowchart of states entered by the back-end state machine 316 of FIG. 33 when a BIST mode being performed by the back-end state machine 316 after the diagnostic mode is invoked is for erasing flash memory cells of the array of core flash memory cells 304 with stand-alone APDE (Auto Program Disturb after Erase). FIG. 40 shows a flowchart of states entered by the back-end state machine 316 of FIG. 33 when a BIST mode being performed by the back-end state machine 316 after the diagnostic mode is invoked is for erasing flash memory cells of the array of core flash memory cells 304 with interleaved APDE (Auto Program Disturb after Erase). Referring to FIG. 35, for stand-alone APDE (Auto Program Disturb after Erase), the BIST controller 502 sets the BAPDE_OPT signal to a logical high state (i.e., the "1" state). On the other hand, for interleaved APDE (Auto Program Disturb after Erase), the BIST controller 502 sets the BAPDE_OPT signal to a logical low state (i.e., the "0" state).

Referring to FIGS. 33 and 39, the diagnostic mode is started (step 1072 of FIG. 39) when the external test system 318 enters the predetermined bit pattern for invoking the diagnostic mode. In that case, the AUTOL signal from the mode decoder 962 is set to the logical high state (i.e., the "1" state). Furthermore, referring to FIG. 33, at the start of the diagnostic mode, the user inputs data into the BIST interface 312 for invoking the current BIST mode. In addition, when the diagnostic mode is invoked, the back-end state machine 316 uses the MATCH signal from the signal selector 966 during a VERIFY state (steps 560 and 562 of FIG. 15 for example) instead of just the output of the matching circuit 520. Referring to FIG. 34, when the BIST mode being performed by the back-end state machine 316 after the diagnostic mode is invoked is for erasing flash memory cells of the array of core flash memory cells 304, the BREAD signal is set to a logical low state (i.e., the "0" state). Thus, with the AUTOL signal set to the logical high state, the MATCH signal from the signal selector 966 of FIG. 34 is the generated match output MATCHD from the diagnostic matching logic 964.

Referring to FIG. 36, before start of the diagnostic mode, the AUTOL signal and the IRSTB signal of the latch 1028 are set to the logical low state such that the generated match output MATCHD is latched to the logical low state. Thus, at the start of the BIST mode for erasing flash memory cells of the array of core flash memory cells 304, the generated match output MATCHD is latched to the logical low state (i.e., the "0" state) at a first address of a first sector of the array of core flash memory cells 304. Referring to FIG. 16, the array of core flash memory cells 304 is divided into a plurality of horizontal sectors 602, 604, 606, 608, 610, 612, 614, and 616 as described herein with reference to FIG. 16. When the back-end state machine 316 enters a first erase VERIFY state, the generated match output MATCHD is latched to the logical low state (i.e., the "0" state), and thus, the first address of the first sector of the array of core flash memory cells has a fail result (step 1074 of FIG. 39).

Because of such a fail result, the back-end state machine 316 enters an erase JUICE state. Referring to FIG. 35, the ER signal on the fifth input terminal 1038, the JUICE signal on the tenth input terminal 1048, the STEST signal on the eighth input terminal 1044, the BEREXE signal on the sixth input terminal 1040, the ERIP signal on the first input terminal 1030, and the BAPDE_OPT signal on the seventh input terminal 1042 are set to the logical high state by the BIST controller 502 in the erase JUICE state, in addition to the AUTOL signal on the eleventh input terminal 1050 being set to the logical high state by the mode decoder 962. The other signals (i.e., the APDE, BACLK, SACLK, and PGM signals) are set to the logical low state by the BIST controller 502 in the erase JUICE state. Thus, the generated match output MATCHD is set to a logical high state (i.e., the "1" state) in the erase JUICE state (step 1076 of FIG. 39).

After the erase JUICE state, the BIST controller 502 enters a subsequent erase VERIFY state with the generated match output MATCHD being set to a logical high state (i.e., the "1" state) from the prior erase JUICE state, and thus, the first address of the first sector of the array of core flash memory cells has a pass result (step 1078 of FIG. 39). Because of such a pass result, referring to FIG. 33, the back-end state machine 316 controls the address sequencer 524 to increment to a subsequent address of the first sector of the array of core flash memory cells 304 by setting the BACLK signal to a logical high state (step 1080 of FIG. 39).

Referring to FIG. 35, even with the BACLK signal being set to the logical high state, because the STEST, BEREXE, ERIP, and BAPDE_OPT signals are set to the logical high state, the generated match output MATCHD remains latched to the logical high state (i.e., the "1" state). After the address sequencer 524 increments to the subsequent address of the first sector of the array of core flash memory cells 304, the BIST controller 502 checks whether such an address is past the last address of the first sector of the array of core flash memory cells 304 (step 1082 of FIG. 39).

If the address is past the last address of the first sector of the array of core flash memory cells 304, then the back-end state machine 316 controls the address sequencer 524 to increment to a first address of a subsequent sector of the array of core flash memory cells 304 by setting the SACLK signal to a logical high state (step 1084 of FIG. 39). Otherwise, steps 1078, 1080, and 1082 of FIG. 39 are repeated for each of the subsequent addresses of the first sector of the array of core flash memory cells 304 until the address sequencer 524 reaches an address that is past the last address of the first sector of the array of core flash memory cells 304.

In the case that the address is past the last address of the first sector of the array of core flash memory cells 304 such that the back-end state machine 316 controls the address sequencer 524 to increment to a first address of a subsequent sector of the array of core flash memory cells 304 by setting the SACLK signal to a logical high state (step 1084 of FIG. 39), the BIST controller 502 checks whether such an address is past the last sector of the array of core flash memory cells 304 (step 1086 of FIG. 39). If the address is past the last sector of the array of core flash memory cells 304, then the stand-alone APDE (Auto Program Disturb after Erase) is performed at step 1088 of FIG. 39.

Otherwise, steps 1074, 1076, 1078, 1080, 1082, 1084, and 1086 of FIG. 39 are repeated for each of the subsequent sectors of the array of core flash memory cells 304 until the address sequencer 524 reaches an address that is past the last sector of the array of core flash memory cells 304. Note that steps 1074 and 1076 are performed for only a first address of each sector of core flash memory cells in this embodiment of the present invention since the generated match output MATCHD is latched back to the logical low state when the SACLK signal at the fourth input terminal (as well as the AUTOL, STEST, BEREXE, ERIP, and BAPDE_OPT signals) of FIG. 35 are set to the logical high state at step 1084 of FIG. 39.

However, the generated match output MATCHD is set back to the logical high state at the erase JUICE state at step 1076 of FIG. 39 for each of the subsequent addresses within a sector of core flash memory cells. For example, steps 1074 and 1076 are performed for only the first address of each sector of core flash memory cells because the time period for the erase JUICE state is relatively long, such as 10 milliseconds for example, such that performing the erase JUICE state for each address of a sector is undesirably long.

When the address reaches past the last sector of the array of core flash memory cells 304 at step 1086, each address of the array of core flash memory cells has been erase verified, and the stand-alone APDE (Auto Program Disturb after Erase) is performed at step 1088 of FIG. 39. By step 1088 of FIG. 39, the generated match output MATCHD is latched to a logical low state (i.e., a "0" state) because the SACLK signal as well as the AUTOL, STEST, BEREXE, ERIP, and BAPDE_OPT signals of FIG. 35 are set to the logical high state at step 1084 of FIG. 39. In addition, with the SACLK signal being set to the logical high state at step 1084 of FIG. 39, the address sequencer 524 is reset to a first column address of the first sector of core flash memory cells 304 by the BIST controller 502.

The back-end state machine 316 enters a first APDE (Auto Program Disturb after Erase) VERIFY state at the first column address of the first sector of core flash memory cells 304 with the generated match output MATCHD latched to the logical low state (i.e., a "0" state). Thus, the first APDE VERIFY state has a fail result for the first column address of the first sector of core flash memory cells 304 (step 1088 of FIG. 39). Because of such a fail result, the back-end state machine 316 enters an APDE (Auto Program Disturb after Erase) JUICE state (step 1090 of FIG. 39).

Referring to FIG. 35, the APDE signal on the second input terminal 1032, the JUICE signal on the tenth input terminal 1048, the STEST signal on the eighth input terminal 1044, the BEREXE signal on the sixth input terminal 1040, the PGM signal on the ninth input terminal 1046, and the BAPDE_OPT signal on the seventh input terminal 1042 are set to the logical high state by the BIST controller 502 in the APDE JUICE state, in addition to the AUTOL signal on the eleventh input terminal 1050 being set to the logical high state by the mode decoder 962. The other signals (i.e., the ERIP, ER, BACLK, and SACLK signals) are set to the logical low state by the BIST controller 502 in the APDE JUICE state. Thus, the generated match output MATCHD is set to a logical high state (i.e., the "1" state) in the APDE JUICE state (step 1090 of FIG. 39).

After the APDE JUICE state, the BIST controller 502 enters a subsequent APDE (Auto Program Disturb after Erase) VERIFY state with the generated match output MATCHD being set to a logical high state (i.e., the "1" state) from the prior APDE JUICE state, and thus, the first column address of the first sector of the array of core flash memory cells has a pass result (step 1092 of FIG. 39). Because of such a pass result, referring to FIG. 33, the back-end state machine 316 controls the address sequencer 524 to increment to a subsequent column address of the first sector of the array of core flash memory cells 304 by setting the BACLK signal to a logical high state (step 1094 of FIG. 39).

Referring to FIG. 35, even with the BACLK signal being set to the logical high state, because the AUTOL, STEST, BEREXE, APDE, and BAPDE_OPT signals are set to the logical high state, the generated match output MATCHD remains latched to the logical high state (i.e., the "1" state). After the address sequencer 524 increments to the subsequent column address of the first sector of the array of core flash memory cells 304, the BIST controller 502 checks whether such a column address is past the last column address of the first sector of the array of core flash memory cells 304 (step 1096 of FIG. 39). An APDE VERIFY state is performed by the back-end state machine one column address at a time since an APDE VERIFY process typically determines the total leakage current flowing through a column of the array of core flash memory cells, as known to one of ordinary skill in the art of flash memory devices.

If the column address is past the last column address of the first sector of the array of core flash memory cells 304, then the back-end state machine 316 controls the address sequencer 524 to increment to a first column address of a subsequent sector of the array of core flash memory cells 304 by setting the SACLK signal to a logical high state (step 1098 of FIG. 39). Otherwise, steps 1092, 1094, and 1096 of FIG. 39 are repeated for each of the subsequent column addresses of the first sector of the array of core flash memory cells 304 until the address sequencer 524 reaches a column address that is past the last column address of the first sector of the array of core flash memory cells 304.

In the case that the column address is past the last column address of the first sector of the array of core flash memory cells 304 such that the back-end state machine 316 controls the address sequencer 524 to increment to a first column address of a subsequent sector of the array of core flash memory cells 304 by setting the SACLK signal to a logical high state (step 1098 of FIG. 39), the BIST controller 502 checks whether such an address is past the last sector of the array of core flash memory cells 304 (step 1100 of FIG. 39). If the column address is past the last sector of the array of core flash memory cells 304, then the BIST mode ends.

Otherwise, steps 1088, 1090, 1092, 1094, 1096, 1098, and 1100 of FIG. 39 are repeated for each of the subsequent sectors of the array of core flash memory cells 304 until the address sequencer 524 reaches a column address that is past the last sector of the array of core flash memory cells 304. Note that steps 1088 and 1090 are performed for only a first column address of each sector of core flash memory cells in this embodiment of the present invention since the generated match output MATCHD is latched back to the logical low state when the SACLK signal at the fourth input terminal as well as the AUTOL, STEST, BEREXE, ADPE, and BAPDE_OPT signals of FIG. 35 are set to the logical high state at step 1098 of FIG. 39.

However, the generated match output MATCHD is set back to the logical high state at the APDE JUICE state at step 1092 of FIG. 39 for each of the subsequent column addresses within a sector of core flash memory cells. For example, steps 1088 and 1090 are performed for only the first column address of each sector of core flash memory cells because during the APDE JUICE state, APDE voltages are applied on each flash memory cell of the whole sector of flash memory cells, as known to one of ordinary skill in the art of flash memory devices.

When the column address reaches past the last sector of the array of core flash memory cells 304 at step 1100 of FIG. 39, each address of the array of core flash memory cells has been APDE verified, and the BIST mode ends. For the stand-alone APDE (Auto Program Disturb after Erase) of FIG. 39 with the BAPDE_OPT signal set to the logical high state, substantially the whole array of core flash memory cells 304 is first erase verified through steps 1074, 1076, 1078, 1080, 1082, 1084, and 1086 of FIG. 39, and then substantially the whole array of core flash memory cells 304 is APDE verified through steps 1088, 1090, 1092, 1094, 1096, 1098, and 1100 of FIG. 39.

On the other hand, FIG. 40 shows the flowchart of states entered by the back-end state machine 316 of FIG. 33 when a BIST mode being performed by the back-end state machine 316 after the diagnostic mode is invoked is for erasing flash memory cells of the array of core flash memory cells 304 with interleaved APDE (Auto Program Disturb after Erase). For such a BIST mode, the BAPDE_OPT signal is set to a logical low state (i.e., the "0" state).

Referring to FIGS. 33 and 40, the diagnostic mode is started (step 1102 of FIG. 40) when the external test system 318 enters the predetermined bit pattern for invoking the diagnostic mode. In that case, the AUTOL signal from the mode decoder 962 is set to the logical high state (i.e., the "1" state). Furthermore, referring to FIG. 33, at the start of the diagnostic mode, the user inputs data into the BIST interface 312 for invoking the current BIST mode. In addition, when the diagnostic mode is invoked, the back-end state machine 316 uses the MATCH signal from the signal selector 966 during a VERIFY state instead of just the output of the matching circuit 520. Referring to FIG. 34, when the BIST mode being performed by the back-end state machine 316 after the diagnostic mode is invoked is for erasing flash memory cells of the array of core flash memory cells 304, the BREAD signal is set to a logical low state (i.e., the "0" state). Thus, with AUTOL set to the logical high state, the MATCH signal from the signal selector 966 of FIG. 34 is the generated match output MATCHD from the diagnostic matching logic 964.

Referring to FIG. 36, before start of the diagnostic mode, the AUTOL signal and the IRSTB signal of the latch 1028 are set to the logical low state such that the generated match output MATCHD is latched to the logical low state. Thus, at the start of the BIST mode for erasing flash memory cells of the array of core flash memory cells 304, the generated match output MATCHD is latched to a logical low state (i.e., the "0" state) at a first address of a first sector of the array of core flash memory cells 304. Referring to FIG. 16, the array of core flash memory cells 304 is divided into a plurality of horizontal sectors 602, 604, 606, 608, 610, 612, 614, and 616 as described herein with reference to FIG. 16. When the back-end state machine 316 enters a first erase VERIFY state, the generated match output MATCHD is latched to a logical low state (i.e., the "0" state), and thus, the first address of the first sector of the array of core flash memory cells has a fail result (step 1104 of FIG. 40).

Because of such a fail result, the back-end state machine 316 enters an erase JUICE state. Referring to FIG. 35, the ER signal on the fifth input terminal 1038, the JUICE signal on the tenth input terminal 1048, the STEST signal on the eighth input terminal 1044, the BEREXE signal on the sixth input terminal 1040, and the ERIP signal on the first input terminal 1030 are set to the logical high state by the BIST controller 502 in the erase JUICE state, in addition to the AUTOL signal on the eleventh input terminal 1050 being set to the logical high state by the mode decoder 962. The other signals (i.e., the BAPDE_OPT, APDE, BACLK, SACLK, and PGM signals) are set to the logical low state by the BIST controller 502 in the erase JUICE state. Thus, the generated match output MATCHD remains at the logical low state (i.e., the "0" state) in the erase JUICE state for the interleaved APDE (step 1106 of FIG. 40).

With interleaved APDE, a first APDE VERIFY state is entered after the erase JUICE state (step 1108 of FIG. 40). Because the MATCHD remains latched at the logical low state, the first APDE VERIFY state has a fail result. With such a failed result, an APDE (Auto Program Disturb after Erase) JUICE state is entered (step 1110 of FIG. 40).

Referring to FIG. 35, during the APDE JUICE state, the APDE, JUICE, PGM, BEREXE, and STEST signals are set to the logical high state by the BIST controller 502, in addition to the AUTOL signal being set to the logical high state by the mode decoder 962. The other signals (i.e., the BAPDE_OPT, ERIP, ER, BACLK, and SACLK signals) are set to the logical low state by the BIST controller 502 in the APDE JUICE state. Thus, the generated match output MATCHD is set to a logical high state (i.e., the "1" state) in the APDE JUICE state (step 1110 of FIG. 40).

After the APDE JUICE state, the BIST controller 502 enters a subsequent APDE (Auto Program Disturb after Erase) VERIFY state with the generated match output MATCHD being set to the logical high state (i.e., the "1" state) from the prior APDE JUICE state, and thus, the first address of the first sector of the array of core flash memory cells has a pass result (step 1112 of FIG. 40). Because of such a pass result, referring to FIG. 33, the back-end state machine 316 controls the address sequencer 524 to increment to a subsequent column address of the first sector of the array of core flash memory cells 304 by setting the BACLK signal to a logical high state (step 1114 of FIG. 40).

Referring to FIG. 35, even with the BACLK signal being set to the logical high state, because the AUTOL, STEST, BEREXE, and APDE signals are set to the logical high state, the generated match output MATCHD remains latched to the logical high state (i.e., the "1" state). After the address sequencer 524 increments to the subsequent column address of the first sector of the array of core flash memory cells 304, the BIST controller 502 checks whether such a column address is past the last column address of the first sector of the array of core flash memory cells 304 (step 1116 of FIG. 40). An APDE VERIFY state is performed by the back-end state machine one column address at a time since an APDE VERIFY process typically determines the total leakage current flowing through a column of the array of core flash memory cells, as known to one of ordinary skill in the art of flash memory devices.

If the column address is past the last column address of the first sector of the array of core flash memory cells 304, then the back-end state machine 316 controls the address sequencer 524 to go back to the first address of the first sector of core flash memory cells that failed the first ERASE verify state initially at step 1104 of FIG. 40 (step 1118 of FIG. 40). Otherwise, steps 1112, 1114, and 1116 of FIG. 40 are repeated for each of the subsequent column addresses of the first sector of the array of core flash memory cells 304 until the address sequencer 524 reaches a column address that is past the last column address of the first sector of the array of core flash memory cells 304.

When the column address is past the last column address of the first sector of the array of core flash memory cells 304, the back-end state machine 316 controls the address sequencer 524 to go back to the first address of the first sector of core flash memory cells that failed the first ERASE verify state initially at step 1104 of FIG. 40 by setting the BACLK signal to a logical high state (step 1118 of FIG. 40). Referring to FIG. 35, because the AUTOL, STEST, BEREXE, BACLK, and ERIP signals are set to the logical high state, the MATCHD signal is latched to the logical high state (step 1118 of FIG. 40).

Then, a second erase VERIFY state is entered for the first address of the first sector of core flash memory cells with the MATCHD signal being latched to the logical high state (step 1120 of FIG. 40) such that the second erase VERIFY state has a pass result. Because of such a pass result, referring to FIG. 33, the back-end state machine 316 controls the address sequencer 524 to increment to a subsequent address of the first sector of the array of core flash memory cells 304 by setting the BACLK signal to a logical high state (step 1122 of FIG. 40).

Referring to FIG. 35, even with the BACLK signal being set to the logical high state, because the AUTOL, STEST, BEREXE, and ERIP signals are set to the logical high state, the generated match output MATCHD remains latched to the logical high state (i.e., the "1" state). After the address sequencer 524 increments to the subsequent address of the first sector of the array of core flash memory cells 304, the BIST controller 502 checks whether such an address is past the last address of the first sector of the array of core flash memory cells 304 (step 1124 of FIG. 40).

If the address is past the last address of the first sector of the array of core flash memory cells 304, then the back-end state machine 316 controls the address sequencer 524 to increment to a first address of a subsequent sector of the array of core flash memory cells 304 by setting the SACLK signal to a logical high state (step 1126 of FIG. 40). Otherwise, steps 1120, 1122, and 1124 of FIG. 40 are repeated for each of the subsequent addresses of the first sector of the array of core flash memory cells 304 until the address sequencer 524 reaches an address that is past the last address of the first sector of the array of core flash memory cells 304.

In the case that the address is past the last address of the first sector of the array of core flash memory cells 304 such that the back-end state machine 316 controls the address sequencer 524 to increment to a first address of a subsequent sector of the array of core flash memory cells 304 by setting the SACLK signal to a logical high state (step 1126 of FIG. 40), the BIST controller 502 checks whether such an address is past the last sector of the array of core flash memory cells 304 (step 1128 of FIG. 40). If the address is past the last sector of the array of core flash memory cells 304, then the BIST mode of FIG. 40 ends.

Otherwise, steps 1104, 1106, 1108, 1110, 1112, 1114, 1116, 1118, 1120, 1122, 1124, 1126, and 1128 of FIG. 40 are repeated for each of the subsequent sectors of the array of core flash memory cells 304 until the address sequencer 524 reaches an address that is past the last sector of the array of core flash memory cells 304. Note that steps 1104, 1106, 1108, and 1110 are performed for only a first address of each sector of core flash memory cells in this embodiment of the present invention since the generated match output MATCHD is latched back to the logical low state when the SACLK signal at the fourth input terminal as well as the AUTOL, STEST, BEREXE, and ERIP signals of FIG. 35 are set to the logical high state at step 1126 of FIG. 40.

However, the generated match output MATCHD is set back to the logical high state at the APDE JUICE state at step 1110 of FIG. 40 for each of the subsequent addresses within a sector of core flash memory cells. For example, steps 1104, 1106, 1108, and 1110 are performed for only the first address of each sector of core flash memory cells because the time period for the ERASE JUICE state is relatively long, such as 10 milliseconds for example, such that performing the ERASE JUICE state for each column address is undesirably long.

When the column address reaches past the last sector of the array of core flash memory cells 304 at step 1128 of FIG. 40, each address of the array of core flash memory cells has been erase verified and APDE verified, and the BIST mode ends. For the interleaved APDE (Auto Program Disturb after Erase) of FIG. 40 with the BAPDE_OPT signal set to the logical low state, the array of core flash memory cells 304 is both erase verified and APDE verified one sector at a time, in contrast to the stand-alone APDE (Auto Program Disturb after Erase) of FIG. 39 where substantially the whole array of core flash memory cells is first erase verified and then substantially the whole array of core flash memory cells 304 is APDE verified thereafter.

Referring to FIG. 13, nodes of the back-end state machine 316 such as the node from the program/erase voltage source 510 may be probed to determine whether the back-end state machine 316 is functional during the steps of FIG. 39 or 40 when the BIST mode being performed by the back-end state machine 316 after the diagnostic mode is invoked is for erasing flash memory cells of the array of core flash memory cells 304 with stand-alone or interleaved APDE (Auto Program Disturb after Erase). For example, the node from the program/erase voltage source 510 of FIG. 13 provides a word-line voltage of −9.5 Volts each time the erase JUICE state is entered in FIG. 39 or 40 if the back-end state machine 316 is functional. With such probing of nodes of the back-end state machine 316 of FIG. 13 during the steps of FIG. 39 or 40, the functionality of the back-end state machine 316 is determined when a BIST mode is for erasing flash memory cells of the array of core flash memory cells 304.

Referring to FIG. 34, when the BIST mode being performed by the back-end state machine 316 after the diagnostic mode is invoked is for reading a respective logical state programmed or erased for each flash memory cell of the core flash memory cells without the repair mode being invoked, the BREAD signal is set to a logical high state, but the BREP signal is set to a logical low state, by the BIST interface 312. In that case, the MATCH signal from the signal selector 966 is set to the logical high state. When the BIST mode being performed by the back-end state machine 316 after the diagnostic mode is invoked is for reading a respective logical state programmed or erased for each flash memory cell of the core flash memory cells, the back-end state machine 316 follows the steps of the flowchart of FIG. 18 using the MATCH signal from the signal selector 966 at the read VERIFY state (steps 690 and 692 of FIG. 18). Since the MATCH signal from the signal selector 966 is set to the logical high state, the read VERIFY state with a pass result is performed by the back-end state machine 316 through each address of substantially the whole array of core flash memory cells.

Figure 41:
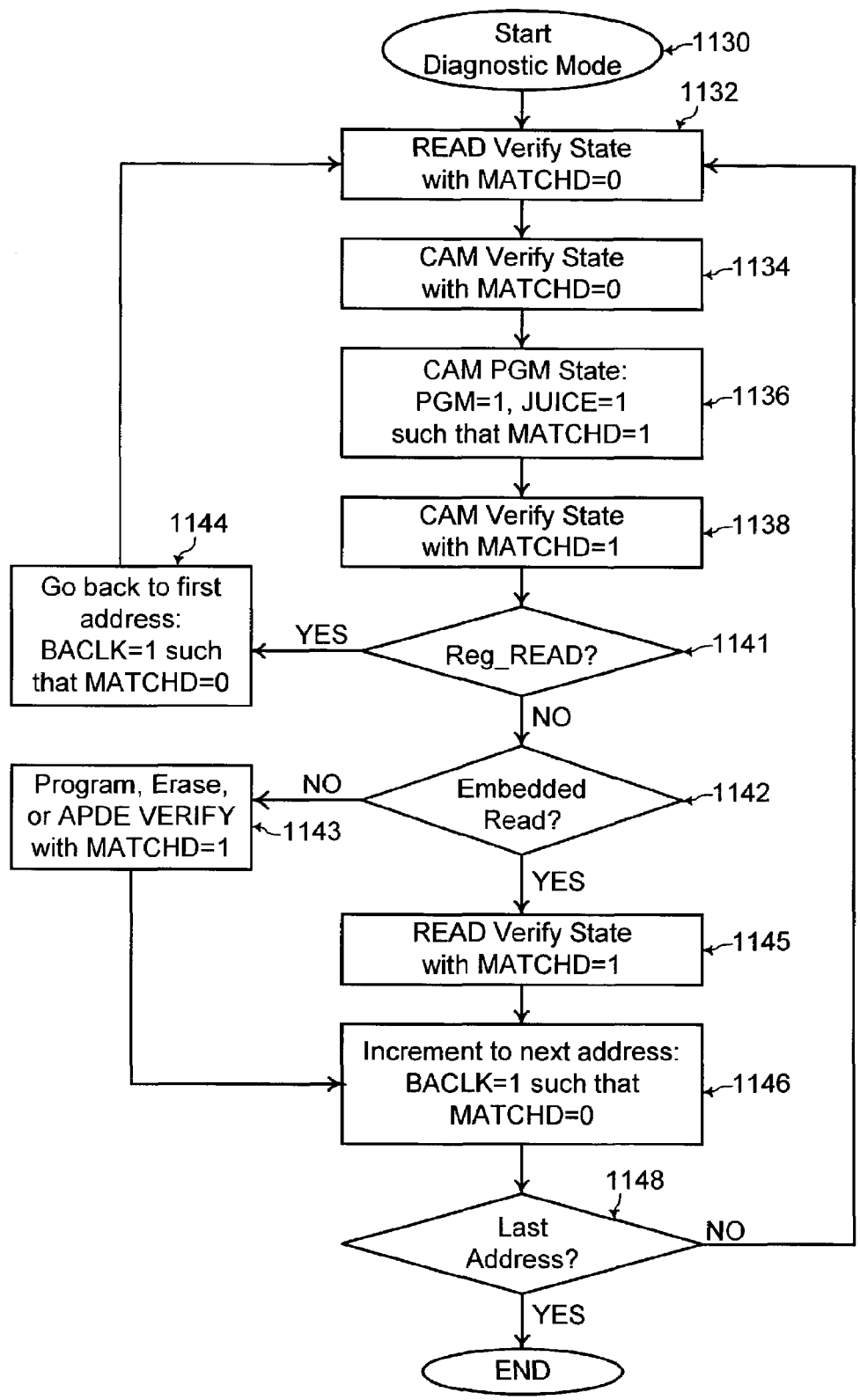
FIG. 41 shows a flow-chart of the states entered by the back-end state machine of FIG. 33 when a BIST mode being performed by the back-end state machine after the diagnostic mode is invoked is for reading a respective logical state programmed or erased for each flash memory cell of the core flash memory cells with the repair routine being invoked.

On the other hand, for any type of BIST mode, if the repair routine is invoked, then the BREP signal is set to the logical high state by the back-end state machine 316. In that case, referring to FIG. 34, the MATCH signal from the signal selector 966 is determined by the generated match output MATCHD from the diagnostic matching logic 964. FIG. 41 shows a flow-chart of the states entered by the back-end state machine 316 when a BIST mode being performed by the back-end state machine after the diagnostic mode is invoked is for reading a respective logical state programmed or erased for each flash memory cell of the core flash memory cells with the repair routine being invoked such as for the flowchart of FIG. 23 for example.

Referring to FIGS. 33 and 41, the diagnostic mode is started (step 1130 of FIG. 41) when the external test system 318 enters the predetermined bit pattern for invoking the diagnostic mode. In that case, the AUTOL signal from the mode decoder 962 is set to the logical high state (i.e., the "1" state). Furthermore, referring to FIG. 33, at the start of the diagnostic mode, the user inputs data into the BIST interface 312 for invoking the current BIST mode. In addition, when the diagnostic mode is invoked, the back-end state machine 316 uses the MATCH signal from the signal selector 966 during any VERIFY state instead of just the output of the matching circuit 520. Referring to FIG. 34, when the repair routine is invoked, the BREP signal is set to the logical high state. Thus, with AUTOL set to the logical high state, the MATCH signal from the signal selector 966 of FIG. 34 is the generated match output MATCHD from the diagnostic matching logic 964.

Referring to FIG. 36, before start of the diagnostic mode, the AUTOL signal and the IRSTB signal of the latch 1028 are set to the logical low state such that the generated match output MATCHD is latched to the logical low state. Thus, at the start of the BIST mode, the generated match output MATCHD is latched to a logical low state (i.e., the "0" state) at a first address of the array of core flash memory cells 304. When the back-end state machine 316 enters a first read VERIFY state, the generated match output MATCHD is latched to a logical low state (i.e., the "0" state), and thus, the first address of the first sector of the array of core flash memory cells has a fail result (step 1132 of FIG. 41). Because the repair routine is invoked, the back-end state machine 316 enters a first CAM (content addressable memory) VERIFY state. Since the MATCHD is latched to a logical low state (i.e., the "0" state), the first address of the first sector of the array of core flash memory cells still has a fail result (step 1134 of FIG. 41).

With such a fail result of the first CAM VERIFY state and with the repair routine as described in reference to FIG. 27 herein, the back-end state machine 316 enters a CAM (content addressable memory) JUICE state. Referring to FIG. 35, the PGM and JUICE signals are set to a logical high state in the CAM JUICE state such that the generated match output MATCHD is set to a logical high state (step 1136 of FIG. 41). Then, the back-end state machine 316 enters a second CAM (content addressable memory) VERIFY state with a pass result (step 1138 of FIG. 41) since the generated match output MATCHD is latched to the logical high state from the prior CAM JUICE state of step 1136 of FIG. 41.

The back-end state machine 316 then checks the reg_READ variable to determine whether the BIST mode is a stand-alone read mode (step 1141 of FIG. 41). Stand alone read modes are known to one of ordinary skill in the art of flash memory devices. For example, the reg_READ variable is set to a logical high state by the front-end decoder 314 of the BIST system 300 when the current BIST mode is a stand-alone read mode for reading a respective logical state of each flash memory cell of the array of core flash memory cells without applying programming or erasing voltages on the core flash memory cells such as for the BIST mode illustrated by the flowchart of FIG. 23. Otherwise, the reg_READ variable is set to a logical low state such as for the BIST mode illustrated by the flowchart of FIG. 21.

When the BIST mode is a stand-alone read mode with the reg_READ variable being set to the logical high state, then the back-end state machine 316 resets the address sequencer 524 to a beginning address of the current block of core flash memory cells containing the current flash memory cell with the BACLK signal being set to a logical high state (step 1144 of FIG. 41). With the BACLK signal being set to a logical high state, the MATCHD signal is set to the logical low state, and steps 1132, 1134, 1136, 1138, 1141, and 1144 are repeated again with the beginning address of the current block of core flash memory cells. In this mode, steps 1132, 1134, 1136, 1138, 1141, and 1144 repeat indefinitely in such a loop until a power supply is disconnected from the BIST state machine. During such a loop of steps, referring to FIGS. 13 and 26, nodes of the back-end state machine 316 and especially the components of FIG. 26 used during the repair routine such as the node from the CAM program voltage source 838 or the CAM margin voltage source 840 may be probed to determine whether the back-end state machine 316 is functional during the steps of FIG. 41.

Alternatively, when the BIST mode is not a stand-alone read with the reg_READ variable being set to the logical low state, the back-end state machine 316 then checks the whether the BIST mode is an embedded read mode with the emb_READ variable (step 1142 of FIG. 41). For example, the emb_READ variable is set to the logical high state at step 584 of FIG. 15 or FIG. 21. If the BIST mode is an embedded read mode with the emb_READ variable being set to the logical high state, the back-end state machine 316 enters a second read VERIFY state with the generated match output MATCHD being latched to the logical high state for a pass result (step 1145 of FIG. 41). On the other hand, if the BIST mode is not an embedded read mode with the emb_READ variable being set to the logical low state, the back-end state machine 316 enters a program, erase, or APDE VERIFY state since the repair routine returns to the current BIST mode that invoked the repair routine. In that case, the generated match output MATCHD is latched to the logical high state for a pass result (step 1143 of FIG. 41).

In either case of the emb_READ variable being set to the logical high or low state, the back-end state machine 316 then controls the address sequencer 524 to increment to a subsequent address of the array of core flash memory cells 304 by setting the BACLK signal to a logical high state (step 1146 of FIG. 41). With the BACLK signal being set to the logical high state, the generated match output MATCHD is set back to a logical low state (i.e., the "0" state). After the address sequencer 524 increments to the subsequent address of the array of core flash memory cells 304, the BIST controller 502 checks whether such an address is past the last address of the array of core flash memory cells 304 (step 1148 of FIG. 41). If the address is past the last address of the array of core flash memory cells 304, then the BIST mode ends. Otherwise, steps 1132, 1134, 1136, 1138, 1141, 1142, 1145, 1146, and 1148 of FIG. 41 are repeated for each of the subsequent addresses of the array of core flash memory cells 304 until the address sequencer 524 reaches an address that is past the last address of the array of core flash memory cells 304.

Referring to FIGS. 13 and 26, nodes of the back-end state machine 316 and especially the components of FIG. 26 used during the repair routine such as the node from the CAM program voltage source 838 or the CAM margin voltage source 840 may be probed to determine whether the back-end state machine 316 is functional during the steps of FIG. 41. With such probing of nodes of the back-end state machine 316 of FIG. 13 and especially the components of FIG. 26 used during the repair routine during the steps of FIG. 41, the functionality of the back-end state machine 316 is determined when the repair routine is invoked during the BIST mode.

In this manner, in any of the BIST modes of FIGS. 38, 39, 40, and 41, with use by the back-end state machine 316 of the generated match output MATCHD that is independent of the functionality of the array of core flash memory cells 304, the functionality of the back-end state machine 316 is determined independent of the functionality of the array of core flash memory cells 304. Thus, the accuracy of testing the array of core flash memory cells 304 with the BIST system 300 is ensured by such independent testing of the back-end BIST state machine 316. With such testing for ensuring functionality of the back-end BIST state machine 316, when the array of core flash memory cells 304 is deemed non-functional after testing with the BIST system 300, such non-functionality is relied upon to arise from a defect within the array of core flash memory cells 304 and not from a defect within the back-end BIST state machine 316.

The foregoing is by way of example only and is not intended to be limiting. Any numbers described or illustrated herein are by way of example only. The present invention is limited only as defined in the following claims and equivalents thereof.

F. Address Sequencer within BIST (Built-In-Self-Test) System

The BIST (built-in-self-test) system 300 performs a plurality of BIST (built-in-self-test) modes with each BIST mode sequencing through the array of flash memory cells 304 in a respective sequence. Thus, an address sequencer within the BIST system 300 is desired for efficiently sequencing through the array of flash memory cells 304 according to the respective sequence for each of the plurality of BIST modes.

Figure 42:
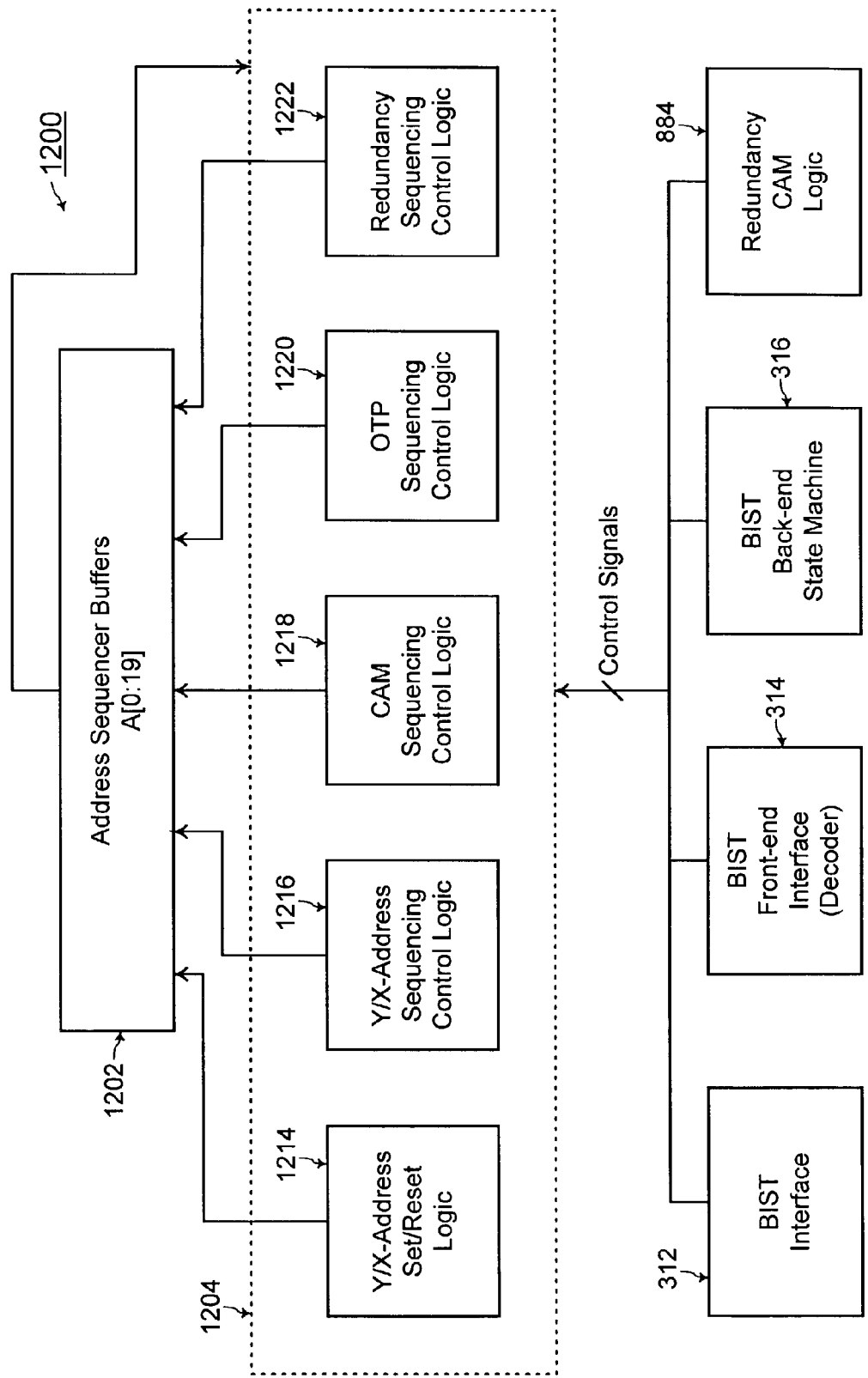
FIG. 42 shows a block diagram of an address sequencer including address sequencer buffers and an address sequencer control logic within the BIST (built-in-self-test) system, according to an embodiment of the present invention.

In another aspect of the present invention, FIG. 42 shows a block diagram of an address sequencer 1200 fabricated on the semiconductor die having the array of flash memory cells 304 fabricated thereon. The address sequencer 1200 may be used for the address sequencer 524 of FIG. 13 or 26 for example. Referring to FIGS. 7 and 33, the address sequencer 1200 is fabricated on the semiconductor die having the array of flash memory cells 304 fabricated thereon as part of the BIST (built-in-self-test) system 300, according to an aspect of the present invention.

Referring to FIG. 42, the address sequencer 1200 includes address sequencer buffers 1202 and an address sequencer control logic 1204. Each buffer of the address sequencer buffers 1202 stores a single bit of data, and buffers for storing data bits are known to one of ordinary skill in the art of electronics. In one embodiment of the present invention, referring to FIGS. 42 and 43, the address sequencer buffers 1202 are comprised of twenty buffers for providing twenty bits that indicate the address of each flash memory cell of the array of flash memory cells 304.

Figure 43:
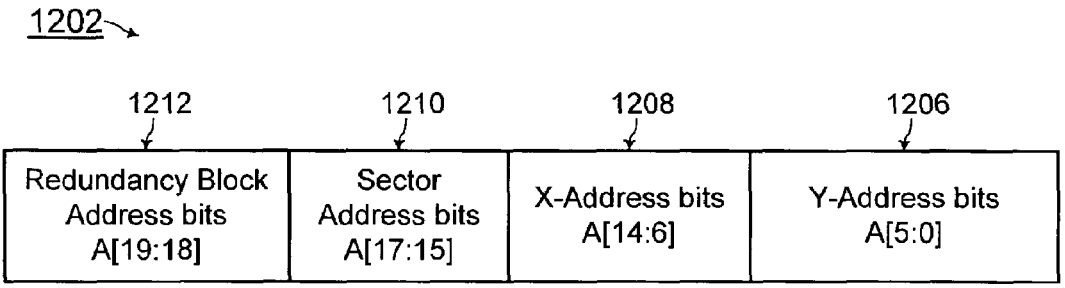
FIG. 43 shows a plurality of address sequencer buffers of the address sequencer of FIG. 42, according to an embodiment of the present invention.

Referring to the example embodiment of FIG. 43, the address sequencer buffers 1202 include a first plurality of six buffers 1206 for providing a first group of six bits A[5:0] that indicate a Y-address for a flash memory cell of the array of flash memory cells 304. The Y-address is a bit-line address indicating which bit-line such a flash memory cell is coupled to, as known to one of ordinary skill in the art of flash memory devices. In addition, the address sequencer buffers 1202 include a second plurality of nine buffers 1208 for providing a second group of nine bits A[14:6] that indicate an X-address for a flash memory cell of the array of flash memory cells 304. The X-address is a word-line address indicating which word-line such a flash memory cell is coupled to, as known to one of ordinary skill in the art of flash memory devices.

Furthermore, the address sequencer buffers 1202 include a third plurality of three buffers 1210 for providing a third group of three bits A[17:15] that indicate a sector address for a flash memory cell of the array of flash memory cells 304. The array of flash memory cells 304 is divided into a plurality of sectors, and the sector address indicates which sector includes such a flash memory cell, as known to one of ordinary skill in the art of flash memory devices. Finally, the address sequencer buffers 1202 include a fourth plurality of two buffers 1212 for providing a fourth group of two bits A[19:18] that indicate a redundancy block address for a flash memory cell of the array of flash memory cells 304. The plurality of sectors are grouped into redundancy blocks with each redundancy block being comprised of a plurality of sectors. The redundancy block address indicates which redundancy block includes such a flash memory cell.

Referring to FIG. 42, the address sequencer control logic 1204 includes a Y/X-address set/reset logic 1214, a Y/X-address sequencing control logic 1216, a CAM (content addressable memory) sequencing control logic 1218, an OTP (one time programmable) sequencing control logic 1220, and a redundancy sequencing control logic 1222. The address sequencer control logic 1204 is coupled to and inputs control signals from the BIST (built-in-self-test) interface 312, the BIST front-end interface decoder 314, the BIST back-end state machine 316, the redundancy CAM logic 884, and the address sequencer buffers 1202. The BIST interface 312, the BIST front-end interface decoder 314, and the BIST back-end state machine 316 are similar in structure and/or function as already described herein with reference to FIG. 7, and the redundancy CAM logic 884 is similar in structure and/or function as already described herein with reference to FIG. 29.

Referring to FIG. 42, the address sequencer control logic 1204 inputs the control signals from at least one of the BIST interface 312, the BIST front-end interface decoder 314, the BIST back-end state machine 316, the redundancy CAM logic 884, and the address sequencer buffers 1202 for a current BIST (built-in-self-test) mode. The address sequencer logic 1204 then controls the address sequencer buffers 1202 to sequence through a respective sequence of addresses depending on such control signals for each of the plurality of BIST (built-in-self-test) modes.

Figure 44:
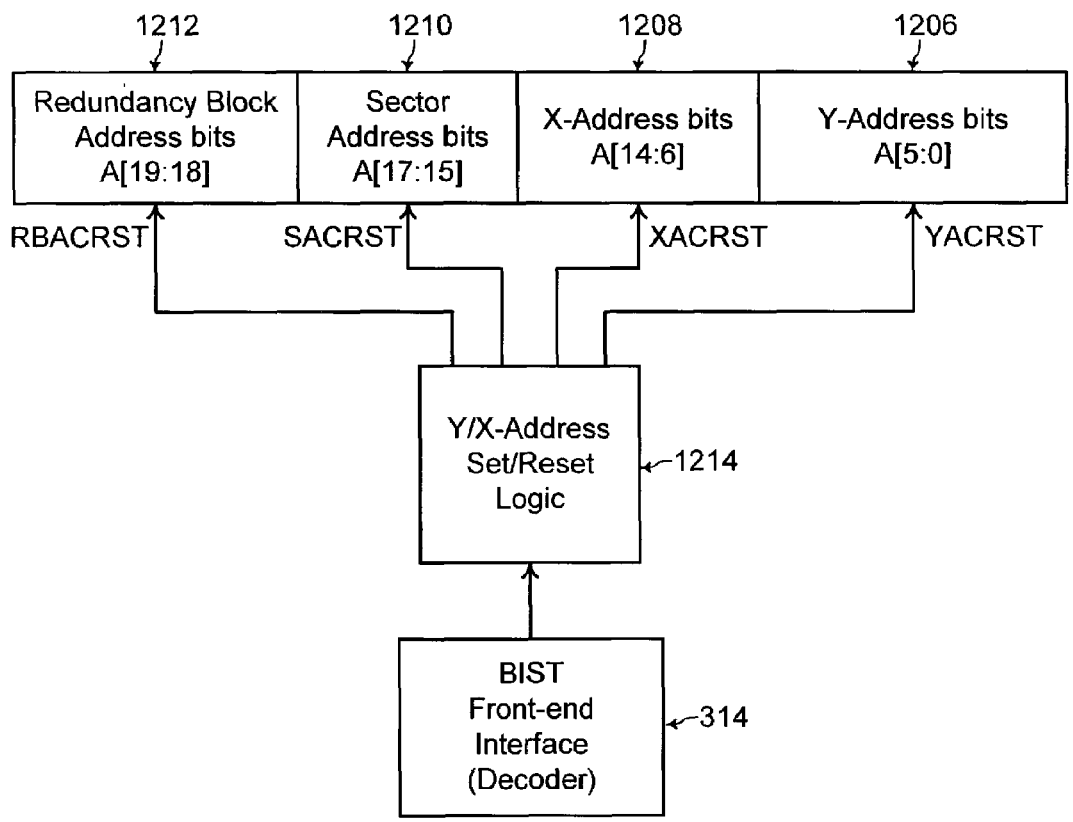
FIG. 44 illustrates reset signals generated by the address sequencer control logic for resetting the address sequencer buffers to beginning addresses at start of a BIST (built-in-self-test) mode, according to an embodiment of the present invention.

Examples of such control signals for BIST (built-in-self-test) modes and the corresponding sequences of addresses is now described. Referring to FIG. 44, the Y/X-address set/reset logic 1214 inputs a control signal from the BIST front-end interface decoder 314 indicating start of a current BIST (built-in-self-test) mode. In that case, the Y/X-address set/reset logic 1214 asserts a YACRST control signal to reset the first plurality of address sequencer buffers 1206 such that the first group of six bits A[5:0] indicates a beginning Y-address of the array of flash memory cells 304. For example, the beginning Y-address may be comprised of all-high six bits such as "1 1 1 1 1 1" when the first group of six bits A[5:0] are decremented down by one bit for each subsequent Y-address.

In addition, the Y/X-address set/reset logic 1214 asserts a XACRST control signal to reset the second plurality of address sequencer buffers 1208 such that the second group of nine bits A[14:6] indicates a beginning X-address of the array of flash memory cells 304 at the start of a current BIST (built-in-self-test) mode. For example, the beginning X-address may be comprised of all-high nine bits such as "1 1 1 1 1 1 1 1 1" when the second group of nine bits A[14:6] are decremented down by one bit for each subsequent X-address.

Similarly, the Y/X-address set/reset logic 1214 asserts a SACRST control signal to reset the third plurality of address sequencer buffers 1210 such that the third group of three bits A[17:15] indicates a beginning sector address of the array of flash memory cells 304 at the start of a current BIST (built-in-self-test) mode. For example, the beginning sector address may be comprised of all-high three bits such as "1 1 1" when the third group of three bits A[17:15] are decremented down by one bit for each subsequent sector address.

Furthermore, the Y/X-address set/reset logic 1214 asserts a RBACRST control signal to reset the fourth plurality of address sequencer buffers 1212 such that the fourth group of two bits A[19:18] indicates a beginning redundancy block address of the array of flash memory cells 304 at the start of a current BIST (built-in-self-test) mode. For example, the beginning redundancy block address may be comprised of all-high two bits such as "1 1" when the fourth group of two bits A[19:18] are decremented down by one bit for each subsequent redundancy block address.

Figure 45:
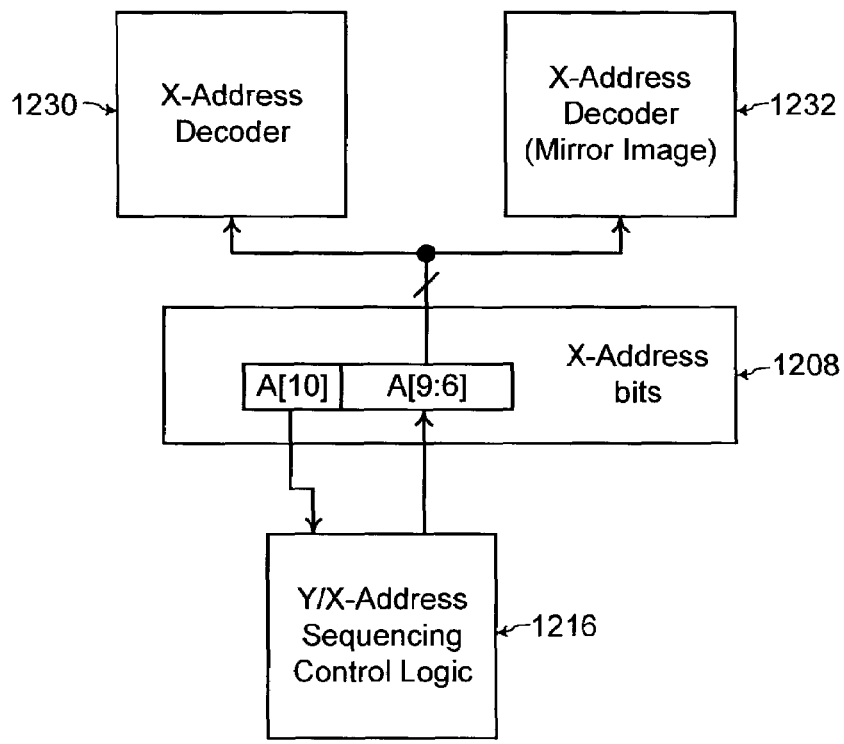
FIG. 45 illustrates control by the address sequencer control logic of a subset of X-address bits for achieving physically adjacent sequencing of the X-addresses when two adjacent X-address decoders are fabricated as mirror-images of each-other, according to an embodiment of the present invention.

Referring to FIG. 45, in another embodiment of the present invention, the second plurality of address sequencer buffers 1208 for the X-address is coupled to a first X-address decoder 1230 and a second X-address decoder 1232. The second group of nine bits from the second plurality of address sequencer buffers 1208 is coupled to the X-address decoders 1230 and 1232 that decode such address bits for selecting the word-line of the array of flash memory cells. Such, address decoders are known to one of ordinary skill in the art of flash memory devices. In one embodiment of the present invention, for efficiency in lay-out of the X-address decoders 1230 and 1232, the second X-address decoder 1232 is laid-out on the semiconductor die having the array of flash memory devices fabricated thereon as a mirror image of the first X-address decoder 1230. In that case, the Y/X address sequencing control logic inverts the order of a subset of bits A[9:6] of the second group of bits for achieving physically adjacent sequencing of the word-lines of the array of flash memory cells 304.

For example, the first X-address decoder 1230 inputs the subset of bits A[9:6] without the order of such bits being inverted to sequence first through sixteenth word-lines from the top of the array of flash memory cells 304. Because the second X-address decoder 1232 is laid out as a mirror image of the first X-address decoder 1230, if the second X-address decoder 1232 inputs the subset of bits A[9:6] without the order of such bits being inverted, then the second X-address decoder 1232 sequences thirty-second through seventeenth word-lines from the bottom of the array of flash memory cells 304. In that case, the sequencing of the word-lines first with the first X-address decoder 1230 and then with the second X-address decoder 1232 is not physically adjacent since the second X-address decoder 1232 jumps to the thirty-second word-line after the first X-address decoder 1230 sequences to the sixteenth word-line.

However, with the order of the subset of bits A[9:6] inverted, after the first X-address decoder 1230 sequences the first through the sixteenth word-lines from the top of the array of flash memory cells 304, the second X-address decoder 1232 sequences the seventeenth through the thirty-second word-lines such that the sequencing of the word-lines with the first X-address decoder 1230 and the second X-address decoder 1232 is physically adjacent. The adjacent significant bit A[10] is coupled to the Y/X address sequencing control logic 1216. The adjacent significant bit A[10] toggles after the first X-address decoder 1230 sequences the first through the sixteenth word-lines from the top of the array of flash memory cells 304. Thus, when the adjacent significant bit A[10] toggles, the Y/X address sequencing control logic 1216 controls the second plurality of address sequencer buffers 1208 to invert the order of the subset of bits A[9:6] such that the second X-address decoder 1232 sequences the seventeenth through the thirty-second word-lines.

Figure 46:
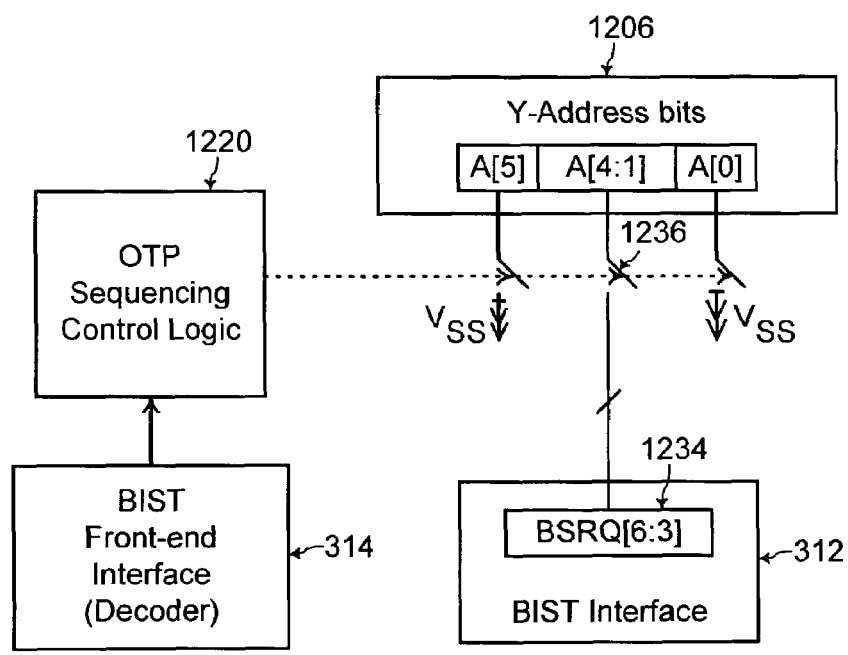
FIG. 46 illustrates coupling of a bit pattern from a register of a BIST (built-in-self-test) interface to a subset of Y-address buffers for indicating an address of each OTP (one time programmable) flash memory cell to be accessed by an external test system, according to an embodiment of the present invention.

Referring to FIG. 46, in another embodiment of the present invention, the OTP sequencing control logic 1220 inputs a control signal from the BIST front-end interface decoder 314 indicating that a current BIST (built-in-self-test) mode is for accessing OTP (one time programmable) flash memory cells. OTP flash memory cells are part of the array of flash memory cells 304 that are typically programmed only once for storing information such as identification information for example descriptive of the array of flash memory cells 304. The user accesses the OTP flash memory cells from the external test system 318 via the BIST interface 312. The user inputs the address of one of such OTP flash memory cells into a register 1234 of the BIST interface 312.

In the example of FIG. 46, the user inputs four data bits BSRQ[6:3] into the register 1234 of the BIST interface 312. When the OTP sequencing control logic 1220 inputs a control signal from the BIST front-end interface decoder 314 indicating that a current BIST (built-in-self-test) mode is for accessing OTP (one time programmable) flash memory cells, the OTP sequencing control logic 1220 controls pass gates 1236 to couple a subset of the first plurality of address sequencer buffers 1206 forming the subset of bits A[4:1] to the register 1234 of the BIST interface 312. Thus, the four data bits BSRQ[6:3] of the register 1234 of the BIST interface 312 are transferred into the subset of the first plurality of address sequencer buffers 1206 forming the subset of bits A[4:1] of the first group of bits A[5:0]. The most significant bit A[5] and the least significant bit A[0] are not used in that case, and the OTP sequencing control logic 1220 controls pass gates to couple the address sequencer buffers for those bits A[5] and A[0] to the negative power supply $V_{SS}$. In this manner, the user specifies the address of the OTP flash memory cell to be accessed via the external test system 318.

Figure 47:
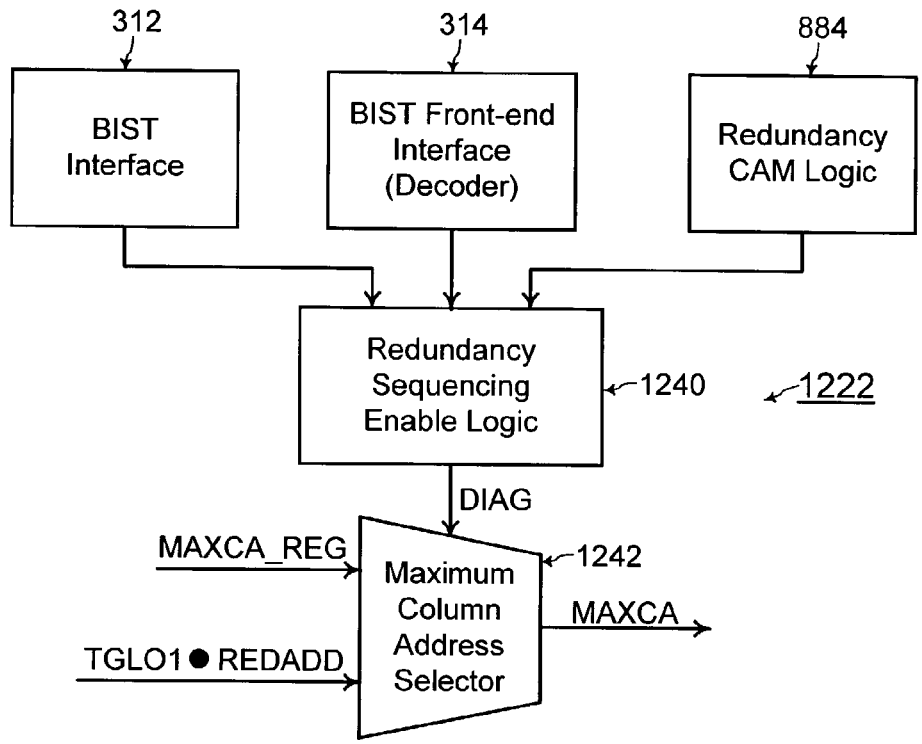
FIG. 47 illustrates a redundancy sequencing enable logic and a maximum column address selector for determining whether redundancy flash memory cells are to be sequenced, according to an embodiment of the present invention.

Referring to FIGS. 42 and 47, the redundancy sequencing control logic 1222 includes a redundancy sequencing enable logic 1240 and a maximum column address selector 1242. The redundancy sequencing enable logic 1240 inputs control signals from the BIST interface 312, the BIST front-end interface decoder 314, and the redundancy CAM logic 884. From such control signals the redundancy sequencing enable logic 1240 determines whether redundancy flash memory cells are to be sequenced by the address sequencer buffers 1202.

Figure 48:
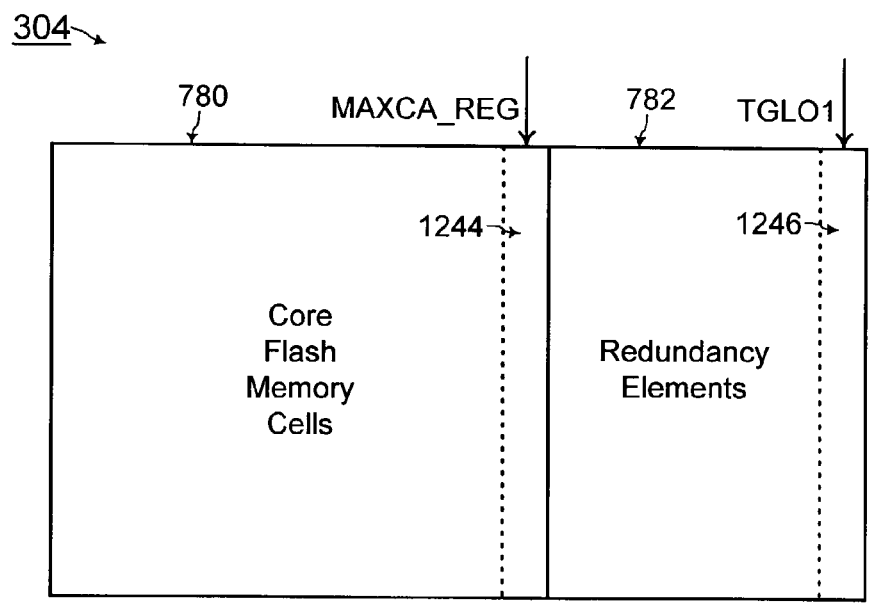
FIG. 48 illustrates the last column of core flash memory cells and the last column of redundancy flash memory cells.

Referring to FIG. 48, the array of flash memory cells 304 is comprised of core flash memory cells 780 and redundancy flash memory cells 782 as already described herein with reference to FIG. 22. During sequencing through columns of the core flash memory cells 780, when the last column address (i.e., Y-address) of a last column 1244 of the core flash memory cells is reached, a MAXCA_REG signal is asserted. During sequencing through columns of the redundancy flash memory cells 782, when the last column address (i.e., Y-address) of a last column 1246 of the redundancy flash memory cells is reached, a TGLO1 signal is asserted.

The redundancy sequencing enable logic 1240 generates a DIAG signal asserted to a logical high state when the redundancy flash memory cells 782 are not to be sequenced with only the core flash memory cells 780 being sequenced and set to a logical low state when the redundancy flash memory cells 782 are to be sequenced along with the core flash memory cells 780. The redundancy sequencing enable logic 1240 asserts the DIAG signal to the logical high state for the following conditions:

(A) when a control signal from the BIST front-end interface decoder 314 indicates that a current BIST mode is for diagonal program of the array of core flash memory cells 780;

(B) when a control signal from the BIST front-end interface decoder 314 indicates that a current BIST mode is for diagonal erase verify of the array of core flash memory cells 780;

(C) when the YCE[1] signal from the redundancy CAM logic 884 is asserted to the logical high state indicating that all available redundancy flash memory cells have already been used for repairing defective core flash memory cells; and (D) when a control signal from the BIST interface 312 indicates that a current test mode is for a manual test mode instead of a BIST (built-in-self-test) mode. Otherwise, the sequencing enable logic 1240 sets the DIAG signal to the logical low state.

The maximum column address selector 1242 selects the MAXCA signal as one of the MAXCA_REG signal or the TGLO1 signal ANDed with the REDADD signal depending on whether the DIAG signal is set to the logical high or low state. The maximum column address selector 1242 selects the MAXCA_REG signal as the MAXCA signal when the DIAG signal is asserted to the logical high state. On the other hand, the maximum column address selector 1242 selects the TGLO1 signal ANDed with the REDADD signal as the MAXCA signal when the DIAG signal is set to the logical low state.

Figure 49:
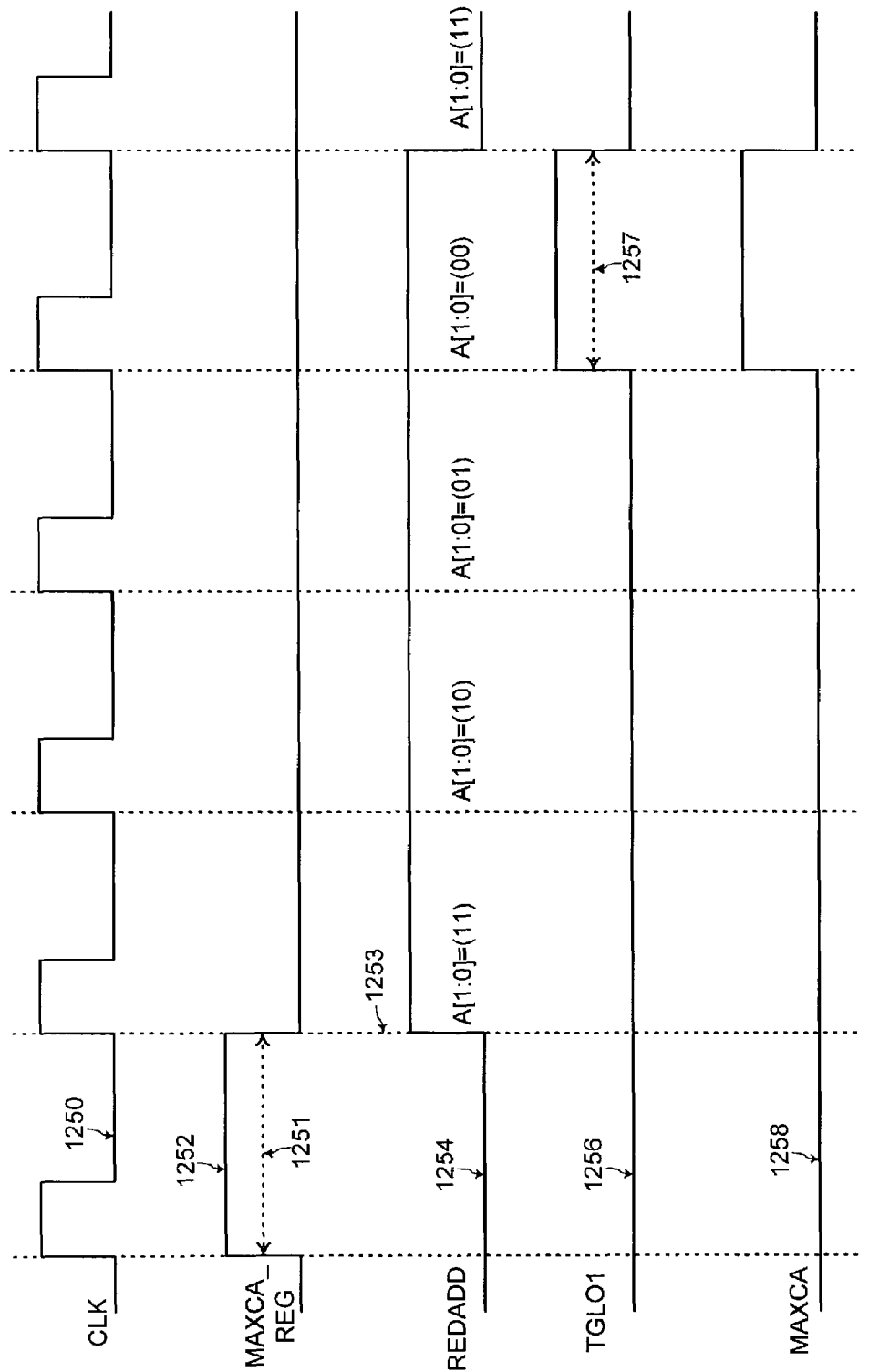
FIG. 49 illustrates a timing diagram of signals used by the sequencing enable logic and the maximum column address selector for determining whether redundancy flash memory cells are to be sequenced, according to an embodiment of the present invention.

FIG. 49 illustrates timing diagrams of the signals used by the maximum column address selector 1242 including a CLK signal 1250. Referring to FIGS. 48 and 49, the MAXCA_REG signal 1252 is asserted by the Y/X address sequencing control logic 1216 when the address of the last column 1244 of the core flash memory cells 780 is reached within the first plurality of address sequencer buffers 1206 for the Y-address, at a first period 1251 of the CLK signal 1250. At the start of a second period 1253 of the CLK signal 1250 after the first period, the redundancy sequencing control logic 1222 controls the first plurality of address sequencer buffers 1206 for the Y-address to sequence through the columns of the redundancy flash memory cells 782.

In one embodiment of the present invention, the least two significant bits A[1:0] are used for sequencing through the columns of the redundancy flash memory cells 782. In an example flash memory device, each redundancy block of flash memory cells has sixteen redundancy I/O's (inputs/outputs) for accessing the redundancy elements. In that example, each redundancy element is associated with eight of such sixteen redundancy I/O's such that each redundancy block has two redundancy elements. In addition, four redundancy columns of redundancy flash memory cells are associated with each of such I/O's. Thus, the two bits A[1:0] are used for sequencing through each of such four redundancy columns of redundancy flash memory cells for each of the I/O's.

During such sequencing of the columns of the redundancy flash memory cells 782, the REDADD signal 1254 is asserted to the logical high state. The REDADD that is asserted to the logical high state prevents the four more significant bits A[5:2] from toggling. The REDADD is asserted to the logical high state as the least two significant bits A[11:0] are decremented through "1 1", "1 0", "0 1", and "0 0" with each period of the CLK signal 1250 to sequence through the columns of the redundancy flash memory cells 782.

Referring to FIGS. 48 and 49, after the address "0 0" of the last column 1246 of the redundancy flash memory cells 782 is sequenced by the least two significant bits A[1:0] of the first plurality of address sequencer buffers 1206, the TGLO1 signal 1256 is asserted to the logical high state during a fifth period 1257 of the CLK signal 1250. The REDADD signal 1254 is maintained at the logical high state until the end of the fifth period 1257 of the CLK signal 1250 when the REDADD signal 1254 is set back to the logical low state as the least two significant bits A[1:0] returns to being set as "1 1".

Referring to FIGS. 47, 48, and 49, if the DIAG signal is asserted to the logical high state, the maximum column address selector 1242 selects the MAXCA signal as the MAXCA_REG signal which is asserted earlier during the first period 1251 of the CLK signal 1250. In that case, processing of the columns of flash memory cells 304 stops at the last column 1244 of the core flash memory cells 780, and the columns of the redundancy flash memory cells 782 are not processed. On the other hand, if the DIAG signal is set to the logical low state, the maximum column address selector 1242 selects the MAXCA signal as the TGLO1 signal ANDed with the REDADD signal.

Such a MAXCA signal 1258 is illustrated in FIG. 49 as being asserted to the logical high state during the fifth period 1257 of the CLK signal after the least two significant bits A[1:0] of the first plurality of address sequencer buffers 1206 have sequenced through the columns of the redundancy flash memory cells 782. In that case, processing of the columns of flash memory cells 304 does not stop at the last column 1244 of the core flash memory cells 780 such that the columns of the redundancy flash memory cells 782 are also processed.

Figures 50, 51:
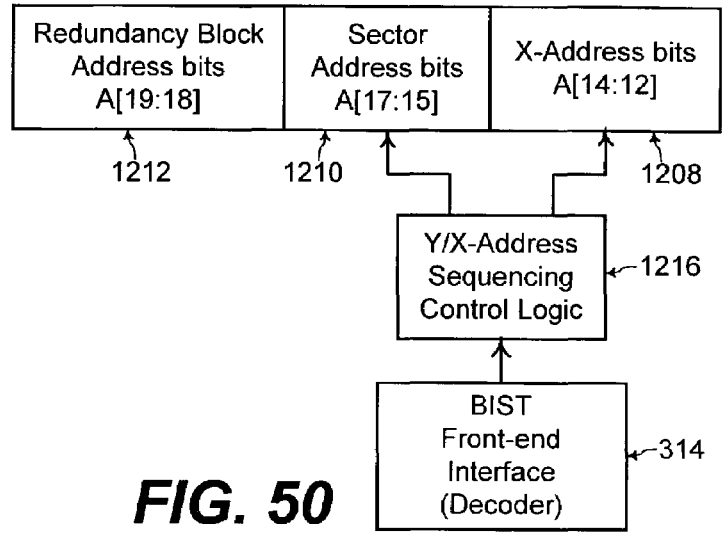
FIG. 50 illustrates control by the address sequencer control logic of the address sequencer buffers for sequencing through each of the WPCAMs (write protect content addressable memories) of the plurality of sectors, according to an embodiment of the present invention.
FIG. 51 shows a table of bit patterns for sequencing through the WPCAMs (write protect content addressable memories) of the plurality of sectors, according to an embodiment of the present invention.

Referring to FIG. 50, in another embodiment of the present invention, the Y/X-address sequencing control logic 1216 inputs a control signal from the front-end interface decoder 314 indicating that a current BIST (built-in-self-test) mode is for testing a respective WPCAM (write protect content addressable memory) for each sector of the array of flash memory cells 304. Referring to the table of FIG. 51, in one example array of flash memory cells 304, the array of flash memory cells 304 is divided into thirty-two 64 Kbyte (kilo-byte) sectors of flash memory cells. In addition, the last 64 Kbyte (kilo-byte) sector is further divided into four smaller subsectors including subsector #31 that is a 32 Kbyte (kilo-byte) sector, subsector #32 that is an 8 Kbyte (kilo-byte) sector, subsector #33 that is an 8 Kbyte (kilo-byte) sector, and subsector #34 that is a 16 Kbyte (kilo-byte) sector. All of the thirty-one prior sectors including sector #0, sector #1, sector #2, and so on through to sector #30 is a 64 Kbyte (kilo-byte) sector.

Referring to FIGS. 50 and 51, when the sequencing control logic 916 inputs a control signal from the front-end interface decoder 314 indicating that a current BIST (built-in-self-test) mode is for testing a respective WPCAM for each sector of the array of flash memory cells 304, the sequencing control logic 1216 controls sequencing of bits A[19:15] of the third and fourth plurality of address sequencer buffers 1210 and 1212. In addition, in that case, the sequencing control logic 1216 controls sequencing of a subset of bits A[14:12] of the second plurality of address sequencer buffers 1208.

Referring to the last column of the table of FIG. 51, for accessing sector #34, sector #33, sector #32, and sector #31, the sequencing control logic 1216 controls the subset of the second plurality of address sequencer buffers 1208 for sequencing the three bits A[14:12]. The three bits A[14:12] are sequenced from "1 1 0" for sector #34, then to "1 0 1" for sector #33, then to "1 0 0" for sector #32, and then to "0 1 1" for sector #31. During such sequencing of the three bits A[14:12], the five bits A[19:15] are held at the bit pattern of "1 1 1 1 1". When sector #31 is reached with the three bits A[14:12] being "0 1 1", the bit A[ 14] has toggled to the logical low state "0" from the logical high state "1".

After that point, the Y/X-address sequencing control logic 1216 controls the third and fourth address sequencer buffers 1210 and 1212 to decrement by one bit for sequencing through sector #30, then sector #29, and so on, down to sector #0. In addition, after sector #30 has been accessed with the three bits A[14:12] being "0 1 0", the buffer for bit A[14] is disconnected from the buffer for bit A[15], and the Y/X-address sequencing control logic 1216 prevents the buffer for bit A[12] from toggling such that the three bits A[14:12] are fixed at "0 1 0" for the rest of the 64 Kbyte sector #30 through sector #0.

In this manner, the three bits A[14:12] of the subset of the second plurality of address sequencer buffers 1208 are used for sequencing through the addresses of the subsectors #34, #33, #32, and #31. Then, after sequencing of the subsectors #34, #33, #32, and #31, the three bits A[14:12] are fixed at "0 1 0", and the five bits A[19:15] of the third and fourth address sequencer buffers 1210 and 1212 are decremented by one bit for sequencing through rest of the 64 Kbyte sector #30 through sector #0. Thus, during sequencing through the thirty-one 64 Kbyte sectors (#30 down to #0), the subsectors #34, #33, #32, and #31 are not sequenced with the three bits A[14:12] of the subset of the second plurality of address sequencer buffers 908.

Figures 52, 53:
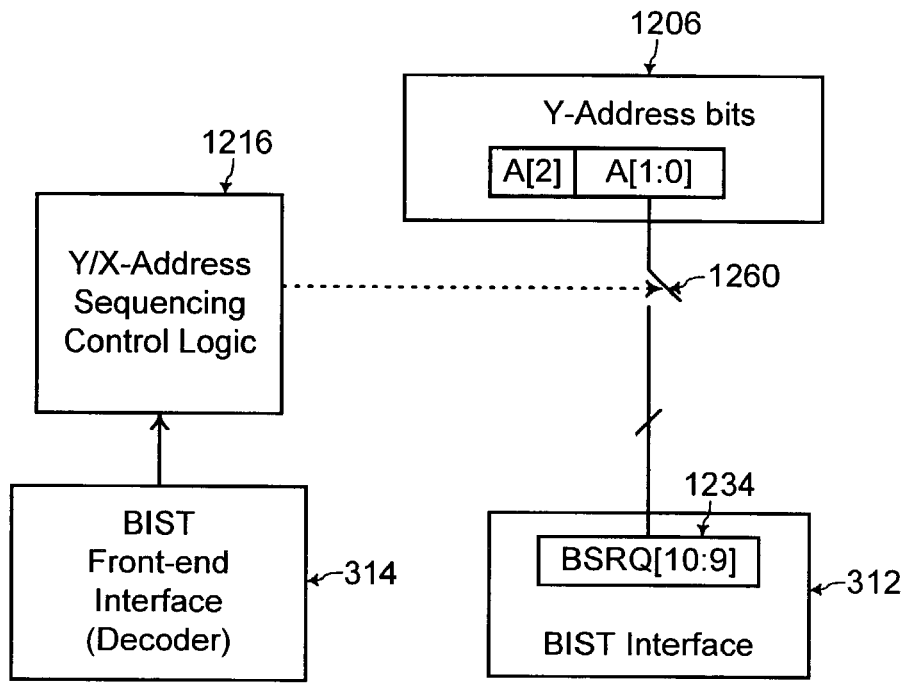
FIG. 52 illustrates coupling of a bit pattern from a register of a BIST (built-in-self-test) interface to the subset of Y-address buffers for indicating an address of a reference cell to be erase trimmed, according to an embodiment of the present invention.
FIG. 53 shows a table of the sequencing of addresses of the reference cells with the subset of Y-address buffers during an erase trimming BIST mode, according to an embodiment of the present invention.

Referring to FIG. 52, in another embodiment of the present invention, the Y/X-address sequencing control logic 1216 inputs a control signal from the front-end interface decoder 314 indicating that a current BIST (built-in-self-test) mode is for erase trimming a set of reference cells. Referring to FIG. 13, the reference flash memory cells are located within the reference circuit 514 and provide the reference current level used by the comparator circuit 516, as already described herein with reference to FIG. 13. In one embodiment of the invention, the reference flash memory cells include an ERV (erase verify) reference cell for providing the current level used to determine whether a flash memory cell has been sufficiently erased during an erase verify process.

In addition, a RDV (read verify) reference cell provides the current level used during a read verify process. A PGMV (program verify) reference cell provides the current level used to determine whether a flash memory cell has been sufficiently programmed during a program verify process. Referring to FIGS. 51 and 53, an APDEV1 reference cell provides the current level used during an APDEV (auto program disturb after erase verify) process for the smaller subsectors (i.e., the subsectors #31, 32, 33, and 34 in FIG. 51). On the other hand, the APDEV2 reference cell together with the APDEV1 reference cell provide the current level used during an APDEV (auto program disturb after erase verify) process for the regular 64 kilobyte sectors (i.e., the sectors #0 to 30 in FIG. 51). Such reference cells and such verify processes are known to one of ordinary skill in the art of flash memory devices.

Referring to FIG. 52, when the Y/X-address sequencing control logic 1216 inputs the control signal from the front-end interface decoder 314 that a current BIST (built-in-self-test) mode is for trimming a set of reference cells, the Y/X-address sequencing control logic 1216 controls a pass-gate 1260 to couple two bits BSRQ[10:9] from the register 1234 of the BIST interface 312 to a subset of the first plurality of address sequencer buffers 1206 for storing the least two significant bits A[1:0]. In that case, the two bits BSRQ[10:9] from the register 1234 of the BIST interface 312 are transferred as the least two significant bits A[1:0] of the first plurality of address sequencer buffers 1206. The user enters the two bits BSRQ[10:9] of the register 1234 of the BIST interface 312 via the external test system 318.

Referring to FIG. 53, the least three significant bits A[2:0] of the first plurality of address sequencer buffers 1206 are used for sequencing through the ERV, RDV, PGMV, APDEV1, and APDEV2 reference cells. The table of FIG. 53 illustrates an example of the bit patterns of the least three significant bits A[2:0] for representing the address of each of the ERV, RDV, PGMV, APDEV1, and APDEV2 reference cells. In the example of FIG. 53, the ERV reference cell is represented by the bit pattern "1 1 1" for the least three significant bits A[2:0], the RDV reference cell is represented by the bit pattern "1 1 0", the PGMV reference cell is represented by the bit pattern "1 0 1", the APDEV1 reference cell is represented by the bit pattern "1 0 0", and the APDEV2 reference cell is represented by the bit pattern "0 1 1".

Figure 54:
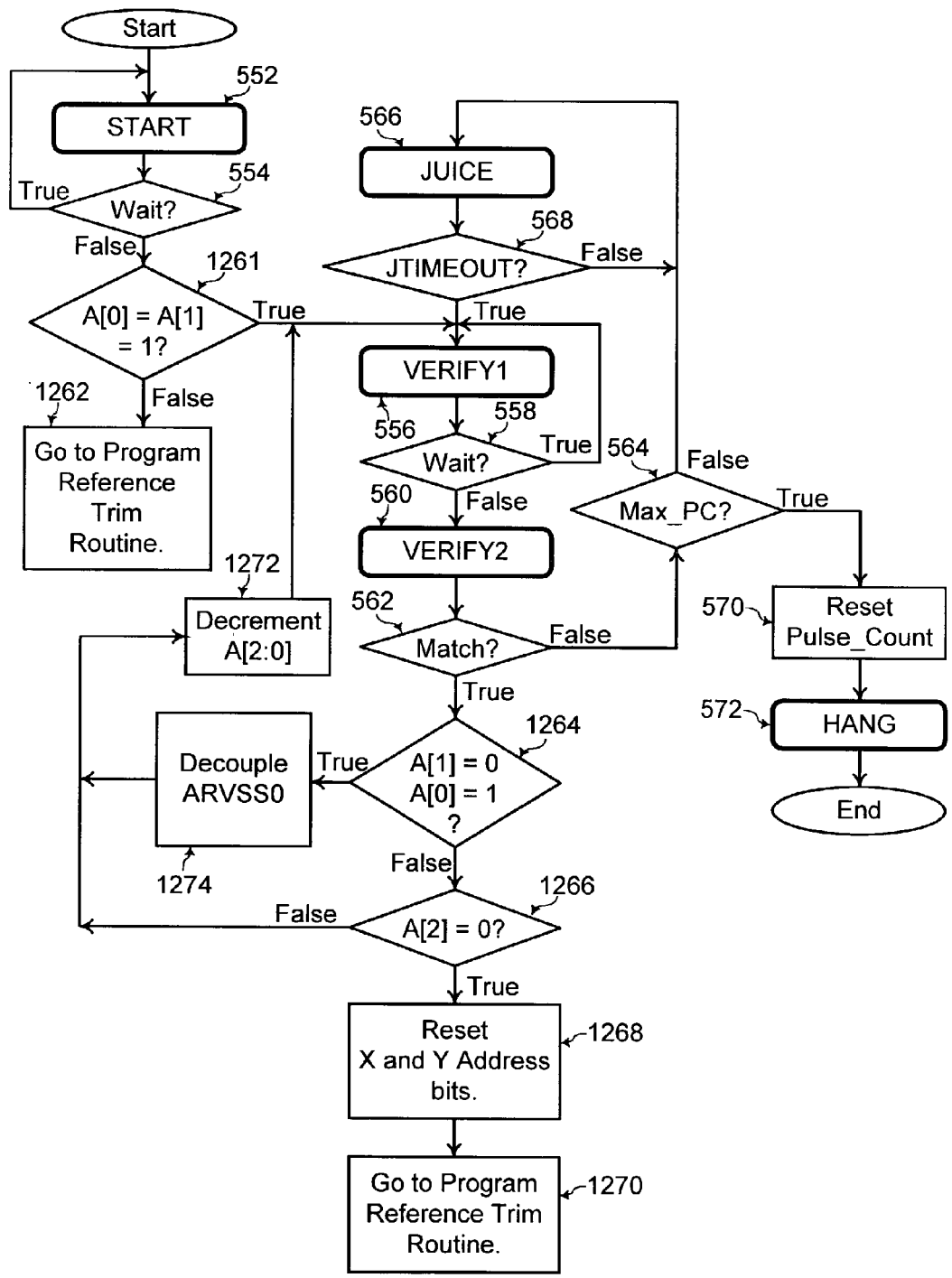
FIG. 54 illustrates the flow-chart for erase trimming reference cells with sequencing through the reference cells using a subset of Y-address buffers of the address sequencer buffers, according to an embodiment of the present invention.

FIG. 54 shows a flowchart of the steps for erase trimming the reference cells as a BIST (built-in-self-test) mode. The steps of the flowchart of FIG. 54 having the same reference numeral as the steps of the flowchart of FIG. 15 are similar as already described herein with reference to FIG. 15. Referring to FIG. 54, after the START state (step 552 and 554 of FIG. 54), the bit pattern of the least two significant bits A[1:0] is checked (step 1261 of FIG. 54). If the user has not entered the bit pattern of "1 1" for the least two significant bits A[1:0], a program trimming routine is entered (step 1262 of FIG. 54) for trimming one of the RDV, PGMV, APDEV1, and APDEV2 reference cells using programming voltages. Such a program reference trimming routine is known to one of ordinary skill in the art of flash memory devices.

On the other hand, the user enters the bit pattern of "1 1" for the least two significant bits A[1:0] for invoking the erase trimming routine of FIG. 54. In that case, the bit pattern in the least three significant bits A[2:0] is "1 1 1", and the VERIFY1 and VERIFY2 states are entered for determining whether the current level through the ERV reference cell is within an acceptable range at the match step 562. If the current level through the ERV reference cell is not within an acceptable range at the MATCH step 562, and a MAX_PC number of erase pulses have not been applied (step 564 of FIG. 54), then the JUICE state is entered (steps 566 and 568 of FIG. 54) for applying an erase pulse on all of the ERV, RDV, PGMV, APDEV1, and APDEV2 reference cells. During such a JUICE state, a first erase pulse having a first ARVSS0 voltage level is applied on the ERV, RDV, and PGMV reference cells while a second erase pulse having a second ARVSS1 voltage level is applied on the APDEV1 and APDEV2 reference cells.

Steps 556, 558, 560, 562, 564, 566, and 568 are repeated with an increment to the Pulse_Count until the current level through the ERV reference cell is within the acceptable range with the Pulse_Count not reaching the MAX_PC or until the Pulse_Count reaches the MAX_PC with the current level through the ERV reference cell not being within the acceptable range. If the Pulse_Count reaches the MAX_PC with the current level through the ERV reference cell not being within the acceptable range, the HANG state is entered (steps 570 and 572 of FIG. 54). In that case, the current reference cell has not been successfully erase trimmed.

If the current level through the ERV reference cell is within the acceptable range with the Pulse_Count not reaching the MAX_PC, the current reference cell has been successfully erase trimmed. In that case, the bit pattern of the least two significant bits A[1:0] is checked again (step 1264 of FIG. 54). If the bit pattern of the least two significant bits A[1:0] is "0 1" then the PGMV reference cell has been erased trimmed. Otherwise, the PGMV reference cell has not been reached yet.

In that case, the bit of the third least significant bit A[2] is checked (step 1266 of FIG. 54). Referring to FIG. 53, if the third least significant bit A[2] reaches the logical low state "0", then the last reference cell APDEV2 has been reached. In that case, the erase trimming for each of the ERV, RDV, PGMV, APDEV1, and APDEV2 reference cells has been completed. Thus, the first and second address sequencer buffers 1202 and 1204 are reset to the beginning Y-address and X-address (step 1268 of FIG. 54), and the program trimming routine is entered (step 1270 of FIG. 54) for trimming the ERV reference cell using programming voltages. Such a reference program trimming routine is known to one of ordinary skill in the art of flash memory devices.

Referring back to step 1266, if the third least significant bit A[2] has not reached the logical low state "0", then the three least significant bits A[2:0] are decremented by one bit (step 1272 of FIG. 54) to sequence to the next one of the reference cells. After the ERV reference cell has been erase trimmed, the three least significant bits A[2:0] are decremented by one bit to "1 1 0" for erase trimming the RDV reference cell through steps 556, 558, 560, 562, 564, 566, and 568. Then, after the RDV reference cell has been erase trimmed, the three least significant bits A[2:0] are decremented by one bit to "1 0 1" for erase trimming the PGMV reference cell through steps 556, 558, 560, 562, 564, 566, and 568.

Referring to step 1264 of FIG. 54, after the PGMV reference cell has been erase trimmed, the bit pattern for the least two significant bits A[1:0] is "0 1". In that case, the erase pulse having the first ARVSS0 voltage level is decoupled from the ERV, RDV, and PGMV reference cells (step 1274 of FIG. 54) such that an erase pulse is no longer applied on the ERV, RDV, and PGMV reference cells during any subsequent JUICE state (steps 566 and 568 of FIG. 54). The erase pulse with voltage level ARVSS1 is only coupled to and applied on the APDEV1 and APDEV2 reference cells, and no erase pulse is applied on the ERV, RDV, and PGMV reference cells from this point since the ERV, RDV, and PGMV reference cells have already been erase trimmed.

At the decrement of the least three significant bits A[2:0] to "1 0 0", the APDEV1 reference cell is erase trimmed through steps 556, 558, 560, 562, 564, 566, and 568 with the second erase pulse voltage level ARVSS1 being applied only on the APDEV1 and APDEV2 reference cells at the JUICE state (step 566 and 568 of FIG. 54). Then, after the APDEV1 reference cell has been erase trimmed, the three least significant bits A[2:0] are decremented by one bit to "0 111" for erase trimming the APDEV2 reference cell through steps 556, 558, 560, 562, 564, 566, and 568 with the second erase pulse voltage level (ARVSS1) at the JUICE state being applied only on the APDEV1 and APDEV2 reference cells (step 566 and 568 of FIG. 54). After the APDEV2 reference cell has been erase trimmed, the third least significant bit A[2] is checked at step 1266, and the routine for erase trimming the ERV, RDV, PGMV, APDEV1, and APDEV2 reference cells ends with steps 1268 and 1270 of FIG. 54.

Figure 55:
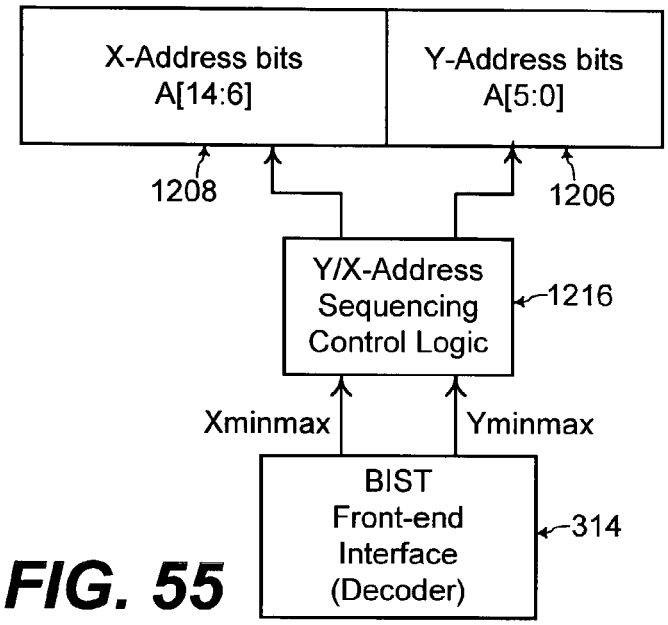
FIG. 55 illustrates control by the address sequencer control logic of the address sequencer buffers for sequencing through each of the bit-lines before incrementing a word-line address or through each of the word-lines before incrementing a bit-line address depending on Xminmax and Yminmax control signals, according to an embodiment of the present invention.

Referring to FIG. 55, in another embodiment of the present invention, the Y/X-address sequencing control logic 1216 inputs Xminmax and Yminmax control signals from the front-end interface decoder 314. When the Xminmax control signal is set to the logical high state with the Yminmax control signal being set to the logical low state, the Y/X-address sequencing control logic 1216 controls the first plurality of address sequencer buffers 1206 for the Y-address to sequence through each of the bit-line addresses for a word-line address of the second plurality of address sequencer buffers 1208 for the X-address before such a word-line address is incremented. In that case, flash memory cells of each bit-line address for a row (i.e., a word-line) of flash memory cells is processed before sequencing to the next row of flash memory cells.

On the other hand, when the Xminmax control signal is set to the logical low state with the Yminmax control signal being set to the logical high state, the Y/X-address sequencing control logic 1216 controls the second plurality of address sequencer buffers 1208 for the X-address to sequence through each of the word-line addresses for a bit-line address of the first plurality of address sequencer buffers 1206 for the Y-address before such a bit-line address is incremented. In that case, flash memory cells of each word-line address for a column (i.e., a bit-line) of flash memory cells is processed before sequencing to the next column of flash memory cells. Such Xminmax and Yminmax control signals provide flexibility in the order for processing the rows and columns of flash memory cells for different BIST (built-in-self-test) modes.

Figure 56:
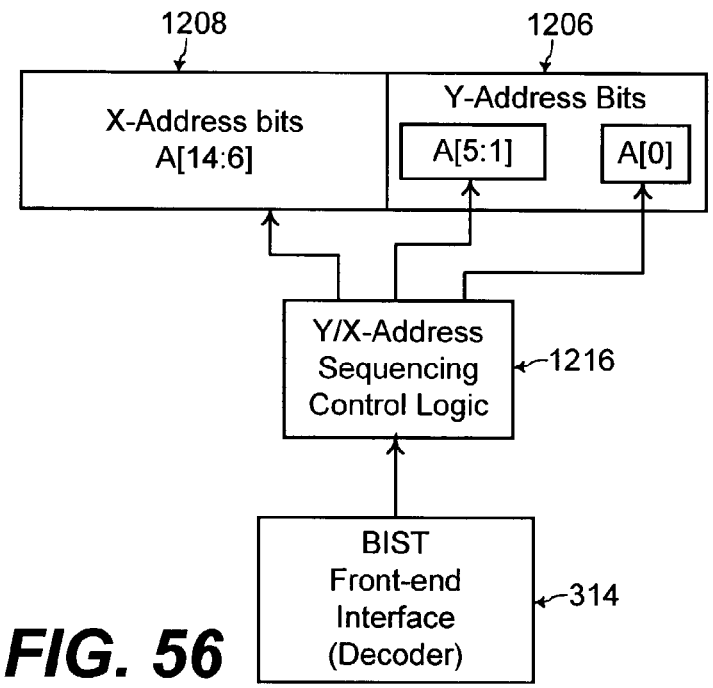
FIG. 56 illustrates control by the address sequencer control logic of the address sequencer buffers for sequencing through alternating flash memory cells through rows and columns of the flash memory cells for a checker-board BIST mode, according to an embodiment of the present invention.

Referring to FIG. 56, in another embodiment of the present invention, the Y/X-address sequencing control logic 1216 inputs a control signal from the front-end interface decoder 314 indicating that a current BIST (built-in-self-test) mode is for checker-board program of flash memory cells. In such a checker-board BIST mode, alternating flash memory cells are accessed as known to one of ordinary skill in the art of flash memory devices. Thus, when the Y/X-address sequencing control logic 1216 inputs the control signal from the front-end interface decoder 314 indicating that a current BIST (built-in-self-test) mode is for a checker-board BIST mode, the Y/X-address sequencing control logic 1216 controls the first plurality of address sequencer buffers 1206 to toggle only the subset of five bits A[5:1] to increment the Y-address by two. Thus, the least significant bit A[0] is not toggled for a row of flash memory cells such that alternating flash memory cells within a row of flash memory cells are accessed to be programmed in the checker-board BIST mode.

However, the least significant bit A[0] is toggled once at the increment of the bits A[14:6] of the second plurality of address sequencer buffers 1208. After that initial one-time toggling, the least significant bit A[0] is not toggled as only the other bits A[5:1] are toggled to increment the Y-address by two such that alternating flash memory cells within a row of flash memory cells are accessed. The initial one-time toggling of the least significant bit A[0] at the increment of the bits A[14:6] for the X-address causes the alternating flash memory cells within a column of flash memory cells to be accessed.

Figure 57:
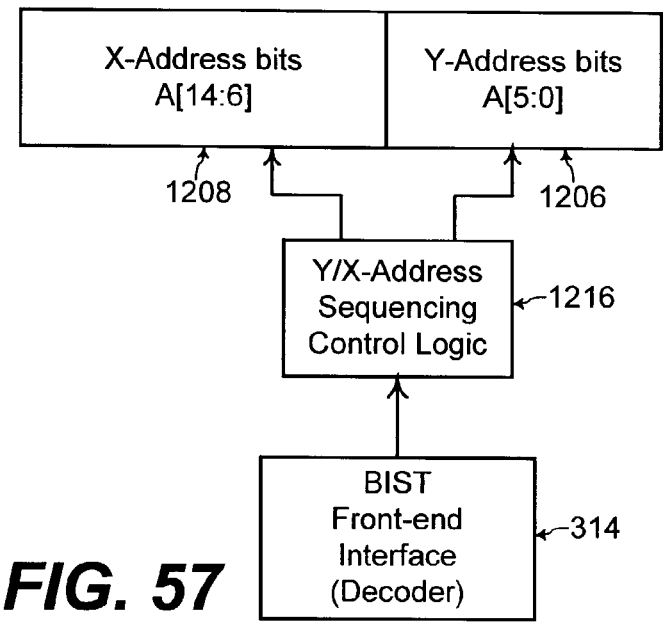
FIG. 57 illustrates control by the address sequencer control logic of the address sequencer buffers for sequencing through each of the flash memory cells at a diagonal location of a sector of flash memory cells, according to an embodiment of the present invention.
Figure 58:
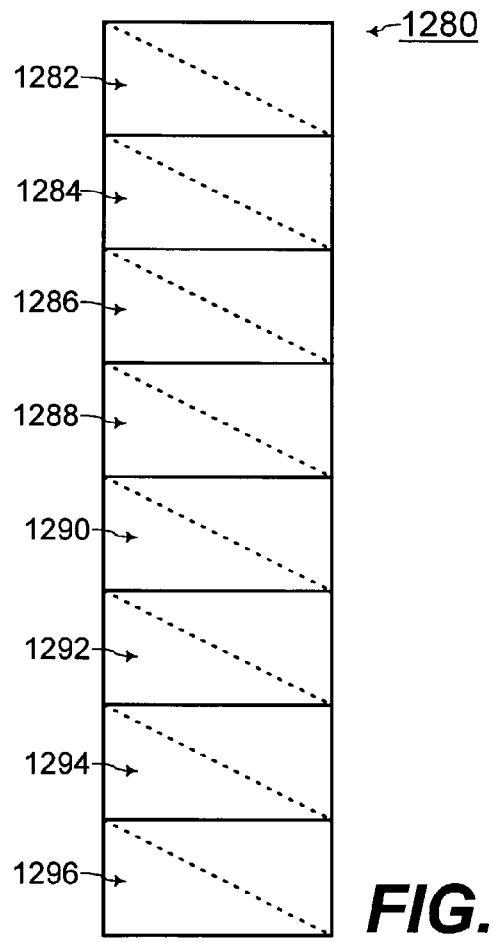
FIG. 58 illustrates an example of a sector of flash memory cells having eight diagonal lines for eight subsectors of the sector of flash memory cells, according to an embodiment of the present invention.

Referring to FIG. 57, in another embodiment of the present invention, the Y/X-address sequencing control logic 1216 inputs a control signal from the front-end interface decoder 314 indicating that a current BIST (built-in-self-test) mode is for diagonal program or erase verify of flash memory cells. In such a diagonal BIST mode, only the flash memory cells at a diagonal location of a sector of flash memory cells are accessed. A diagonal location is defined as a location having a same row number and a same column number. Referring to FIG. 58, an example sector 1280 is comprised of eight subsectors including a first subsector 1282, a second subsector 1284, a third subsector 1286, a fourth subsector 1288, a fifth subsector 1290, a sixth subsector 1292, a seventh subsector 1294, and an eighth subsector 1296. Each of the eight subsectors 1282, 1284, 1286, 1288, 1290, 1292, 1294, and 1296 has an equal number of rows and columns of flash memory cells such that each of such eight subsectors has a respective diagonal line (as indicated by the dashed lines in FIG. 58).

The addresses of flash memory cells through a diagonal line of one of the eight subsectors of FIG. 58 is sequenced by decrementing one bit of both the Y-address bits A[5:0] and the X-address bits A[14:6]. Note that the six-bits of the Y-address bits A[5:0] and the six least significant X-address bits A[11:6] are both decremented by one bit for accessing each of the flash memory cells at a diagonal location. In that case, the three most significant X-address bits A[14:12] are decremented for sequencing through each of the eight subsectors 1282, 1284, 1286, 1288, 1290, 1292, 1294, and 1296. Thus, eight diagonal lines of flash memory cells (illustrated by dashed lines through each subsector in FIG. 58) with one diagonal line through each of the eight subsectors 1282, 1284, 1286, 1288, 1290, 1292, 1294, and 1296 is accessed in this manner.

In that case, the six-bits of the Y-address A[5:0] are initialized to a beginning Y-address that is six logical high bits "1 1 1 1 1 1", and the nine-bits of the X-address A[14, 6] are also initialized to a beginning X-address that is nine logical high bits "1 1 1 1 1 1 1 1 1". Then, the Y-address A[5:0] is decremented down by one bit, and the X-address A[14, 6] is also decremented down by one bit with each clock cycle of the address sequencer which occurs at every successful diagonal program verify or diagonal erase verify. When the six-bits of the Y-address A[5:0] reaches six logical low bits "0 0 0 0 0 0" and when the six least significant bits of the X-address A[11:6] reaches six logical low bits "0 0 0 0 0 0", all flash memory cells at the diagonal location of one of the eight subsectors of FIG. 58 have been accessed.

At that point, the six-bits of the Y-address A[5:0] roll over again to logical high bits "1 1 1 1 1 1", and the six least significant bits of the X-address A[11:6] also roll over to the logical high bits "1 1 1 1 1 1" with a decrement by one bit of the three-most significant X-address bits A[14:12] for sequencing through flash memory cells of the diagonal location of the next subsequent one of the subsectors 1282, 1284, 1286, 1288, 1290, 1292, 1294, and 1296. In this manner, the flash memory cells at each of the eight diagonal lines through the eight subsectors 1282, 1284, 1286, 1288, 1290, 1292, 1294, and 1296 are accessed when the six Y-address bits A[5:0] reaches six logical low bits "0 0 0 0 0 0" and the nine X-address bits A[14:6] reaches nine logical low bits "0 0 0 0 0 0 0 0 0", from being initialized at "1 1 1 1" and "1 1 1 1 1 1 1 1 1", respectively, and with decrementing down both of each of the six Y-address bits A[5:0] and the nine X-address bits A[14:6] by one bit at each clock cycle of the address sequencer which occurs at every successful diagonal program verify or diagonal erase verify.

In this manner, sequencing through the addresses of array of flash memory cells 304 for each BIST mode is performed on-chip by the address sequencer control logic 1204 and the address sequencer buffers 1202. Thus, pins from the external test system 318 are not used for such sequencing through the addresses of the array of flash memory cells 304. With use of such minimized number of pins from the external test system 318, a higher number of semiconductor dies may be tested concurrently by the external test system having a limited total number of pins, to maximize throughput during manufacture of flash memory devices. In addition, because such sequencing through the addresses of the array of flash memory cells is performed on-chip, the speed of performing such address sequencing is not limited by the capacity of the external test system. Thus, such sequencing through the addresses of array of flash memory cells may be more efficient for the plurality of BIST modes.

The foregoing is by way of example only and is not intended to be limiting. For example, any numbers described or illustrated herein are by way of example only. In addition, implementation for each of the individual components of FIGS. 42–58 would be known to one of ordinary skill in the art of electronics. For example, the address sequencer control logic 1204 including the Y/X address set/reset logic 1214, the Y/X-address sequencing control logic 1216, the CAM sequencing control logic 1218, the OTP sequencing control logic 1220, and the redundancy sequencing control logic 1222 may be implemented with data processing devices such as programmable logic devices for example for carrying out the functionality described herein as would be known to one of ordinary skill in the art of electronics. The present invention is limited only as defined in the following claims and equivalents thereof.

G. Pattern Generator in BIST (Built-In-Self-Test) System

A mechanism for efficiently generating the desired bit pattern of programmed and erased states of the array of core flash memory cells is desired for each of the plurality of BIST modes. In the prior art, such a desired bit pattern is stored in a memory device. However, with a large number of BIST modes, such storage of a corresponding desired bit pattern for each of the plurality of BIST modes may require an undesirably large area of the semiconductor die for the memory device.

Figure 59:
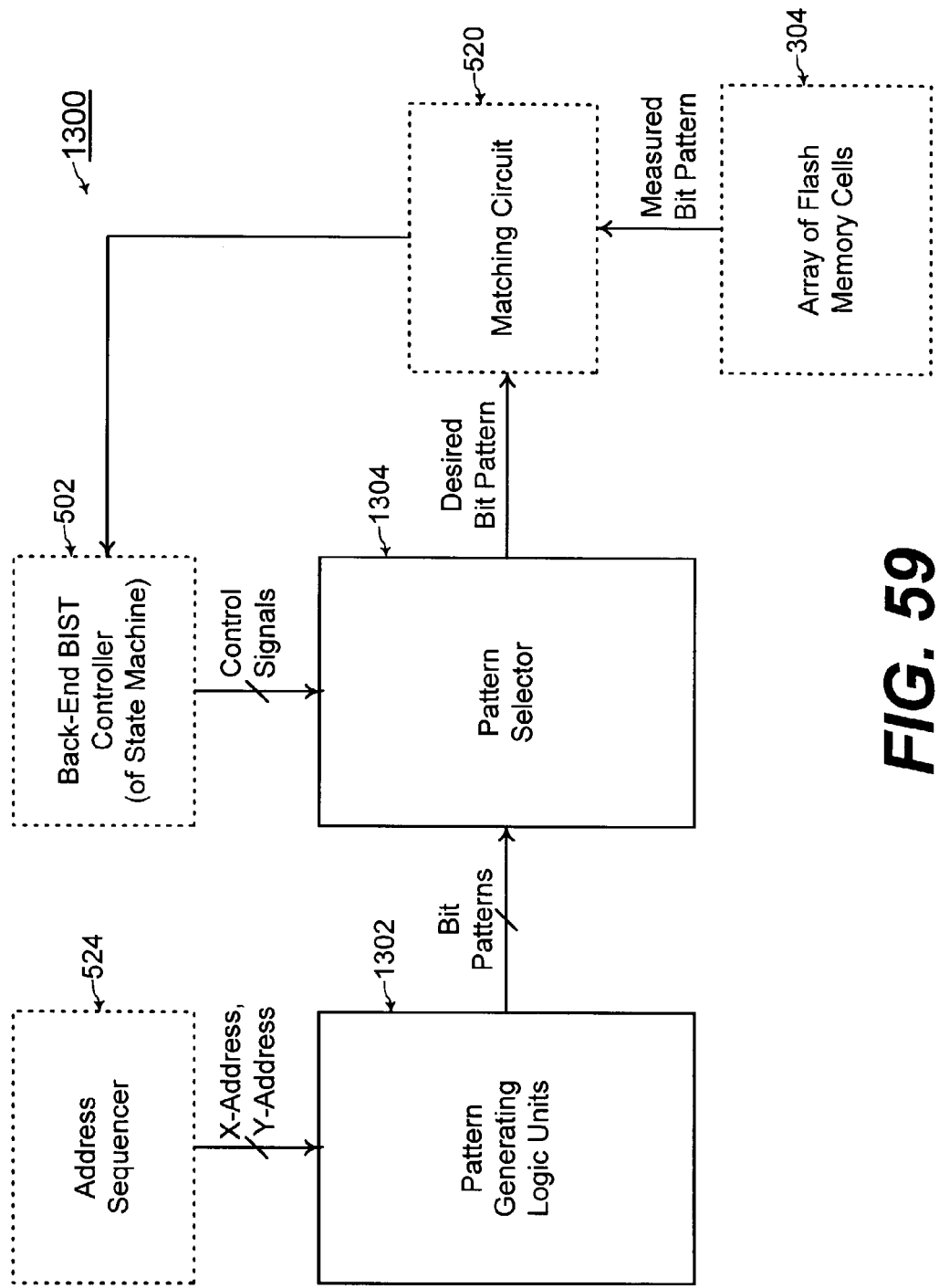
FIG. 59 shows a block diagram of a system for generating the desired bit pattern for each of the BIST modes with a plurality of pattern generating logic units fabricated on the semiconductor die having the array of flash memory cells fabricated thereon, according to one embodiment of the present invention.

Referring to FIG. 59, in another aspect of the present invention, a system 1300 for generating the desired bit pattern for each of the BIST modes includes a plurality of pattern generating logic units 1302 and a pattern selector 1304. Referring to FIGS. 13 and 59, the address sequencer 524, the back-end BIST controller 502 of the state machine 316, the matching circuit 520, and the array of flash memory cells 304 of FIG. 59 are similar in function and structure to the similarly reference numbered blocks of FIG. 13, as already described herein. In addition, the pattern generating logic units 1302 and the pattern selector 1304 comprised the bit pattern generator 518 of FIG. 13, according to one embodiment of the present invention.

The plurality of pattern generating logic units 1302 inputs a respective X-address and a respective Y-address from the address sequencer 524 for the respective location of each flash memory cell of the array of flash memory cells 304. The plurality of pattern generating logic units 1302 uses the X-address and the Y-address to generate a plurality of bit patterns. The pattern selector 1304 inputs controls signals from the back-end BIST controller 502 of the back-end state machine 316 and the plurality of bit patterns from the plurality of pattern generating logic units 1302. The pattern selector 1304 selects one of the plurality of bit patterns from the plurality of pattern generating logic units 1302 as the desired bit pattern depending on the control signals from the back-end BIST controller 502.

The matching circuit 520 is coupled to the pattern selector 1304 and inputs the desired bit pattern from the pattern selector 1304. The matching circuit 520 compares the desired bit pattern from the pattern selector 1304 with the measured bit pattern of the array of flash memory cells 304 to send the result of such a comparison to the back-end BIST controller 502 during a VERIFY state of the current BIST mode to indicate a PASS or FAIL result as already described herein. According to an aspect of the present invention, the plurality of pattern generating logic units 1302 and the pattern selector 1304 are fabricated on the semiconductor die having the array of flash memory cells 304 fabricated thereon.

Figure 60:
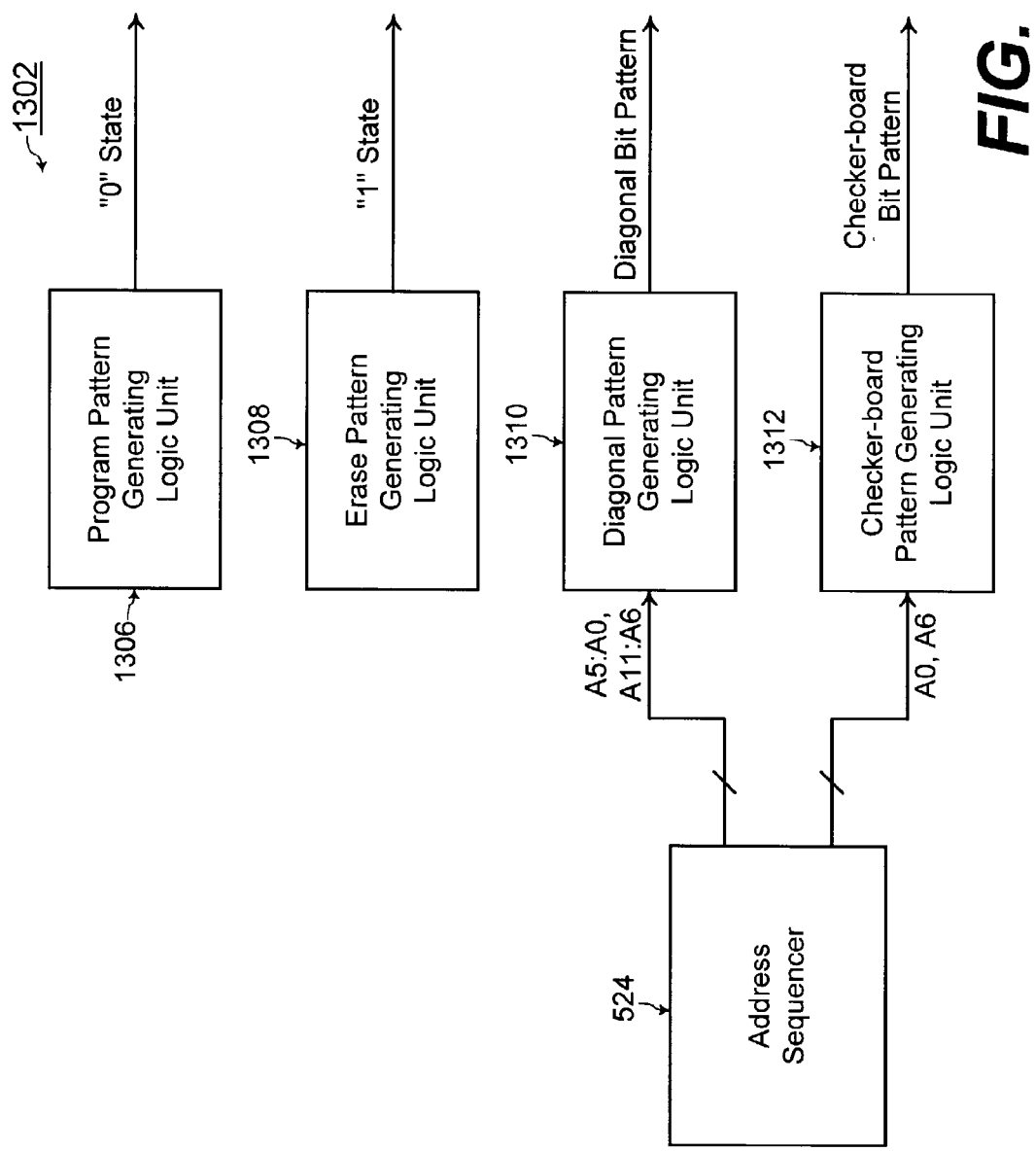
FIG. 60 illustrates an example of a program pattern generating logic unit, an erase pattern generating logic unit, a diagonal pattern generating logic unit, and a checker-board pattern generating logic unit, according to one embodiment of the present invention.

Referring to FIG. 60, in one example, the pattern generating logic units 1302 includes a program patten generating logic unit 1306, an erase pattern generating logic unit 1308, a diagonal pattern generating logic unit 1310, and a checker-board pattern generating logic unit 1312. Each of the pattern generating logic units 1306, 1308, 1310, and 1312 generates a respective output that is a respective logical state corresponding to the respective location of each flash memory cell of the array of flash memory cells 304. The program pattern generating logic unit 1306 generates a logical low state (i.e., a "0" state) for each location of flash memory cell within the array of flash memory cells 304, and the erase pattern generating logic unit 1308 generates a logical high state (i.e., a "1" state) for each location of flash memory cell within the array of flash memory cells 304.

The diagonal pattern generating logic unit 1310 generates a diagonal bit pattern by generating a logical low state (i.e., a "0" state) only at each of the diagonal locations of the array of flash memory cells 304. The diagonal pattern generating logic unit 1310 inputs the six bits A11, A10, A9, A8, A7, and A6 of the X-address and the six bits A5, A4, A3, A2, A1, and A0 of the Y-address, generated by the address sequencer 524 for indicating the respective location of a flash memory cell, for generating the respective logical state for that respective location of the flash memory cell according to the desired diagonal bit pattern.

The checker-board pattern generating logic unit 1312 generates a checker-board bit pattern by generating alternating logical low and high states for any two adjacent locations of flash memory cells of the array of flash memory cells 304. The checker-board pattern generating logic unit 1312 inputs the least significant bit A6 of the X-address and the least significant bit A0 of the Y-address from the address sequencer 524 for generating the respective logical state for the respective location of the flash memory cell according to the desired checker-board bit pattern.

Figure 61:
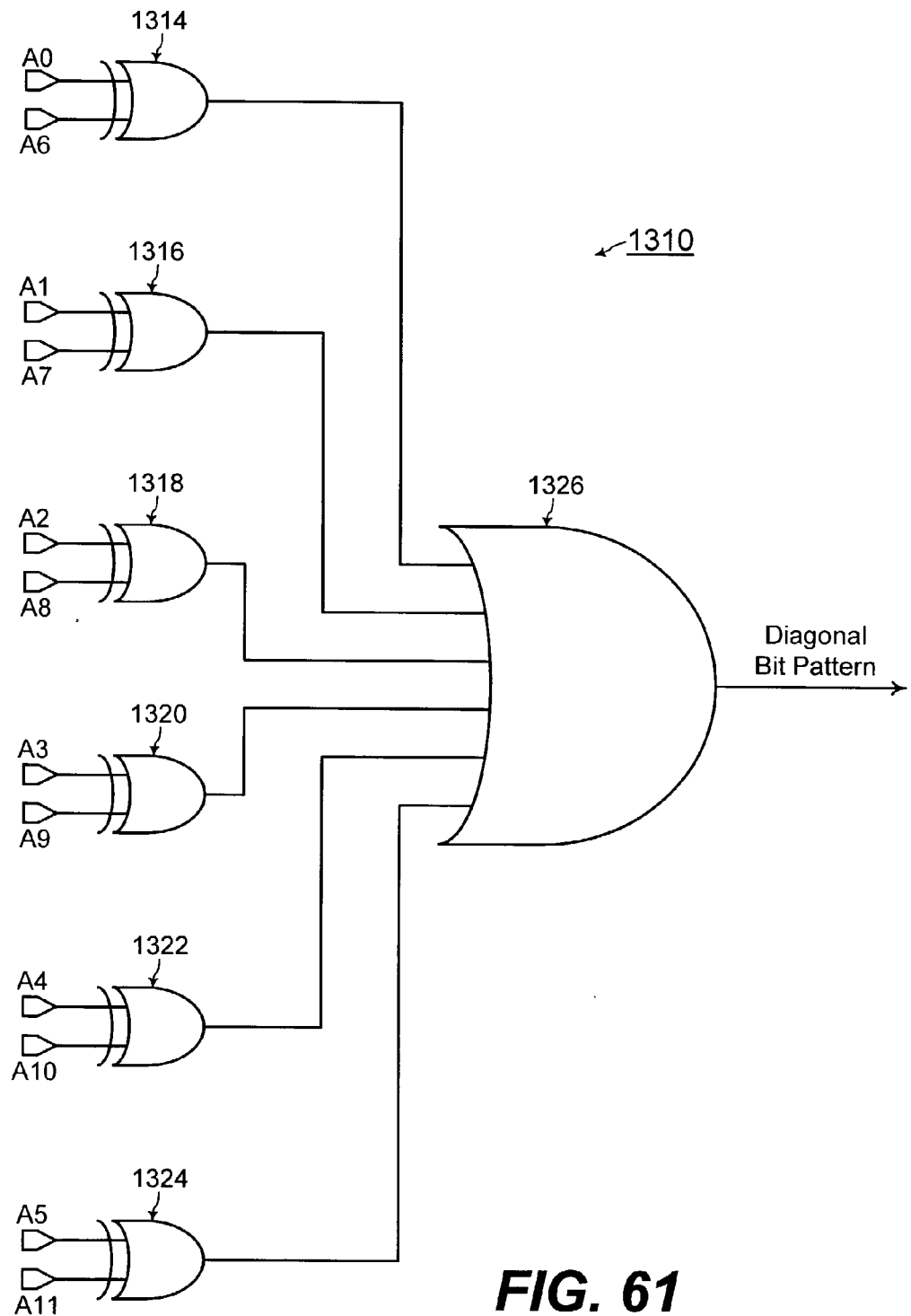
FIG. 61 shows an example implementation of the diagonal pattern generating logic unit of FIG. 60, according to one embodiment of the present invention.

FIG. 61 shows an example implementation of the diagonal pattern generating logic unit 1310 including a first exclusive OR gate 1314, a second exclusive OR gate 1316, a third exclusive OR gate 1318, a fourth exclusive OR gate 1320, a fifth exclusive OR gate 1322, and a sixth exclusive OR gate 1324, and an OR gate 1326. The first exclusive OR gate 1314 has as inputs the least significant bit A6 of the X-address and the least significant bit A0 of the Y-address. The second exclusive OR gate 1316 has as inputs the second least significant bit A7 of the X-address and the second least significant bit A1 of the Y-address. The third exclusive OR gate 1318 has as inputs the third least significant bit A8 of the X-address and the third least significant bit A2 of the Y-address.

Similarly, the fourth exclusive OR gate 1320 has as inputs the fourth least significant bit A9 of the X-address and the fourth least significant bit A3 of the Y-address. The fifth exclusive OR gate 1322 has as inputs the fifth least significant bit A10 of the X-address and the fifth least significant bit A4 of the Y-address. The sixth exclusive OR gate 1324 has as inputs the most significant bit A11 of the X-address and the most significant bit A5 of the Y-address. The OR gate 1326 has as inputs the outputs of each of the exclusive OR gates 1314, 1316, 1318, 1320, 1322, and 1324. Thus, the respective output of the diagonal pattern generating logic unit 1310 is expressed as follows:

OUTPUT=(A0⊕A6)+(A1⊕A7)+(A2⊕A8)+(A3⊕A9)+
(A4⊕A10)+(A5⊕A11)

where the symbol "⊕" represents the exclusive-OR function and the symbol "+" represents the OR function.

Figures 62, 63, 64:
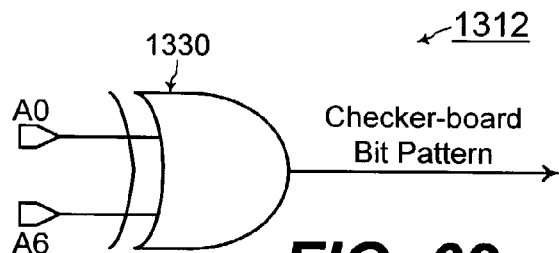
FIG. 62 shows an example implementation of the checker-board pattern generating logic unit of FIG. 60, according to one embodiment of the present invention.
FIG. 63 shows an example array of four by four flash memory cells and their respective locations in the array.
FIG. 64 shows the desired bit pattern of all logical low states when the current BIST mode is for programming each flash memory cell of the array of flash memory cells of FIG. 63.

FIG. 62 shows an example implementation of the checker-board pattern generating logic unit 1312 including an exclusive OR gate 1330. The exclusive OR gate 1330 of FIG. 62 has as inputs the least significant bit A6 of the X-address and the least significant bit A0 of the Y-address. Thus, the respective output of the diagonal pattern generating logic unit 1310 is expressed as follows:

OUTPUT=A0⊕A6 where the symbol "⊕" represents the exclusive-OR function.

FIG. 63 shows an example array of flash memory cells 304 being comprised of four rows by four columns of flash memory cells. A typical array of flash memory cells has more numerous rows and columns of flash memory cells. However, a four row by four column array of flash memory cells is shown in FIG. 63 for clarity of illustration. A location of a flash memory cell at the first row and first column is designated as "a1", at the first row and second column is designated as "a2", at the first row and third column is designated as "a3", and at the first row and fourth column is designated as "a4". A location of a flash memory cell at the second row and first column is designated as "b1", at the second row and second column is designated as "b2", at the second row and third column is designated as "b3", and at the second row and fourth column is designated as "b4". A location of a flash memory cell at the third row and first column is designated as "c1", at the third row and second column is designated as "c2", at the third row and third column is designated as "c3", and at the third row and fourth column is designated as "c4". A location of a flash memory cell at the fourth row and first column is designated as "d1", at the fourth row and second column is designated as "d2", at the fourth row and third column is designated as "d3", and at the fourth row and fourth column is designated as "d4".

Figures 65, 66, 67:
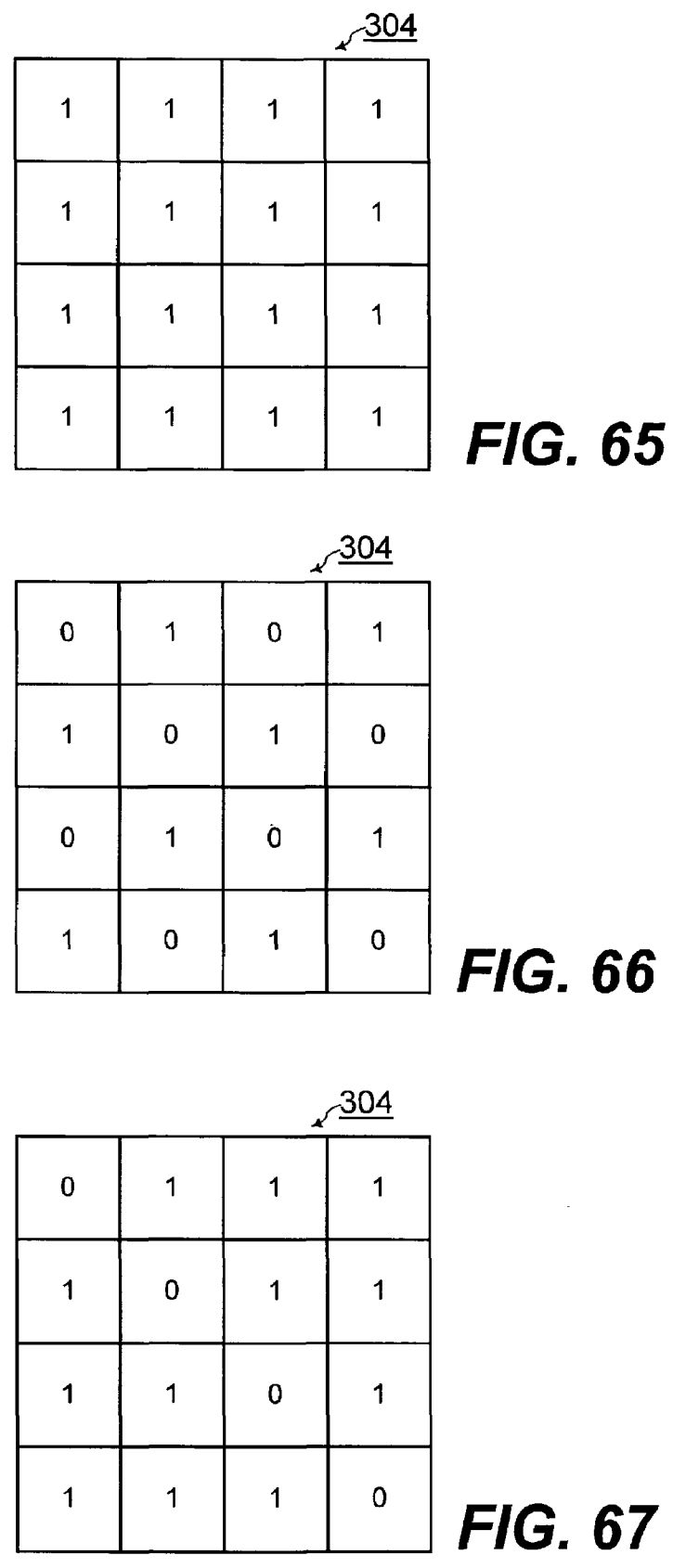

Referring to FIG. 64, when the current BIST mode is for programming each flash memory cell of the array of flash memory cells 304, the desired bit pattern is a logical low state "0" for each location of the array of flash memory cells 304. Referring to FIG. 65, when the current BIST mode is for erasing each flash memory cell of the array of flash memory cells 304, the desired bit pattern is a logical high state "1" for each location of the array of flash memory cells 304.

Referring to FIG. 66, when the current BIST mode is for checker-board programming the array of flash memory cells 304, the desired bit pattern is alternating logical low and high states "0" and "1" for any two adjacent flash memory cells of the array of flash memory cells 304. Referring to FIG. 67, when the current BIST mode is for diagonal programming the array of flash memory cells 304, the desired bit pattern is the logical low state "0" for only the flash memory cells located at the diagonal of the array of flash memory cells 304.

Referring to FIGS. 60 and 64, the output of the program pattern generating logic unit 1306 which is the logical low state "0" for any location of the array of flash memory cells 304 is selected for generating the desired bit pattern of FIG. 64. Logic circuitry that has the logical low state "0" con-stantly latched is known to one of ordinary skill in the art of electronics. Alternatively, Referring to FIGS. 60 and 65, the output of the erase pattern generating logic unit 1308 which is the logical high state "1" for any location of the array of flash memory cells 304 is selected for generating the desired bit pattern of FIG. 65. Logic circuitry that has a logical high state "1" constantly latched is known to one of ordinary skill in the art of electronics.

Referring to FIGS. 60, 61, and 67, the output of the diagonal pattern generating logic unit 1310 is used to generate the desired diagonal bit pattern of FIG. 67. FIG. 68 shows an example table of the respective X-address and Y-address for each location of the array of flash memory cells of FIG. 63. Note that for the location of a flash memory cell at the first row and first column designated as "a1", the six-bits (A11, A10, A9, A8, A7, and A6) of the X-address are "1 1 1 1 1 1", and the six-bits (A5, A4, A3, A2, A1, and A0) of the Y-address are "1 1 1 1 1 1". The X-address indicates the column location of a flash memory cell, and the Y-address indicates the row location of the flash memory cell. In FIG. 68, for any two adjacent flash memory cells within the same row, the X-address is decremented down by one bit from left to right in the same row. Similarly, for any two adjacent flash memory cells within the same column, the Y-address is decremented by one bit from top to bottom in the same column. With such address designations, the implementation of the diagonal pattern generating logic unit 1310 of FIG. 61 generates the desired diagonal bit pattern of FIG. 67.

Referring to FIGS. 60, 62, and 66, the output of the checker-board pattern generating logic unit 1312 is used to generate the desired checker-board bit pattern of FIG. 66. With the address designations of the table of FIG. 68, the implementation of the checker-board pattern generating logic unit 1312 of FIG. 62 generates the desired checker-board bit pattern of FIG. 66.

Figure 69:
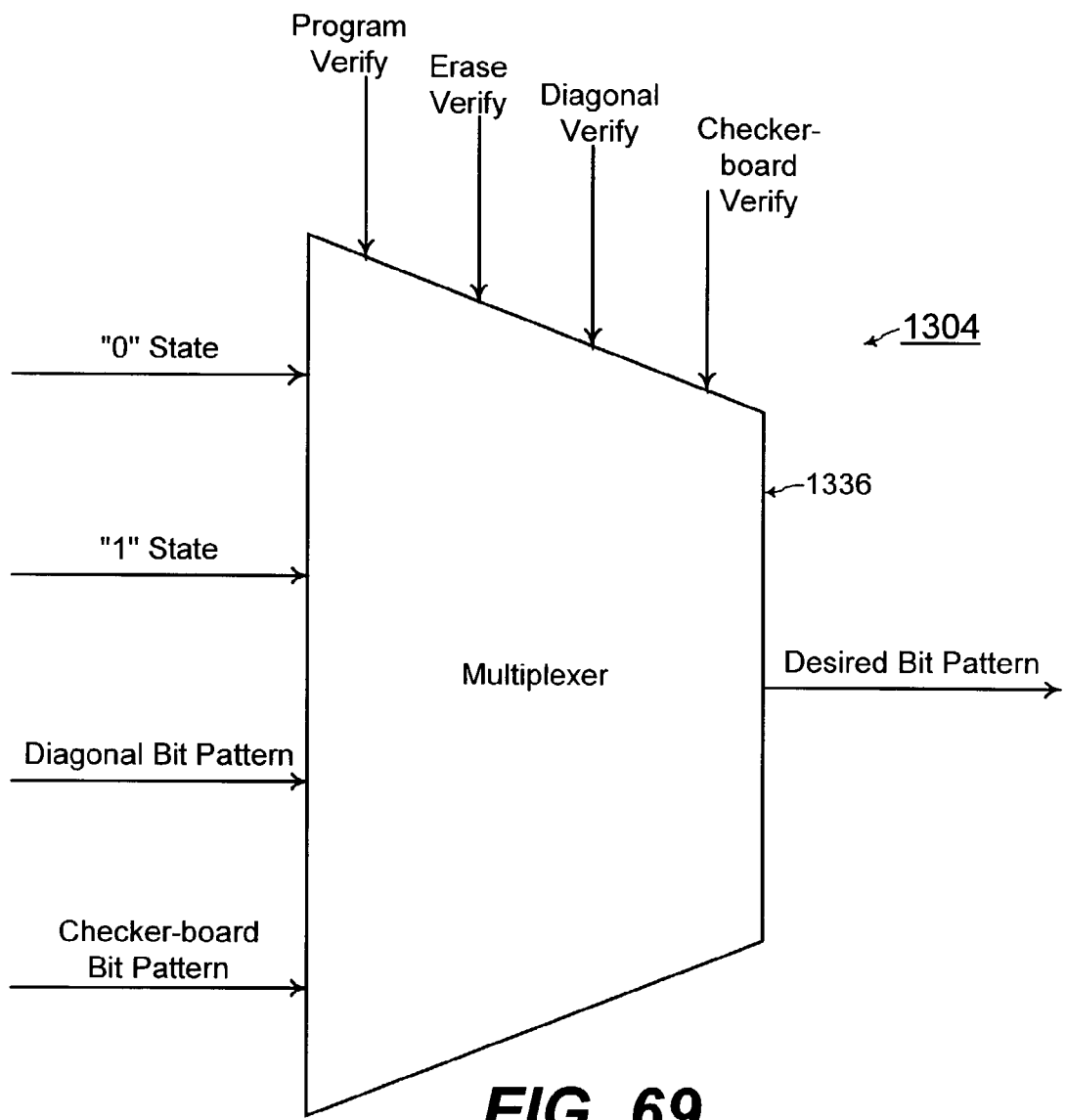
FIG. 69 shows an example implementation of the pattern selector of FIG. 59, according to one embodiment of the present invention.

FIG. 69 shows an example implementation of the pattern selector 1304 including a multiplexer 1336 that is coupled to each of the pattern generating logic units 1306, 1308, 1310, and 1312 of FIG. 60. The multiplexer 1336 inputs the respective output of each of the pattern generating logic units 1306, 1308, 1310, and 1312. In addition, the multiplexer 1336 inputs control signals "Program Verify", "Erase Verify", "Diagonal Verify", and "Checker-board Verify" from the back-end BIST controller 502.

The back-end BIST controller 502 asserts one of the control signals "Program Verify", "Erase Verify", "Diagonal Verify", and "Checker-board Verify" depending on the type of current BIST mode. If the current BIST mode is for programming each flash memory cell of the array of flash memory cells 304, the BIST controller 502 asserts the "Program Verify" control signal. If the current BIST mode is for erasing each flash memory cell of the array of flash memory cells 304, the BIST controller 502 asserts the "Erase Verify" control signal. If the current BIST mode is for checker-board programming the array of flash memory cells 304, the BIST controller 502 asserts the "Checker-board Verify" control signal. If the current BIST mode is for diagonal programming the array of flash memory cells 304, the BIST controller 502 asserts the "Diagonal Verify" control signal.

The multiplexer 1336 selects one of the respective outputs of the pattern generating logic units 1306, 1308, 1310, and 1312 as the selected output for generating the desired bit pattern for each location of flash memory cell of the array of flash memory cells 304. If the "Program Verify" control signal is asserted, the multiplexer 1336 selects the logical low state "0" output from the program pattern generating logic unit 1306 as the selected output for a location of flash memory cell. If the "Erase Verify" control signal is asserted, the multiplexer 1336 selects the logical high state "1" output from the erase pattern generating logic unit 1308 as the selected output for a location of flash memory cell.

On the other hand, if the "Diagonal Verify" control signal is asserted, the multiplexer 1336 selects the diagonal bit pattern output from the diagonal pattern generating logic unit 1310 as the selected output for a location of flash memory cell. Similarly, if the "Checker-board Verify" control signal is asserted, the multiplexer 1336 selects the checker-board bit pattern output from the checker-board pattern generating logic unit 1312 as the selected output for a location of flash memory cell.

Generally, a VERIFY state during a BIST mode may be classified as one of a "Program Verify", an "Erase Verify", a "Diagonal Verify", or a "Checker-board Verify". In this manner, the desired bit pattern used during a VERIFY state by the BIST (built-in-self-test) system for on-chip testing of the array of flash memory cells 304 is generated by the pattern generating logic units 1306, 1308, 1310, and 1312 also fabricated on-chip. The pattern selector 1304 selects the proper output of one of the pattern generating logic units 1306, 1308, 1310, and 1312 depending on the current BIST mode. Such a mechanism for generating the desired bit pattern does not require a large storage device for storing the desired bit patterns for performing a plurality of BIST modes during on-chip testing of the array of flash memory cells 304.

The foregoing is by way of example only and is not intended to be limiting. For example, the present invention may be practiced for a larger number of pattern generating logic units 1306, 1308, 1310, and 1312 for generating a larger number of desired bit patterns. In addition, the present invention may be practiced for a larger array of flash memory cells. Any numbers described or illustrated herein are by way of example only.

H. On-Chip Erase Pulse Counter for Efficient Erase Verify BIST (Built-In-Self-Test) Mode Furthermore, one of the BIST (built-in-self-test) modes is an erase verify BIST mode for testing that each flash memory cell of the core array of flash memory cells is erased properly. During such an erase verify BIST mode, each flash memory cell of the array must be erased to a proper level (indicated by the amount of current flowing through the flash memory cell) before a maximum number of erase pulses are applied on the flash memory cell.

An erase verify process includes applying an erase pulse of erasing voltages on a flash memory cell, then measuring the current level flowing through the flash memory cell with reading voltages applied on the flash memory cell. The current level flowing through the flash memory cell must be at least a reference current level for the flash memory cell to pass erase verify (and to be deemed properly erased). Application of the erase pulse of erasing voltages on the flash memory cell is repeated a plurality of times until the current level flowing through the flash memory cell is at least the reference current level. However, the current level flowing through the flash memory cell must be at least the reference current level before a maximum number of erase pulses are applied on the flash memory cell for the flash memory cell to pass the erase verify BIST mode. Otherwise, the flash memory cell is deemed to be defective.

Figures 70, 71:
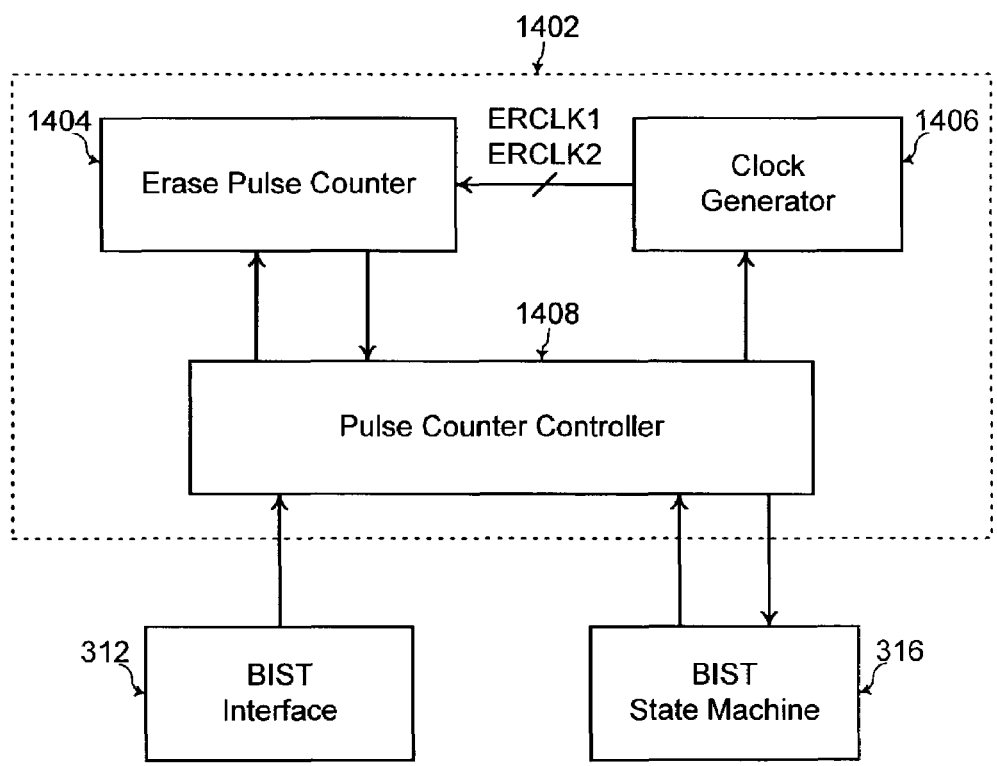
FIG. 70 shows an example sector of four rows by four columns of flash memory cells to be erase verified during an erase verify BIST (built-in-self-test) mode.
FIG. 71 shows a block diagram of a system for keeping track of the number of erase pulses applied on the sector of flash memory cells during the erase verify BIST mode on-chip, according to an embodiment of the present invention.

The array of flash memory cells are divided into a plurality of sectors of flash memory cells, as known to one of ordinary skill in the art of flash memory devices. FIG. 70 illustrates an example sector 1400 of four rows by four columns of flash memory cells. A sector of flash memory cells typically has a much higher number of rows and columns, but four rows and four columns are illustrated for the example sector 1400 of FIG. 70 for simplicity of illustration.

An erase pulse of the erasing voltages for erasing a flash memory cell is applied on all of the flash memory cells of the sector of flash memory cells at once. Referring to FIG. 70, the flash memory cells at the diagonal locations (i.e., at the locations designated A1, B2, C3, and D4 in FIG. 70) are erase verified first. During erase verification of each of the flash memory cells at the diagonal location, the erase pulse is applied on all of the flash memory cells of the sector 1400 of flash memory cells.

A diagonal total number of erase pulses required to be applied on the sector 1400 of flash memory cells for each of the flash memory cells at the diagonal locations to pass erase verify is first determined. Then, a selected percentage of the diagonal total number of erase pulses is determined as a maximum number of pulses that may be applied on the sector 1400 of flash memory cells during erase verification of the whole sector of flash memory cells 1400. After the flash memory cells of the diagonal location pass erase verify with the diagonal total number of erase pulses applied on the sector of flash memory cells 1400, each of the flash memory cells of the whole sector (i.e., at the locations designated A1, A2, A3, A4, B1, B2, B3, B4, C1, C2, C3, C4, D1, D2, D3, and D4 in FIG. 70) must pass erase verify before the selected percentage of the diagonal total number of erase pulses is further applied on the sector 1400 of flash memory cells for the sector 1400 to pass the erase verify BIST mode. Otherwise, the sector 1400 of flash memory cells is deemed to fail the erase verify BIST mode.

In the prior art, the external test system keeps track of the number of erase pulses applied on the sector of flash memory cells 1400 during an erase verify test mode. However, keeping track of the number of erase pulses applied on the sector of flash memory cells 1400 during the erase verify test mode by the external test system may be slow depending on the capacity of the external test system. Thus, an efficient mechanism is desired for keeping track of the number of erase pulses applied on the sector of flash memory cells 1400 during the erase verify BIST mode.

Referring to FIGS. 7 and 70, in another embodiment of the present invention, a system 1402 for keeping track of the number of erase pulses applied during an erase verify BIST (built-in-self-test) mode is fabricated on the semiconductor die having the array of flash memory cells 304 fabricated thereon. The system 1402 includes an erase pulse counter 1404, a clock generator 1406, and a pulse counter controller 1408, (shown within the dashed lines in FIG. 71). The pulse counter controller 1408 is coupled to the BIST interface 312 and the BIST state machine 316. The BIST interface 312 and the BIST state machine 316 have already been described herein with reference to FIG. 7.

In one embodiment of the present invention, the erase pulse counter 1404 is a binary counter that increments a binary count with at least one pulse generated from the clock generator 1406. Binary counters are known to one of ordinary skill in the art of electronics. The BIST state machine 316 generates a control signal to indicate that an erase pulse has been applied on the sector of flash memory cells 1400. The pulse counter controller 1408 controls the clock generator 1406 to generate two non-overlapping clock signal pulses, ERCLK1 and ERCLK2, when the BIST state machine 316 generates the control signal to indicate that an erase pulse has been applied on the sector of flash memory cells 1400 during a JUICE state. Clock signal generators for generating clock signal pulses are known to one of ordinary skill in the art of electronics. The erase pulse counter 1404 increments the binary count when the clock generator 1406 generates the two non-overlapping clock signal pulses, ERCLK1 and ERCLK2. Thus, the erase pulse counter 1404 increments the binary count for each erase pulse of erasing voltages applied on the sector of flash memory cells 1400.

Figure 72:
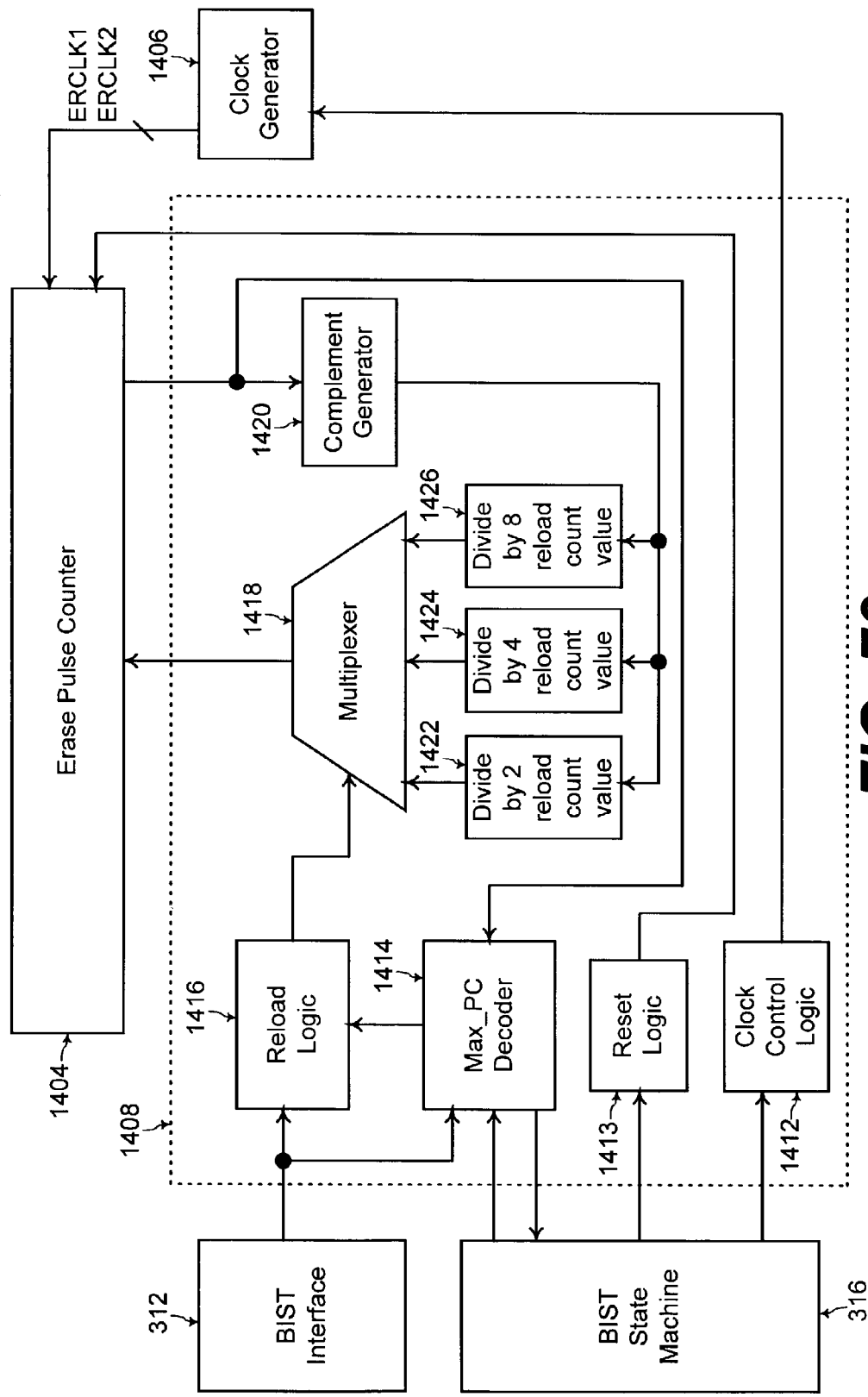
FIG. 72 shows components within a pulse counter controller of the system of FIG. 71 for keeping track of the number of erase pulses applied on the sector of flash memory cells during the erase verify BIST mode on-chip, according to an embodiment of the present invention.
Figure 73:
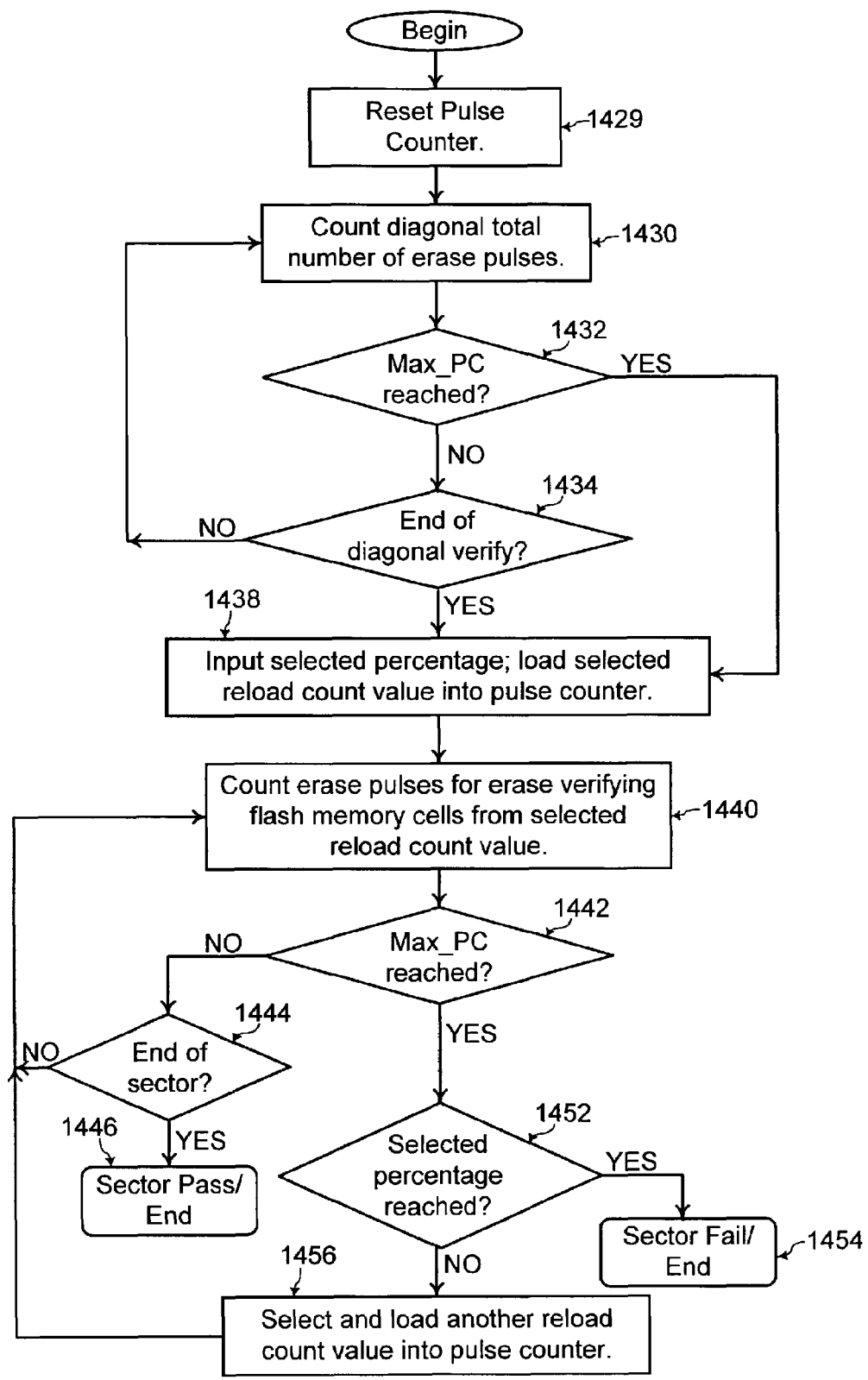
FIG. 73 shows a flowchart of operation of the system of FIGS. 71 and 72 for keeping track of the number of erase pulses applied on the sector of flash memory cells during the erase verify BIST mode on-chip, according to an embodiment of the present invention.

Referring to FIG. 72, components within the pulse counter controller 1408 are shown within dashed lines including a clock control logic 1412, a reset logic 1413, a maximum pulse count decoder 1414, a reload logic 1416, a multiplexer 1418, a complement generator 1420, and a plurality of reload count value generators including a divide by two reload count value generator 1422, a divide by four reload count value generator 1424, and a divide by eight reload count value generator 1426. FIG. 73 shows a flowchart of steps during operation of the system of FIG. 72 for keeping track of the number of erase pulses applied during an erase verify BIST mode.

Referring to FIGS. 72 and 73, the reset logic 1413 inputs from the BIST state machine 316 a control signal indicating start of an erase verify BIST (built-in-self-test) mode. The reset logic 1413 resets the erase pulse counter 1404 to an initial zero pulse count after the reset logic 1413 receives from the BIST state machine 316 the control signal indicating start of the erase verify BIST (built-in-self-test) mode (step 1429 of FIG. 73). For example, when the erase pulse counter is a six-bit counter, the initial zero pulse count may be "0 0 0 0 0 0" for example.

Referring to FIGS. 70 and 72, the BIST state machine 316 performs the erase verify BIST mode by first erase verifying each of the flash memory cells at the diagonal locations (i.e., at the locations designated A1, B2, C3, and D4 in FIG. 70) for the sector of flash memory cells 1400. An erase verify process includes applying an erase pulse of erasing voltages on a flash memory cell, then measuring the current level flowing through the flash memory cell with reading voltages applied on the flash memory cell, as known to one of ordinary skill in the art of flash memory devices. The current level flowing through the flash memory cell must be at least a reference current level for the flash memory cell to pass erase verify (and to be deemed properly erased), as known to one of ordinary skill in the art of flash memory devices. Application of the erase pulse of erasing voltages on the flash memory cell is repeated until the current level flowing through the flash memory cell is at least the reference current level.

An erase pulse of the erasing voltages for erasing a flash memory cell is applied on all of the flash memory cells of the sector of flash memory cells 1400 at once. During erase verification of each of the flash memory cells at the diagonal location, the erase pulse is applied on all of the flash memory cells of the sector 1400 of flash memory cells.

The BIST state machine 316 sends a control signal each time an erase pulse is applied on each flash memory cell of the sector 1400 of flash memory cells during erase verification of the diagonal flash memory cells. The clock control logic 1412 controls the clock generator 1406 to generate the two non-overlapping clock signals pulses, ERCLK1 and ERCLK2, each time the BIST state machine 316 sends the control signal indicating that an erase pulse is applied on each flash memory cell of the sector 1400 of flash memory cells during erase verification of the diagonal flash memory cells. The erase pulse counter 1404 increments the binary count each time the clock generator 1406 generates the two non-overlapping clock signal pulses, ERCLK1 and ERCLK2. Thus, the erase pulse counter 1404 increments the binary count for each erase pulse of erasing voltages applied on the sector of flash memory cells 1400 during erase verifying the diagonal flash memory cells (step 1430 of FIG. 73).

In this manner, the erase pulse counter 1404 counts a diagonal total number of erase pulses required to be applied on the sector of flash memory cells 1400 for each of the diagonal flash memory cells to pass erase verify when an end of the diagonal verify is reached (steps 1430 to 1434 of FIG. 73). In addition, during the diagonal verify, the maximum pulse count decoder 1414 inputs the binary count indicating the diagonal total number of erase pulses from the erase pulse counter 1404 to determine whether the diagonal total number of erase pulses reaches (i.e., becomes equal to) a maximum pulse count value (Max_PC) (step 1432 of FIG. 73).

If the diagonal total number of erase pulses reaches the maximum pulse count value (Max_PC) (step 1432 of FIG. 73) before the end of the diagonal verify in step 1434 of FIG. 73, the diagonal total number of erase pulses is set to the maximum pulse count value (Max_PC), and operation continues with step 1438 of FIG. 73. On the other hand, if the diagonal total number of erase pulses does not reach the maximum pulse count value (Max_PC) (step 1432 of FIG. 73) by the end of the diagonal verify in step 1434 of FIG. 73, then the steps of the flowchart of FIG. 73 continues at step 1438 with the diagonal total number of erase pulses counted by the erase pulse counter 1404.

In either case, after the diagonal total number of erase pulses is determined, the whole sector of flash memory cells 1400 is erase-verified. The reload logic 1416 and the maximum pulse count decoder 1414 input a selected percentage of the diagonal total number of erase pulses to be applied on the sector of flash memory cells 1400 for erase verifying the whole sector of flash memory cells (i.e., at the locations designated A1, A2, A3, A4, B1, B2, B3, B4, C1, C2, C3, C4, D1, D2, D3, and D4 in FIG. 70). Such a selected percentage of the diagonal total number of erase pulses is indicated by a user through the BIST interface 312.

The complement generator 1420 inputs the binary bit pattern of the diagonal total number of erase pulses and generate a binary complement of such a bit pattern. The diagonal total number of erase pulses is set to be the maximum pulse count value (Max_PC) if the diagonal total number of erase pulses reaches the maximum pulse count value (Max_PC) in step 1432 of FIG. 73 before the end of the diagonal verify in step 1434 of FIG. 73. On the other hand, the diagonal total number of erase pulses is as counted by the erase pulse counter 1404 if the diagonal total number of erase pulses does not reach the maximum pulse count value (Max_PC) in step 1432 of FIG. 73 by the end of the diagonal verify in step 1434 of FIG. 73. A binary complement is generated by changing a logical high state (i.e., a "1") to a logical low state (i.e., a "0"), and by changing a logical low state (i.e., a "0") to a logical high state (i.e., a "1"), for the bit pattern of the diagonal total number of erase pulses. Such a complement generator is known to one of ordinary skill in the art of electronics.

In one embodiment of the present invention, the maximum pulse count value, Max_PC, is expressed as $2^m - 1$, and the erase pulse counter is an m-bit counter. For example, for simplicity of illustration, assume that Max_PC is 63 which is expressed as $2^6 - 1$ such that m is six. In that case, the erase pulse counter 1404 is a six-bit binary counter.

Further referring to FIGS. 72 and 73, the plurality of reload count value generators 1422, 1424, and 1426 generates a respective reload count value that is the maximum pulse count value, Max_PC, minus a respective percentage of the diagonal total number of erase pulses. The divide by two reload count value generator 1422 generates a first reload count value that is Max_PC minus 50% of the diagonal total number of erase pulses by shifting the complement of the diagonal total number of erase pulses one-bit toward the least significant bit and adding a logical high bit for the most significant bit.

In addition, the divide by four reload count value generator 1424 generates a second reload count value that is Max_PC minus 25% of the diagonal total number of erase pulses by shifting the complement of the diagonal total number of erase pulses two-bits toward the least significant bit and adding a logical high bit for each of the two-most significant bits. The divide by eight reload count value generator 1426 generates a third reload count value that is Max_PC minus 12.5% of the diagonal total number of erase pulses by shifting the complement of the diagonal total number of erase pulses three-bits toward the least significant bit and adding a logical high bit for each of the three-most significant bits.

For an example illustration, for the case of Max_PC being 63 such that the erase pulse counter 1404 is a six-bit binary counter, further assume that the diagonal total number of erase pulses is 40 such that the binary bit pattern of the diagonal total number of erase pulses is "1 0 1 0 0 0". The complement of the diagonal total number of erase pulses in that case is "0 1 0 1 1 1". The output of the divide by two reload count value generator 1422 is "1 0 1 0 1 1" which is generated by shifting the complement of the diagonal total number of erase pulses (i.e., "0 1 0 1 1 1" in this example) one-bit toward the least significant bit and adding a logical high bit for the most significant bit. The first reload count value from the divide by two reload count value generator 1422 is then 43 which is the Max_PC value (i.e. 63) minus 50% of the diagonal total number of erase pulses (i.e., 50% of 40 which is 20).

Similarly, the output of the divide by four reload count value generator 1424 is "1 1 0 1 0 1" which is generated by shifting the complement of the diagonal total number of erase pulses (i.e., "0 1 0 1 1 1" in this example) two-bits toward the least significant bit and adding a logical high bit for each of the two-most significant bits. The second reload count value from the divide by four reload count value generator 1424 is then 53 which is the Max_PC value (i.e. 63) minus 25% of the diagonal total number of erase pulses (i.e., 25% of 40 which is 10).

In addition, the output of the divide by eight reload count value generator 1426 is "1 1 1 0 1 0" which is generated by shifting the complement of the diagonal total number of erase pulses (i.e., "0 1 0 1 1 1" in this example) three-bits toward the least significant bit and adding a logical high bit for each of the three-most significant bits. The third reload count value from the divide by eight reload count value generator 1426 is then 58 which is the Max_PC value (i.e. 63) minus 12.5% of the diagonal total number of erase pulses (i.e., 12.5% of 40 which is 5).

The reload logic 1416 controls the multiplexer 1418 to select one of the first, second, and third reload count values from the reload count value generators 1422, 1424, and 1426 as a selected reload count value to be loaded into the pulse counter 1404. The selected reload count value is selected from one of the first, second, and third reload count values depending on the selected percentage of the diagonal total number of erase pulses as input by the user via the BIST interface 312.

If the selected percentage of the diagonal total number of erase pulses as input by the user via the BIST interface 312 is same as the respective percentage corresponding to one of the reload count value generators 1422, 1424, or 1426, then the reload count value from that one reload count value generator is the selected reload count value. For example, if the selected percentage of the diagonal total number of erase pulses as input by the user via the BIST interface 312 is 50%, then the selected reload count value from the multiplexer 1418 is the first reload count value from the divide by two reload count value generator 1422. Or, if the selected percentage of the diagonal total number of erase pulses as input by the user via the BIST interface 312 is 25%, then the selected reload count value from the multiplexer 1418 is the second reload count value from the divide by four reload count value generator 1424. Alternatively, if the selected percentage of the diagonal total number of erase pulses as input by the user via the BIST interface 312 is 12.5%, then the selected reload count value from the multiplexer 1418 is the third reload count value from the divide by eight reload count value generator 1426.

On the other hand, if the selected percentage of the diagonal total number of erase pulses as input by the user via the BIST interface 312 is not the same as the respective percentage corresponding to one of the reload count value generators 1422, 1424, or 1426, then the selected reload count value is from one of the reload count value generators 1422, 1424, or 1426 corresponding to a respective percentage that is less than the selected percentage of the diagonal total number of erase pulses as input by the user. For example, if the selected percentage of the diagonal total number of erase pulses as input by the user via the BIST interface 312 is 75%, then the reload logic 1416 controls the multiplexer 1418 to choose the selected reload count value as either one of the first reload count value from the divide by two reload count value generator 1422 or the second reload count value from the divide by four reload count value generator 1424.

In any case, after erase verifying each of the diagonal flash memory cells of the sector 1400 of flash memory cells with determination of the diagonal total number of erase pulses, the whole sector of flash memory cells 1400 is erase-verified. Before beginning the erase verification of the whole sector of flash memory cells 1400, the selected reload count value from the multiplexer is loaded into the erase pulse counter 1404. Then for erase verifying the whole sector of flash memory cells 1400, the BIST state machine 316 sends a control signal each time an erase pulse is applied on each flash memory cell of the sector 1400 during erase verification of the whole sector of flash memory cells. The clock control logic 1412 controls the clock generator 1406 to generate the two non-overlapping clock signals pulses, ERCLK1 and ERCLK2, each time the BIST state machine 316 sends the control signal indicating that an erase pulse is applied on each flash memory cell of the sector 1400 of flash memory cells during erase verification of the whole sector of flash memory cells.

The erase pulse counter 1404 increments the binary count each time the clock generator 1406 generates the two non-overlapping clock signal pulses, ERCLK1 and ERCLK2. Thus, the erase pulse counter 1404 increments the binary count for each erase pulse of erasing voltages applied on the sector of flash memory cells 1400 during erase verifying the whole sector of flash memory cells (step 1440 of FIG. 73). However, for erase verifying the whole sector of flash memory cells 1400, the erase pulse counter 1404 increments from the selected reload count value that was loaded into the erase pulse counter before start of erase verifying the whole sector of flash memory cells.

During erase verifying the whole sector of flash memory cells, the maximum pulse count decoder 1414 inputs the binary count from the erase pulse counter 1404 to determine whether the maximum pulse count (Max_PC) is reached by the erase pulse counter 1404 (step 1442 of FIG. 73). The maximum pulse count decoder 1414 generates a control signal to the BIST state machine 316 indicating that the maximum pulse count (Max_PC) is reached by the erase pulse counter 1404 when the binary count from the erase pulse counter 1404 reaches the maximum pulse count (Max_PC).

If the whole sector of flash memory cells 1400 passes erase verify such that the end of the sector 1400 is reached before the count of the erase pulses applied on the sector 1400 reaches the maximum pulse count (Max_PC) (step 1444 of FIG. 73), then the sector 1400 passes the erase verify BIST mode (step 1446 of FIG. 73), and the erase verify BIST mode ends. On the other hand, if the count of the erase pulses applied on the sector 1400 from the erase pulse counter 1404 reaches the maximum pulse count (Max_PC) (step 1442 of FIG. 73), the maximum pulse count decoder 1414 determines whether the selected percentage of the diagonal total number of erase pulses as input by the user via the BIST interface 312 has been applied on the sector 1400 during erase verifying of the whole sector of flash memory cells (step 1452 of FIG. 73). If the selected percentage of the diagonal total number of erase pulses as input by the user via the BIST interface 312 is same as the respective percentage corresponding to one of the reload count value generators 1422, 1424, or 1426, then the selected percentage of the diagonal total number of erase pulses as input by the user via the BIST interface 312 has been applied on the sector 1400 during erase verifying of the whole sector of flash memory cells.

For example, if the selected percentage of the diagonal total number of erase pulses as input by the user via the BIST interface 312 is 50%, then the selected reload count value from the multiplexer 1418 is the first reload count value from the divide by two reload count value generator 1422. Thus, by the time the count of the erase pulses applied on the sector 1400 reaches the maximum pulse count (Max_PC) as indicated by the count from the erase pulse counter 1404 (step 1442 of FIG. 73), 50% of the diagonal total number of erase pulses have been applied on the sector of flash memory cells 1400 during erase verifying of the whole sector of flash memory cells such that the selected percentage (i.e., 50%) of the diagonal total number of erase pulses have been applied on the sector 1400.

Or, if the selected percentage of the diagonal total number of erase pulses as input by the user via the BIST interface 312 is 25%, then the selected reload count value from the multiplexer 1418 is the second reload count value from the divide by four reload count value generator 1424. Thus, by the time the count of the erase pulses applied on the sector 1400 reaches the maximum pulse count (Max_PC) as indicated by the count from the erase pulse counter 1404 (step 1442 of FIG. 73), 25% of the diagonal total number of erase pulses have been applied on the sector of flash memory cells 1400 during erase verifying of the whole sector of flash memory cells such that the selected percentage (i.e., 25%) of the diagonal total number of erase pulses have been applied on the sector 1400.

Alternatively, if the selected percentage of the diagonal total number of erase pulses as input by the user via the BIST interface 312 is 12.5%, then the selected reload count value from the multiplexer 1418 is the third reload count value from the divide by eight reload count value generator 1426. Thus, by the time the count of the erase pulses applied on the sector 1400 reaches the maximum pulse count (Max_PC) as indicated by the count from the erase pulse counter 1404 (step 1442 of FIG. 73), 12.5% of the diagonal total number of erase pulses have been applied on the sector of flash memory cells 1400 during erase verifying of the whole sector of flash memory cells such that the selected percentage (i.e., 12.5%) of the diagonal total number of erase pulses have been applied on the sector 1400.

If the maximum pulse count (Max_PC) is reached at step 1442 of FIG. 73 and if the selected percentage of the diagonal total number of erase pulses as input by the user via the BIST interface 312 has already been applied on the sector 1400 during erase verifying of the whole sector of flash memory cells (step 1452 of FIG. 73), then the sector 1400 of flash memory cells is deemed to fail the erase verify BIST mode (step 1454 of FIG. 73). In that case, the erase verify BIST mode may end or the repair routine may be entered (as already described herein).

On the other hand, if the maximum pulse count (Max_PC) is reached at step 1442 of FIG. 73 and if the selected percentage of the diagonal total number of erase pulses as input by the user via the BIST interface 312 has not yet been applied on the sector 1400 during erase verifying of the whole sector of flash memory cells (step 1452 of FIG. 73), then the maximum pulse count decoder 1414 sends a reload control signal to the reload logic 1416 such that the reload logic 1416 controls the multiplexer to select another one of the reload count values from the reload count value generators 1422, 1424, and 1426 (step 1456 of FIG. 73). Such another selected reload count value is loaded into the erase pulse counter 1404 before continuing on with erase verifying the whole sector of flash memory cells 1400.

Another selected reload count value as chosen by the multiplexer 1418 as one of the reload count values from the reload count value generators 1422, 1424, and 1426 is such that the respective percentage of the prior selected reload count value and the respective percentage of another selected reload count value add up to the selected percentage of the diagonal total number of erase pulses as input by the user via the BIST interface 312. For example, if the selected percentage of the diagonal total number of erase pulses as input by the user via the BIST interface 312 is 75%, then the respective percentage corresponding to the divide by two reload count value generator 1422 which is 50% and the respective percentage corresponding to the divide by four reload count value generator 1424 which is 25% add up to the selected percentage of the diagonal total number of erase pulses as input by the user via the BIST interface 312 (i.e., the 75%).

In that case, if in prior step 1438 of FIG. 73, if the first reload count value from the divide by two reload count value generator 1422 was chosen by the multiplexer 1418 as the selected reload count value, and step 1456 of FIG. 73 is reached, then another selected reload count value at step 1456 of FIG. 73 is the second reload count value from the divide by four reload count value generator 1424. After the reload logic 1416 controls the multiplexer 1418 to choose the second reload count value from the divide by four reload count value generator 1424, the erase pulse counter loads in that newly selected reload count value.

Then, the flowchart of FIG. 73 returns to step 1440 such that steps 1440, 1442, 1444, 1446, 1452, 1454, and/or 1456 are repeated for continued erase verifying of the whole sector of flash memory cells 1400. However, during this repeat of such steps, the erase pulse counter increments from the newly selected reload count value (i.e., the second reload count value from the divide by four reload count value generator 1424 in the example). Again, during the repeat of such steps, if each of the whole sector of flash memory cells 1400 passes erase verify such that the end of the sector 1400 is reached before the count of the erase pulses applied on the sector 1400 reaches the maximum pulse count (Max_PC) (step 1444 of FIG. 73), then the sector 1400 passes the erase verify BIST mode (step 1446 of FIG. 73), and the erase verify BIST mode ends.

However, if the maximum pulse count (Max_PC) is reached at step 1442 of FIG. 73, the maximum pulse count decoder 1414 determines whether the selected percentage of the diagonal total number of erase pulses as input by the user via the BIST interface 312 has been applied on the sector 1400 during erase verifying of the whole sector of flash memory cells (step 1452 of FIG. 73). For the prior example of the selected percentage of the diagonal total number of erase pulses being 75%, when the Max_PC value is reached by the erase pulse counter 1404 this time, the selected percentage of the diagonal total number has been applied on the sector 1400. During the prior cycle of steps 1440, 1442, 1444, 1446, 1452, 1454, and/or 1456, the first reload count value from the divide by two reload count value generator 1422 being loaded into the erase pulse counter 1404 and the Max_PC value being reached resulted in 50% of the diagonal total number of erase pulses being applied on the sector 1400. Then, during the current cycle of steps 1440, 1442, 1444, 1446, 1452, 1454, and/or 1456, the second reload count value from the divide by four reload count value generator 1424 being loaded into the erase pulse counter 1404 and the Max_PC value being reached resulted in 25% of the diagonal total number of erase pulses being applied on the sector 1400. Thus, a total of 75% of the diagonal total number of erase pulses is applied on the sector 1400.

In this manner, the reload logic 1416 and the maximum pulse count decoder 1414 keep track of any selected percentage of the diagonal total number of erase pulses as input by the user via the BIST interface 312 as long as the selected percentage is a combination of the respective percentages of the plurality of reload count value generators 1422, 1424, and 1426. For example, since the respective percentage of the plurality of reload count value generators 1422, 1424, and 1426 is 50%, 25%, and 12.5%, respectively, the selected percentage as input by the user via the BIST interface 312 may be any one of 75%, 62.5%, 50%, 37.5%, 25%, or 12.5%. Thus, the system 1402 for keeping track of the number of erase pulses applied on the sector 1400 of flash memory cells during the erase verify BIST (built-in-self-test) mode provides flexibility in accommodating any of multiple percentages of the diagonal total number of erase pulses to be applied during erase verifying the whole sector of flash memory cells.

In addition, additional respective percentages may be generated with additional reload count value generators of the plurality of reload count value generators 1422. In particular, any percentage that is a fraction represented by $\frac{1}{2^n}$, with "n" being an positive integer greater than zero, such as $\frac{1}{16}$, $\frac{1}{32}$, $\frac{1}{64}$, etc. may advantageously be generated. Furthermore, the selected percentage of the diagonal total number of erase pulses as input by the user via the BIST interface 312 may be any combination of the respective percentages of the plurality of reload count value generators with any number of reloads of the reload count values from the plurality of reload count value generators. For example, for the selected percentage of the diagonal total number of erase pulses being 75%, only two reloads of 50% and 25% have been described. However, other selected percentages may be accommodated with three reloads, or four reloads, etc.

Furthermore, keeping track of the number of erase pulses applied on the sector of flash memory cells 1400 during the erase verify BIST mode is performed on-chip. Because keeping track of the number of erase pulses applied on the sector of flash memory cells during the erase verify BIST mode is performed on-chip, the speed of performing the erase verify BIST mode is not limited by the capacity of the external test system. Thus, keeping track of the number of erase pulses applied on the sector of flash memory cells during an erase verify BIST mode may be more efficient.

The foregoing is by way of example only and is not intended to be limiting. For example, any numbers described or illustrated herein are by way of example only. In addition, implementation of each of the components 1412, 1413, 1414, 1416, 1418, 1420, 1422, 1424, and 1426 of the pulse counter controller 1408 may be implemented in various means as known to one of ordinary skill in the art of electronics such as by way of hardware logic or by way of software programming within a data processor. The present invention is limited only as defined in the following claims and equivalents thereof.

Figure 74:
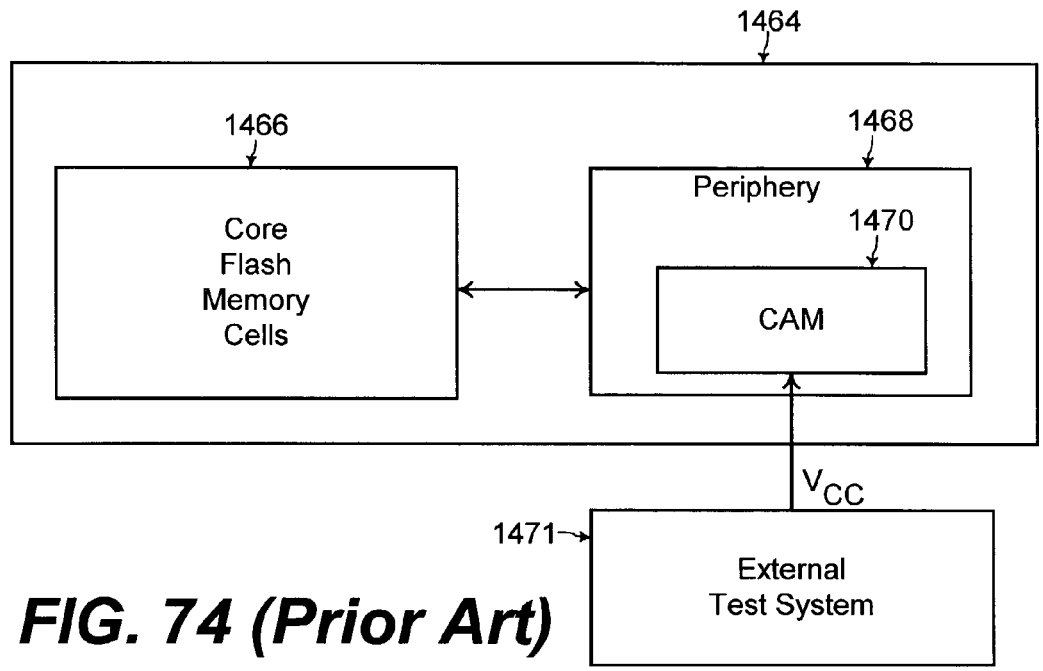
FIG. 74 shows components of a semiconductor die of FIG. 4 including a CAM (content addressable memory) within a periphery area and with generation of a program margining voltage off-chip from an external test system, according to the prior art.

I. Generation of Margining Voltage On-Chip During Testing CAM Portion of Flash Memory Device Referring to FIG. 4, the semiconductor wafer 220 has a plurality of semiconductor dies fabricated thereon. Each square area on the semiconductor wafer 220 of FIG. 4 represents one semiconductor die. More numerous semiconductor dies are typically fabricated on a semiconductor wafer than shown in FIG. 4 for clarity of illustration. Each semiconductor die has a flash memory device fabricated thereon for example. Referring to FIG. 74, an example semiconductor die 1465 is illustrated with a flash memory device 1466 comprised of an array of core flash memory cells. Each semiconductor die of FIG. 4 has a respective flash memory device comprised of an array of core flash memory cells 1466. Such a flash memory device comprised of an array of flash memory cells are known to one of ordinary skill in the art of electronics.

Furthermore, the semiconductor die 1464 has a periphery area 1468 with logic circuitry for controlling the operation of the array of core flash memory cells 1466, as known to one of ordinary skill in the art of electronics. A CAM (content addressable memory) 1470 is typically a part of the periphery area 1468. The CAM 1470 stores various types of information regarding the array of core flash memory cells 1466 for proper operation of the array of core flash memory cells 1466. For example, the CAM 1470 stores address information of a redundant cell that replaces any defective cell within the array of core flash memory cells 1466. Such use of the CAM 1470 within the periphery area 1468 is known to one of ordinary skill in the art of electronics.

Figure 1:
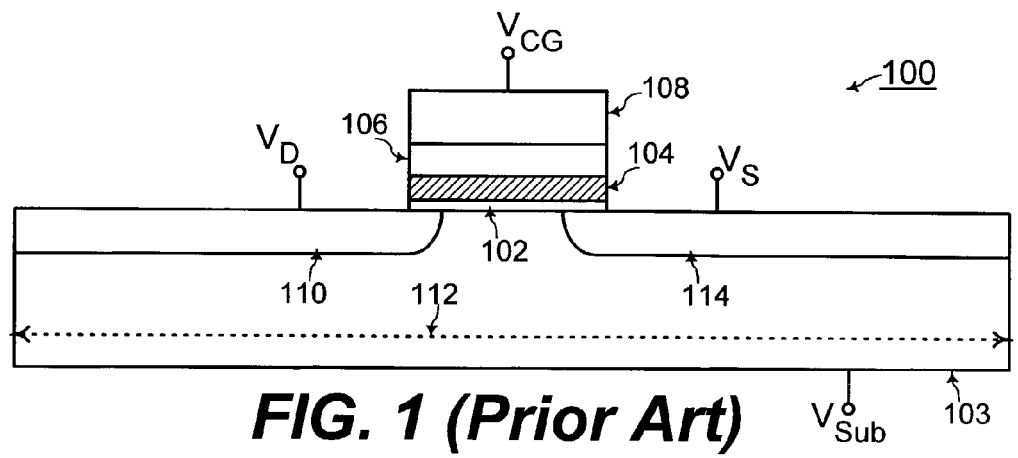
FIG. 1 shows a cross-sectional view of a flash memory cell.
Figure 2:
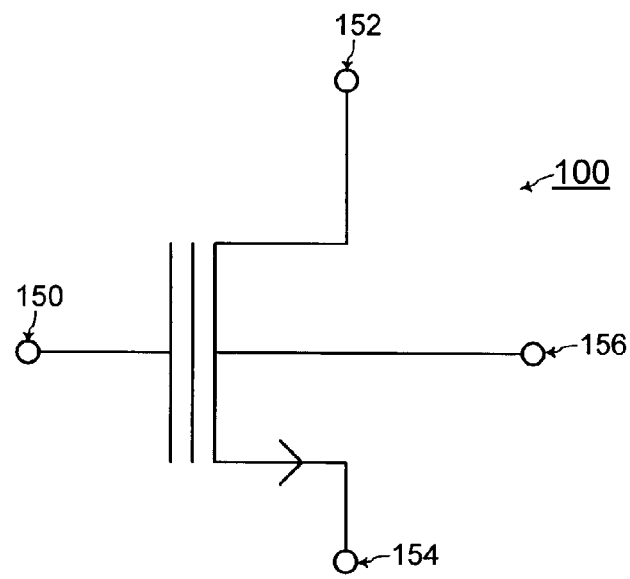
FIG. 2 shows a circuit diagram representation of the flash memory cell of FIG. 1.

Because the CAM 1470 stores information used during operation of the array of core flash memory cells 1466, the reliability and proper operation of the CAM 1470 is verified before the CAM 1470 is used. The CAM 1470 is typically comprised of an array of flash memory cells, as known to one of ordinary skill in the art of electronics. For example, each flash memory cell of the CAM 1470 has the device structure of FIG. 1 as illustrated and already described herein.

Because the CAM 1470 stores information used during operation of the array of core flash memory cells 1466, the reliability and proper operation of the CAM 1470 is verified before the CAM 1470 is used. For verifying the reliability and proper operation of a flash memory cell of the CAM 1470, the flash memory cell of the CAM 1470 is programmed and erased. Then, a read operation is performed on such a flash memory cell after being programmed or erased to ensure that the flash memory cell is properly programmed or erased for checking the proper functionality of the flash memory cell of the CAM. Such a read operation after programming the flash memory cell of the CAM is referred to as "program margining" by one of ordinary skill in the art of flash memory technology. Similarly, such a read operation after erasing the flash memory cell of the CAM is referred to as "erase margining" by one of ordinary skill in the art of flash memory technology.

During program margining of a flash memory cell of a CAM, a gate to source voltage of about 3.3 Volts is applied on the flash memory cell to test whether that flash memory cell remains turned off. If the flash memory cell turns on with such a gate to source voltage, then the flash memory cell is determined to be defective. Such a gate to source voltage of 3.3 Volts is referred to as the margining voltage. During erase margining of a flash memory cell of a CAM, a gate to source voltage of about 0 Volts is applied on the flash memory cell to test whether that flash memory cell turns on. If the flash memory cell remains turned off with such a gate to source voltage, then the flash memory cell is determined to be defective. Such a gate to source voltage of 0 Volts is referred to as the margining voltage.

In the prior art, the margining voltage of 3.3 Volts is supplied from a power source $V_{CC}$ of an external test system 1471. The external test system 1471 tests for the proper functionality of the flash memory device including the array of core flash memory cells 1466 fabricated on the semiconductor die 1464. An example of such an external test system 1471 is the model V3300, available from Agilent Technologies, Inc., headquartered in Palo Alto, Calif. However, such a voltage $V_{CC}$ from the external test system 1471 may vary from day to day with external conditions such as temperature. In addition, for different modes of testing the core flash memory cells 1466, different voltage levels may be desired for the $V_{CC}$ voltage from the external test system 1471. However, such a variation of the voltage $V_{CC}$ from the external test system 1471 results in undesired variations during testing the proper functionality of the flash memory cells of the CAM 1470. Thus, a more stable source of margining voltage is desired for more consistent results of testing the proper functionality of the flash memory cells of the CAM 1470.

Figure 75:
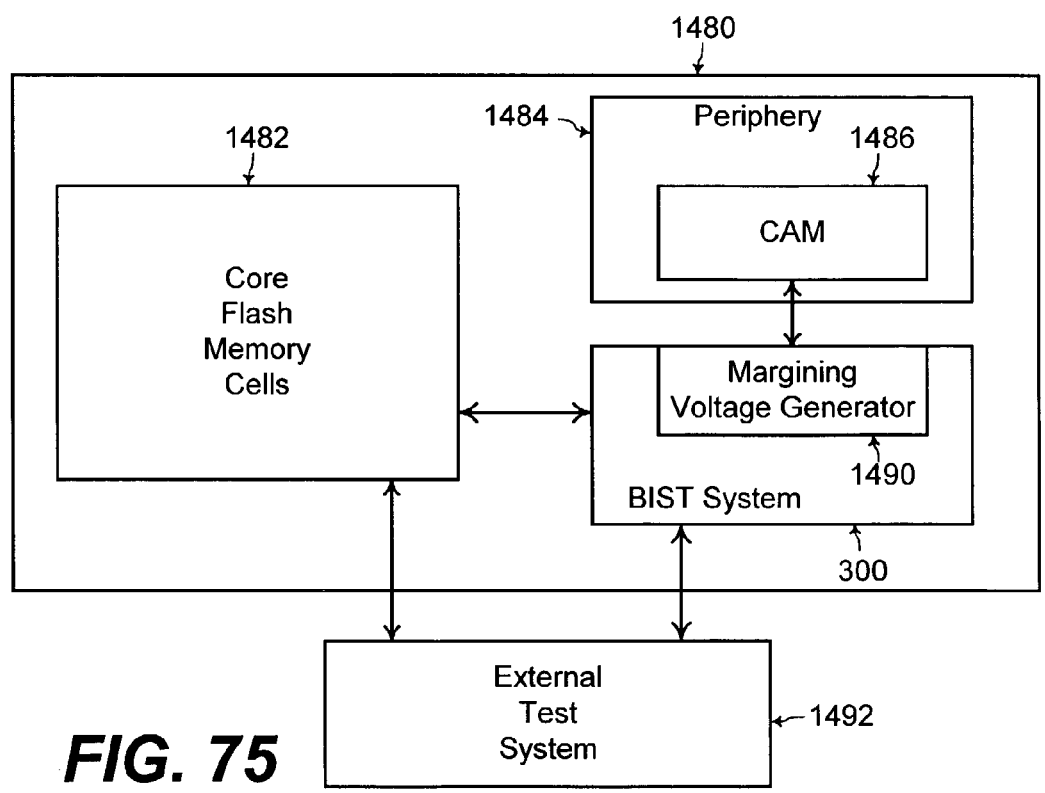
FIG. 75 shows components of a semiconductor die of FIG. 4 with a margining voltage generator apparatus within a BIST (built-in-self-test) system for generating margining voltages on-chip within the semiconductor die during testing of the CAM (content addressable memory), according to an embodiment of the present invention.

Referring to FIG. 75, a semiconductor die 1480 includes a flash memory device 1482 comprised of an array of core flash memory cells and a periphery area 1484 having logic circuitry and a CAM (content addressable memory) 1486, as known to one of ordinary skill in the art of flash memory technology. In addition, the semiconductor die 1480 according to an aspect of the present invention includes a BIST (built-in-self-test) system 300 with a margining voltage generator 1490. The BIST system 300 is similar in function and structure to the BIST system 300 as already described herein.

The BIST system 300 performs programming, erasing, and reading operations on the array of core flash memory cells 1482 on-chip within the semiconductor die 1480 during testing for the proper functionality of the array of core flash memory cells 1482 during a BIST (built-in-self-test) mode invoked by an external test system 1492. On the other hand, the external test system 1492 performs the programming, erasing, and reading operations directly on the array of core flash memory cells 1482 when a manual mode is invoked by the external test system 1492. An example of such an external test system 1492 that may be used with the BIST mode or the manual mode is the model V3300, available from Agilent Technologies, Inc., headquartered in Palo Alto, Calif.

Because the CAM 1486 stores information used during operation of the array of core flash memory cells 1482, the reliability and proper operation of the CAM 1486 is verified before the CAM 1486 is used for storing such information. The CAM 1486 is typically comprised of an array of flash memory cells, as known to one of ordinary skill in the art of electronics. For verifying the reliability and proper operation of a flash memory cell of the CAM 1486, the flash memory cell is programmed and erased. Then, a read operation is performed on such a flash memory cell after being programmed or erased to ensure that the flash memory cell is properly programmed or erased for checking the proper functionality of the flash memory cell of the CAM 1486. Such a read operation after programming the flash memory cell of the CAM 1486 is referred to as "program margining" by one of ordinary skill in the art of flash memory technology. Similarly, such a read operation after erasing the flash memory cell of the CAM 1486 is referred to as "erase margining" by one of ordinary skill in the art of flash memory technology.

During program margining of a flash memory cell of the CAM 1486, a gate to source voltage of about 3.3 Volts is applied on the flash memory cell to test whether that flash memory cell remains turned off. If the flash memory cell turns on with such a gate to source voltage, then the flash memory cell is determined to be defective. Such a gate to source voltage of 3.3 Volts is referred to as the program margining voltage. During erase margining of a flash memory cell of a CAM, a gate to source voltage of about 0 Volts is applied on the flash memory cell to test whether that flash memory cell turns on. If the flash memory cell remains turned off with such a gate to source voltage, then the flash memory cell is determined to be defective. Such a gate to source voltage of 0 Volts is referred to as the erase margining voltage.

Figure 76:
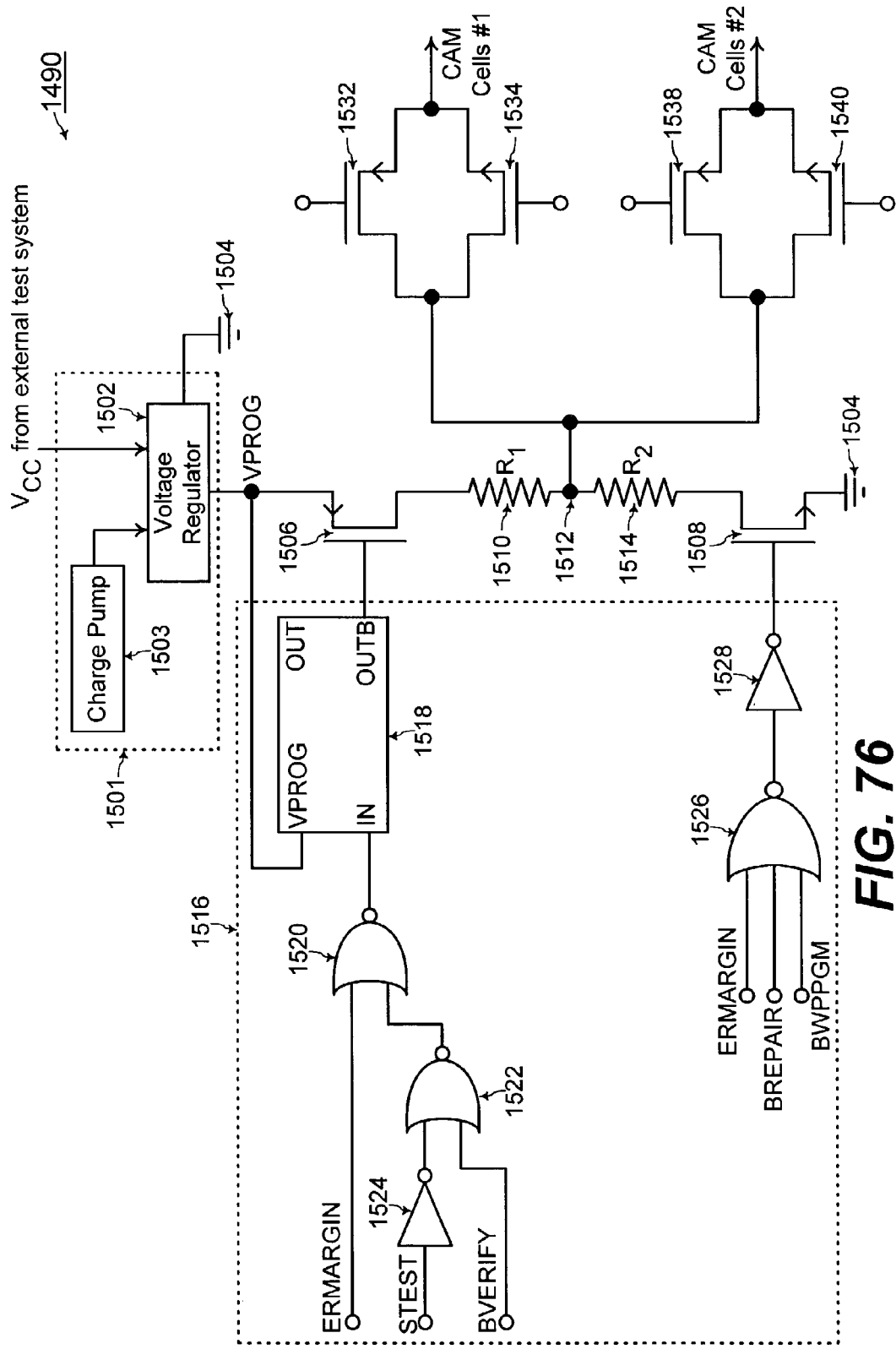
FIG. 76 shows a circuit diagram of the margining voltage generator apparatus of FIG. 75, according to an embodiment of the present invention.

FIG. 76 shows a circuit diagram of the margining voltage generator apparatus 1490 for generating the program margining voltage and the erase margining voltage used during testing of a flash memory cell of the CAM 1486. Referring to FIGS. 75 and 76, the margining voltage generator apparatus 1490 is formed as part of the BIST system 300 on the semiconductor die 1480, according to one embodiment of the present invention. Referring to FIG. 76, the margining voltage generator apparatus 1490 includes a voltage regulator 1502 and a high voltage charge pump 1503 that are part of a high voltage generator 1501 (shown within dashed lines in FIG. 76) for providing a high voltage source having a voltage level of VPROG. The voltage regulator 1502 and the charge pump 1503 are fabricated on the semiconductor die 1480. Such charge pumps and voltage regulators for generating a relatively stable voltage are known to one of ordinary skill in the art of electronics.

In addition, a low voltage source 1504 such as the ground node 1504 is coupled to the voltage regulator 1502. The high voltage level of VPROG is with respect to the ground node

1504. Referring to FIG. 76, the margining voltage generator apparatus 1490 also includes a PMOSFET (P-channel metal oxide semiconductor field effect transistor) 1506 as a first transistor and an NMOSFET (N-channel metal oxide semiconductor field effect transistor) 1508 as a second transistor. The source of the PMOSFET 1506 is coupled to the high voltage source 1501 providing the VPROG voltage, and the source of the NMOSFET 1508 is coupled to the ground node of the low voltage source 1504.

In addition, a first resistor 1510 having a resistance value of $R_1$ is coupled between the drain of the PMOSFET 1506 and an output node 1512, and a second resistor 1514 having a resistance value of $R_2$ is coupled between the drain of the NMOSFET 1508 and the output node 1512. The program or erase margining voltage used for testing the flash memory cells of the CAM 1486 is generated at the output node 1512.

The margining voltage generator apparatus 1490 also includes a logic circuit 1516 (shown within dashed lines in FIG. 76) for controlling generation of the program or erase margining voltage during a BIST (built-in-self-test) mode or a manual mode. The logic circuit 1516 includes a voltage level shifter 1518. An output, OUTB, of the voltage level shifter 1518 is coupled to the gate of the PMOSFET 1506. The output of a first NOR gate 1520 is coupled to the input of the voltage level shifter 1518. The first NOR gate 1520 has a control signal, ERMARGIN, as a first input and the output of a second NOR gate 1522 as a second input. The second NOR gate 1522 has a control signal, BVERIFY, as a first input and the output of a first inverter 1524 as a second input. The first inverter 1524 has a control signal, STEST, as the input.

In addition, the logic circuit 1516 includes a third NOR gate 1526 and a second inverter 1528. The output of the second inverter 1528 is coupled to the gate of the NMOSFET 1508, and the input of the second inverter 1528 is coupled to the output of the third NOR gate 1526. The third NOR gate 1526 has three inputs with the control signal, ERMARGIN, coupled to a first input of the third NOR gate 1526, a control signal, BREPAIR, coupled to a second input of the third NOR gate 1526, and a control signal, BWPPGM, coupled to a third input of the third NOR gate 1526.

Figure 77:
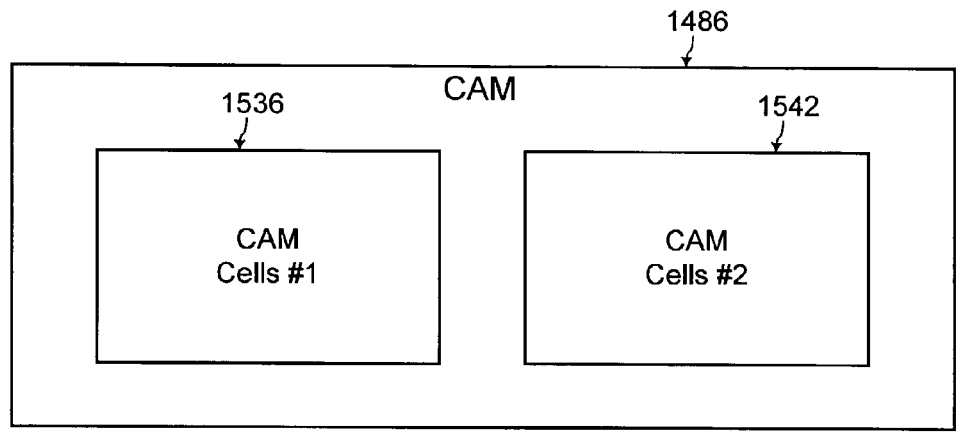
FIG. 77 shows a block diagram of the CAM (content addressable memory) having two portions of CAM flash memory cells.

Furthermore, the margining voltage generator apparatus 1490 also includes a first set of pass transistors, including a first pass PMOSFET (P-channel metal oxide semiconductor field effect transistor) 1532 and a first pass NMOSFET (N-channel metal oxide semiconductor field effect transistor) 1534. The drains of the first set of pass transistors 1532 and 1534 are coupled to the output node 1512, and the sources of the first set of pass transistors 1532 and 1534 are coupled to the gates of a first group of flash memory cells 1536 of the CAM 1486 as shown in FIG. 77.

Similarly, the margining voltage generator apparatus 1490 also includes a second set of pass transistors, including a second pass PMOSFET (P-channel metal oxide semiconductor field effect transistor) 1538 and a second pass NMOSFET (N-channel metal oxide semiconductor field effect transistor) 1540. The drains of the second set of pass transistors 1538 and 1540 are coupled to the output node 1512, and the sources of the second set of pass transistors 1538 and 1540 are coupled to the gates of a second group of flash memory cells 1542 of the CAM 1486 as shown in FIG. 77.

Figure 78:
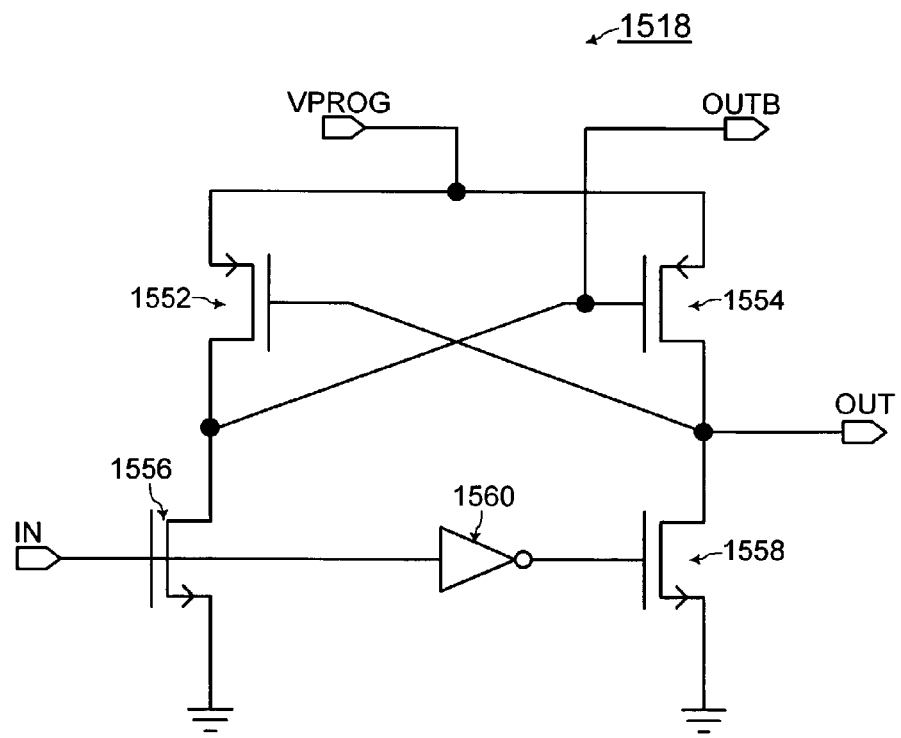
FIG. 78 shows a voltage level shifter used in the margining voltage generator apparatus of FIG. 76 for controlling the turning on and off of a transistor coupled to a high voltage source, according to an embodiment of the present invention.

FIG. 78 shows an example implementation of the voltage level shifter 1518. The voltage level shifter 1518 includes a first shift PMOSFET (P-channel metal oxide semiconductor field effect transistor) 1552, a second shift PMOSFET (P-channel metal oxide semiconductor field effect transistor) 1554, a first shift NMOSFET (N-channel metal oxide semiconductor field effect transistor) 1556, and a second shift NMOSFET (N-channel metal oxide semiconductor field effect transistor) 1558.

The sources of the first and second shift PMOSFETs 1552 and 1554 are coupled together to the high voltage source 1501 providing the voltage level of VPROG. The drains of the first shift PMOSFET 1552 and the first shift NMOSFET 1556 are coupled together at a first output node OUTB. The drains of the second shift PMOSFET 1554 and the second shift NMOSFET 1558 are coupled together at a second output node OUT. The gate of the first shift PMOSFET 1552 is coupled to the drains of the second shift PMOSFET 1554 and the second shift NMOSFET 1558 at the second output node OUT. The gate of the second shift PMOSFET 1554 is coupled to the drains of the first shift PMOSFET 1552 and the first shift NMOSFET 1556 at the first output node OUTB. The gate of the first shift NMOSFET 1556 is coupled to an input node IN, and the gate of the second shift NMOSFET 1558 is coupled to the input node IN via a third inverter 1560.

FIG. 79 shows a table of voltages during operation of the margining voltage generator apparatus 1490 of FIG. 76. Referring to FIGS. 75, 76, and 79, the signals ERMARGIN, STEST, BVERIFY, BREPAIR, and BWPPGM are control signals sent from the BIST system 300. The control signal ERMARGIN is set to a high state (i.e., a "1") when an erase margining operation is performed on the CAM 1486 and to a low sate (i.e., a "0") when a program margining operation is performed on the CAM 1486. The control signal STEST is set to a high state (i.e., a "1") when the BIST (built-in-self-test) mode is invoked by the external test system and to a low state (i.e., a "0") when the manual mode is invoked by the external test system.

Typically, when a control signal is set high (i.e., a "1"), approximately 5 Volts is applied for the control signal. On the other hand, when a control signal is set low (i.e., a "0"), approximately 0 Volts is applied for the control signal.

Referring to FIGS. 76 and 77, the control signal BREPAIR is set low (i.e., a "0") for testing the functionality of the first group of flash memory cells 1536 of the CAM 1486, and the control signal BWPPGM is set low (i.e., a "0") for testing the functionality of the second group of flash memory cells 1542 of the CAM 1486. The use of the control signal BVERIFY allows the PMOSFET 1506 to turn on or off after the voltage level VPROG from the high voltage source 1501 has stabilized.

Figure 80:
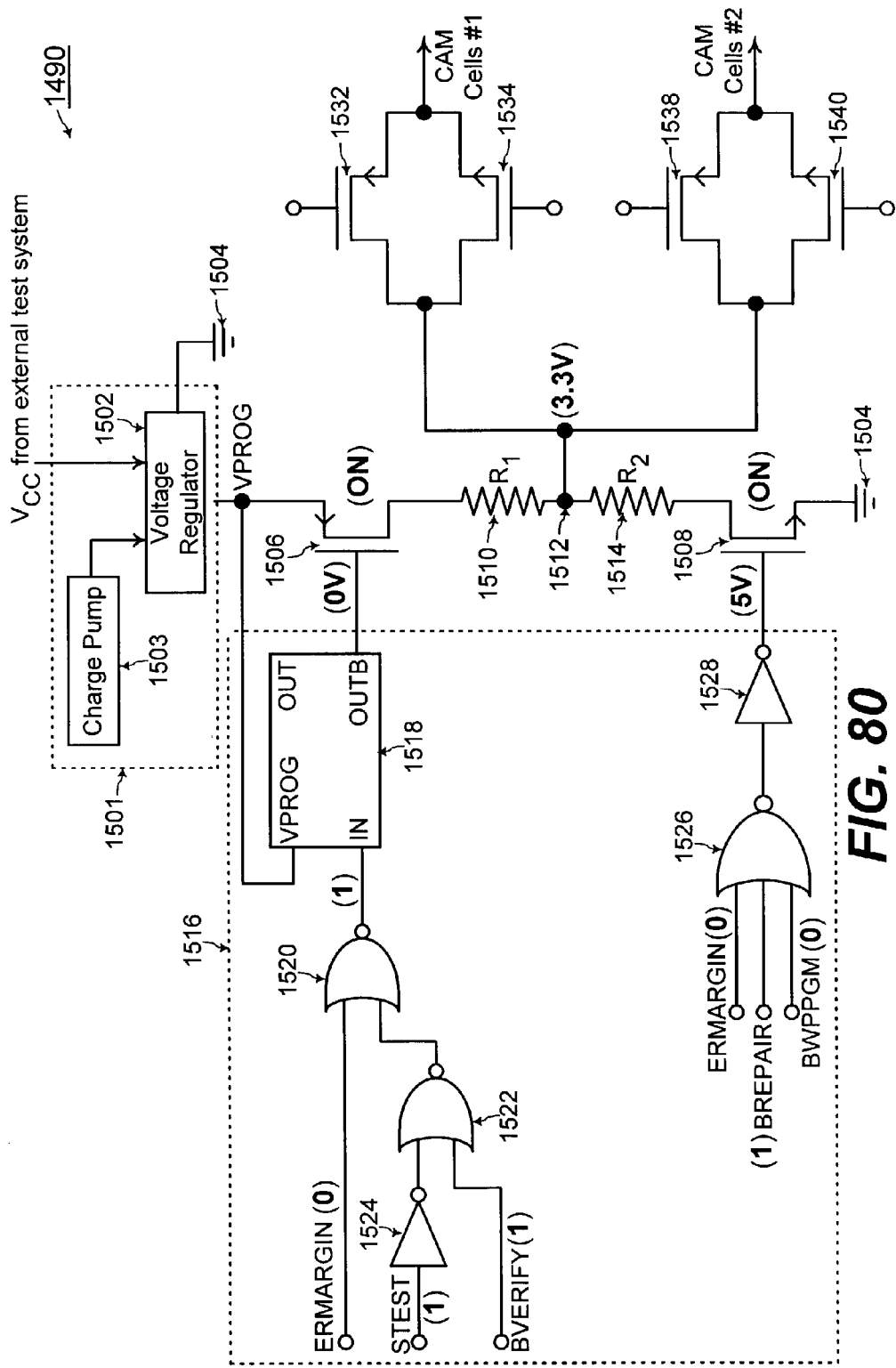
FIG. 80 shows the voltage levels of the margining voltage generator apparatus of FIG. 76 when program margining during a BIST (built-in-self-test) mode is invoked, according to one embodiment of the present invention.

FIG. 80 shows the voltage levels during operation of the margining voltage generator apparatus 1490 of FIG. 76 for providing a program margining voltage of 3.3 Volts at the output node 1512 when the BIST mode is invoked by the external test system 1492. Referring to FIGS. 79 (i.e., the first column entitled "BIST Program Margin" in FIG. 79) and 80, because the BIST mode is invoked, the control signal STEST is set high (i.e., a "1"). In addition, for the program margining voltage, the control signal ERMARGIN is set low (i.e., a "0"). In one embodiment of the present invention, the BREPAIR control signal is set high (i.e., a "1"), and the BWPPGM control signal is set low (i.e., a "0"), for applying the program margining voltage of 3.3 Volts to the second group of flash memory cells 1542 of the CAM 1486 in FIG. 77.

Referring to FIGS. 78 and 80, with such control signals, the input to the voltage level shifter 1518 is set high (i.e., a "1") such that the voltage level at the first output OUTB node is at 0 Volts. With 0 Volts at the gate of the PMOSFET 1506, the PMOSFET 1506 turns on. In addition, with such control signals, a voltage level of 5 Volts is applied at the gate of the NMOSFET 1508 such that the NMOSFET 1508 is turned on. With the PMOSFET 1506 and the NMOSFET 1508 turned on, the first and second resistors 1510 and 1514 form a resistive divider between the high voltage source 1501 and the ground node 1504. In that case, the output voltage $V_{OUT}$ at the output node 1512 is as follows:

$$V_{OUT}=V_{PROG}[R_2/(R_1+R_2)]$$

In one embodiment of the present invention, $V_{PROG}$=5 Volts, and the values of $R_1$ and $R_2$ are selected such that $V_{OUT}$=3.3 Volts.

Figure 81:
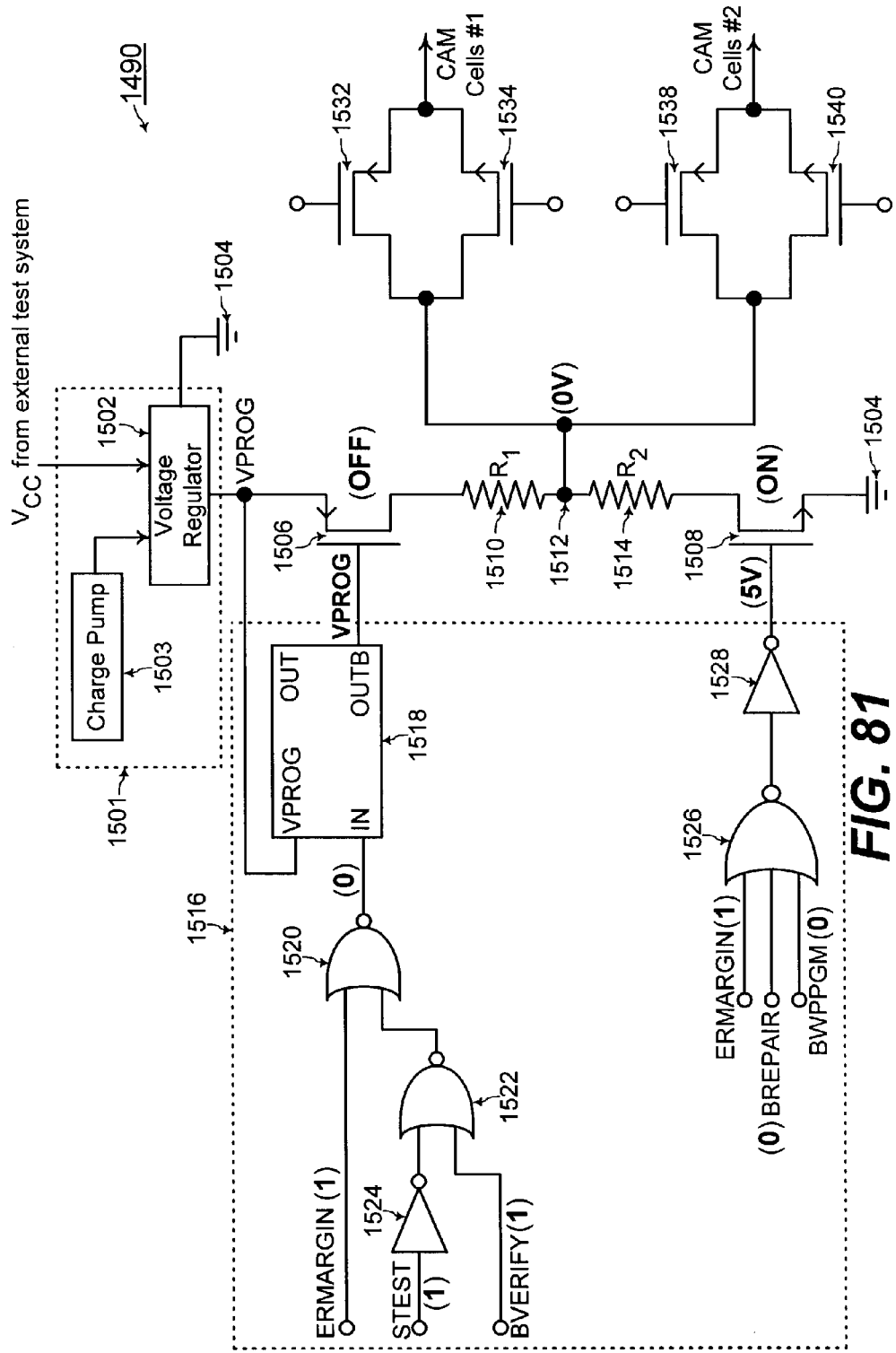
FIG. 81 shows the voltage levels of the margining voltage generator apparatus of FIG. 76 when erase margining during the BIST (built-in-self-test) mode is invoked, according to one embodiment of the present invention.

FIG. 81 shows the voltage levels during operation of the margining voltage generator apparatus 1490 of FIG. 76 for providing an erase margining voltage of 0 Volts at the output node 1512 when the BIST mode is invoked by the external test system 1492. Referring to FIGS. 79 (i.e., the second column entitled "BIST Erase Margin" in FIG. 79) and 81, because the BIST mode is invoked, the control signal STEST is set high (i.e., a "1"). In addition, for the erase margining voltage, the control signal ERMARGIN is set high (i.e., a "1"). In addition, the BREPAIR control signal is set low (i.e., a "0"), and the BWPPGM control signal is set low (i.e., a "0"), for applying the erase margining voltage of 0 Volts to all of the first and second groups of flash memory cells 1536 and 1542 of the CAM 1486 in FIG. 77.

Referring to FIGS. 78 and 81, with such control signals, the input to the voltage level shifter 1518 is set low (i.e., a "0") such that the voltage level at the first output OUTB node is at the high voltage level of VPROG. With the voltage level of VPROG at the gate of the PMOSFET 1506, the PMOSFET 1506 turns off. In addition, with such control signals, a voltage level of 5 Volts is applied at the gate of the NMOSFET 1508 such that the NMOSFET 1508 is turned on. With the PMOSFET 1506 turned off and the NMOSFET 1508 turned on, the output node 1512 discharges to an output voltage $V_{OUT}$=0 Volts of the ground node of the low voltage source 1504.

Figure 82:
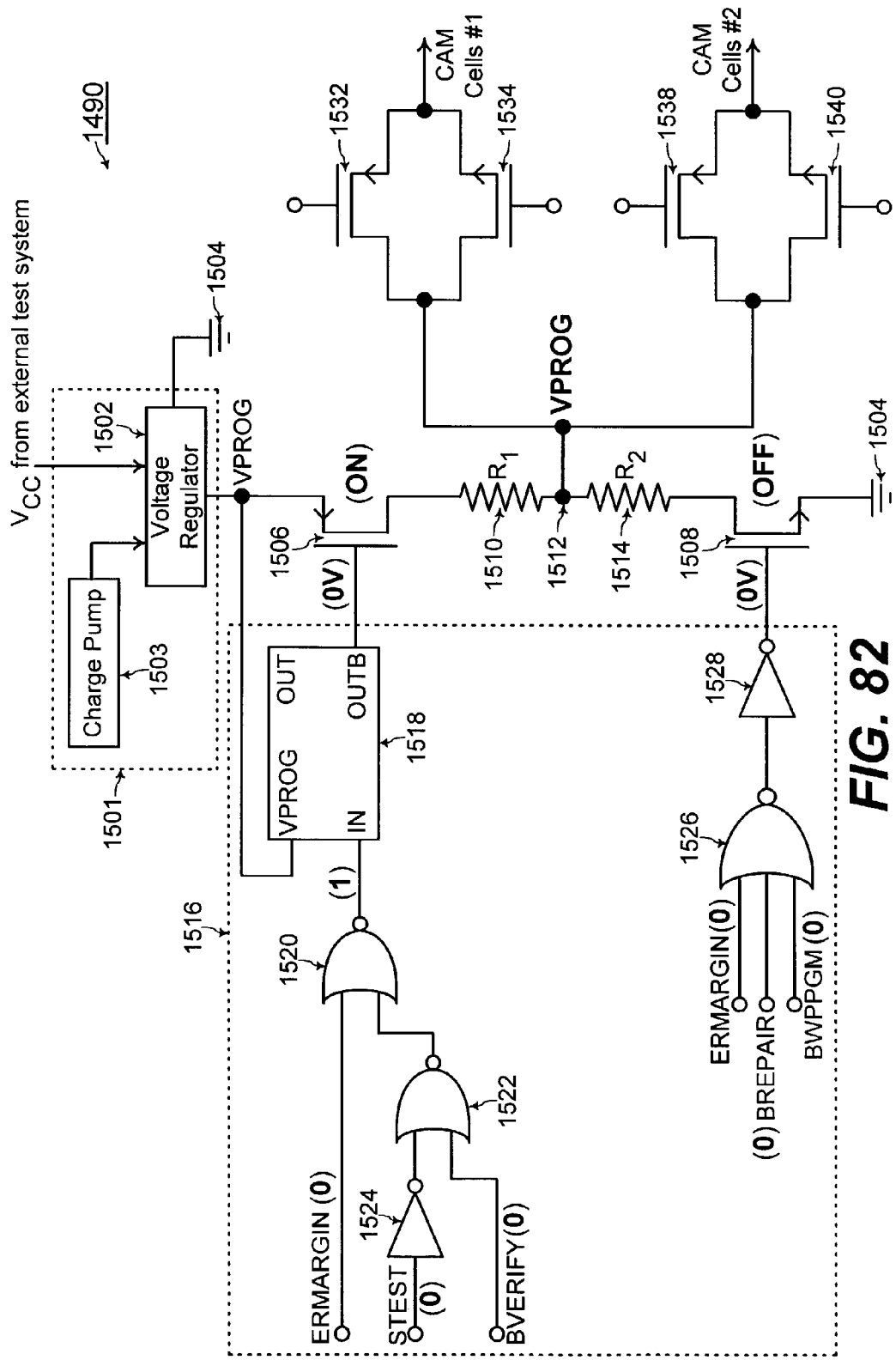
FIG. 82 shows the voltage levels of the margining voltage generator apparatus of FIG. 76 when program margining during a manual mode is invoked, according to one embodiment of the present invention.

FIG. 82 shows the voltage levels during operation of the margining voltage generator apparatus 1490 of FIG. 76 for providing a program margining voltage of VPROG at the output node 1512 when the manual mode is invoked by the external test system 1492. Referring to FIGS. 79 (i.e., the third column entitled "Manual Program Margin" in FIG. 79) and 82, because the manual mode is invoked, the control signal STEST is set low (i.e., a "0"). In addition, for the program margining voltage, the control signal ERMARGIN is set low (i.e., a "0"). In addition, the BREPAIR control signal is set low (i.e., a "0"), and the BWPPGM control signal is set low (i.e., a "0"), for applying the program margining voltage of VPROG to all of the first and second groups of flash memory cells 1536 and 1542 of the CAM 1486 in FIG. 77.

Referring to FIGS. 78 and 82, with such control signals, the input to the voltage level shifter 1518 is set high (i.e., a "1") such that the voltage level at the first output OUTB node is at 0 Volts. With voltage level of 0 Volts at the gate of the PMOSFET 1506, the PMOSFET 1506 turns on. In addition, with such control signals, a voltage level of 0 Volts is applied at the gate of the NMOSFET 1508 such that the NMOSFET 1508 is turned off. With the PMOSFET 1506 turned on and the NMOSFET 1508 turned off, the output node 1512 charges to an output voltage $V_{OUT}$=VPROG of the high voltage source 1501.

Figure 83:
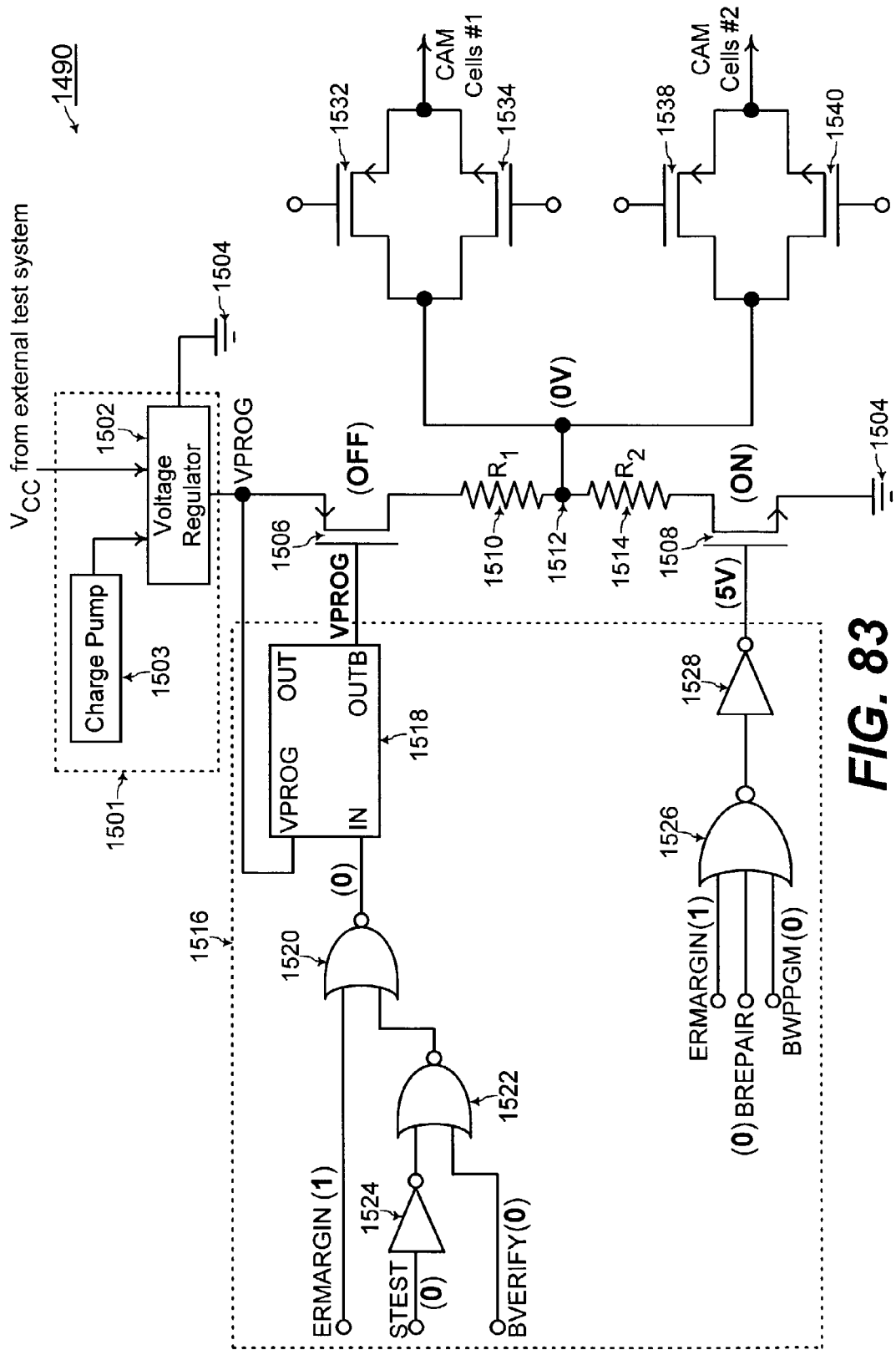
FIG. 83 shows the voltage levels of the margining voltage generator apparatus of FIG. 76 when erase margining during the manual mode is invoked, according to one embodiment of the present invention.

FIG. 83 shows the voltage levels during operation of the margining voltage generator apparatus 1490 of FIG. 76 for providing an erase margining voltage of 0 Volts at the output node 1512 when the manual mode is invoked by the external test system. Referring to FIGS. 79 (i.e., the fourth column entitled "Manual Erase Margin" in FIG. 79) and 83, because the manual mode is invoked, the control signal STEST is set low (i.e., a "0"). In addition, for the erase margining voltage, the control signal ERMARGIN is set high (i.e., a "1"). In addition, the BREPAIR control signal is set low (i.e., a "0"), and the BWPPGM control signal is set low (i.e., a "0"), for applying the erase margining voltage of 0 Volts to all of the first and second groups of flash memory cells 1536 and 1542 of the CAM 1486 in FIG. 77.

Referring to FIGS. 78 and 83, with such control signals, the input to the voltage level shifter 1518 is set low (i.e., a "0") such that the voltage level at the first output OUTB node is at the voltage level of VPROG. With voltage level of VPROG at the gate of the PMOSFET 1506, the PMOSFET 1506 turns off. In addition, with such control signals, a voltage level of 5 Volts is applied at the gate of the NMOSFET 1508 such that the NMOSFET 1508 is turned on. With the PMOSFET 1506 turned off and the NMOSFET 1508 turned on, the output node 1512 discharges to an output voltage $V_{OUT}$=0 Volts of the ground node of the low voltage source 1504.

In addition, the BVERIFY signal may be set to the desired high state or low state with a delay after the STEST signal is set to the desired high state or low state such that the PMOSFET is turned on or off after the delay. With such a delay, the PMOSFET is turned on or turned off after the VPROG voltage level from the high voltage source 1501 is stabilized, according to one embodiment of the present invention.

Furthermore, referring to FIGS. 76 and 77, the first set of pass transistors 1532 and 1534 are turned on while the second set of pass transistors 1538 and 1540 remain turned off with appropriate voltages applied to the gates of the first and second set of pass transistors 1532, 1534, 1538, and 1540 for coupling the output voltage $V_{OUT}$ at the output node 1512 to the first group of flash memory cells 1536 of the CAM 1486 as shown in FIG. 77. On the other hand, the second set of pass transistors 1538 and 1540 are turned on while the first set of pass transistors 1532 and 1534 remain turned off with appropriate voltages applied to the gates of the first and second set of pass transistors 1532, 1534, 1538, and 1540 for coupling the output voltage $V_{OUT}$ at the output node 1512 to the second group of flash memory cells 1542 of the CAM 1486 as shown in FIG. 77. Alternatively, the first and second set of pass transistors 1532, 1534, 1538, and 1540 are turned on for coupling the output voltage $V_{OUT}$ at the output node 1512 to the first and second groups of flash memory cells 1536 and 1542 of the CAM 1486 as shown in FIG. 77. Control circuitry for applying such appropriate voltages on the gates of the first and second set of pass transistors 1532, 1534, 1538, and 1540 are known to one of ordinary skill in the art of electronics.

In this manner, the program or erase margining voltages for testing the flash memory cells of the CAM 1486 are generated on-chip with a resistive divider such that the margining voltages are independent from the voltage $V_{CC}$ provided by the external test system. The program or erase margining voltages are generated on-chip within the semiconductor die 1480 because the components of the margining voltage generator apparatus 1490 of FIG. 76 are fabricated on the semiconductor wafer of the semiconductor die 1480. With more stable margining voltages, the results of testing the CAM of the flash memory device is more consistent across a high number of lots of semiconductor wafers. In addition, with such on-chip generated margining voltages that are independent of the $V_{CC}$ voltage from the external test system, the results of testing the CAM of the flash memory device are more consistent even when various levels of the $V_{CC}$ voltage from the external test system are used for testing the core flash memory cells.

The foregoing is by way of example only and is not intended to be limiting. For example, the present invention may be practiced with other types of transistors than the PMOSFET 1506 and the NMOSFET 1508. In addition, any voltage levels described herein are by way of example only, and the present invention may be practiced with other voltage levels as would be apparent to one of ordinary skill in the art of electronics from the description herein. The present invention is limited only as defined in the following claims and equivalents thereof.

We claim:

1. A method for sequencing through flash memory cells fabricated on a semiconductor substrate, including the steps of:
    fabricating a plurality of logic units of an address sequencer control logic and address sequencer buffers on the semiconductor substrate;
    generating a plurality of bits by the buffers for indicating an address of the flash memory cells; and
    controlling, by a respective different logic unit of the control logic, the buffers to sequence through a respective different sequence of bit patterns for each of a plurality of different types of BIST (built-in-self-test) modes,
    wherein a different unique logic unit controls the buffers to sequence through a different unique sequence of bit patterns for each of the different types of BIST modes.

2. The method of claim 1, further including the steps of:
    generating first bits by a first group of the buffers for indicating a Y-address for a flash memory cell;
    generating second bits by a second group of the buffers for indicating an X-address for a flash memory cell; and
    generating third bits by a third group of the buffers for indicating a sector address for a flash memory cell.

3. The method of claim 2, further including the step of:
    generating fourth bits by a fourth group of the buffers for indicating a redundancy block address for a flash memory cell;
    wherein each redundancy block is comprised of a plurality of sectors of the flash memory cells;
    and wherein when a BIST mode is for testing each sector, with a last sector being divided into subsectors, the control logic controls the second group of the buffers to sequence through each subsector of the last sector, and controls the third and fourth groups of the buffers to sequence through each of the other sectors aside from the last sector.

4. The method of claim 2, wherein at the start of a BIST mode, the method further includes the steps of:
    resetting the first group of the buffers to indicate a beginning Y-address;
    resetting the second group of the buffers to indicate a beginning X-address; and
    resetting the third group of the buffers to indicate a beginning sector address.

5. The method of claim 2, further including the step of:
    controlling, by the control logic, the second group of the buffers to invert a bit pattern of the second bits for achieving physically adjacent sequencing of X-addresses when two adjacent X-address decoders are fabricated as mirror-images of each-other on the semiconductor substrate.

6. The method of claim 2, further including the steps of:
    controlling, by the control logic, the first group of the buffers to sequence through each Y-address for an X-address before the X-address is incremented when an Xmimnax control signal is asserted; and
    controlling, by the control logic, the second group of the buffers to sequence through each X-address for a Y-address before the Y-address is incremented when a Yminmax control signal is asserted.

7. The method of claim 2, wherein when a BIST mode is for checker-board access of the flash memory cells, the method further includes the steps of:
    controlling, by the control logic, the first group of the buffers not including the least significant bit to increment such that alternating flash memory cells within a row are accessed; and
    controlling, by the control logic, the first group of the buffers to toggle the least significant bit once at the increment of the second group of the buffers such that alternating flash memory cells within a column are accessed.

8. The method of claim 2, wherein when a BIST mode is for diagonal access of the flash memory cells, the method further includes the steps of:
    initializing, by the control logic, the first and second groups of the buffers to a beginning Y-address and a beginning X-address; and
    controlling, by the control logic, the first and second groups of the buffers to increment for each clock cycle such that flash memory cells of diagonal location are accessed.

9. The method of claim 1, wherein when a BIST mode is for accessing OTP (one time programmable) flash memory cells, the method further includes the step of:
    coupling a group of the buffers to a register of a BIST interface for indicating an address of an OTP flash memory cell to be accessed by an external test system.

10. The method of claim 1, further including the step of:
    fabricating a redundancy sequencing enable logic on the semiconductor substrate for determining whether redundancy flash memory cells fabricated on the semiconductor substrate are to be sequenced.

11. The method of claim 10, further including the step of:
    determining by the redundancy sequencing enable logic that the redundancy flash memory cells are not to be sequenced if (A) a BIST mode is for diagonal program of the flash memory cells, (B) a BIST mode is for diagonal erase verify of the flash memory cells, (C) all available redundancy flash memory cells have already been used, or (D) a manual test mode is invoked.

12. The method of claim 1, wherein when a BIST mode is for trimming reference cells, the method further includes the steps of:
    coupling, by the control logic, a bit pattern from a register of a BIST interface to a group of the buffers for indicating an address of the reference cells to be erase trimmed.

13. The method of claim 12, further including the steps of:
    controlling, by the control logic, the group of the buffers to sequence through the reference cells to be erase trimmed with a first erase pulse voltage level ARVSS0 applied on a first subset of the reference cells and with a second erase pulse voltage level ARVSS1 applied on a second subset of the reference cells; and decoupling the first erase pulse voltage level ARVSS0 from the first subset of the reference cells when the group of the buffers has sequenced through the first subset of the reference cells.

14. The method of claim 1, further including the step of:
inputting, by the control logic, control signals from at least one of a BIST back-end state machine, a BIST interface, a BIST front-end interface decoder, and the buffers, for determining the respective sequence of bit patterns.

15. A system for sequencing through flash memory cells fabricated on a semiconductor substrate, comprising:
address sequencer buffers, fabricated on the semiconductor substrate, for generating a plurality of bits that indicate an address of the flash memory cells; and
a plurality of logic units of an address sequencer control logic, fabricated on the semiconductor substrate, a respective different logic unit controlling the buffers to sequence through a respective different sequence of bit patterns for each of a plurality of different types of BIST (built-in-self-test) modes,
wherein a different unique logic unit controls the buffers to sequence through a different unique sequence of bit patterns for each of the different types of BIST modes.

16. The system of claim 15, wherein the buffers are comprised of:
a first group of the buffers for generating first bits that indicate a Y-address for a flash memory cell;
a second group of the buffers for generating second bits that indicate an X-address for a flash memory cell; and
a third group of the buffers for generating third bits that indicate a sector address for a flash memory cell.

17. The system of claim 16, wherein the buffers are further comprised of:
a fourth group of the buffers for generating fourth bits that indicate a redundancy block address for each flash memory cell;
and wherein each redundancy block is comprised of a plurality of sectors of the flash memory cells;
and wherein when a BIST mode is for testing each sector, with a last sector being divided into subsectors, the control logic controls the second group of the buffers to sequence through each subsector of the last sector, and controls the third and fourth groups of the buffers to sequence through each of the other sectors aside from the last sector.

18. The system of claim 16, wherein at the start of a BIST mode:
the first group of the buffers are reset to indicate a beginning Y-address;
the second group of the buffers are reset to indicate a beginning X-address; and
the third group of the buffers are reset to indicate a beginning sector address.

19. The system of claim 16, wherein the control logic controls the second group of the buffers to invert a bit pattern of the second bits for achieving physically adjacent sequencing of X-addresses when two adjacent X-address decoders are fabricated as mirror-images of each-other on the semiconductor substrate.

20. The system of claim 16, wherein:
the control logic controls the first group of the buffers to sequence through each Y-address for an X-address before the X-address is incremented when an Xminmax control signal is asserted; and wherein the control logic controls the second group of the buffers to sequence through each X-address for a Y-address before the Y-address is incremented when a Yminmax control signal is asserted.

21. The system of claim 16, wherein when a BIST mode is for checker-board access of the flash memory cells:
the control logic controls the first group of the buffers not including the least significant bit to increment such that alternating flash memory cells within a row are accessed;
and wherein the control logic controls the first group of the buffers to toggle the least significant bit once at the increment of the second group of the buffers such that alternating flash memory cells within a column are accessed.

22. The system of claim 16, wherein when a BIST mode is for diagonal access of the flash memory cells:
the control logic initializes the first and second groups of the buffers to a beginning Y-address and a beginning X-address;
and wherein the control logic controls the first and second groups of the buffers to increment for each clock cycle such that flash memory cells of diagonal location are accessed.

23. The system of claim 15, wherein when a BIST mode is for accessing OTP (one time programmable) flash memory cells:
a group of the buffers are coupled to a register of a BIST interface for indicating an address of an OTP flash memory cell to be accessed by an external test system.

24. The system of claim 15, further comprising:
a redundancy sequencing enable logic, fabricated on the semiconductor substrate, for determining whether redundancy flash memory cells fabricated on the semiconductor substrate are to be sequenced.

25. The system of claim 24, wherein the redundancy sequencing enable logic determines that the redundancy flash memory cells are not to be sequenced if (A) a BIST mode is for diagonal program of the flash memory cells, (B) a BIST mode is for diagonal erase verify of the flash memory cells, (C) all available redundancy flash memory cells have already been used, or (D) a manual test mode is invoked.

26. The system of claim 15, wherein when a BIST mode is for trimming reference cells, the control logic couples a bit pattern from a register of a BIST interface to a group of the buffers for indicating an address of the reference cells to be erase trimmed.

27. The system of claim 26, wherein:
the control logic controls the group of the buffers to sequence through the reference cells to be erase trimmed with a first erase pulse voltage level ARVSS0 applied on a first subset of the reference cells and with a second erase pulse voltage level ARVSS1 applied on a second subset of the reference cells;
and wherein the control logic decouples the first erase pulse voltage level ARVSS0 from the first subset of the reference cells when the group of the buffers has sequenced through the first subset of the reference cells.

28. The system of claim 15, wherein the control logic inputs control signals from at least one of a BIST back-end state machine, a BIST interface, a BIST front-end interface decoder, and the buffers, for determining the respective sequence of bit patterns.

* * * * *